United States Patent
Kim et al.

(10) Patent No.: US 11,908,386 B2
(45) Date of Patent: Feb. 20, 2024

(54) DISPLAY APPARATUS

(71) Applicant: SAMSUNG ELECTRONICS CO., LTD., Suwon-si (KR)

(72) Inventors: Jinho Kim, Suwon-si (KR); Seungran Park, Suwon-si (KR); Donggun Oh, Suwon-si (KR); Jongsu Oh, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/894,623

(22) Filed: Aug. 24, 2022

(65) Prior Publication Data

US 2023/0012711 A1 Jan. 19, 2023

Related U.S. Application Data

(63) Continuation of application No. PCT/KR2022/010292, filed on Jul. 14, 2022.

(30) Foreign Application Priority Data

Jul. 19, 2021 (KR) .................. 10-2021-0094220
Apr. 27, 2022 (KR) .................. 10-2022-0052371

(51) Int. Cl.
  *G09G 3/32* (2016.01)
  *H01L 25/075* (2006.01)

(52) U.S. Cl.
  CPC ........... *G09G 3/32* (2013.01); *H01L 25/0753* (2013.01); *G09G 2310/027* (2013.01);
  (Continued)

(58) Field of Classification Search
  CPC ............... G09G 3/32; G09G 2310/027; G09G 2320/0214; G09G 2320/0233;
  (Continued)

(56) References Cited

U.S. PATENT DOCUMENTS 9,349,313 B2  5/2016  Kawae et al.
10,542,596 B1 * 1/2020 Talati .................. G09G 3/2022
(Continued)

FOREIGN PATENT DOCUMENTS

CN  209964330 U  1/2020
KR  10-0682855 B1  2/2007
(Continued)

OTHER PUBLICATIONS

International Search Report (PCT/ISA/210) dated Oct. 21, 2022, issued by the Patent Cooperation Treaty, in App No. PCT/KR2022/010292.

(Continued)

*Primary Examiner* — Andrew Sasinowski
(74) *Attorney, Agent, or Firm* — Sughrue Mion, PLLC

(57) ABSTRACT

A display apparatus, including a display panel which includes a pixel array including a plurality of pixels arranged in a plurality of row lines, and a plurality of sub-pixel circuits, wherein each pixel of the plurality of pixels includes a plurality of inorganic light emitting elements, and wherein each sub-pixel circuit of the plurality of sub-pixel circuits corresponds to an inorganic light emitting element of the plurality of light emitting elements; and a driver configured to drive the plurality of sub-pixel circuits so that the plurality of inorganic light emitting elements emit light a plurality of times in an order of the plurality of row lines based on an image data voltage corresponding to one image frame, wherein the each sub-pixel circuit includes a discharge transistor configured to remove a potential difference between both ends of a corresponding inorganic light emitting element based on a predetermined cycle.

12 Claims, 77 Drawing Sheets

BLUE

GREEN

RED

(52) U.S. Cl.
CPC .............. *G09G 2320/0214* (2013.01); *G09G 2320/0233* (2013.01); *G09G 2330/021* (2013.01)

(58) Field of Classification Search
CPC ........... G09G 2330/021; G09G 3/2003; G09G 3/2014; G09G 2300/0861; G09G 2310/0251; G09G 2310/066; G09G 2320/0223; G09G 2320/0295; G09G 2320/064; H01L 25/0753
See application file for complete search history.

(56) References Cited

U.S. PATENT DOCUMENTS

| | | |
|---|---|---|
| 11,100,840 B2 | 8/2021 | Kim et al. |
| 11,398,181 B2 | 7/2022 | Kim et al. |
| 2018/0075798 A1 | 3/2018 | Nho et al. |
| 2020/0258448 A1* | 8/2020 | Hargreaves .......... G09G 3/3208 |
| 2020/0312216 A1 | 10/2020 | Kim et al. |
| 2021/0210002 A1 | 7/2021 | Kim et al. |
| 2021/0210003 A1 | 7/2021 | Kim et al. |
| 2021/0375185 A1* | 12/2021 | Kim .......................... G09G 3/32 |

FOREIGN PATENT DOCUMENTS

| | | |
|---|---|---|
| KR | 10-2014-0071236 A | 6/2014 |
| KR | 10-1789643 B1 | 10/2017 |
| KR | 10-2020-0115003 A | 10/2020 |
| KR | 10-2021-0026150 A | 3/2021 |
| KR | 10-2021-0087867 A | 7/2021 |
| KR | 10-2021-0087873 A | 7/2021 |

OTHER PUBLICATIONS

Written Opinion (PCT/ISA/237) dated Oct. 21, 2022 issued by Korean Patent Office in App No. PCT/KR2022/010292.

* cited by examiner

DISPLAY APPARATUS

CROSS-REFERENCE TO RELATED APPLICATION

This application is a bypass continuation of International Application No. PCT/KR2022/010292, filed on Jul. 14, 2022, which is based on and claims priority to Korean Patent Application No. 10-2021-0094220, filed on Jul. 19, 2021, in the Korean Intellectual Property Office, and Korean Patent Application No. 10-2022-0052371, filed on Apr. 27, 2022, in the Korean Intellectual Property Office, the disclosures of which are incorporated by reference herein in their entireties.

BACKGROUND

Field

The disclosure relates to a display apparatus and, more specifically, to a display apparatus including a pixel array composed of inorganic light emitting elements.

Description of Related Art

In a related art display panel in which an inorganic light emitting element such as a red light emitting diode (LED), a green LED, and a blue LED is driven as a sub-pixel, a gray scale of a sub-pixel may be represented by a pulse amplitude modulation (PAM) driving method.

Depending on a magnitude of a driving current, a wavelength as well as a gray scale of emitted light may change, resulting in decrease in color reproducibility of an image. FIG. 1 illustrates a wavelength change according to the magnitude of a driving current flowing through a blue LED, a green LED, and a red LED.

Accordingly, there is a need for a method of driving a self-emitting display panel capable of improving color reproducibility. In this regard, various kinds of issues related to performance of a display apparatus, e.g., power consumption, uniformity of brightness, horizontal crosstalk, a dynamic range, etc. may be considered together.

SUMMARY

Provided is a display apparatus providing improved color reproducibility for an input image signal, and a driving method thereof.

Also provided is a display apparatus capable of preventing a phenomenon in which a wavelength of light emitted from an inorganic light emitting element changes according to a gray scale, and a driving method thereof.

Also provided is a display apparatus capable of resolving a problem of a drop of uniformity of brightness due to a difference in the threshold voltage between driving transistors, and a driving method thereof.

Also provided is display apparatus capable of reducing power consumption consumed in driving a display panel, and a driving method thereof.

Also provided is a display apparatus capable of compensating for an effect of a drop of a driving voltage generated differently for each position of a display panel in a process of setting a data voltage, and a driving method thereof.

Also provided is a display apparatus wherein problems of disuniformity of brightness and horizontal crosstalk by a sweep load have been improved, and a driving method thereof.

Also provided is a display apparatus capable of implementing a black gray scale precisely, and a driving method thereof.

In accordance with an aspect of the disclosure, a display apparatus includes a display panel includes a pixel array which includes a plurality of pixels arranged in a plurality of row lines, and a plurality of sub-pixel circuits, wherein each pixel of the plurality of pixels includes a plurality of inorganic light emitting elements, and wherein each sub-pixel circuit of the plurality of sub-pixel circuits corresponds to an inorganic light emitting element of the plurality of light emitting elements; and a driver configured to drive the plurality of sub-pixel circuits so that the plurality of inorganic light emitting elements emit light a plurality of times in an order of the plurality of row lines based on an image data voltage corresponding to one image frame, wherein the each sub-pixel circuit includes a discharge transistor configured to remove a potential difference between both ends of a corresponding inorganic light emitting element based on a predetermined cycle.

The driver may be further configured to during a data setting section that proceeds in the order of the plurality of row lines, set the image data voltage for the plurality of sub-pixel circuits in the order of the plurality of row lines, and in each light emitting section of a plurality of light emitting sections that proceed in the order of the plurality of row lines, drive the plurality of sub-pixel circuits so that the plurality of inorganic light emitting elements emit the light in the order of the plurality of row lines based on the set image data voltage.

A first light emitting section from among the plurality of light emitting sections may be temporally consecutive with the data setting section, and the plurality of light emitting sections may have a predetermined time interval with respect to each other.

The discharge transistor may be further configured to be turned on based on the predetermined cycle, and to short-circuit the both ends of the inorganic light emitting element while the discharge transistor is turned on.

The discharge transistor may be further configured to be turned on at least once per image frame.

The discharge transistor may be further configured to be turned on once per a plurality of image frames.

The potential difference may be generated, based on the image data voltage being a value corresponding to a black gray scale, by a leakage current flowing in the inorganic light emitting element, and a junction capacitance of the inorganic light emitting element.

Discharge transistors included in the display panel may be turned on at once after the data setting section proceeds for all of the plurality of row lines of the display panel.

The image data voltage may include a constant current generator data voltage and a pulse width modulation (PWM) data voltage, and the each sub-pixel circuit may include a constant current generator circuit including a first driving transistor, and configured to provide a constant current to the corresponding inorganic light emitting element based on the constant current generator data voltage; and a PWM circuit including a second driving transistor, and configured to control a time during which the constant current is provided to the corresponding inorganic light emitting element based on a sweep voltage which sweeps between two different voltages and the PWM data voltage.

The constant current generator circuit may be further configured to set, in the data setting section, the constant current generator data voltage and a first voltage based on a threshold voltage of the first driving transistor to a gate terminal of the first driving transistor, and the PWM circuit may be further configured to set, in the data setting section, the PWM data voltage and a second voltage based on a threshold voltage of the second driving transistor to a gate terminal of the second driving transistor.

The constant current generator circuit may be further configured to provide, in the each light emitting section, a driving current having a magnitude based on the first voltage to the inorganic light emitting element, and the PWM circuit may be further configured to control, in the each light emitting section, the time during which the constant current is provided to the corresponding inorganic light emitting element based on a voltage of the gate terminal of the second driving transistor changing from the second voltage according to the sweep voltage.

The display apparatus may further include a sensing unit configured to sense currents flowing in the first driving transistor and the second driving transistor based on a specific voltage, and to output sensing data corresponding to the sensed currents; and a correction unit configured to correct the constant current generator data voltage and the PWM data voltage applied to the plurality of sub-pixel circuits based on the sensing data.

The plurality of sub-pixel circuits may be configured to be driven by a first driving voltage in the each light emitting section, and are further configured to be driven by a second driving voltage separate from the first driving voltage in the data setting section.

According to the various embodiments of the disclosure as described above, a phenomenon in which a wavelength of light emitted from an inorganic light emitting element changes according to a gray scale can be prevented.

Also, a stain of an image that might appear on a screen due to a difference in the threshold voltage between driving transistors can be easily compensated. Further, correction of colors is facilitated.

In addition, power consumption consumed in driving a display panel can be reduced.

Further, an effect of a drop of a driving voltage in a process of setting a data voltage can be compensated.

Also, problems of disuniformity of brightness and horizontal crosstalk by a sweep load can be improved.

In addition, a dynamic range can be sufficiently secured.

DETAILED DESCRIPTION

Figure 1:
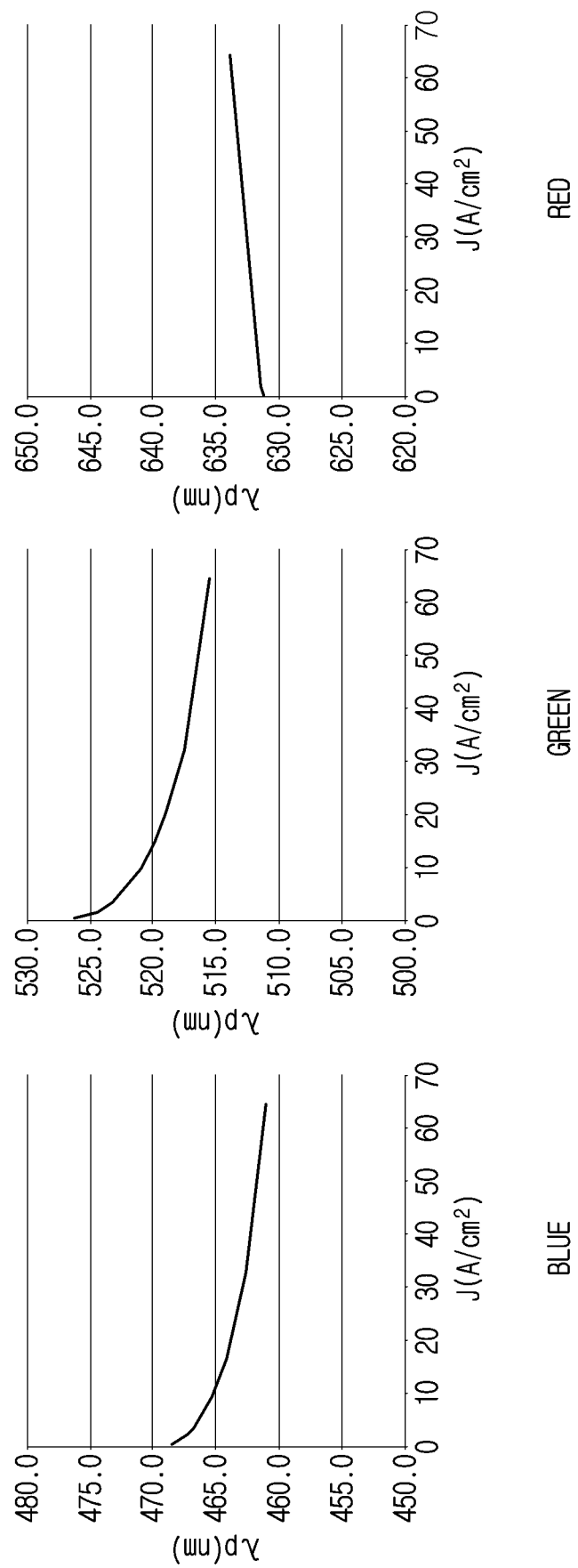
FIG. 1 is a graph illustrating a change in a wavelength according to a magnitude of a driving current flowing in a blue LED, a green LED, and a red LED.

In describing the disclosure, detailed descriptions of related known technologies will be omitted when it is determined that the descriptions may unnecessarily obscure the gist of the disclosure. In addition, overlapping descriptions of the same components will be omitted as far as possible.

The term "unit" for components used in the following description is added or interchangeably used only in consideration of the convenience in drafting the specification, and it does not have a distinguished meaning or role by itself.

As is traditional in the field, embodiments may be described and illustrated in terms of blocks which carry out a described function or functions. These blocks, as shown in the drawings, which may be referred to herein as units or modules or the like, may be physically implemented by analog or digital circuits such as logic gates, integrated circuits, microprocessors, microcontrollers, memory circuits, passive electronic components, active electronic components, optical components, hardwired circuits, or the like, and may be driven by firmware and software. The circuits may, for example, be embodied in one or more semiconductor chips, or on substrate supports such as printed circuit boards and the like. Circuits included in a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks. Likewise, the blocks of the embodiments may be physically combined into more complex blocks.

The terminology used in the disclosure is used to describe embodiments, and is not intended to restrict and/or limit the disclosure. Further, a singular expression of any component used in the disclosure includes a plural expression, except for a case obviously meaning the contrary in the context.

It is to be understood that in the disclosure, terms such as 'include' or 'have' may be used to designate a presence of a characteristic, a number, a step, an operation, an element, a component, or a combination thereof described in the specification, and not to preclude a presence or a possibility of adding one or more of other characteristics, numbers, steps, operations, elements, components or a combination thereof.

In the disclosure, expressions such as "first", "second", etc. may be used to describe various elements regardless of their order and/or importance and to discriminate one element from other elements, but are not used to limit the elements.

In embodiments, in the disclosure, if it is described that a certain element (e.g.: a first element) is "connected to" another element (e.g.: a second element), it should be understood that the certain element (e.g.: a first element) may be directly connected to the another element (e.g.: a second element), or may be connected to the another element (e.g.: a second element) through still another element (e.g.: a third element).

On the other hand, if it is described that a certain element (e.g.: a first element) is "directly connected to" another element (e.g.: a second element), it may be understood that there is no element (e.g.: a third element) between the certain element (e.g.: a first element) and the another element (e.g.: a second element).

The terms used in the embodiments of the disclosure may be interpreted in a meaning commonly known to those of ordinary skill in the art unless otherwise defined.

Hereinafter, various embodiments of the disclosure will be described in detail with reference to the accompanying drawings.

Figure 2:
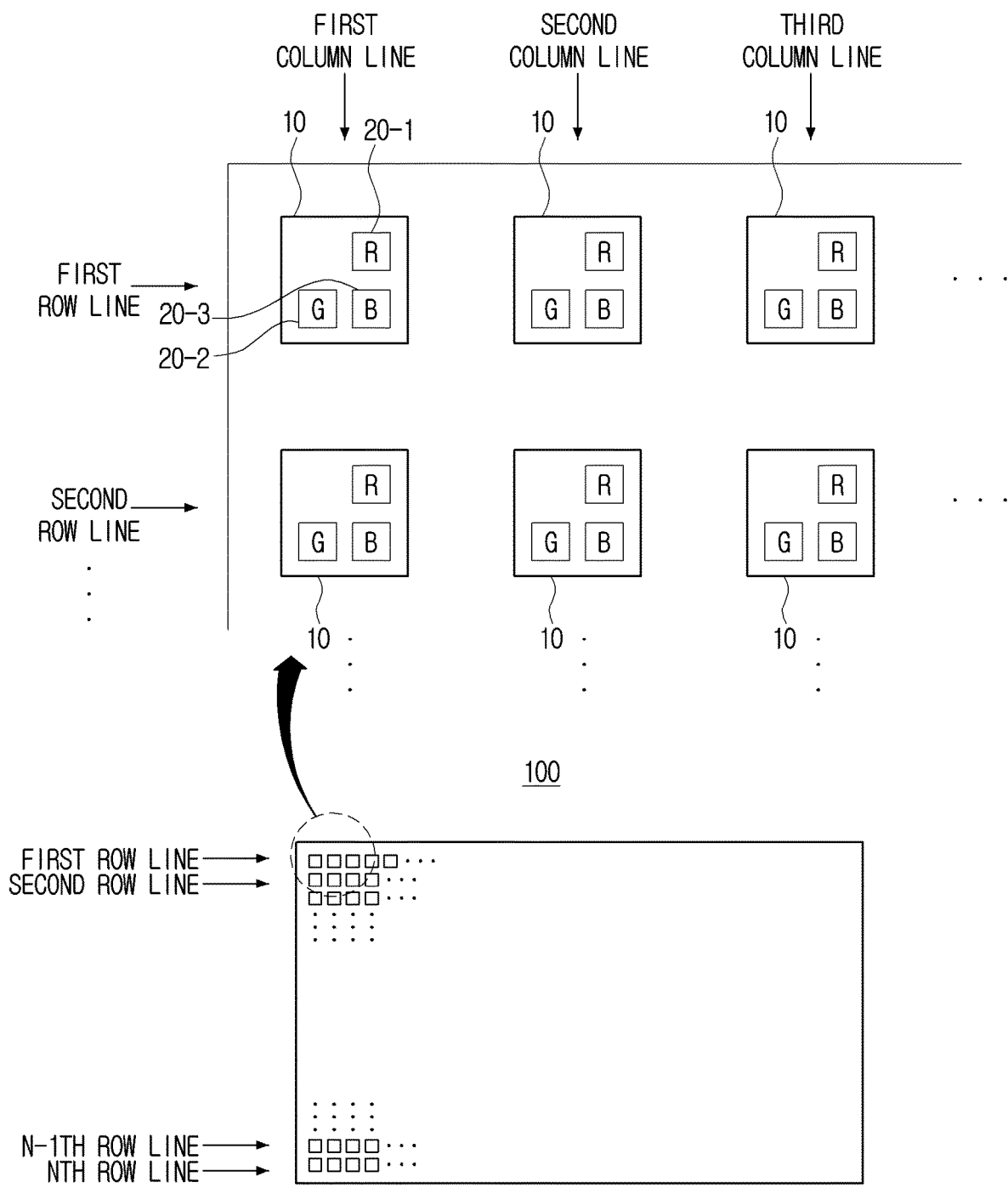
FIG. 2 is a diagram for illustrating a pixel structure of a display panel according to an embodiment.

FIG. 2 is a diagram for illustrating a pixel structure of a display panel according to an embodiment of the disclosure.

Referring to FIG. 2, a display panel 100 includes a plurality of pixels 10 disposed (or arranged) in a matrix form, i.e., a pixel array.

The pixel array includes a plurality of row lines or a plurality of column lines. In embodiments, the row line may also be called a horizontal line, a scan line, or a gate line, and the column line may also be called a vertical line or a data line.

In embodiments, terms such as a row line, a column line, a horizontal line, and a vertical line may be used as words to refer to a line formed by pixels on a pixel array, and terms such as a scan line, a gate line, and a data line may be used as words to refer to the actual wiring on the display panel 100 to which data or signals are transmitted.

In embodiments, each pixel 10 of the pixel array may include three types of sub-pixels including a red (R) sub-pixel 20-1, a green (G) sub-pixel 20-2, and a blue (B) sub-pixel 20-3.

In this case, each pixel 10 may include a plurality of inorganic light emitting elements included in the sub-pixels 20-1, 20-2, and 20-3.

For example, each pixel 10 may include three types of inorganic light emitting elements, such as a red (R) inorganic light emitting element included in the R sub-pixel 20-1, a green (G) inorganic light emitting element included in the G sub-pixel 20-2, and a blue (B) inorganic light emitting element included in the B sub-pixel 20-3.

In embodiments, each pixel 10 may include three blue inorganic light emitting elements. In this example, a color filter for implementing R, G, or B colors may be provided on each inorganic light emitting element. In this case, the color filter may be a quantum dot (QD) color filter, but is not limited thereto.

In embodiments, a sub-pixel circuit for driving an inorganic light emitting element may be provided on the display panel 100 for each inorganic light emitting element.

In this case, each sub-pixel circuit may provide a driving current to a corresponding inorganic light emitting element based on an image data voltage applied from outside.

Specifically, the image data voltage includes a constant current generator (CCG) data voltage and a pulse width modulation (PWM) data voltage. Each sub-pixel circuit may represent a gray scale of an image by providing a driving current of a magnitude corresponding to a constant current generator data voltage to an inorganic light emitting element for a time corresponding to a PWM data voltage. An example of this is described in greater detail below.

In embodiments, the sub-pixel circuits included in each row line of the display panel 100 may be driven in the order of "setting (or programming) an image data voltage" and "providing a driving current based on the set image data voltage".

In this case, according to an embodiment of the disclosure, the sub-pixel circuits included in each row line of the display panel 100 may be sequentially driven in the order of row lines.

For example, the image data voltage setting operation of the sub-pixel circuits included in one row line (e.g., the first row line) and the image data voltage setting operation of the sub-pixel circuits included in the next row line (e.g., the second row line) may be sequentially performed in the order of row lines. Further, the driving current providing operation of the sub-pixel circuits included in the one row line (e.g., the first row line) and the driving current providing operation of the sub-pixel circuits included in the next row line (e.g., the second row line) may also be sequentially performed in the order of the row lines.

In embodiments, in FIG. 2, an example wherein the sub-pixels 20-1 to 20-3 are arranged in a shape of L of which left and right sides are inverted within one pixel region is suggested. However, embodiments are not limited thereto, and the R, G, and B sub-pixels 20-1 to 20-3 may be arranged in a line inside a pixel region, and may be arranged in various shapes depending on embodiments.

Also, in FIG. 2, description was made based on an example wherein three types of sub-pixels form one pixel. However, depending on embodiments, four types of sub-pixels such as R, G, B, and white (W) may form one pixel, and any other number of sub-pixels may form one pixel.

Figure 3A:
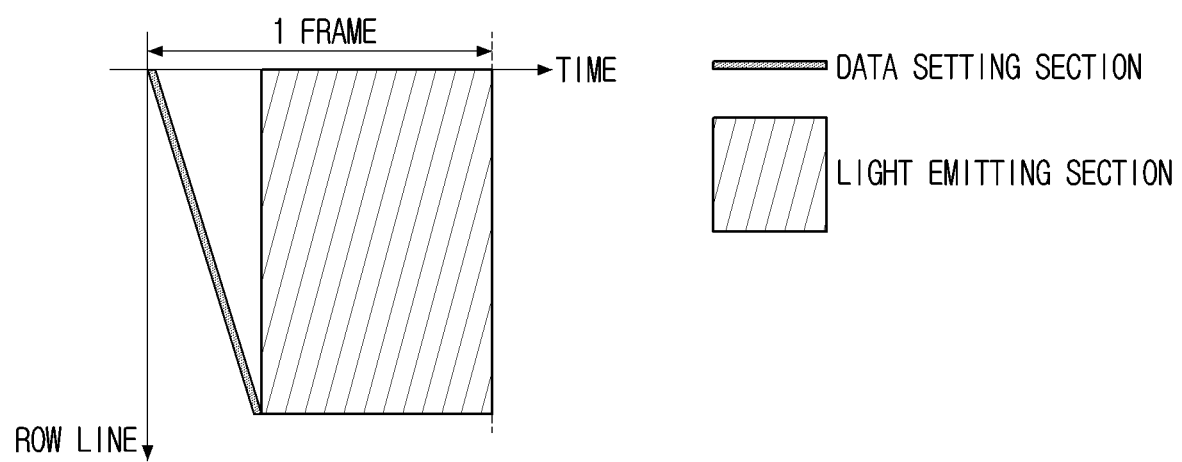
FIG. 3A is a conceptual diagram illustrating a driving method of a display panel, according to an embodiment.
Figure 3B:
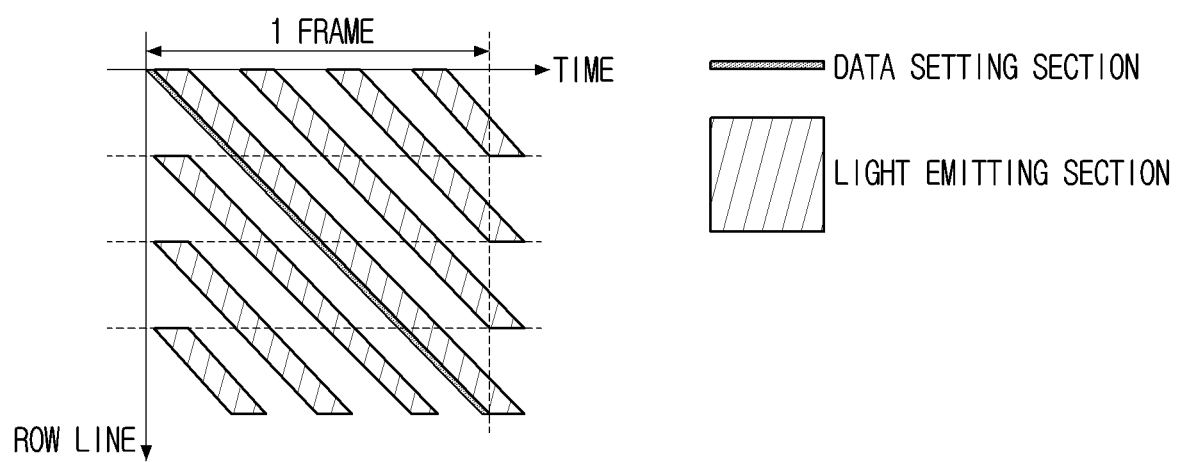
FIG. 3B is a conceptual diagram illustrating a driving method of a display panel according to an embodiment.
Figure 3C:
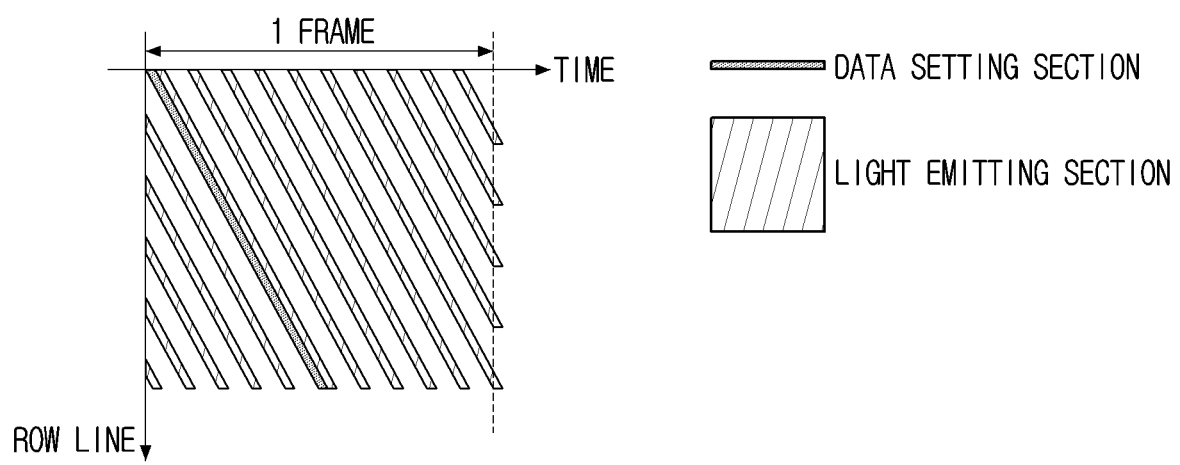
FIG. 3C is a conceptual diagram illustrating a driving method of a display panel according to an embodiment.

FIGS. 3A to 3C are conceptual diagrams illustrating a driving method of a display panel according to an embodiment of the disclosure.

FIGS. 3A to 3C illustrate a method of driving a display panel for one image frame time. In FIGS. 3A to 3C, the vertical axis represents the row line of the display panel 100, and the horizontal axis represents time. Also, the data setting section represents a driving period of the display panel 100 in which the image data voltage is set to the sub-pixel circuits included in each row line, and the light emitting section represents a driving period of the display panel 100 in which the sub-pixel circuits included in each row line provide a driving current to the inorganic light emitting elements based on the image data voltage set in the data setting section. The inorganic light emitting elements emit light according to the driving current in the light emitting section.

In the related art, as shown for example in FIG. 3A, after the setting of the image data voltage for all row lines of the display panel are completed first, the light emitting sections collectively proceed at once.

In this example, all row lines of the display panel emit light simultaneously during the light emitting section, and thus a high peak current is required, and accordingly, there is a problem that peak power consumption required for a product increases.

When peak power consumption increases, a capacity of a power supply device such as a switched mode power supply (SMPS) installed in a product increases, resulting in an increase in the cost and the volume, which causes restrictions in the design.

According to an embodiment of the disclosure, on the contrary, a data setting section and a light emitting section (specifically, a plurality of light emitting sections) of each row line may sequentially proceed in the order of the row lines.

FIGS. 3B and 3C illustrate two embodiments in which the data setting section and the light emitting section sequentially proceed in the order of the row lines.

Referring to FIG. 3B, it can be seen that the data setting section for each row line sequentially proceeds in the order of the row lines. Further, it can be seen that the light emitting sections for each row line also sequentially proceed in the order of the row lines.

In this case, according to an embodiment of the disclosure, it can be seen that the first light emitting section among the plurality of light emitting sections is temporally continuous with the data setting section, and the plurality of light emitting sections have a predetermined time interval from each other, as shown in the drawing.

In embodiments, in FIG. 3B, an example wherein the data setting section for all row lines proceeds during one frame time, and the number of the light emitting sections is four is illustrated. However, this is merely an example, and the time during which the data setting section proceeds or the number of the light emitting sections are not limited thereto.

For example, as shown in FIG. 3C, the data setting section may proceed for all row lines during a time that is shorter than one frame time, and the number of the light emitting sections may also be more than four.

Hereinafter, a driving method in which a data setting section and a light emitting section sequentially proceed in the order of row lines, examples of which are shown in FIG. 3B or FIG. 3C, is referred to as "a progressive driving method" as distinguished from the batch driving method of FIG. 3A.

In the case of the progressive driving method, because the number of row lines which simultaneously emit light is reduced compared to the related art, the required peak current amount may be lowered, and accordingly, peak power consumption may be reduced.

As described above, according to embodiments of the disclosure, the display panel 100 may be driven by an active matrix (AM) method, and each sub-pixel may represent a gray scale of an image in a PWM scheme. Therefore, unlike the related art for representing a gray scale in the PAM method, it is possible to prevent a phenomenon in which the wavelength of the light emitted from the inorganic light emitting element changes according to the gray scale. In addition, instantaneous peak power consumption may be reduced by driving the display panel 100 so that sub-pixels sequentially emit light in the order of row lines.

Figure 4:
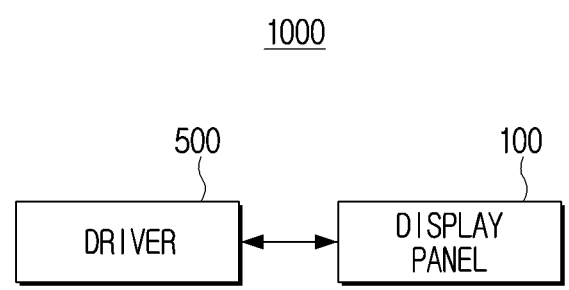
FIG. 4 is a block diagram illustrating a configuration of a display apparatus according to an embodiment.

FIG. 4 is a block diagram illustrating a configuration of a display apparatus according to an embodiment of the disclosure. According to FIG. 4, a display apparatus 1000 includes a display panel 100 and a driver 500.

The display panel 100 may include the pixel array as described above in FIG. 2, and may display an image corresponding to the applied image data voltage.

Each sub-pixel circuit included in the display panel 100 may provide a driving current of which magnitude and pulse width are controlled to a corresponding inorganic light emitting element based on the image data voltage applied from the driver 500.

The inorganic light emitting elements included in the pixel array may emit light according to a driving current provided from a corresponding sub-pixel circuit, and accordingly, an image may be displayed on the display panel 100.

The driver 500 drives the display panel 100. The driver 500 may provide various kinds of control signals, data signals, driving voltages, or the like, to the display panel 100 to drive the display panel 100.

In particular, according to an embodiment of the disclosure, the driver 500 may drive the display panel 100 by the progressive driving method as described above.

Specifically, during a data setting section that proceeds in the order of the row lines, the driver 500 may set the image data voltage to the sub-pixel circuits of the display panel 100 in the order of the row lines. Also, in a plurality of respective light emitting sections that proceed in the order of the row lines, the driver 500 may drive the sub-pixel circuits so that the inorganic light emitting elements of the pixel array emit light in the order of the row lines based on the set image data voltage.

For this, the driver 500 may include a gate driver for driving pixels on the pixel array in units of row lines. The gate driver may provide various kinds of gate signals to the display panel 100 for each row line to drive the pixels on the pixel array in the units of the row lines.

Also, the driver 500 may include a source driver (or a data driver) for providing an image data voltage (for example, a constant current generator data voltage or a PWM data voltage) to each pixel (or each sub-pixel) of the display panel 100.

In addition, the driver 500 may include a demultiplexer (DeMUX) circuit for selecting each of the plurality of sub-pixels 20-1 to 20-3 included in one pixel 10.

Further, the driver 500 may include a power IC for providing various kinds of DC voltages (e.g., a first driving voltage (VDD_PAM) described below, a second driving voltage (VDD_PWM), a ground voltage (VSS), etc.) to each sub-pixel circuit included in the display panel 100.

Also, the driver 500 may include a level shifter for shifting levels of various kinds of signals provided by a timing controller (TCON) to a level usable in the aforementioned driver (e.g., a gate driver or a data driver) or in the display panel 100.

In embodiments, according to an embodiment of the disclosure, at least some of the aforementioned various kinds of components that may be included in the driver 500 may be arranged on a printed circuit board (PCB) separate from the display panel 100, and may be connected to sub-pixel circuits formed on a TFT layer of the display panel 100 through a film on glass (FOG) wiring.

In embodiments, at least some of the aforementioned various kinds of components may be arranged on a film in a chip on film (COF) form, and may be connected to the sub-pixel circuits formed on the TFT layer of the display panel 100 through the FOG wiring.

In embodiments, at least some of the aforementioned various kinds of components may be arranged on a rear surface of a glass substrate (an opposite side of a surface on which the TFT layer is formed with respect to the glass substrate) of the display panel 100 in a chip on glass (COG) form, and may be connected to the sub-pixel circuits formed on the TFT layer of the display panel 100 through a connection wiring. An example of this is described in greater detail below.

In embodiments, at least some of the aforementioned various kinds of components may be formed on the TFT layer together with the sub-pixel circuits formed on the TFT layer in the display panel 100 and may be connected to the sub-pixel circuits.

For example, among the aforementioned various kinds of components, the gate driver and the DeMUX circuit may be formed in the TFT layer of the display panel 100, the data driver may be arranged on the rear surface of the glass substrate of the display panel 100 in a COG form, the level shifter may be arranged on a film in a COF form, and the power IC and the TCON may be arranged on a separate external PCB, but the disclosure is not limited thereto.

In embodiments, according to an embodiment of the disclosure, the display apparatus 1000 may be applied to a wearable device, a portable device, a handheld device, and various kinds of electronic products or electronic parts requiring a display, in a single unit.

Also, according to an embodiment of the disclosure, the display apparatus 1000 may be one display module. In this case, one display panel may be configured by combining or assembling a plurality of display modules. As described above, one display panel in which a plurality of display modules are combined may be referred to as "a modular display panel". However, the name is not limited thereto. In this example, each display module becomes a component included in the modular display panel. The modular display panel may be applied to small display products such as monitors and TVs, or large display products such as digital signage and electronic displays.

Figure 5A:
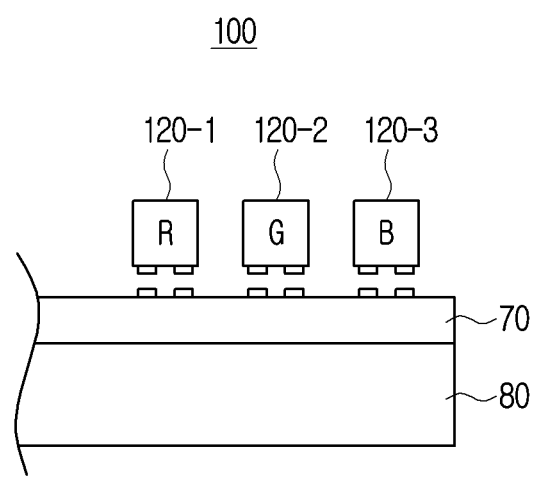
FIG. 5A is a cross-sectional view of a display panel according to an embodiment.

FIG. 5A is a cross-sectional view of the display panel 100 according to an embodiment of the disclosure. In FIG. 5A, only one pixel included in the display panel 100 is illustrated, for the convenience of explanation.

According to FIG. 5A, the display panel 100 may include a glass substrate 80, a TFT layer 70, and inorganic light emitting elements, for example inorganic light emitting element R 120-1, inorganic light emitting element G 120-2, and inorganic light emitting element B 120-3. In this example, the aforementioned sub-pixel circuit 110 may be implemented as a thin film transistor (TFT), and may be included in the TFT layer 70 on the glass substrate 80.

Each of the inorganic light emitting elements 120-1, 120-2, and 120-3 may be mounted on the TFT layer 70 so as to be electrically connected to the corresponding sub-pixel circuit 110 to form the sub-pixel described above.

Although not shown in the drawing, on the TFT layer 70, the sub-pixel circuit 110 for providing a driving current to the inorganic light-emitting elements 120-1, 120-2, and 120-3 may exist for each of the inorganic light-emitting elements 120-1, 120-2, and 120-3, and each of the inorganic light-emitting elements 120-1, 120-2, and 120-3 may be mounted or arranged on the TFT layer 70 so as to be electrically connected to the corresponding sub-pixel circuit 110.

In embodiments, in FIG. 5A, an example wherein the inorganic light emitting elements 120-1, 120-2, and 120-3 are flip-chip type micro LEDs is illustrated. However, the disclosure is not limited thereto, and the inorganic light emitting elements 120-1, 120-2, and 120-3 may be lateral type or vertical type micro LEDs depending on embodiments.

Figure 5B:
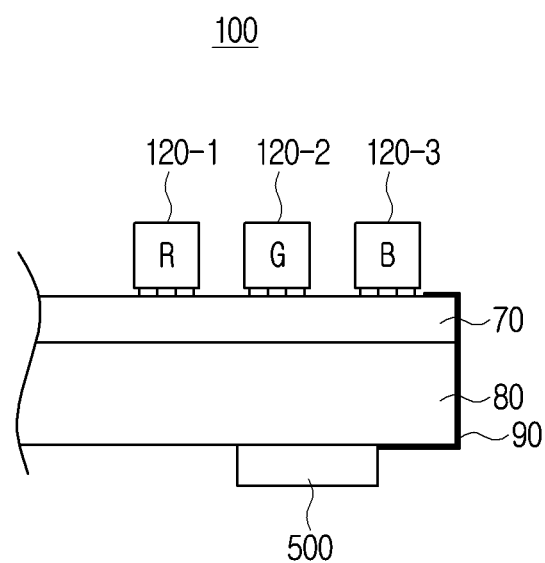
FIG. 5B is a cross-sectional view of a display panel according to an embodiment.

FIG. 5B is a cross-sectional view of the display panel 100 according to an embodiment of the disclosure.

According to FIG. 5B, the display panel 100 may include a TFT layer 70 formed on one surface of the glass substrate 80, inorganic light emitting elements 120-1, 120-2, and 120-3 mounted on the TFT layer 70, a driver 500, and a connection wiring 90 for electrically connecting the sub-pixel circuits 110 formed on the TFT layer 70 and the driver 500.

As described above, according to an embodiment of the disclosure, at least some of the aforementioned various kinds of components, which may be included in the driver 500, may be disposed on the rear surface of the glass substrate 80, and may be connected to the sub-pixel circuits 110 formed on the TFT layer 70 through the connection wiring 90.

Referring to FIG. 5B, it can be seen that the sub-pixel circuits 110 included in the TFT layer 70 are electrically connected to the driver 500 (specifically, at least some of the aforementioned various kinds of components) through the connection wiring 90 formed at the edge (or side) of the TFT panel (hereinafter, the TFT layer 70 and the glass substrate 80 in combination will be called a TFT panel).

The reason why the sub-pixel circuits 110 and the driver 500 are connected through the connection wiring 90 formed in the edge area of the display panel 100 is that a problem such as cracks may occur in the glass substrate 80 due to the temperature difference between the process of manufacturing the TFT panels 70 and 80 and the process of filling the holes with a conductive material, when the sub-pixel circuits 110 and the driver 500 are connected by forming a hole penetrating the glass substrate 80.

Figure 5C:
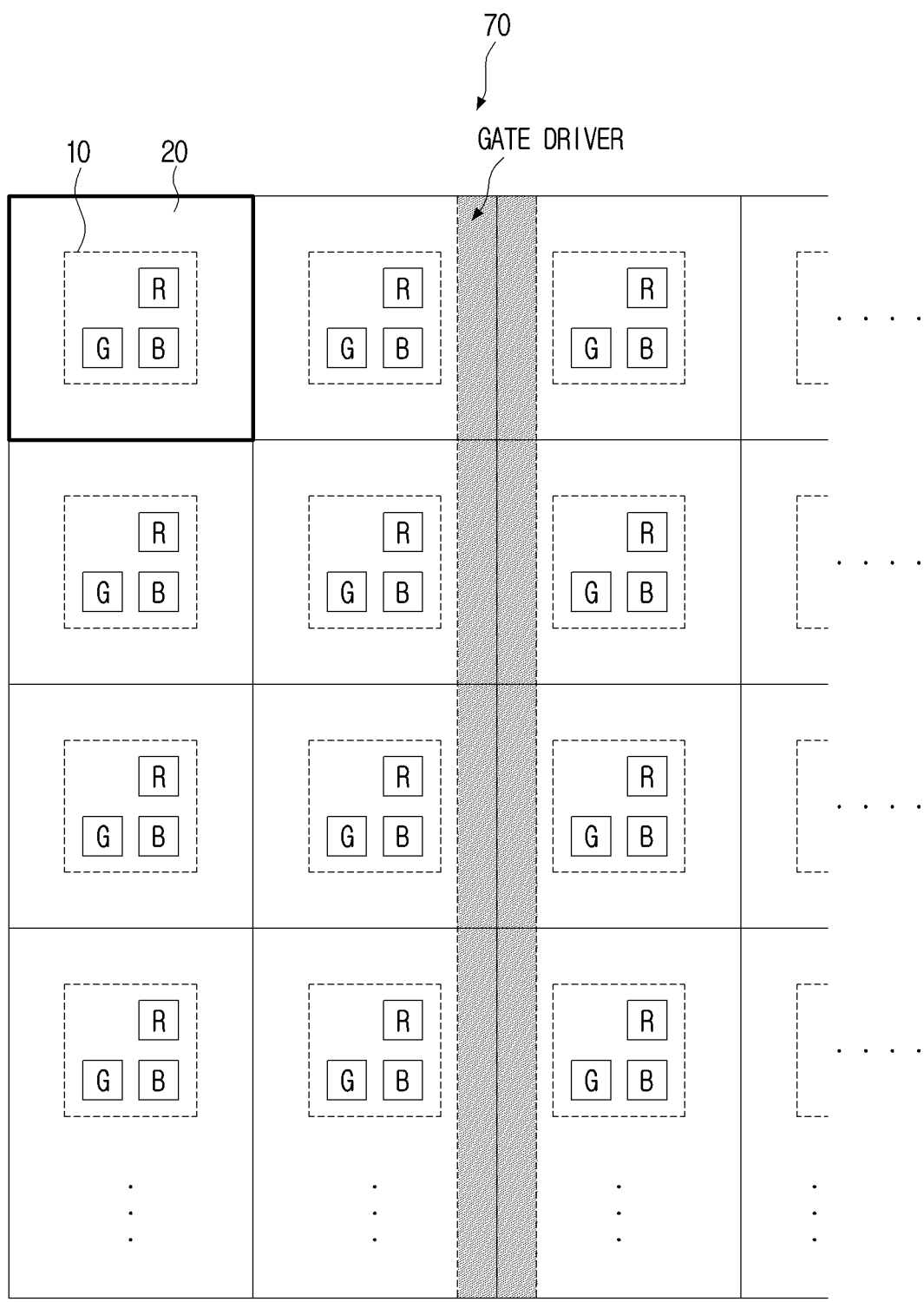
FIG. 5C is a plan view of a TFT layer according to an embodiment.

In embodiments, as described above, according to another embodiment of the disclosure, at least some of the various kinds of components that may be included in the driver 500 may be formed on the TFT layer along with the sub-pixel circuits to be connected to the sub-pixel circuits. FIG. 5C illustrates such an embodiment.

FIG. 5C is a plan view of the TFT layer 70 according to an embodiment of the disclosure. Referring to FIG. 5C, a remaining region 20 other than a region occupied by one pixel 10 (there are sub-pixel circuits 110 corresponding to each of the R, G, and B sub-pixels included in the pixel 10 in this region) is present in the TFT layer 70, and some of the aforementioned various kinds of components that may be included in the driver 500 may be formed in the remaining region 20.

FIG. 5C illustrates an example in which the aforementioned gate driver is implemented in the remaining region 20 of the TFT layer 70. The structure in which the gate driver is formed in the TFT layer 70 as such may be referred to as a gate in panel (GIP) structure, but the name is not limited thereto. Also, the position of the gate driver formed in the TFT layer 70 is not limited to that shown in FIG. 5C.

In embodiments, FIG. 5C is only an example, and the components that may be included in the remaining region 20 of the TFT layer 70 are not limited to the gate driver. Depending on embodiments, the TFT layer 70 may further include a DeMUX circuit for selecting each of R, G, and B sub-pixels, and an electro static discharge (ESD) protection circuit for protecting the sub-pixel circuits 110 from static electricity, or the like.

In the above description, an example in which the substrate on which the TFT layer 70 is formed is the glass substrate 80 was suggested, but embodiments are not limited thereto. In embodiments, the TFT layer 70 may be formed on a synthetic resin substrate. In this case, the sub-pixel circuits 110 and the driver 500 of the TFT layer 70 may be connected through a hole penetrating the synthetic resin substrate.

In embodiments, in the above description, an example in which the sub-pixel circuits 110 are implemented on the TFT layer 70 was described. However, embodiments are not limited thereto. That is, according to another embodiment of the disclosure, when the sub-pixel circuits 110 are implemented, the sub-pixel circuits 110 may be implemented as pixel circuit chips in the form of ultra-small micro-ICs in units of sub-pixels or pixels without using the TFT layer 70, and the pixel circuit chips may be mounted on the substrate.

In this example, the position where the sub-pixel circuit chips are mounted may be, for example, the periphery of the corresponding inorganic light emitting elements 120, but is not limited thereto.

Also, in the above description, an example in which the gate driver is formed in the TFT layer 70 was suggested, but embodiments are not limited thereto. That is, according to another embodiment of the disclosure, the gate driver may be implemented as a gate driver chip in the form of an ultra-small micro-IC, and may be mounted on the TFT layer 70.

In addition, in the aforementioned various embodiments of the disclosure, the TFT included in the TFT layer (or TFT panel) is not limited to a specific structure or type. That is, the TFT recited in the various examples of the disclosure may be implemented as a low temperature poly silicon (LTPS) TFT, an oxide TFT, a poly silicon or a-silicon TFT, an organic TFT, a graphene TFT, or the like, and may be applied only with a P-type (or N-type) MOSFET in an Si-wafer CMOS process.

Figure 6:
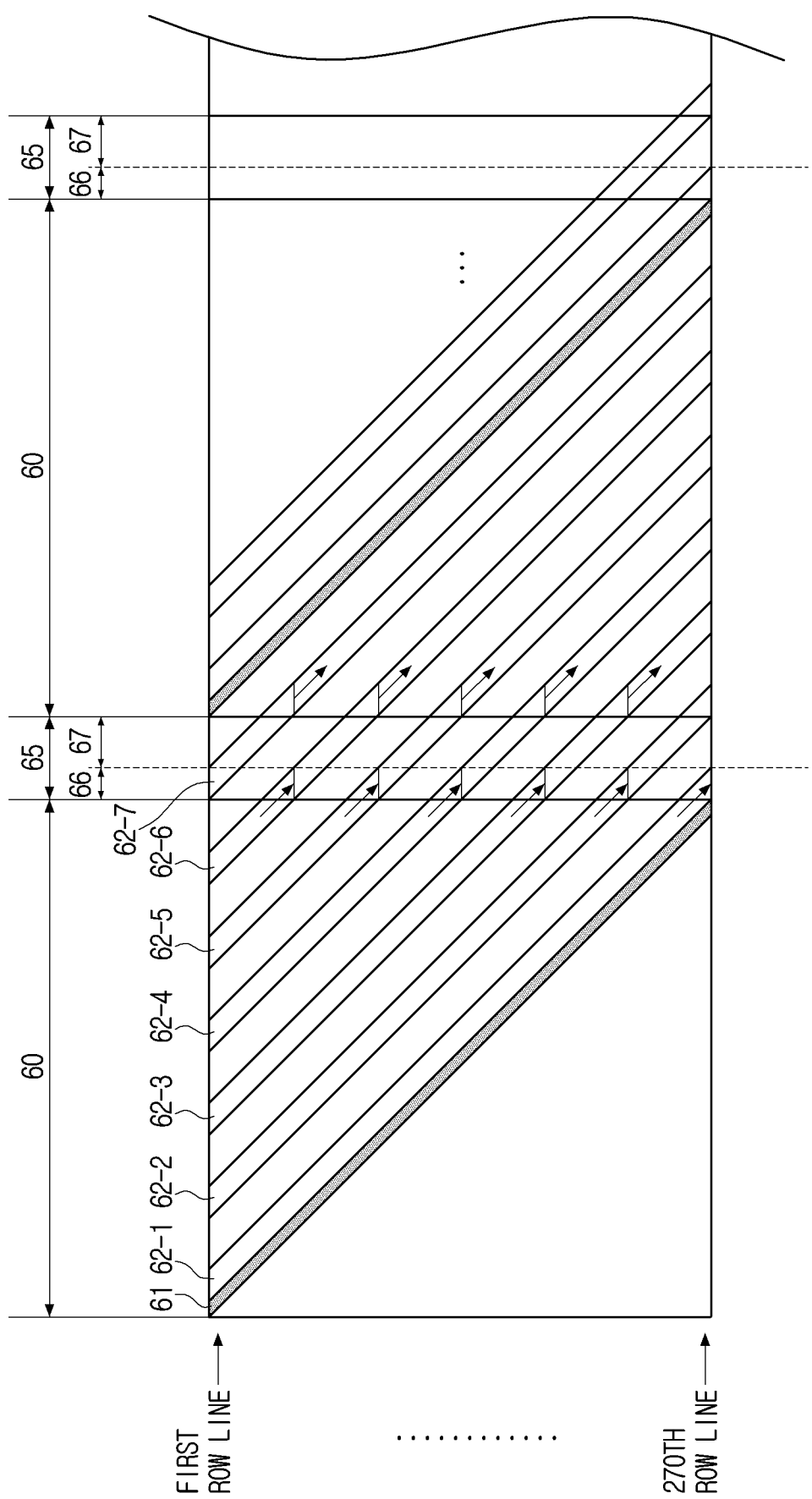
FIG. 6 is a diagram for illustrating a progressive driving method of a display panel according to an embodiment.

FIG. 6 is a diagram for illustrating in more detail a progressive driving method of the display panel 100 according to an embodiment of the disclosure.

FIG. 6 conceptually illustrates a driving method of the display panel 100 for two consecutive image frames. In FIG. 6, the vertical axis represents row lines, and the horizontal axis represents time.

In FIG. 6, an example wherein the display panel 100 consists of 270 row lines, and seven times of light emitting sections 62-1 to 62-7 proceed based on an image data voltage set in the data setting section 61 is suggested. However, the number of the row lines or the number of times that the light emitting sections proceed are obviously not limited thereto.

Referring to FIG. 6, it can be seen that for one image frame, one data setting section 61 and a plurality of light emitting sections 62-1 to 62-7 proceed for each row line.

During the data setting section 61, an image data voltage may be set in the sub-pixel circuits included in each row line. Also, in each of the plurality of light emitting sections 62-1 to 62-7, the sub-pixel circuits included in each row line may provide a driving current to a corresponding inorganic light emitting element based on the image data voltage set in the data setting section 61.

For this, the driver 500 may apply a control signal for setting an image data voltage (which may be referred to as a scan signal) to the sub-pixel circuits of each row line during the data setting section 61. Also, the driver 500 may apply a control signal for controlling a driving current providing operation of the sub-pixel circuits (which may be referred to as an emission signal) to the sub-pixel circuits of each row line during each light emitting section 62-1 to 62-7.

In embodiments, referring to FIG. 6, it can be seen that the data setting section 61 and each light emitting section 62-1 to 62-7 sequentially proceed in the order of the row lines for all row lines of the display panel 100.

For this, the driver 500 may apply a scan signal to the sub-pixel circuits from the first row line to the last row line of the display panel 100 in the order of the row lines. Also, the driver 500 may apply an emission signal to the sub-pixel circuits from the first row line to the last row line of the display panel 100 in the order of the row lines.

In embodiments, referring to FIG. 6, it can be seen that the first light emitting section 62-1 of each row line is temporally continuous with the data setting section 61, and the plurality of light emitting sections 62-1 to 62-7 have a predetermined time interval from each other.

In this case, the number of the light emitting sections and the predetermined time interval between the light emitting sections may be set based on the size of the display panel 100 and/or a shutter speed of a camera, etc. However, the disclosure is not limited thereto.

In general, a shutter speed of a camera is faster than one image frame time by several times, and thus an image displayed on the display panel 100 captured by a camera may be distorted when the display panel 100 is driven such that a light emitting section proceeds once in the order of the row lines for one image frame.

Thus, according to an embodiment of the disclosure, the display panel 100 may be driven such that light emitting sections proceed a plurality of times at a predetermined time interval for one image frame, and the predetermined time interval may be set on the basis of the speed of the camera. Accordingly, no matter at any moment the display panel 100 is captured, an image displayed on the display panel 100 captured by the camera may not be distorted.

In embodiments, according to an embodiment of the disclosure, a blanking interval may exist between two consecutive image frames.

A blanking interval may be at least a portion of a time period during which an image data voltage is not applied between two consecutive image frames. In FIG. 6, an example wherein the entire time period during which an image data voltage is not applied between the two image frames 60 is the blanking interval 65 was suggested, but embodiments are not limited thereto.

Referring to FIG. 6, it can be seen that the data setting section 61 does not proceed during the blanking interval 65. Accordingly, during the blanking interval 65, an image data voltage is not applied to the display panel 100.

Apart from the fact that an image data voltage is not applied during the blanking interval 65 as described above, the inorganic light emitting elements may emit light based on the image data voltage set in the data setting section during the blanking interval 65. Referring to the arrows included in the time period indicated by the reference numeral 66 in FIG. 6, it can be seen that the light emitting sections of some row lines proceed within the blanking interval 65.

In embodiments, according to an embodiment of the disclosure, a non-light emitting section 67 in which all inorganic light emitting elements of the display panel 100 do not emit light may exist in the blanking interval 65, as illustrated in FIG. 6. As no current flows in the display panel 100 in the non-light emitting section 67, a failure detection of the display panel 100 or an operation for discharging a charge remaining in an inorganic light emitting element may be performed.

Specifically, a failure detection of the display panel 100 is an important operation for a safe use of the display apparatus. For example, in case the display apparatus is driven while the display panel 100 is broken down, like the TFT substrate is damaged, a problem such as a fire may occur. Accordingly, in case a failure of the display panel 100 is detected, a measure such as stopping the driving or blocking the supply of power, etc. needs to be taken.

According to an embodiment of the disclosure, whether there is a failure of the display panel 100 may be determined based on whether a current flows from the power IC to the display panel 100 during a non-light emitting section.

As none of the sub-pixels of the display panel 100 emits light in a non-light emitting section, a current does not flow from the power IC to the display panel 100. However, in case the display panel 100 has a failure such as a short occurring in the sub-pixel circuits, a current may flow in the display panel 100 during a non-light emitting section. Accordingly, when a current flows in the display panel 100 during a non-light emitting section, the processor or the timing controller included in the display apparatus 1000 may determine that the display panel 100 has a failure.

In embodiments, an operation of discharging a charge remaining in an inorganic light emitting element is an important operation related to implementation of a correct black gray scale. Implementation of a correct black gray scale is an important factor that is directly related to the ability of the display apparatus of expressing an image.

When expressing a black gray sale, it is idealistic that no current is provided from a sub-pixel circuit to an inorganic light emitting element. However, in practice, a leakage current may be provided from a sub-pixel circuit to an inorganic light emitting element when a black gray scale is expressed.

When a leakage current is provided, if a voltage smaller than a forward voltage is applied to both ends of an inorganic light emitting element, the leakage current may not flow in the inorganic light emitting element, and thus there is no problem in implementing a black gray scale. However, if a voltage greater than a forward voltage is applied to both ends of an inorganic light emitting element, the leakage current may flow in the inorganic light emitting element, and due to this, a phenomenon wherein the inorganic light emitting element slightly emits light may occur. This causes a problem in implementing a black gray scale.

As described above, in the various embodiments of the disclosure, a plurality of light emitting sections are used for displaying one image frame, and this is the same when expressing a black image. Accordingly, when expressing a black gray scale, charges due to a leakage current may be accumulated in a junction capacitance component of an inorganic light emitting element in every light emitting section, and due to this, a potential difference greater than or equal to a forward direction may be generated at both ends of the inorganic light emitting element.

This hinders implementation of a correct black gray scale as described above. Thus, according to an embodiment of the disclosure, a potential difference of both ends of an inorganic light emitting element is removed by discharging a charge remaining in the inorganic light emitting element during a non-light emitting section, and accordingly, more perfect implementation of a black gray scale can be guaranteed.

In embodiments, in FIG. 6, an example wherein the entire time period during which an image data voltage is not applied between the two image frames 60 is the blanking interval 65 was suggested, and thus the non-light emitting section 67 gets to exist in the blanking interval 65.

However, a non-light emitting section does not necessarily have to exist in a blanking interval. That is, depending on embodiments, a blanking interval may exist in some portions of a time period during which an image data voltage is not applied, and in this case, a separate non-light emitting section may be implemented in a time period which is not a blanking interval in a time period during which an image data voltage is not applied, depending on needs.

In a non-light emitting section separately provided as such, a failure detection of the display panel 100 or an operation for discharging a charge remaining in an inorganic light emitting element can obviously be performed.

Hereinafter, various embodiments of performing an operation for discharging a charge remaining in an inorganic light emitting element will be described with reference to FIGS. 7A to 7D.

FIGS. 7A to 7D illustrate a progressive driving method of the display panel 100 according to the various embodiments of the disclosure. In FIGS. 7A to 7D, the vertical axis represents row lines, the horizontal axis represents time, and the time period indicated by the arrow represents a time period wherein an operation for discharging an inorganic light emitting element is performed.

In the various embodiments of the disclosure, an operation for discharging a charge remaining in an inorganic light emitting element may be performed by a predetermined cycle. For example, an operation for discharging a charge remaining in an inorganic light emitting element may be performed once per image frame, or may be performed a plurality of times for one image frame, or may be performed once per a plurality of image frames.

In this case, the predetermined cycle may vary according to the number of light emitting sections for one image frame.

Specifically, as the number of light emitting sections for one image frame is greater, the number of times that a leakage current is provided when expressing a black gray scale becomes greater, and accordingly, more charges are accumulated in a junction capacitance component of an inorganic light emitting element. As more charges are accumulated, the voltage applied to both ends of the inorganic light emitting element becomes higher, and accordingly, the possibility that a voltage greater than or equal to a forward voltage is applied to both ends of the inorganic light emitting element becomes higher.

Accordingly, the cycle by which an operation for discharging a charge remaining in an inorganic light emitting element is performed, i.e., the cycle by which an operation for removing a voltage at both ends of an inorganic light emitting element is performed may vary according to the number of light emitting sections.

However, if there is no problem in implementing a black gray scale, the predetermined cycle does not necessarily have to become faster even if the number of light emitting sections increases. That is, the predetermined cycle may be determined by the product developer within a range where a voltage greater than or equal to a forward voltage is not applied to both ends of an inorganic light emitting element while a plurality of light emitting sections proceed.

Figure 7A:
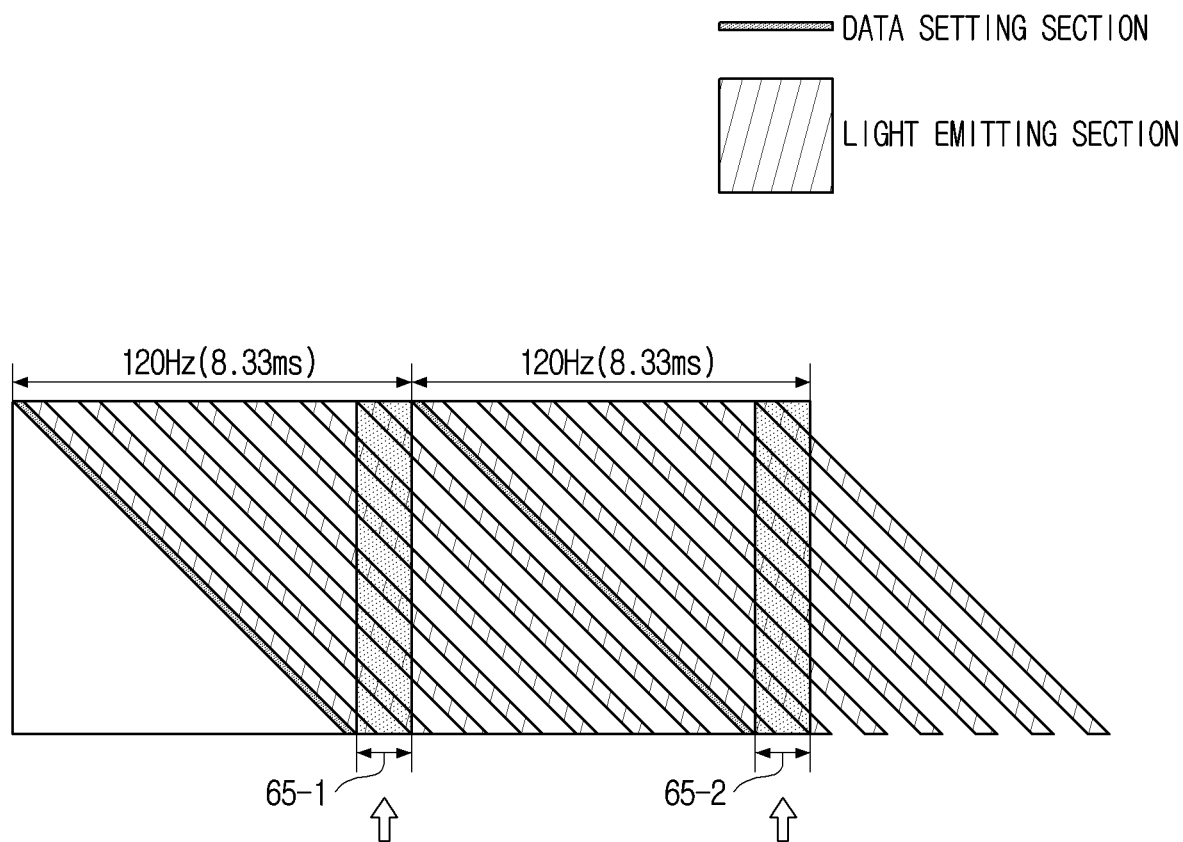
FIG. 7A is a diagram for illustrating a progressive driving method of a display panel according to an embodiment.

FIG. 7A illustrates a case wherein one image frame is driven by 120 Hz according to an embodiment of the disclosure. In this case, it can be seen that the blanking intervals 65-1, 65-2 as described in FIG. 6 above exist between the image frame periods. Although not illustrated to be distinguished, in each blanking interval 65-1, 65-2, a non-light emitting section respectively exists. In this case, in each non-light emitting section, an operation for discharging a charge remaining in an inorganic light emitting element may be performed.

Figure 7B:
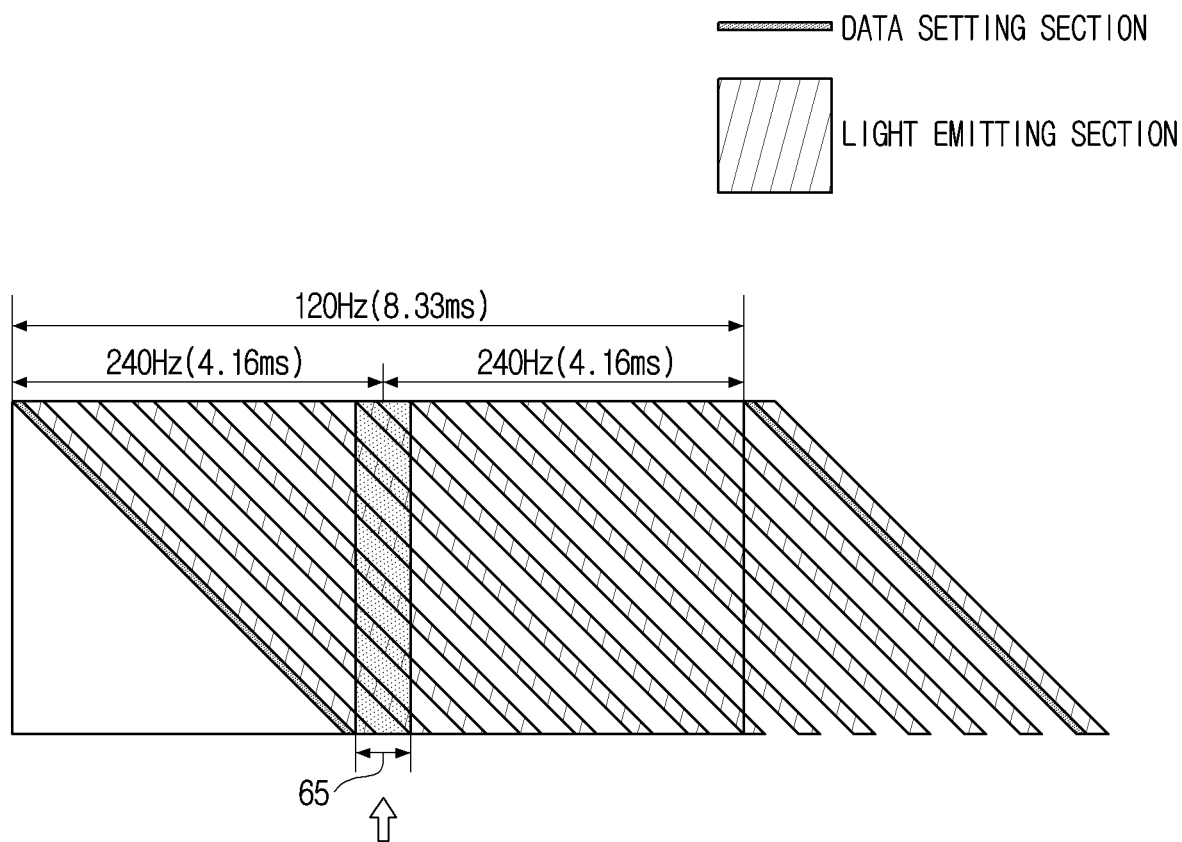
FIG. 7B is a diagram for illustrating a progressive driving method of a display panel according to another embodiment.

FIG. 7B illustrates a case wherein one image frame is driven by 240 Hz according to an embodiment of the disclosure. In FIG. 7B, it can be seen that the blanking interval 65 exists in some portions of a time period during which an image data voltage is not applied. In this case, an operation for discharging a charge remaining in an inorganic light emitting element may also be performed in a non-light emitting section included in the blanking interval 65.

In embodiments, referring to FIGS. 7A and 7B, it can be seen that, even though the scan rates and the numbers of the light emitting sections are different between the drawings, an operation for discharging a charge remaining in an inorganic light emitting element is commonly performed once per image frame in FIGS. 7A and 7B.

Figure 7C:
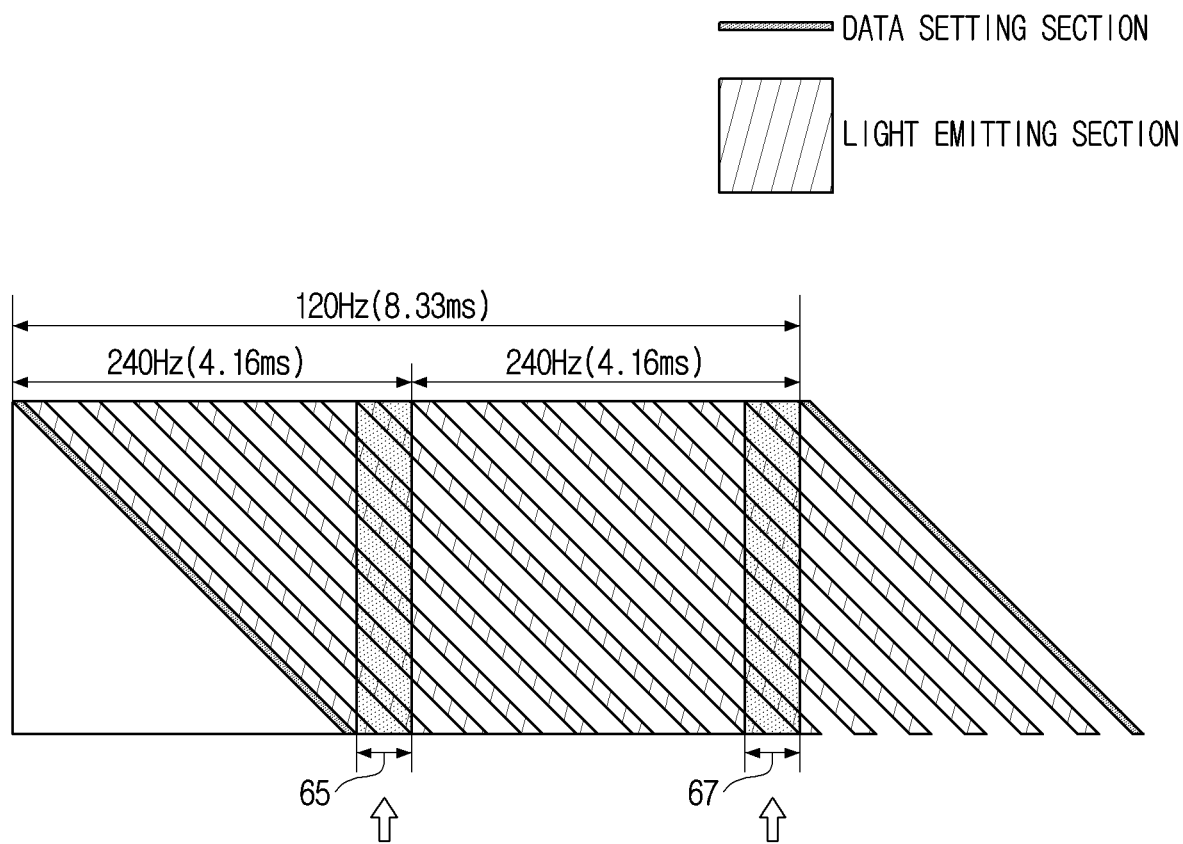
FIG. 7C is a diagram for illustrating a progressive driving method of a display panel according to still another embodiment.

FIG. 7C illustrates another case wherein one image frame is driven by 240 Hz. In FIG. 7C, it can be seen that a separate non-light emitting section 67 is implemented in a time period which is not the blanking interval 65 in a time period during which an image data voltage is not applied, unlike in FIG. 7B. Thus, according to FIG. 7C, an operation for discharging a charge remaining in an inorganic light emitting element may respectively be performed in the non-light emitting section included in the blanking interval 65 and the separate non-light emitting section 67. That is, it can be seen that an operation for discharging a charge remaining in an inorganic light emitting element may be performed a plurality of times (two times in FIG. 7C) for one image frame, unlike in FIG. 7A or FIG. 7B.

Figure 7D:
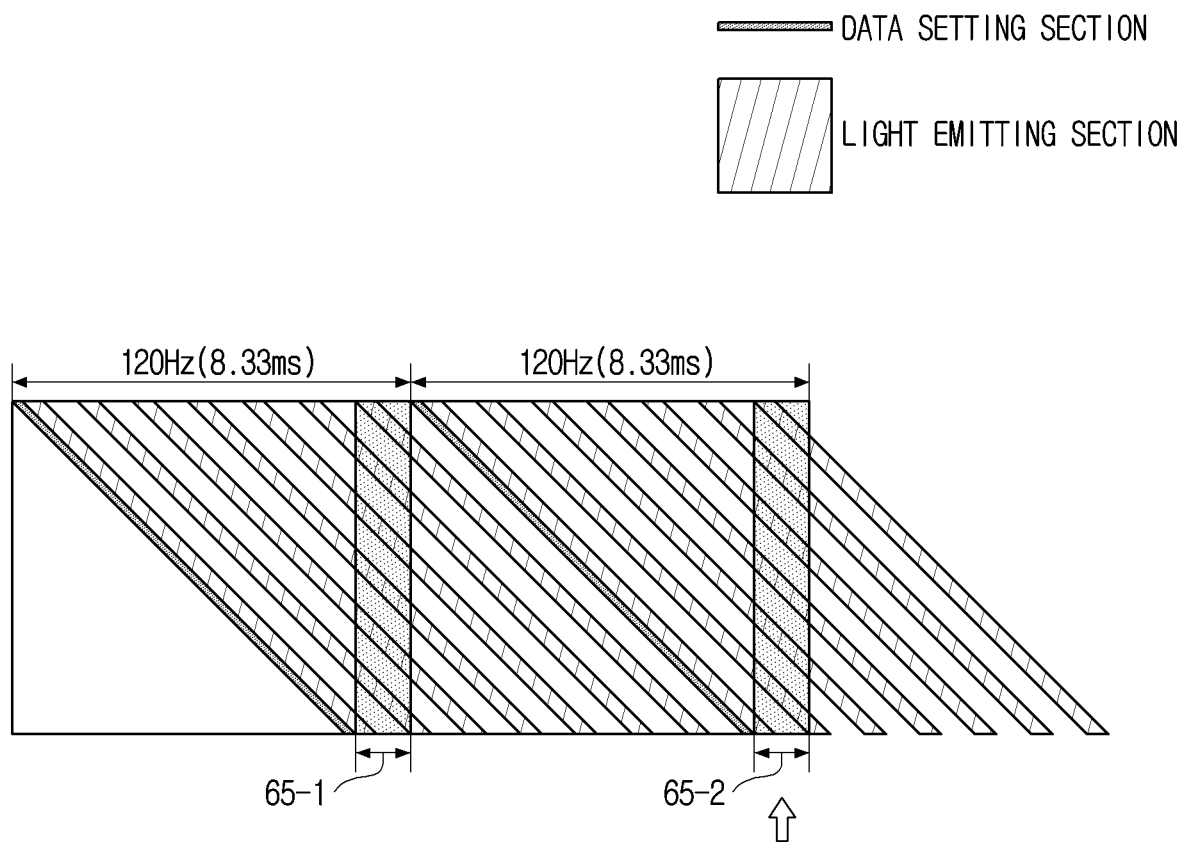
FIG. 7D is a diagram for illustrating a progressive driving method of a display panel according to still another embodiment.

FIG. 7D illustrates another case wherein one image frame is driven by 120 Hz. Referring to the arrow in FIG. 7D, it can be seen that in the non-light emitting section included in the first blanking interval 65-1, an operation for discharging a charge remaining in an inorganic light emitting element is not performed, but an operation for discharging a charge remaining in an inorganic light emitting element is performed only in the non-light emitting section included in the second blanking interval 65-2, unlike in FIG. 7A.

As described above, according to an embodiment of the disclosure, an operation for discharging a charge remaining in an inorganic light emitting element may be performed once per a plurality of image frames. In this case, embodiments are not limited to what is illustrated in FIG. 7D, but an operation for discharging a charge remaining in an inorganic light emitting element can obviously be performed once per three image frames or four image frames.

In embodiments, the sub-pixel circuits providing a driving current to the inorganic light emitting elements include driving transistors. The driving transistors are core components that determine operations of the sub-pixel circuits, and theoretically, electronic characteristics such as threshold voltages (Vth) or mobility (p) of the driving transistors should be identical among the sub-pixel circuits of the display panel 100.

However, in practice, there may be deviations in the threshold voltages (Vth) and the mobility (p) of the driving transistors among the respective sub-pixel circuits due to various factors such as process deviations or changes over time. These deviations cause degradation of image quality, and thus they need to be compensated.

Hereinafter, various embodiments of the disclosure will be described in detail by referring to a method of compensating deviations in the electronic characteristics of the driving transistors based on the configuration of the sub-pixel circuits as "an internal compensation method", and by referring to a method of compensating deviations in the electronic characteristics of the driving transistors by correcting an image data voltage based on a current flowing in the driving transistors as "an external compensation method".

First, some embodiments of a display apparatus to which an internal compensation method is applied will be described with reference to FIGS. 8 to 12B.

Figure 8:
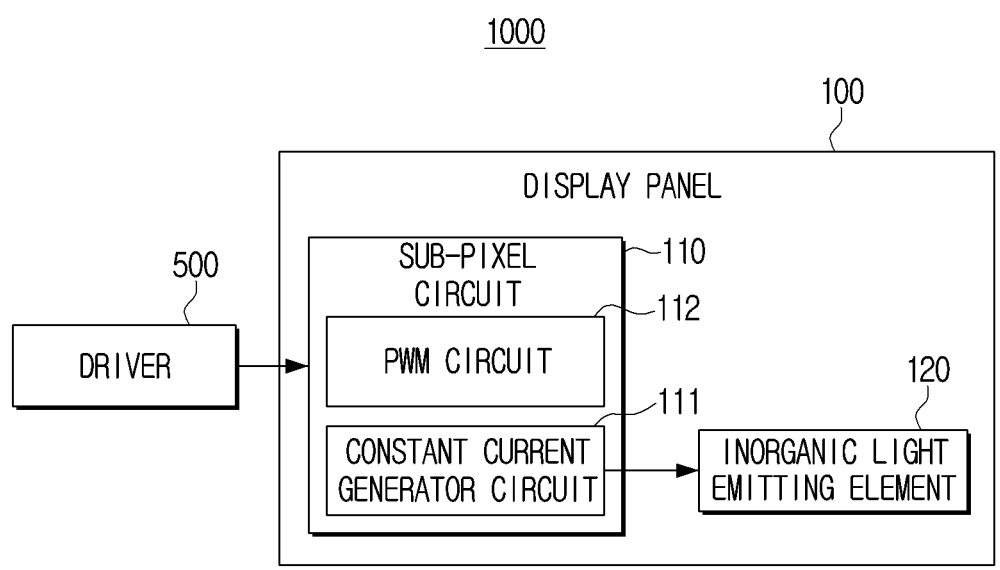
FIG. 8 is a detailed block diagram illustrating a configuration of an apparatus according to an embodiment.

FIG. 8 is a detailed block diagram illustrating a configuration of a display apparatus 1000 according to an embodiment of the disclosure. In describing FIG. 8, descriptions regarding contents overlapping with the aforementioned contents will be omitted.

According to FIG. 8, the display apparatus 1000 includes a display panel 100 including a sub-pixel circuit 110 and an inorganic light emitting element 120, and a driver 500. In FIG. 8, only a structure related to one sub-pixel included in the display panel 100 is illustrated for the convenience of explanation, but the sub-pixel circuit 110 and the inorganic light emitting element 120 can obviously be provided for each sub-pixel.

The inorganic light emitting element 120 may be mounted on the sub-pixel circuit 110 so as to be electrically connected to the sub-pixel circuit 110, and may emit light based on the driving current provided from the sub-pixel circuit 110.

The inorganic light emitting element 120 may be included in the sub-pixels of the display panel 100, and there may be a plurality of types depending on the color of the emitted light. For example, the inorganic light emitting element 120 may be one of a red (R) inorganic light emitting element emitting red color light, a green (G) inorganic light emitting element emitting green color light, and a blue (B) inorganic light emitting element emitting blue color light.

The type of the sub-pixel may be determined according to the type of the inorganic light emitting element 120. That is, the R inorganic light emitting element may be included in the R sub-pixel 20-1, the G inorganic light emitting element may be included in the G sub-pixel 20-2, and the B inorganic light emitting element may be included in the B sub-pixel 20-3, respectively.

Here, the inorganic light emitting element 120 means a light emitting element that is manufactured using an inorganic material, which is different from an organic light emitting diode (OLED) that is manufactured using an organic material.

In particular, according to an embodiment of the disclosure, the inorganic light emitting element 120 may be a micro light emitting diode (micro LED or μLED) having a size that is less than or equal to 100 micrometers (μm).

A display panel in which each sub-pixel is implemented with a micro LED is called a micro LED display panel. A micro LED display panel is one of flat display panels, and it consists of a plurality of inorganic LEDs, each of which is less than or equal to 100 micrometers. A micro LED display panel provides better contrast, response time, and energy efficiency compared to a liquid crystal display (LCD) panel requiring a backlight. In embodiments, both of an organic LED (OLED) and a micro LED have good energy efficiency, but a micro LED provides better performance than an OLED in terms of the brightness, light emission efficiency, and lifespan.

The inorganic light emitting element 120 may represent various gray scales according to the magnitude of the driving current provided from the sub-pixel circuit 110 or the pulse width of the driving current. Here, the pulse width of the driving current may also be called a duty ratio of the driving current or a duration of the driving current.

For example, the inorganic light emitting element 120 may express a brighter gray scale value as the magnitude of the driving current is bigger. Also, the inorganic light emitting element 120 may express a brighter gray scale value as the pulse width of the driving current is longer (e.g., as the duty ratio of the driving current is higher or the duration of the driving current is longer).

The sub-pixel circuit 110 provides a driving current to the inorganic light emitting element 120.

Specifically, the sub-pixel circuit 110 may provide a driving current of which magnitude and duration are controlled to the inorganic light emitting element 120 based on an image data voltage (e.g., a constant current generator data voltage, a PWM data voltage), a driving voltage (e.g., a first driving voltage, a second driving voltage, a ground voltage), and various kinds of control signals (e.g., a scan signal, an emission signal), etc. applied from the driver 500.

That is, the sub-pixel circuit 110 may drive the inorganic light emitting element 120 by the pulse amplitude modulation (PAM) method and/or the pulse width modulation (PWM) method.

For this, the sub-pixel circuit 110 may include a constant current generator circuit 111 for providing a constant current having a magnitude based on a constant current generator data voltage to the inorganic light emitting element 120, and a PWM circuit 112 for controlling the time during which the constant current is provided to the inorganic light emitting element 120 based on a PWM data voltage. Here, the constant current provided to the inorganic light emitting element 120 becomes the aforementioned driving current.

According to an embodiment of the disclosure, a same constant current generator data voltage may be applied to all of the constant current generator circuits 111 of the display panel 100. Accordingly, a driving current (e.g., a constant current) of the same magnitude gets to be provided to all of the inorganic light emitting elements 120 of the display panel 100, and thus the problem of wavelength variation of the LED according to the change in the magnitude of the driving current may be solved.

The terms "a constant current generator circuit" and "a constant current generator data voltage" as used herein only emphasize that, when the same PAM data voltage is applied to all PAM circuits of the display panel 100, the PAM circuits operate as a constant current generator, and the capability of the components is not limited by the terms.

In this case, a DC voltage of the same magnitude may be used as a constant current generator data voltage. Thus, unlike a PWM data voltage applied from the data driver, a constant current generator data voltage may be provided from the power IC.

In embodiments, depending on embodiments, the same constant current generator data voltage may be applied to the constant current generator circuits 111 of the display panel 100 for each type of the sub-pixels. That is, characteristics may vary according to the types of the inorganic light emitting elements 120, and thus constant current generator data voltages of different magnitudes may be applied to sub-pixel circuits of different types. In this case, the same constant current generator data voltage may be applied to the sub-pixel circuits of the same type.

To each PWM circuit 112 of the display panel 100, a PWM data voltage corresponding to a gray scale value of each sub-pixel may be applied. Accordingly, the duration of the driving current (e.g., the constant current) provided to the inorganic light emitting element 120 of each sub-pixel may be controlled through the PWM circuit 112. Accordingly, a gray scale of an image may be represented.

In embodiments, in the case of a modular display panel, a separate constant current generator data voltage may be applied for each display module. Accordingly, deviations in the brightness or deviations in the colors among the display modules may be compensated through adjustment of the constant current generator data voltages.

Figure 9A:
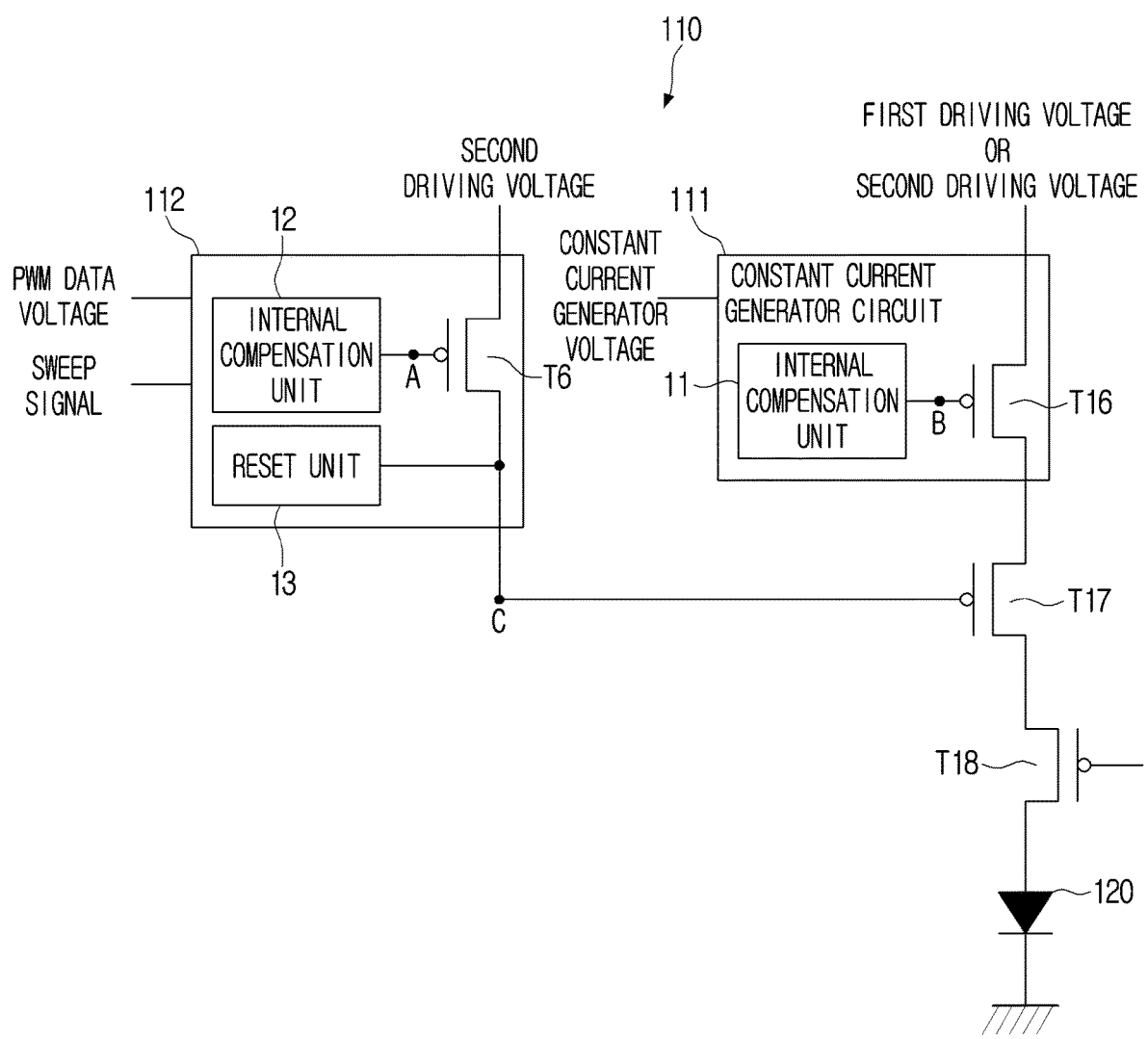
FIG. 9A is a configuration diagram of a sub-pixel circuit according to an embodiment.

FIG. 9A is a configuration diagram of the sub-pixel circuit 110 according to an embodiment of the disclosure. According to FIG. 9A, the sub-pixel circuit 110 includes a constant current generator circuit 111, a PWM circuit 112, a first switching transistor T17, and a second switching transistor T18.

The constant current generator circuit 111 includes a first driving transistor T16, and it may provide a constant current having a regular magnitude to the inorganic light emitting element 120 based on a voltage applied between a source terminal and a gate terminal of the first driving transistor T16.

Specifically, when a constant current generator data voltage is applied in a data setting section, the constant current generator circuit 111 may apply or set the constant current generator data voltage of the first driving transistor T16 of which threshold voltage has been compensated to the gate terminal (e.g., the B node) of the first driving transistor T16. In this case, compensation of the threshold voltage may be performed by an internal compensation unit 11. An example of a specific configuration and operation of the internal compensation unit 11 is described below.

Afterwards, when a first driving voltage is applied to the source terminal of the first driving transistor T16 in a light emitting section, the constant current generator circuit 111 may provide a constant current having a magnitude based on a difference between the voltage of the source terminal of the first driving transistor T16 (e.g., the first driving voltage) and the voltage of the gate terminal (e.g., the constant current generator data voltage of which threshold voltage has been compensated) to the inorganic light emitting element 120 through the turned-on first driving transistor T16.

Accordingly, regardless of the deviations in the threshold voltages of the first driving transistors T16, the constant current generator circuit 111 may provide a driving current of a magnitude corresponding to the applied constant current generator data voltage to the inorganic light emitting element 120.

In embodiments, according to what is illustrated in FIG. 9A, a constant current provided from the constant current generator circuit 111 is provided to the inorganic light emitting element 120 while the first switching transistor T17 and the second switching transistor T18 are turned on.

The PWM circuit 112 includes a second driving transistor T6, and it may control the time during which a constant current flows in the inorganic light emitting element 120 by controlling on/off operations of the first switching transistor T17.

Specifically, when a PWM data voltage is applied during a data setting section, the PWM circuit 112 may apply or set the PWM data voltage of the second driving transistor T6 of which threshold voltage has been compensated to the gate terminal (e.g., the A node) of the second driving transistor T6. In this case, compensation of the threshold voltage may also be performed by an internal compensation unit 12. An example of the specific configuration and operation of the internal compensation unit 12 is described below.

Afterwards, when the second driving transistor T6 is turned on based on a sweep signal applied during a light emitting section, the PWM circuit 112 may control the time during which a constant current flows in the inorganic light emitting element 120 by turning off the first switching transistor T17 by applying a second driving voltage to the gate terminal of the first switching transistor T17.

In this case, the second driving transistor T6 is turned on when the voltage of the gate terminal changes according to the sweep signal, and the voltage between the gate terminal and the source terminal of the second driving transistor T6 becomes the threshold voltage.

Here, a sweep signal is a signal that is applied from the driver 500 (e.g., a sweep driver) to the sub-pixel circuit 110 for changing the voltage of the gate terminal of the second driving transistor T6 during a light emitting section, and it may be a voltage signal that sweeps between two different voltages. For example, a sweep signal may be a signal that linearly changes between two voltages such as a ramp wave, a sawtooth wave, a triangular wave, etc., but is not limited thereto.

As described above, the PWM circuit 112 may make the constant current flow in the inorganic light emitting element 120 during a time corresponding to a PWM data voltage, regardless of the deviations in the threshold voltages of the second driving transistors T6.

In embodiments, the PWM circuit 112 includes a reset unit 13. The reset unit 13 is a component for forcefully turning on the first switching transistor T17. As described above, in order that a constant current flows in the inorganic light emitting element 120 and the inorganic light emitting element 120 emits light, the first switching transistor T17 should be in a turned-on state. For this, the reset unit 13 may make the first switching transistor T17 be in a turned-on state at the starting point of each of the plurality of light emitting sections. An example of the specific configuration and operation of the reset unit 13 is described below.

The second switching transistor T18 is turned on/turned off according to an emission signal Emi_PAM(n), as is described below. The turning-on/turning-off timing of the second switching transistor T18 is related to implementation of a black gray scale, and an example of this is described in greater detail below.

In embodiments, there is a resistance component in the display panel 100. Accordingly, when a driving current flows in a light emitting section, an IR drop occurs, which causes a drop in the driving voltage. Since the driving voltage becomes a reference potential when the constant current generator data voltage is set, the drop of the driving voltage interferes with the accurate setting of the constant current generator data voltage.

As described above, in the various embodiments of the disclosure, a data setting section and light emitting sections proceed in the order of row lines, and accordingly, while the sub-pixel circuits of some row lines of the display panel 100 operate in the light emitting section, the sub-pixel circuits of the other row lines operate in the data setting section.

Accordingly, when the same driving voltage applied through one wire is applied to the constant current generator circuits 111 regardless of the driving period of the display panel 100, the drop of the driving voltage due to the sub-pixel circuits operating in the light emitting section affects the constant current generator data voltage setting operation of the sub-pixel circuits operating in the data setting section.

In order to overcome the problem as above, in the various embodiments of the disclosure, a separate driving voltage applied through separate wiring is applied to the constant current generator circuits 111 in the data setting section and the light emitting section, respectively.

In the example of FIG. 9A, the second driving voltage is applied to the constant current generator circuits 111 in the data setting section, and the first driving voltage is applied to the constant current generator circuits 111 in the light emitting section.

Accordingly, even if a voltage drop occurs in the first driving voltage due to the sub-pixel circuits operating in the light emitting section, a separate second driving voltage irrelevant to the driving current is applied to the sub-pixel circuits operating in the data setting section, and thus setting of a stable constant current generator data voltage becomes possible.

In embodiments, according to what is illustrated in FIG. 9A, the second driving voltage is also applied to the PWM circuit 112 during the light emitting section, and is used as a voltage for turning off the first switching transistor T17.

Figure 9B:
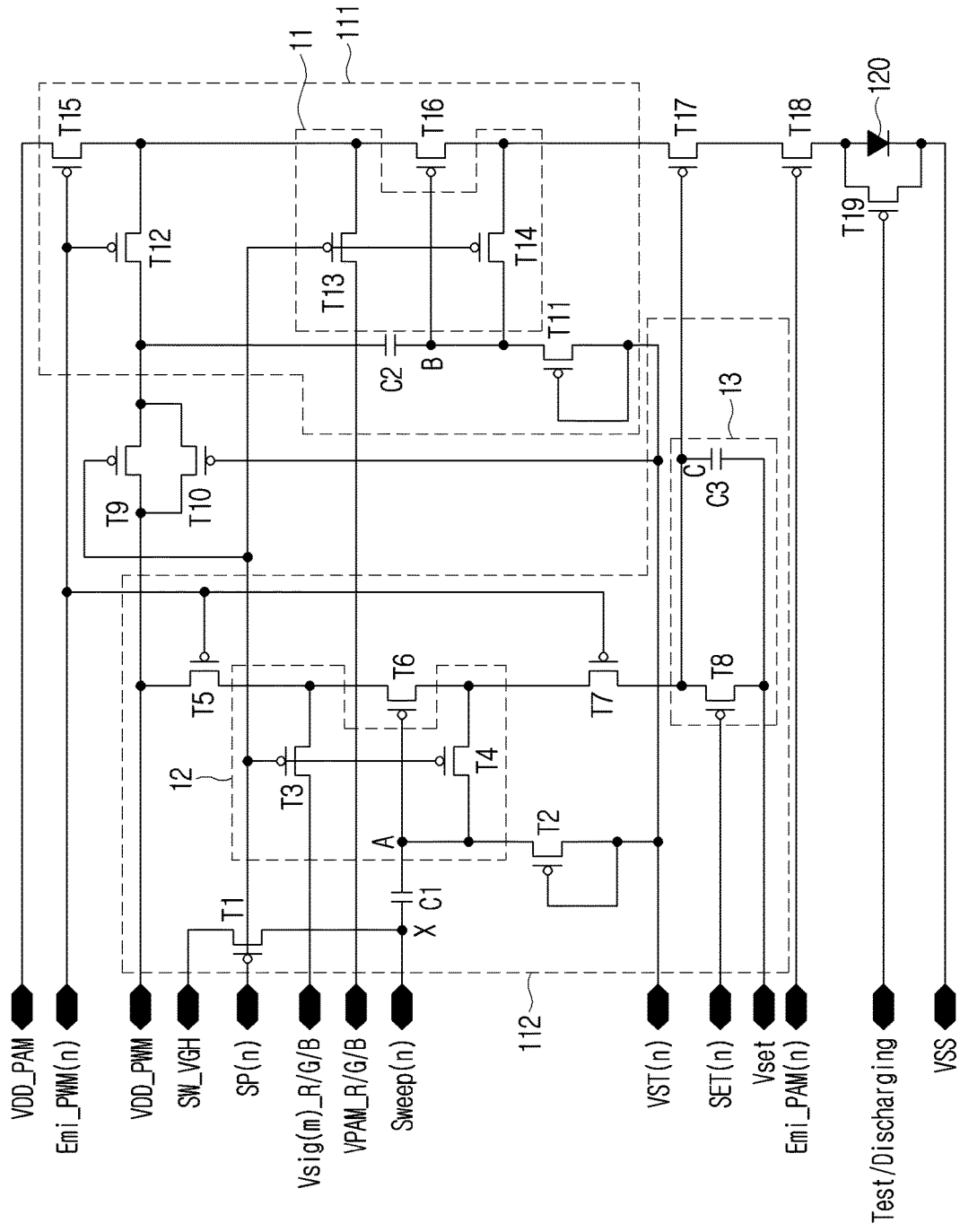
FIG. 9B is a detailed circuit diagram of a sub-pixel circuit according to an embodiment.

FIG. 9B is a detailed circuit diagram of the sub-pixel circuit 110 according to an embodiment of the disclosure. Referring to FIG. 9B, the sub-pixel circuit 110 includes a constant current generator circuit 111, a PWM circuit 112, a first switching transistor T17, a second switching transistor T18, a transistor T9, a transistor T10, and a transistor T19. Here, it can be seen that the PWM circuit 112 includes an internal compensation unit 12 and a reset unit 13, and the constant current generator circuit 111 includes an internal compensation unit 11.

The transistor T9 and the transistor T10 are circuit components for applying the second driving voltage (VDD_PWM) to the constant current generator circuit 111 during the data setting section.

The transistor T19 is connected between the anode terminal and the cathode terminal of the inorganic light emitting element 120. The transistor T19 may be used for different uses respectively before and after the inorganic light emitting element 120 is mounted on the TFT layer and electronically connected with the sub-pixel circuit 110.

For example, before the inorganic light emitting element 120 and the sub-pixel circuit 110 are connected with each other, the transistor T19 may be turned on according to a control signal (Test) to check whether the sub-pixel circuit 110 is abnormal.

Also, after the inorganic light emitting element 120 and the sub-pixel circuit 110 are connected with each other, the transistor T19 may perform a role of a discharging transistor. That is, the transistor T19 may be turned on according to a control signal (Discharging) for discharging a charge remaining in the inorganic light emitting element 120.

When the transistor T19 is turned on, the anode terminal and the cathode terminal of the inorganic light emitting element 120 are short-circuited, and thus a charge remaining in the inorganic light emitting element 120 may be discharged, and the potential difference between both ends of the inorganic light emitting element 120 may be removed.

Here, the Discharging signal is not a gate signal applied to the display panel 100 in the order of the row lines, but is a global signal applied identically to all of the row lines of the display panel 100 simultaneously.

In embodiments, in FIG. 9B, VDD_PAM refers to a first driving voltage (e.g., +10[V]), VDD_PWM refers to a second driving voltage (e.g., +10[V]), VSS refers to a ground voltage (e.g., 0[V]), and Vset refers to a low voltage for turning on the first switching transistor T17 (e.g., −3[V]). The VDD_PAM, VDD_PWM, VSS, and Vset may be provided from the aforementioned power IC, but the disclosure is not limited thereto.

VST(n) refers to a scan signal applied to the sub-pixel circuit 110 in order to initialize the voltages of the A node (the gate terminal of the second driving transistor T6) and the B node (the gate terminal of the first driving transistor T16).

SP(n) refers to a scan signal applied to the sub-pixel circuit 110 in order to set (or program) an image data voltage (e.g., a PWM data voltage, a constant current generator data voltage) to the sub pixel circuit 110.

SET(n) refers to an emission signal applied to the reset unit 13 of the PWM circuit 112 to turn on the first switching transistor T17.

Emi_PWM(n) refers to an emission signal for turning on the transistor T5 and applying the second driving voltage (VDD_PWM) to the PWM circuit 112, and turning on the transistor T15 and the transistor T12 and applying the first driving voltage (VDD_PAM) to the constant current generator circuit 111.

Sweep(n) refers to a sweep signal. According to an embodiment of the disclosure, a sweep signal may be a voltage signal that linearly changes between two different voltages, but is not limited thereto. In this embodiment, a sweep signal may be applied while being repeated in the same form per light emitting section.

Emi_PAM(n) refers to an emission signal for turning on the second switching transistor T18.

Figure 9C:
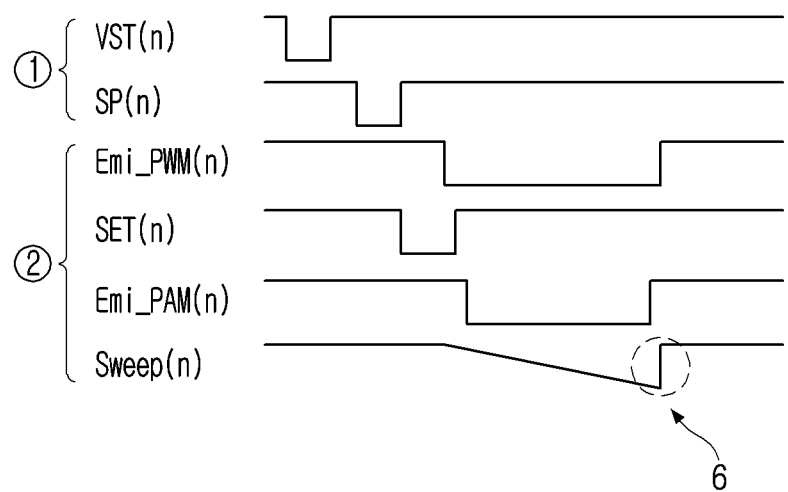
FIG. 9C is a timing diagram of gate signals for driving the sub-pixel circuit in FIG. 9B, according to an embodiment.

In the above signals, (n) refers to the $n^{th}$ row line. As described above, the driver 500 drives the display panel 110 for each row line (or a scan line or a gate line), and thus the aforementioned control signals (VST(n), SP(n), SET(n), Emi_PWM(n), Sweep(n), and Emi_PAM(n)) may be applied identically to all sub-pixel circuits 110 included in the $n^{th}$ row line in an order as shown in FIG. 9C to be described below.

The aforementioned control signals (a scan signal, an emission signal, and a sweep signal) may be applied from the gate driver, and they may also be referred to as gate signals.

Vsig(m)_R/G/B refers to a PWM data voltage signal for each of R, G, and B sub-pixels of a pixel included in the $m^{th}$ column line. As the aforementioned gate signals are signals for the $n^{th}$ row line, the Vsig(m)_R/G/B shown in FIG. 9B refers to PWM data voltage signals applied to a pixel arranged in a location wherein the $n^{th}$ row line and the $m^{th}$ column line intersect with each other (specifically, PWM data voltages for each of R, G, and B sub-pixels that are time division multiplexed).

A PWM data voltage may be applied from the data driver. Also, a PWM data voltage may have a voltage value higher than the second driving voltage (VDD_PWM) excluding a voltage corresponding to a black gray scale. For example, as a PWM data voltage, a voltage between +10[V] (full black) and +15[V] (full white) may be used, but the disclosure is not limited thereto.

In embodiments, the sub-pixel circuit 110 shown in FIG. 9B shows a sub-pixel circuit 110 corresponding to any one sub-pixel among R, G, and B sub-pixels (e.g., an R sub-pixel). Accordingly, to the sub-pixel circuit 110, only the PWM data voltage for the R sub-pixel among the time division multiplexed PWM data voltages may be selected and applied through a DeMUX circuit.

VPAM_R/G/B refers to a constant current generator data voltage signal for each of the R, G, and B sub-pixels included in the display panel 100. As described above, to the display panel 100, the same constant current generator data voltage may be applied.

However, the feature that the constant current generator data voltage is the same in this case just means that the same constant current generator data voltage is applied to the sub-pixels of the same type included in the display panel 100, but does not mean that the same constant current generator data voltage should necessarily be applied to all of the sub-pixels of different types such as R, G, and B.

As described above, the characteristics of the R, G, and B sub-pixels may vary according to the types of the sub-pixels, and thus a constant current generator data voltage may vary for each type of the sub-pixels. In this case, the same constant current generator data voltage may also be applied to the sub-pixels of the same type regardless of the column line or the row line.

In embodiments, according to an embodiment of the disclosure, a constant current generator data voltage may not be applied from the data driver like a PWM data voltage, but may be applied directly from the power IC for each type of the sub-pixels.

That is, the same constant current generator data voltage may be applied to the sub-pixels of the same type regardless of the column line or the row line, and thus a DC voltage may be used as a constant current generator data voltage. Accordingly, for example, three types of DC voltages (e.g., +5.1[V], +4.8[V], +5.0[V]) corresponding to each of the R, G, and B sub-pixels may be directly applied to each of the R, G, and B sub-pixel circuits of the display panel 100 from a driving voltage circuit independently. In this case, a separate data driver for applying a constant current generator data voltage to the sub-pixel circuit 110 may not be needed.

In embodiments, depending on embodiments, in case using the same constant current generator data voltage to sub-pixels of different types exhibits a better characteristic, the same constant current generator data voltage can obviously be applied to sub-pixels of different types.

FIG. 9C is a timing diagram of the gate signals described above in FIG. 9B.

Among the gate signals shown in FIG. 9C, the VST(n) and SP(n)(①) are scan signals related to a data setting operation of the sub-pixel circuit 110. Also, among the gate signals shown in FIG. 9C, the Emi_PWM(n), SET(n), Emi_PAM(n), and Sweep(n)(②) are emission signals related to a light emitting operation of the sub-pixel circuit 110.

As described above, according to an embodiment of the disclosure, a data setting section may proceed once, and light emitting sections may proceed a plurality of times for one image frame. For this, the driver 500 may apply scan signals (①) to each row line of the display panel 100 once, and apply emission signals (②) to each row line of the display panel 100 a plurality of times, for one image frame.

Figure 9D:
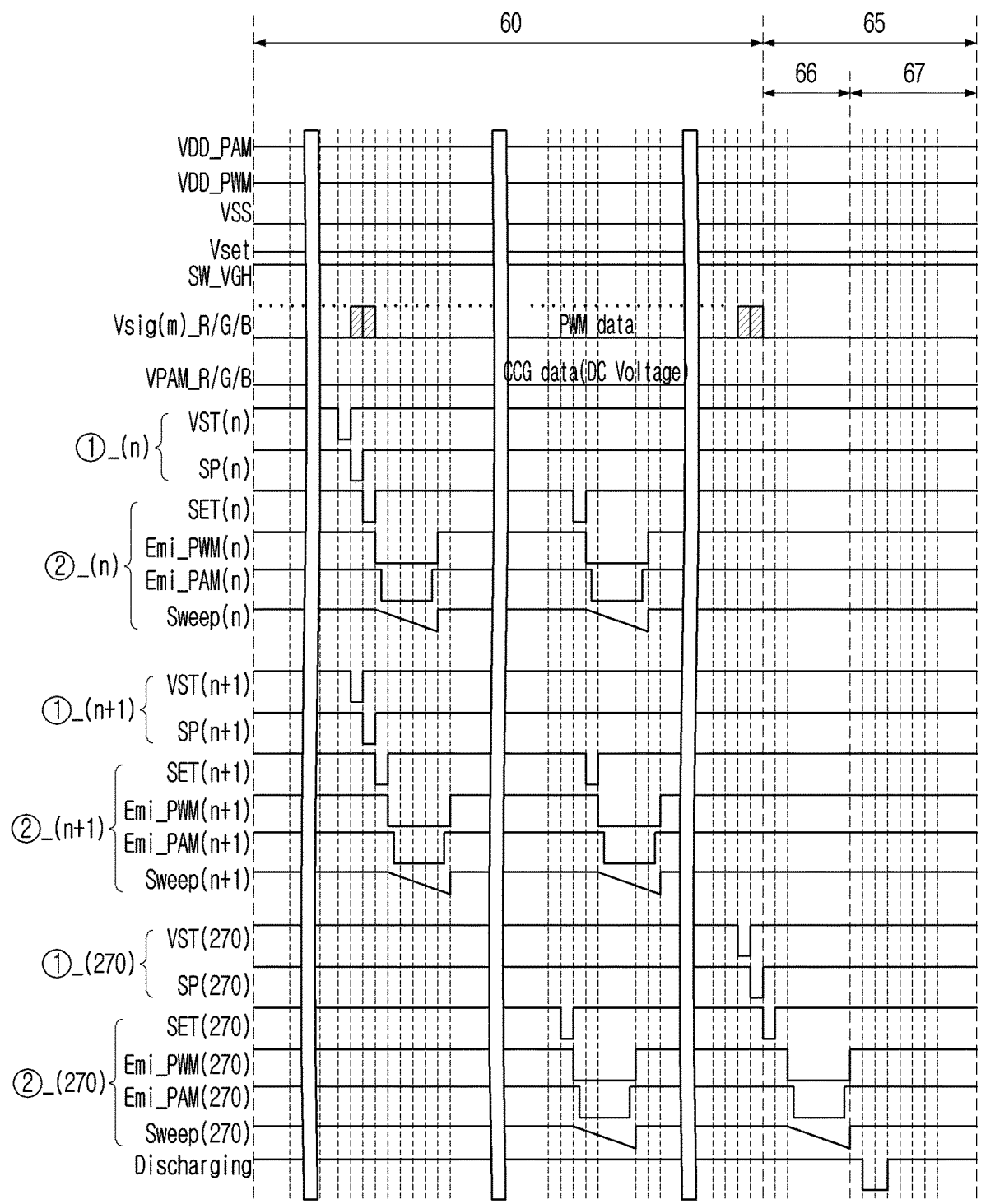
FIG. 9D is a timing diagram of various kinds of signals for driving a display panel including the sub-pixel circuit in FIG. 9B during an image frame period and a blanking interval, according to an embodiment.

FIG. 9D is a driving timing diagram of various kinds of signals for driving the display panel 100 including the sub-pixel circuit 110 in FIG. 9B during the aforementioned image frame period 60 and blanking interval 65. In FIG. 9D, a case wherein the display panel 100 includes 270 row lines is suggested as an example.

As can be seen from the reference numerals ①_(n), ①_(n+1), to ①_(270), the scan signals (VST(n), SP(n)) for a data setting operation may be applied to each row line once in the order of the row lines during the image frame period 60.

Also, as can be seen from the reference numerals ②_(n), ②_(n+1), to ②_(270), the emission signals having a low level (Emi_PWM(n), SET(n), Emi_PAM(n), and Sweep(n)) for a light emitting operation may be applied to each row line a plurality of times in the order of the row lines.

Hereinafter, a specific operation of the sub-pixel circuit 110 is described below with reference to FIGS. 9B and 9D together.

When a data setting section starts in each row line, the driver 500 first turns on the first driving transistor T16 included in the constant current generator circuit 111 and the second driving transistor T6 included in the PWM circuit 112. For this, the driver 500 applies a low voltage (e.g., −3[V]) to the sub-pixel circuit 110 through a VST(n) signal.

Referring to FIG. 9B, when a low voltage is applied to the gate terminal (referred to as the A node hereinafter) of the second driving transistor T6 through the transistor T2 turned on according to a VST(n) signal, the second driving transistor T6 is turned on. Also, when a low voltage is applied to the gate terminal (referred to as the B node hereinafter) of the first driving transistor T16 through the transistor T11 turned on according to a VST(n) signal, the first driving transistor T16 is turned on.

In embodiments, when a low voltage (e.g., −3[V]) is applied to the sub-pixel circuit 110 through a VST(n) signal, the transistor T10 is turned on together, and here, a VDD_PWM voltage (referred to as the second driving voltage (e.g., +10[V]) hereinafter) is applied to the other node of the capacitor C2 of which one end is connected to the B node through the turned-on transistor T10. Here, the second driving voltage becomes a reference potential for setting a constant current generator data voltage that will proceed according to an SP(n) signal afterwards.

In a data setting section, when the first driving transistor T16 and the second driving transistor T6 are turned on through a VST(n) signal, the driver 500 respectively inputs a data voltage to the A node and the B node. For this, the driver 500 applies a low voltage to the sub-pixel circuit 110 through an SP(n) signal.

When the low voltage is applied to the sub-pixel circuit 110 through the SP(n) signal, the transistor T3 and the transistor T4 of the PWM circuit 112 are turned on. Accordingly, through the turned-on transistor T3, the turned-on second driving transistor T6, and the turned-on transistor T4, a PWM data voltage may be applied to the A node from a data signal line Vsig(m)_R/G/B.

In this case, to the A node, the PWM data voltage applied from the driver 500 (specifically, the data driver) is not set as it is, but a PWM data voltage wherein the threshold voltage of the second driving transistor T6 has been compensated (e.g., a voltage which is the sum of the PWM data voltage and the threshold voltage of the second driving transistor T6) is set.

Specifically, when the transistor T3 and the transistor T4 are turned on according to an SP(n) signal, the PWM data voltage applied to the source terminal of the transistor T3 is input to the internal compensation unit 12. In this case, the second driving transistor T6 is in a fully turned-on state through a VST(n) signal, and thus the input PWM data voltage starts to be input to the A node as it passes by the transistor T3, the second driving transistor T6, and the transistor T4 in order. That is, the voltage of the A node starts to rise from the low voltage.

However, the voltage of the A node cannot rise to the input PWM data voltage, but it just rises to the voltage which is the sum of the PWM data voltage and the threshold voltage of the second driving transistor T6. This is because, when a voltage difference between the gate terminal and the source terminal of the second driving transistor T6 reaches the threshold voltage of the second driving transistor T6, the second driving transistor T6 is turned off.

That is, to the source terminal of the second driving transistor T6, a PWM data voltage is applied through the turned-on transistor T3, and thus the voltage of the A node just gets to rise to the voltage which is the sum of the PWM data voltage and the threshold voltage of the second driving transistor T6.

In embodiments, when a low voltage is applied to the sub-pixel circuit 110 through an SP(n) signal line, the transistor T13 and the transistor T14 of the constant current generator circuit 111 are also turned on. Accordingly, through the turned-on transistor T13, the turned-on first driving transistor T16, and the turned-on transistor T14, a constant current generator data voltage may be applied to the B node from a data signal line VPAM_R/G/B.

In this case, to the B node, the constant current generator data voltage applied from the driver 500 (specifically, the power IC) is not set as it is, but a constant current generator data voltage wherein the threshold voltage of the first driving transistor T16 has been compensated (e.g., a voltage which is the sum of the constant current generator data voltage and the threshold voltage of the first driving transistor T16) is set, for the reason as described above in the explanation regarding the A node.

In embodiments, when a low voltage is applied to the sub-pixel circuit 110 through an SP(n) signal line, the transistor T9 is turned on together, and here, the second driving voltage (VDD_PWM) is applied to the other end of the capacitor C2 through the turned-on transistor T9. Accordingly, the reference potential for the constant current generator data voltage (specifically, the constant current generator data voltage wherein the threshold voltage of the first driving transistor T16 has been compensated) set to the B node is maintained as it is.

After the setting of each data voltage to the constant current generator circuit 111 and the PWM circuit 112 is completed, the driver 500 first turns on the first switching transistor T17 for making the inorganic light emitting element 120 emit light. For this, the driver 500 applies a low voltage to the reset unit 13 (specifically, the transistor T8 of the reset unit 13) through an SET(n) signal.

When the low voltage is applied to the transistor T8 along the SET(n) signal line, a Vset voltage is charged in the capacitor C3 through the turned-on transistor T8. As the Vset is a low voltage (e.g., −3[V]), when the Vset voltage is charged in the capacitor C3, the low voltage is applied to the gate terminal (referred to as the C node hereinafter) of the first switching transistor T17, and the first switching transistor T17 is turned on.

In embodiments, the reset unit 13 operates independently from the remaining circuit components until a low voltage is applied through an Emi_PWM(n) signal line. Thus, if a low voltage applied through an SET(n) signal line is applied earlier than the time point illustrated in FIG. 9C or FIG. 9D, this would not cause a problem, depending on embodiments.

When the first switching transistor T17 is turned on, the driver 500 makes the inorganic light emitting element 120 emit light based on the voltages set to the A node and the B node. For this, the driver 500 applies a low voltage to the sub-pixel circuit 110 through Emi_PWM(n) and Emi_PAM(n) signal lines, and applies a sweep voltage to the sub-pixel circuit 110 through a Sweep(n) signal line.

First, an operation of the constant current generator circuit 111 according to signals applied from the driver 500 in a light emitting section is described as below. Here, a case wherein a PWM data voltage corresponding to a black gray scale is not set to the PWM circuit 112 is assumed.

The constant current generator circuit 111 may provide a constant current to the inorganic light emitting element 120 based on the voltage set to the B node.

Specifically, during a light emitting section, a low voltage is applied to the gate terminal through the Emi_PWM(n) and Emi_PAM(n) signal lines, and accordingly, the transistor T15 and the second switching transistor T18 are turned on.

In embodiments, the first switching transistor T17 is in a turned-on state according to an SET(n) signal, as described above.

Also, as described above, in a state wherein a voltage which is the sum of a constant current generator data voltage (e.g., +5[V]) and the threshold voltage of the first driving transistor T16 is applied to the B node, VDD_PAM (referred to as the first driving voltage (e.g., +10[V]) hereinafter) is applied to the source terminal of the first driving transistor T16 through the transistor T15 turned on according to an Emi_PWM(n) signal. Accordingly, a voltage smaller than the threshold voltage of the first driving transistor T16 is applied between the gate terminal and the source terminal of the first driving transistor T16, and the first driving transistor T16 is also turned on. (For reference, in the case of a PMOSFET, the threshold voltage has a negative value, and it is turned on when a voltage smaller than the threshold voltage is applied between the gate terminal and the source terminal, and is turned off when a voltage exceeding the threshold voltage is applied.)

Accordingly, the first driving voltage is applied to the anode terminal of the inorganic light emitting element 120 through the transistor T15, the first driving transistor T16, the first switching transistor T17, and the second switching transistor T18 that are turned on, and a potential difference exceeding a forward voltage (Vf) is generated at both ends of the inorganic light emitting element 120. Accordingly, a driving current (e.g., a constant current) gets to flow in the inorganic light emitting element 120, and the inorganic light emitting element 120 starts to emit light. In this case, the magnitude of the driving current (e.g., the constant current) making the inorganic light emitting element 120 emit light is a magnitude corresponding to the constant current generator data voltage.

In embodiments, in a light emitting section, a driving current needs to be provided to the inorganic light emitting element 120. Accordingly, the driving voltage applied to the constant current generator circuit 111 changes from the second driving voltage (VDD_PWM) to the first driving voltage (VDD_PAM). Referring to FIG. 9B, it can be seen that, when a low voltage is applied to the transistor T12 and the transistor T15 according to an Emi_PWM(n) signal, the first driving voltage (VDD_PAM) is applied to the other end of the capacitor C2 through the turned-on transistor T12 and transistor T15.

As described above, a voltage drop may occur in the first driving voltage due to an IR drop generated as a driving current flows to the inorganic light emitting element 120. However, even if a voltage drop occurs in the first driving voltage, the voltage between the gate terminal and the source terminal of the first driving transistor T16 is maintained to be the same as a voltage set in a data setting section, regardless of the voltage drop amount (e.g., the IR drop amount) of the first driving voltage. This is because, no matter to which voltage the voltage applied to the other end of the capacitor C2 is changed, the voltage of the B node changes together as much as the changed amount by being coupled through the capacitor C2.

Thus, according to the embodiments of the disclosure, the second driving voltage wherein there is no voltage drop is applied to the constant current generator circuit 111 in a data setting section. Accordingly, a correct constant current generator data voltage can be set to the constant current generator circuit 111 regardless of the voltage drop of the first driving voltage.

Also, in a light emitting section, the driving voltage is changed to the first driving voltage wherein there may be a voltage drop, but as described above, the voltage between the gate terminal and the source terminal of the first driving transistor T16 is maintained to be the same as a voltage set in a data setting section. Accordingly, the constant current generator circuit 111 can operate normally regardless of the voltage drop of the first driving voltage.

Next, an operation of the PWM circuit 112 according to signals applied from the driver 500 in a light emitting section is described as below.

The PWM circuit 112 may control the light emitting time of the inorganic light emitting element 120 based on a voltage set to the A node. Specifically, the PWM circuit 112 may control an off operation of the first switching transistor T17 based on a voltage set to the A node, and thereby control the time during which a constant current provided from the constant current generator circuit 111 to the inorganic light emitting element 120 flows in the inorganic light emitting element 120.

As described above, when the constant current generator circuit 111 provides a constant current to the inorganic light emitting element 120, the inorganic light emitting element 120 starts to emit light.

In this case, even if the transistor T5 and the transistor T7 are turned on according to an Emi_PWM(n) signal, the second driving transistor T6 is in a turned-off state, and thus the second driving voltage (VDD_PWM) is not applied to the C node. Accordingly, the first switching transistor T17 may continuously maintain the turned-on state according to an SET(n) signal, as described above, and the constant current provided from the constant current generator circuit 111 may flow in the inorganic light emitting element 120.

Specifically, when the transistor T5 is turned on according to an Emi_PWM(n) signal, the second driving voltage (VDD_PWM) is applied to the source terminal of the second driving transistor T6 through the turned-on transistor T5.

For example, when a voltage between +10[V] (black) and +15[V] (full white) is used as a PWM data voltage as described above, if it is assumed that the threshold voltage of the second driving transistor T6 is −1[V], a voltage between +9[V] (black) and +14[V] (full white) gets to be set to the A node during a data setting section.

Afterwards, when the second driving voltage (e.g., +10 [V]) is applied to the source terminal of the second driving transistor T6 according to an Emi_PWM(n) signal, the voltage between the gate terminal and the source terminal of the second driving transistor T6 becomes greater than or equal to (−1[V] to +4[V]) the threshold voltage of the second driving transistor T6 (−1[V]).

Accordingly, unless a PWM data voltage corresponding to a black gray scale is set to the A node, even if the second driving voltage (VDD_PWM) is applied to the source terminal of the second driving transistor T6, the second driving transistor T6 maintains a turned-off state, and as long as the second driving transistor T6 maintains a turned-off state, the first switching transistor T17 maintains a turned-on state, and thus the inorganic light emitting element 120 maintains light emission. (In case a PWM data voltage corresponding to a black gray scale is set to the A node, when the second driving voltage is applied to the source terminal of the second driving transistor T6, the second driving transistor T6 is immediately turned on.)

However, if the voltage of the A node changes according to a sweep signal Sweep(n) and the voltage between the gate terminal and the source terminal of the second driving transistor T6 becomes smaller than or equal to the threshold voltage (−1[V]) of the second driving transistor T6, the second driving transistor T6 is turned on, and the second driving voltage (VDD_PWM, e.g., +10[V]) is applied to the C node, and the first switching transistor T17 is turned off. Accordingly, the constant current cannot flow in the inorganic light emitting element 120 anymore, and the inorganic light emitting element 120 gets to stop light emission.

Specifically, referring to FIG. 9C or FIG. 9D, it can be seen that, while a low voltage is applied to the sub-pixel circuit 110 according to an Emi_PWM(n) signal, a sweep signal Sweep(n) that linearly changes, i.e., a sweep voltage that is linearly reduced from a high voltage (e.g., +15[V]) to a low voltage (e.g., +10[V]) is applied to the sub-pixel circuit 110.

As the change of the voltage of the sweep signal is coupled to the A node through the capacitor C1, the voltage of the A node also changes according to the sweep signal.

When the voltage of the A node is reduced according to the sweep signal and becomes a voltage which is the sum of the second driving voltage and the threshold voltage of the second driving transistor T6 (e.g., when the voltage between the gate terminal and the source terminal of the second driving transistor T6 becomes smaller than or equal to the threshold voltage of the second driving transistor T6), the second driving transistor T6 is turned on.

Accordingly, through the turned-on transistor T5, the second driving transistor T6, and the transistor T7, the second driving voltage which is a high voltage is applied to the C node, i.e., the gate terminal of the first switching transistor T17, and the first switching transistor T17 is turned off.

As can be seen above, the PWM circuit 112 may control the light emitting time of the inorganic light emitting element 120 based on a voltage set to the A node.

In embodiments, it can be seen that, after the light emitting section ends, the voltage of the sweep signal is restored to the voltage before it linearly changed, as shown in the reference numeral 6 of FIG. 9C.

As described above, the change of the voltage of the sweep signal is coupled to the A node through the capacitor C1. Thus, when the voltage of the sweep signal is restored as described above, the voltage of the A node is restored together. Accordingly, the voltage of the A node, which linearly changed according to the sweep signal during the first light emitting section among the plurality of light emitting sections, is restored according to the voltage restoration of the sweep signal before the second light emitting section which is the next light emitting section starts.

Specifically, the voltage of the A node becomes a voltage which is the sum of the PWM data voltage and the threshold voltage of the second driving transistor T6 during the data setting section, and linearly changes according to the change of the voltage of the sweep signal during the light emitting section, and is restored to the voltage which is the sum of the PWM data voltage and the threshold voltage of the second driving transistor T6 again according to the voltage restoration of the sweep signal when the light emitting section ends. Accordingly, the same light emitting operation as in the previous light emitting section becomes possible in the next light emitting section.

In embodiments, as described above, in order that the inorganic light emitting element 120 emits light during a light emitting section, the first switching transistor T17 should be in a turned-on state in the first place. However, as one light emitting section among the plurality of light emitting sections proceeds, the second driving voltage is applied to the C node, and the first switching transistor T17 gets in a turned-off state. Accordingly, in order that the next light emitting section proceeds, the voltage of the C node needs to be reset to a low voltage for making the first switching transistor T17 be in a turned-on state.

For this, when the next light emitting section starts, the driver 500 applies a low voltage to the gate terminal of the transistor T8 again through an SET(n) signal in the first place, and in accordance thereto, a Vset voltage which is a low voltage is applied to the C node, and the first switching transistor T17 gets in a turned-on state again.

After the first switching transistor T17 is turned on according to the SET(n) signal, the driver 500 applies a low voltage to the sub-pixel circuit 110 through an Emi_PWM (n) signal and an Emi_PAM(n) signal, and applies a sweep voltage to the sub-pixel circuit 110 through a Sweep(n) signal, and can thereby control the light emitting operation of the inorganic light emitting element 120 in the next light emitting section in the same manner as described above.

In embodiments, referring to the timing diagrams in FIGS. 9C and 9D, it can be seen that there is a difference between the time point when a low voltage starts to be applied to the Emi_PWM(n) signal and the time point when a low voltage starts to be applied to the Emi_PAM(n) signal. This is related to implementation of a black gray scale.

Specifically, in case a PWM data voltage corresponding to a black gray scale is set to the A node, the first switching transistor T17 should be turned off as soon as a light emitting section starts. That is, theoretically, the second driving voltage (VDD_PWM) should be applied to the C node through the turned-on transistor T5, the second driving transistor T6, and the transistor T7 at a time point when a low voltage is applied through an Emi_PWM(n) signal, and the first switching transistor T17 should be turned off immediately. (If the first switching transistor T17 is turned off immediately, a driving current may not flow in the inorganic light emitting element 120 at all, and a black gray scale may be expressed.)

However, in practice, time is spent until the second driving voltage (VDD_PWM) is charged to the C node, and the first switching transistor T17 is not turned off immediately. Specifically, after the second driving voltage (VDD_PWM) is applied to the C node and charging to the capacitor C3 started and until a voltage that may turn off the first switching transistor T17 is charged to the C node, the first switching transistor T17 maintains a turned-on state, and accordingly, a leakage current is provided from the first switching transistor T17 to the inorganic light emitting element 120.

Ultimately, in case the first switching transistor T17 and the inorganic light emitting element 120 are directly connected without the second switching transistor T18, even if a PWM data voltage corresponding to a black gray scale is set to the A node, a current leaked from the first switching transistor T17 flows in the inorganic light emitting element 120 during a specific time, and thus interruption occurs in correct implementation of a black gray scale.

For eliminating such a problem, according to an embodiment of the disclosure, the second switching transistor T18 may be arranged between the first switching transistor T17 and the inorganic light emitting element 120, and the driver 500 may apply an Emi_PAM(n) signal so that the second switching transistor T18 is turned on after a specific time passes from a time point when a low voltage starts to be applied to the Emi_PAM(n) signal. Here, the specific time may be a time that is greater than or equal to the time during which the voltage of the C node is charged from a Vset voltage to a voltage that may turn off the first switching transistor T17.

Accordingly, a leakage current that is generated as the first switching transistor T17 is not turned off immediately even though a PWM data voltage corresponding to a black gray scale is set to the A node may be blocked by the second switching transistor T18. Therefore, a black gray scale can be implemented more correctly.

In embodiments, even if the second switching transistor T18 is turned off until the first switching transistor T17 is turned off by adjusting the driving timing of an Emi_PWM (n) signal and an Emi_PAM(n) signal as described above, a leakage current (e.g., an off current) of the second switching transistor T18 may be provided to the inorganic light emitting element 120 in every light emitting section.

As described above, if a voltage greater than or equal to a forward voltage is applied to both ends of the inorganic light emitting element 120 due to such a leakage current, the leakage current may flow in the inorganic light emitting element 120, and a problem may occur in implementation of a black gray scale.

Thus, according to an embodiment of the disclosure, a potential difference between both ends of the inorganic light emitting element may be removed by applying a Discharging signal having a low level to the gate terminal of the transistor T19 within the non-light emitting section 67, as illustrated in FIG. 9D. Accordingly, more correct implementation of a black gray scale can be guaranteed.

In FIG. 9D, an example wherein an operation for discharging a charge remaining in the inorganic light emitting element (e.g., an operation for removing a potential difference between both ends of the inorganic light emitting element) is performed once for one image frame within the non-light emitting section 67 that exists inside the blanking interval 65 is suggested. However, embodiments are not limited thereto, and depending on products, the operation can obviously be performed in various ways in various situations, as described above in FIGS. 7A to 7D.

In embodiments, referring to FIG. 9B, it can be seen that, when a low voltage is applied through the SP(n) signal line, the transistor T1 is turned on and a high voltage (SW_VGH) of a sweep signal is applied to the X node. Through such an operation, phenomena of disuniformity of brightness and horizontal crosstalk that may occur by a sweep load can be minimized.

Figure 10A:
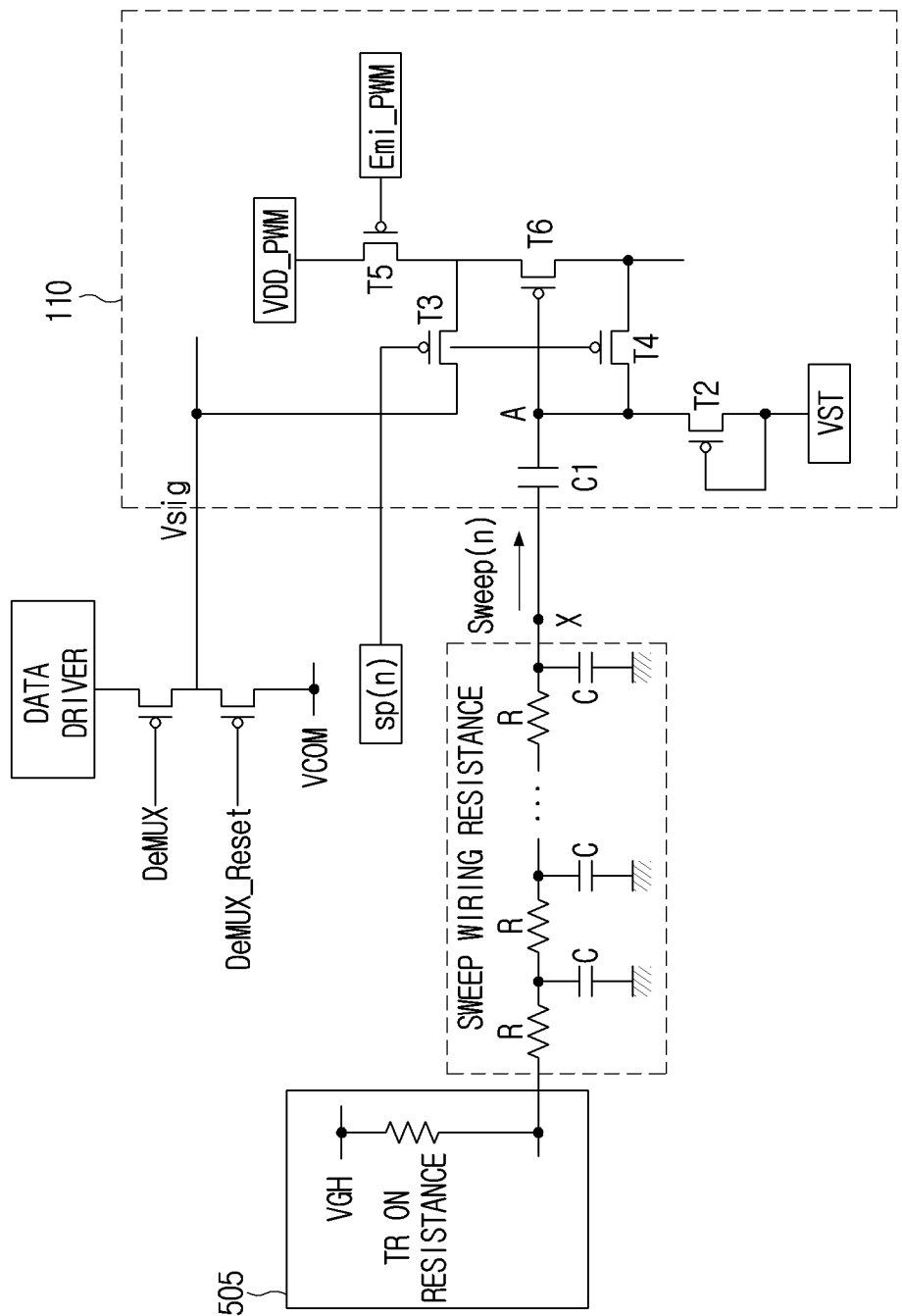
FIG. 10A is a diagram for illustrating phenomena of disuniformity of brightness and horizontal crosstalk that may occur by a sweep load, according to an embodiment.
Figure 10B:
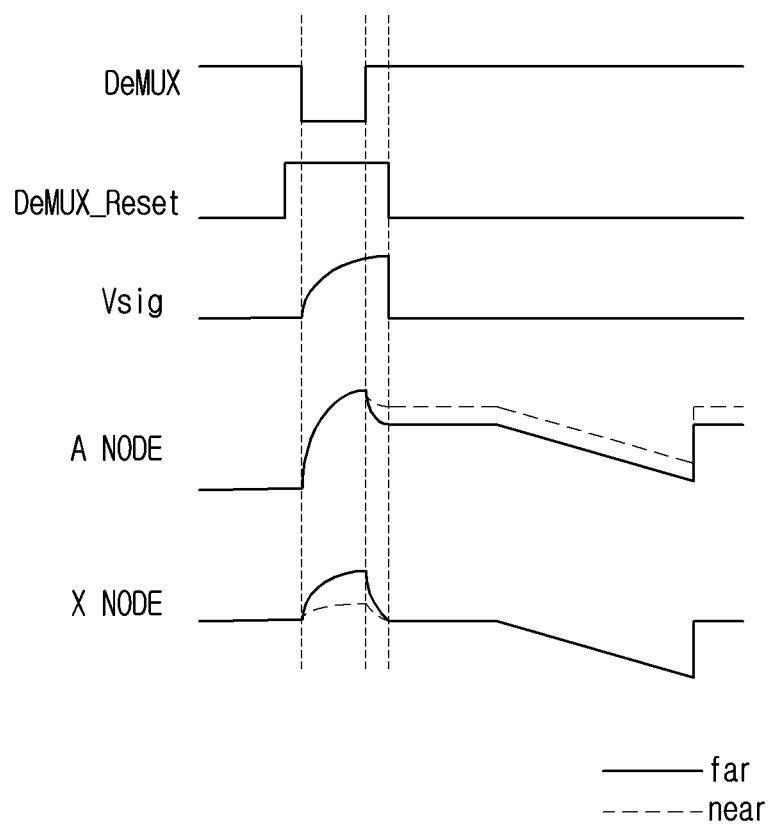
FIG. 10B is a diagram for illustrating phenomena of disuniformity of brightness and horizontal crosstalk that may occur by a sweep load, according to an embodiment.

FIGS. 10A and 10B are diagrams for illustrating phenomena of disuniformity of brightness and horizontal crosstalk that may occur by a sweep load.

As described above, in the various embodiments of the disclosure, light emitting sections proceed sequentially in the order of row lines. Accordingly, an emission signal cannot be applied by using a global signal that is applied identically to all row lines simultaneously, and an emission driver circuit for providing an emission signal corresponding to each row line is needed per row line.

In particular, a sweep signal Sweep(n) for PWM driving is also provided to the display panel 100 in the order of the row lines through emission driver circuits respectively corresponding to the row lines. (Hereinafter, an emission driver circuit for providing a sweep signal Sweep(n) will be referred to as a driver circuit.)

In this case, in a process wherein a PWM data voltage is set to the gate terminal, i.e., the A node of the second driving transistor T6, the change of the voltage of the A node is coupled through the capacitor C1, and a change occurs in the voltage of the Sweep(n) signal line.

Afterwards, the change of the voltage occurred in the Sweep(n) signal line is restored, and in accordance thereto, the voltage set to the A node changes reversely. In this case, the changed amount of the voltage of the A node varies according to a sweep load as is described below, and this becomes the cause of disuniformity of brightness and horizontal crosstalk.

Specifically, FIG. 10A illustrates a configuration wherein a sweep driver circuit 505 corresponding to one row line is connected with one sub-pixel circuit 110 through a wiring. Here, FIG. 10A illustrates a case wherein the transistor T1 does not exist in the sub-pixel circuit 110 in FIG. 9B.

As illustrated in FIG. 10A, a sweep signal Sweep(n) is transmitted to the sub-pixel circuit 110 through the sweep driver circuit 505. In this case, a sweep wiring resistance, i.e., an RC load exists between the sweep driver circuit 505 and the sub-pixel circuit 110, and its size becomes smaller as it gets closer to the sweep driver circuit 505, and becomes bigger as it gets farther from the sweep driver circuit 505.

FIG. 10B illustrates waveforms of the various kinds of signals illustrated in FIG. 10A. Also, the label "far" illustrated in FIG. 10B indicates changes of the voltages of the A node and the X node of the sub-pixel circuit 110 arranged relatively far from the sweep driver circuit 505, and the label "near" indicates changes of the voltages of the A node and the X node of the sub-pixel circuit 110 arranged relatively close to the sweep driver circuit 505, respectively. In embodiments, for example, the A node and the X node of the sub-pixel circuit 110 corresponding to the label "far" may be further from the sweep driver circuit 505 than the A node and the X node of the sub-pixel circuit 110 corresponding to the label "near".

When a scan signal SP(n) having a low level is applied to the sub-pixel circuit 110 in a data setting section, a PWM data voltage applied from the data driver is applied to the A node through a Vsig wiring, the transistor T3, the second driving transistor T6, and the transistor T4. Here, the PWM data voltage is a PWM data voltage corresponding to any one sub-pixel among R, G, and B sub-pixels selected by the DeMUX circuit.

In this process, as illustrated in FIG. 10B, as the voltage of the A node changes, the change is coupled to the X node through the capacitor C1, and a change occurs in the voltage of the X node, i.e., the voltage of the Sweep(n) signal line.

Afterwards, the voltage of the Sweep(n) signal line (the voltage of the X node) is restored to the original voltage level again by the operation of the sweep driver circuit 505, and the change of the voltage of the X node occurred in this process is coupled through the capacitor C1, and brings out a change in the voltage of the A node, reversely.

In particular, it can be seen that, due to an effect by a sweep load, there is a bigger change in the voltage of the A node in the case of a sub-pixel circuit 110 of which X node exists in a farther place from the sweep driver circuit 505. (refer to the label "far" and the label "near")

Accordingly, even if the same PWM data voltage is applied, a different voltage is set to the sub-pixel circuit 110 according to a sweep load, and this becomes the cause of disuniformity of brightness. Also, the problem of disuniformity of brightness according to a sweep load as described above becomes the cause of generation of horizontal crosstalk from the viewpoint of the entire display panel 100.

The problems of disuniformity of brightness and horizontal crosstalk as above are caused as the voltage of the X node changes together when a PWM data voltage is applied to the A node. Thus, the problems can be resolved by preventing the voltage of the X node from being changed even if a PWM data voltage is applied to the A node during a data setting section.

Figure 10C:
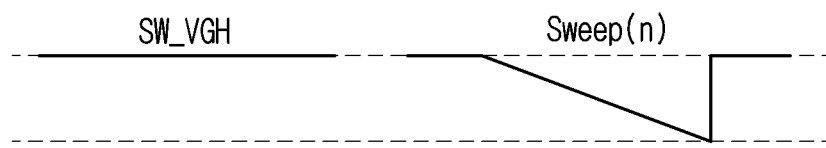
FIG. 10C is a diagram illustrating a high voltage (SW_VGH) of a sweep signal according to an embodiment.

According to an embodiment of the disclosure, while a PWM data voltage is set to the A node, a high voltage (SW_VGH) of a sweep signal as shown in FIG. 10C may be applied to the X node. In this case, the high voltage (SW_VGH) of the sweep signal may be a global signal that is applied identically from the power IC to all of the sub-pixel circuits 110 of the display panel 100.

To be more specific, referring to FIG. 9B, the PWM circuit 112 includes a transistor T1 of which source terminal is connected to the SW_VGH signal line, and of which gate terminal is connected to the SP(n) signal line, and of which drain terminal is connected to the X node. In this case, the source terminal of the transistor T1 may be directly connected to the wiring through which the high voltage (SW_VGH) of the sweep signal is applied from the power IC.

Accordingly, while a low voltage is applied through the SP(n) signal line and a PWM data voltage is set to the A node, the high voltage (SW_VGH) of the sweep signal that is applied through the turned-on transistor T1 is forcefully applied to the X node, and the voltage of the X node may be maintained as the high voltage (SW_VGH) of the sweep signal regardless of the change of the voltage of the A node.

Accordingly, phenomena of disuniformity of brightness and horizontal crosstalk that may occur by a sweep load can be prevented or minimized.

Figure 11A:
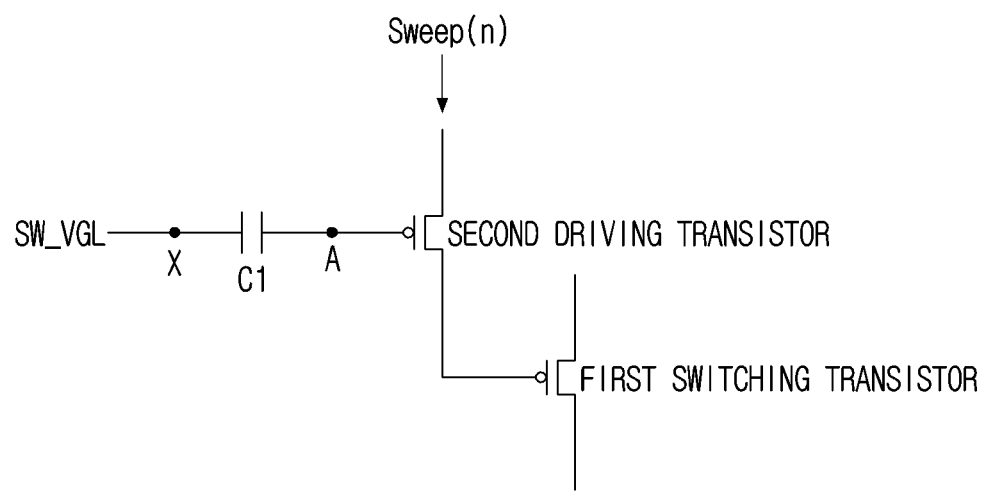
FIG. 11A is a diagram for illustrating an embodiment wherein a low voltage (SW_VGL) of a sweep signal is applied to an X node, according to an embodiment.
Figure 11B:
FIG. 11B is a diagram illustrating a low voltage (SW_VGL) of a sweep signal according to an embodiment.

In embodiments, as another embodiment for resolving the aforementioned problems of disuniformity of brightness and horizontal crosstalk, a method of connecting a low voltage (SW_VGL) input of a sweep signal to the X node can be considered. FIGS. 11A and 11B are diagrams for describing embodiments of connecting a low voltage (SW_VGL) input of a sweep signal to the X node.

As illustrated in FIG. 11A, a low voltage (SW_VGL) of a sweep signal may be applied to the X node. In this case, the low voltage (SW_VGL) of the sweep signal may be a global signal that is applied identically from the power IC to all of the sub-pixel circuits 110 of the display panel 100.

Specifically, the X node may be directly connected to the power IC through the wiring by which the low voltage (SW_VGL) of the sweep signal is applied. Accordingly, even if the voltage of the A node changes by application of a PWM data voltage, the voltage of the X node may be maintained as the low voltage (SW_VGL) of the sweep signal without being influenced by the coupling through the capacitor C1.

In embodiments, according to FIG. 11A, the sweep signal Sweep(n) for PWM driving may be applied to the source terminal of the second driving transistor. In this case, the sweep signal Sweep(n) may be a voltage signal in a form that linearly increases from a low voltage to a high voltage, as illustrated in FIG. 11B.

As described above, the PWM circuit controls the time during which a driving current flows in the inorganic light emitting element 120 through turning-on/turning-off operations of the second driving transistor, and this is also the same in the embodiment of FIG. 11A.

Specifically, in a state wherein a PWM data voltage is set to the A node, when the voltage of the source terminal of the second driving transistor increases according to a sweep signal Sweep(n), the voltage difference between the gate terminal and the source terminal of the second driving transistor decreases.

When the voltage difference between the gate terminal and the source terminal of the second driving transistor that was decreasing reaches the threshold voltage of the second driving transistor, the second driving transistor is turned on, and the first switching transistor is turned off.

In embodiments, the PWM driving mechanism as above may be the same as in the aforementioned embodiment (the embodiment wherein a sweep signal is applied to the X node).

Thus, according to the embodiments described in FIGS. 11A and 11B, the aforementioned problems of disuniformity of brightness and horizontal crosstalk by a sweep load can be resolved. Here, even if a sweep signal is applied to the source terminal of the second driving transistor, this would not cause a problem in PWM driving of the display panel 100.

Figure 12A:
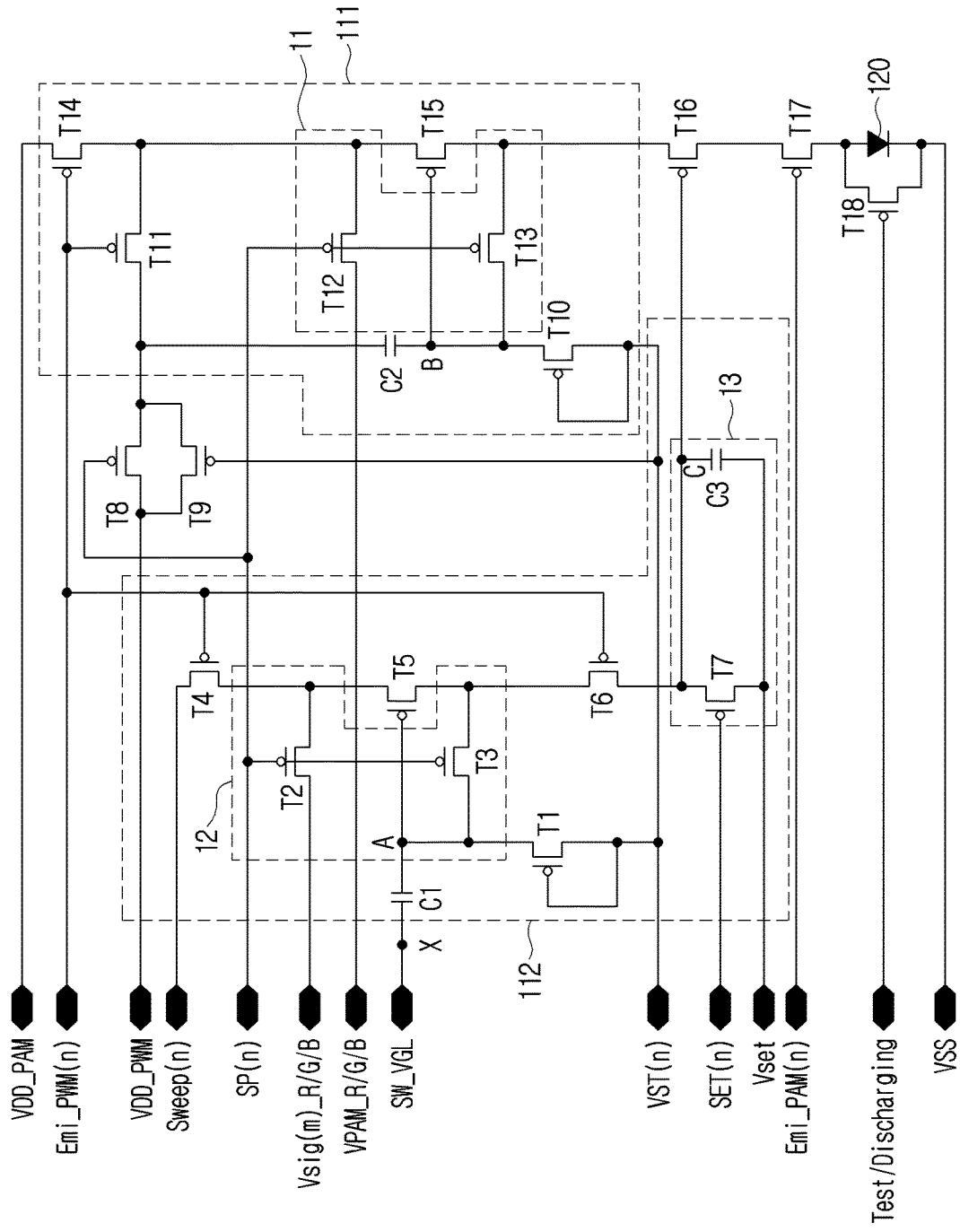
FIG. 12A is a detailed circuit diagram of a sub-pixel circuit according to an embodiment.
Figure 12B:
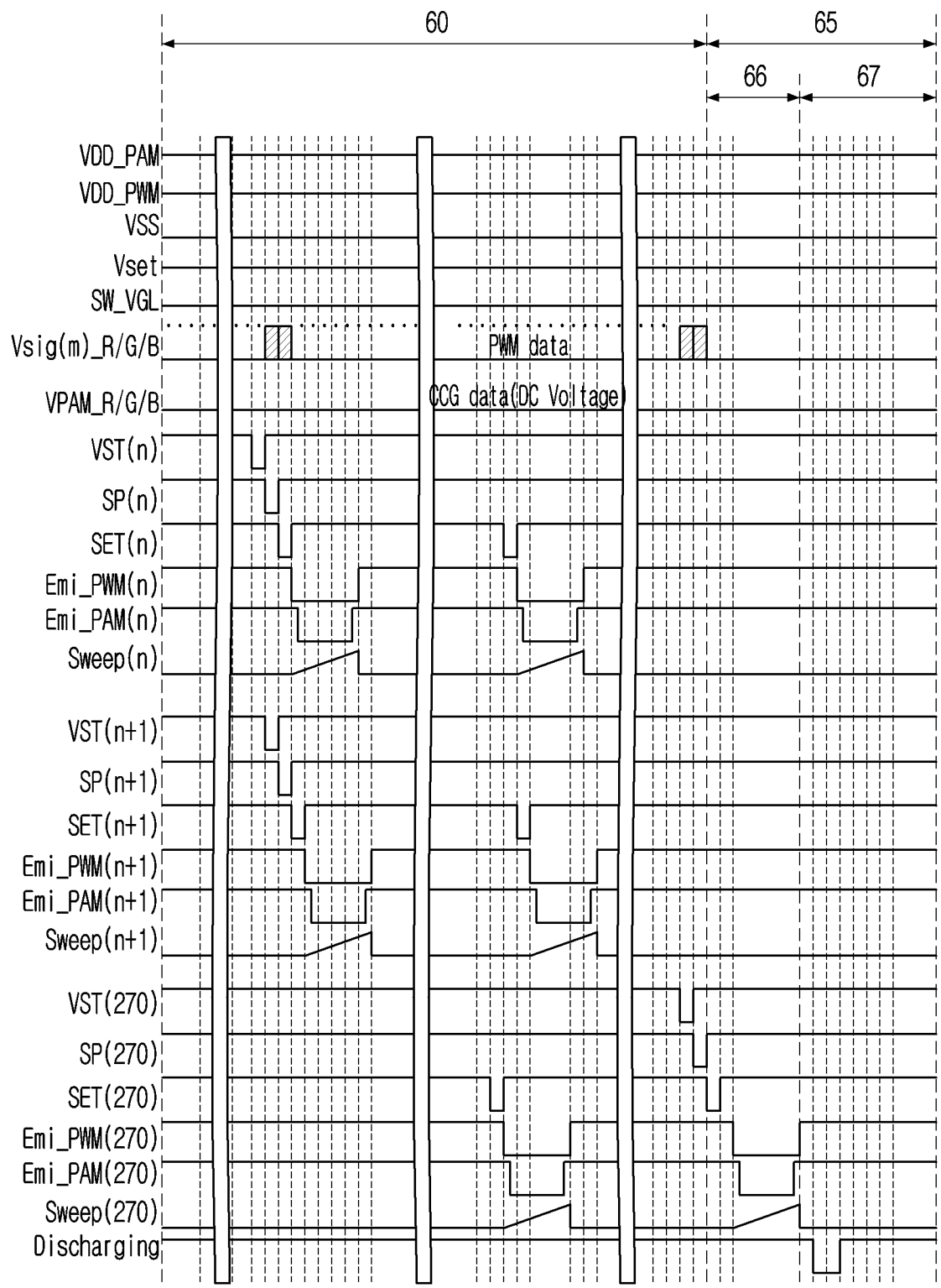
FIG. 12B is a timing diagram of various kinds of signals for driving a display panel including the sub-pixel circuit in FIG. 12A during an image frame period and a blanking interval, according to an embodiment.

FIG. 12A is a detailed circuit diagram of the sub-pixel circuit 110 according to an embodiment of the disclosure to which the embodiments described through FIGS. 11A and 11B are applied, and FIG. 12B is a timing diagram of various kinds of signals for driving the display panel 100 including the sub-pixel circuit in FIG. 12A during the image frame period 60 and the blanking interval 65.

The embodiments illustrated in FIGS. 12A and 12B have similar configurations and operation principles as those described above through FIGS. 9A to 9D, and thus overlapping explanation will be omitted, and explanation will be made focused on differences.

In the sub-pixel circuit 110 in FIG. 12A, the SW_VGL signal line is directly connected to the X node, and thus the transistor T1 for applying an SW_VGH signal to the X node during a data setting section is not needed. Referring to FIG. 12A, it can be seen that a transistor does not exist in a location corresponding to the transistor T1 in FIG. 9B. Accordingly, in the sub-pixel circuit 110 in FIG. 12A, the reference numerals for the transistors are described as numbers preceding the corresponding reference numerals in FIG. 9B by one.

In embodiments, in the sub-pixel circuit 110 in FIG. 9B, if an Emi_PWM(n) signal having a low level is applied in the light emitting section, the second driving voltage (VDD_PWM) is applied to the source terminal of the second driving transistor T6 through the turned-on transistor T5, and a sweep signal Sweep(n) is applied to the X node. However, it can be seen that, in the sub-pixel circuit 110 in FIG. 12A, if an Emi_PWM(n) signal having a low level is applied in the light emitting section, a sweep signal Sweep (n) (specifically, a sweep voltage that linearly changes from a low voltage to a high voltage) is applied to the source terminal of the second driving transistor T5 through the turned-on transistor T4.

In this case, it can be seen that the sweep signal Sweep(n) applied to the sub-pixel circuit 110 in FIG. 9B is in a form that linearly decreases as illustrated in FIG. 9D, and the sweep signal Sweep(n) applied to the sub-pixel circuit 110 in FIG. 12A is in a form that linearly increases as illustrated in FIG. 12B, and thus there is a difference between them.

The operation of the PWM circuit 112 according to a sweep signal in the embodiment of FIG. 12A is explained in detail as below based on an example.

For example, in a state wherein a voltage of +13[V] (specifically, a PWM data voltage (+14[V])+the threshold voltage (−1[V]) of the second driving transistor T5) is set to the A node during a data setting section, if a sweep signal (e.g., a voltage that linearly increases from +10[V] to +15[V]) is applied to the source terminal of the second driving transistor T5, the voltage difference between the gate terminal and the source terminal of the second driving transistor T5 decreases from +3[V] to −2[V].

In this case, when the voltage difference between the gate terminal and the source terminal of the second driving transistor T5 that was decreasing from +3[V] reaches the threshold voltage (−1[V]) of the second driving transistor T5, the second driving transistor T5 is turned on. Also, +14[V] which is the sweep voltage when the second driving transistor T5 is turned on is applied to the first switching transistor T16, and the first switching transistor T16 is turned off.

It can be seen that the operation mechanism of the PWM circuit 112 in FIG. 12A as above is the same as the operation mechanism of the PWM circuit 112 described in FIGS. 9A to 9D, while there is only a difference in the terminal to which the sweep signal is input.

In embodiments, as the remaining contents regarding the configurations and the operations of the sub-pixel circuit 110 illustrated in FIGS. 12A and 12B overlap with the contents described above in FIGS. 9A to 9D, explanation in that regard will be omitted below.

Hereinafter, some embodiments of the display apparatus to which the external compensation method is applied are described below with regard to FIGS. 13 to 33B. Among the aforementioned descriptions regarding the embodiments to which the internal compensation method is applied, the contents that are not contradictory may be applied as they are to the embodiments related to the external compensation method described below. Accordingly, the same contents may be described briefly, or explanation in that regard may be omitted.

Figure 13:
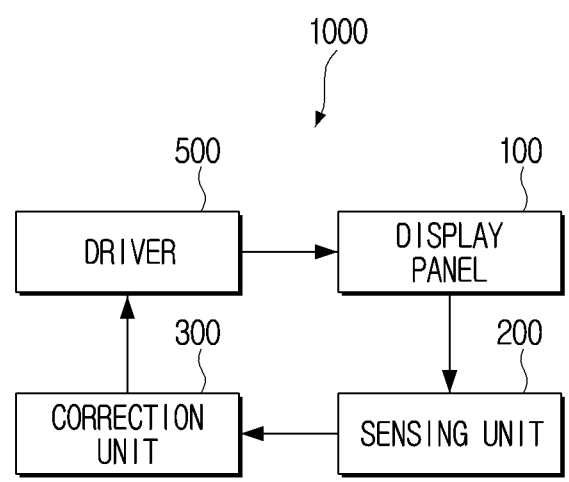
FIG. 13 is a block diagram illustrating a configuration of a display apparatus according to an embodiment.

FIG. 13 is a block diagram illustrating a configuration of a display apparatus according to an embodiment of the disclosure. According to FIG. 13, the display apparatus 1000 includes a display panel 100, a sensing unit 200, a correction unit 300, and a driver 500.

The driver 500 drives the display panel 100. Specifically, the driver 500 may provide various kinds of control signals, data signals, driving voltage signals, or the like, to the display panel 100 to drive the display panel 100.

The driver 500 may drive the display panel 100 by the progressive driving method. For this, the driver 500 may include a gate driver for driving pixels on the pixel array in units of row lines.

Also, the driver 500 may include a DeMUX circuit, a power IC, and a level shifter.

In addition, the driver 500 may include a data driver for providing an image data voltage (e.g., a constant current generator data voltage and a PWM data voltage) and a specific voltage which are described below. In this case, through the external compensation method, the threshold voltage of the driving transistor is compensated by applying the corrected image data voltage to the sub-pixel circuits as is described below. Accordingly, unlike in the internal compensation method, a constant current generator data voltage is provided from the data driver.

In embodiments, as the various embodiments related to the arrangement of various kinds of drivers or circuits of the driver 500 described above, and connection to the sub-pixel circuits formed on the TFT layer are the same as what is described above in the explanation regarding the internal compensation method, overlapping explanation will be omitted.

In particular, the driver 500 may set an image data voltage to the sub-pixel circuits of the display panel 100 in the order of the row lines during a data setting section 61, for driving the display panel 100 by the progressive driving method.

For this, the driver 500 may apply a control signal for setting an image data voltage to the sub-pixel circuits (which may be referred to as a scan signal, and it includes, for example, SP(n), SPWM(n), and SCCG(n) to be described below) to the sub-pixel circuits of each row line in the order of the row lines during the data setting section 61.

Also, the driver 500 may drive the sub-pixel circuits such that the pixels of the pixel array emit light in the order of the row lines based on a sweep signal and the set image data voltage during the light emitting sections 62-1 to 62-7.

For this, the driver 500 may apply a control signal for controlling a driving current providing operation (which may be referred to as an emission signal, and it includes SET(n), Emi_PWM(n), Emi_PAM(n), and Sweep(n) to be described below) to the sub-pixel circuits of each row line in the order of the row lines during the light emitting sections 62-1 to 62-7.

In embodiments, in the external compensation method, a current flowing in the driving transistor based on a specific voltage should be sensed by the sensing unit 200. For this, the driver 500 may apply a control signal for sensing a current flowing in the driving transistor (which may be referred to as a sense signal, and it includes PWM_Sen(n) and CCG_Sen(n) to be described below) to the sub-pixel circuits of at least one row line per image frame. An example of a more detailed content in this regard is described below.

The sensing unit 200 is a component for sensing a current flowing in the driving transistor included in the sub-pixel circuits, and outputting sensing data corresponding to the sensed current.

If a current based on a specific voltage flows in the driving transistor, the sensing unit 200 may sense the current flowing in the driving transistor and convert the current into sensing data, and output the converted sensing data to the correction unit 300.

Here, the specific voltage is a voltage that is applied to the sub-pixel circuits separately from an image data voltage for sensing a current flowing in the driving transistor, and as is described below, it may include a first specific voltage for sensing a current flowing in the driving transistor of the constant current generator circuit, and a second specific voltage for sensing a current flowing in the driving transistor of the PWM circuit.

The correction unit 300 is a component for correcting an image data voltage to be applied to the sub-pixel circuits based on sensing data output from the sensing unit 200.

The correction unit 300 may correct an image data voltage by acquiring a compensation value for correcting image data based on reference data per voltage and sensing data output from the sensing unit 200, and correcting the image data based on the acquired compensation value.

Here, the reference data per voltage is data for a reference current value flowing in the driving transistor in case a specific voltage is applied to the driving transistor, and theoretically or experimentally, it may be calculated in advance and stored in advance in a look-up table form, but the disclosure is not limited thereto.

The reference data per voltage may include first reference data corresponding to the first specific voltage, and second reference data corresponding to the second specific voltage, as is described below.

The reference data per voltage may be stored in advance in various kinds of memories inside or outside the correction unit 300, and the correction unit 300 may load the reference data per voltage from the memories when necessary, and use the data.

A specific example wherein the correction unit 300 acquires a compensation value by using the reference data per voltage and the sensing data, and corrects the image data voltage is described below.

The driver 500 (specifically, the data driver) may apply the image data voltage corrected as above to the display panel 100, and accordingly, deviations in the threshold voltages (Vth) and the mobility (p) of the driving transistors may be compensated.

Figure 14:
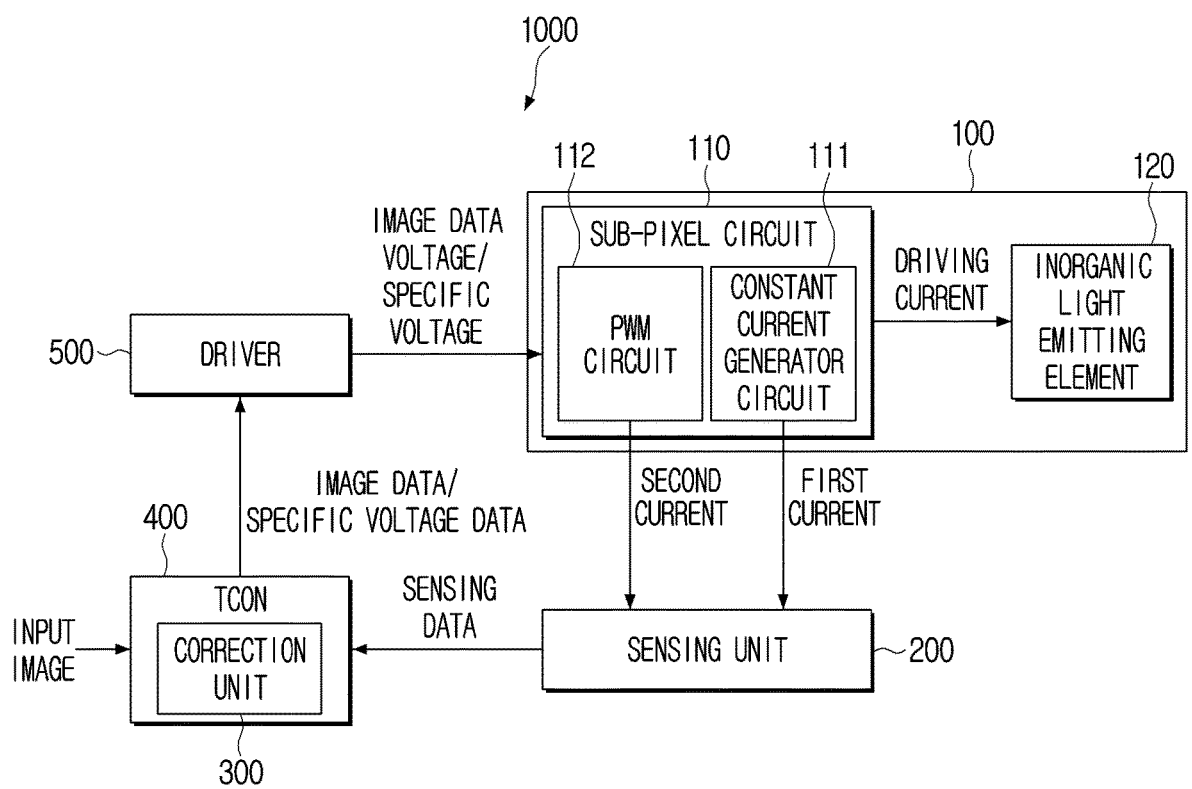
FIG. 14 is a detailed block diagram of a display apparatus according to an embodiment.

FIG. 14 is a detailed block diagram of a display apparatus according to an embodiment of the disclosure.

According to FIG. 14, the display apparatus 1000 includes a display panel 100, a sensing unit 200, a correction unit 300, a timing controller (TCON) 400, and a driver 500.

The TCON 400 controls the overall operations of the display apparatus 1000. In particular, the TCON 400 may perform sensing driving of the display apparatus 1000. Also, the TCON 400 may perform display driving of the display apparatus 1000.

Here, the sensing driving is a driving that updates a compensation value for compensating deviations in the threshold voltages (Vth) and the mobility (p) of the driving transistors included in the display panel 100, and the display driving is a driving that displays an image on the display panel 100 based on an image data voltage to which the compensation value is reflected.

When the display driving is performed, the TCON 400 provides image data for an input image to the driver 500. In this case, the image data provided to the driver 500 may be image data for which correction was performed by the correction unit 300.

The correction unit 300 may correct image data for an input image based on a compensation value. In this case, the compensation value may be acquired by the correction unit 300 through the sensing driving to be described below.

As illustrated in FIG. 14, the correction unit 300 may be implemented as one function module of the TCON 400 that is mounted on the TCON 400. However, the disclosure is not limited thereto, and the correction unit 300 may be mounted on a separate processor different from the TCON 400, and it may also be implemented as a separate chip in an application specific integrated circuit (ASIC) or a field-programmable gate array (FPGA) type.

The driver 500 may generate an image data voltage based on image data provided from the TCON 400, and provide or apply the generated image data voltage to the display panel 100. Accordingly, the display panel 100 may display an image based on the image data voltage provided from the driver 500.

In embodiments, the driver 500 may generate a specific voltage based on the specific voltage data provided from the TCON 400, and provide the generated specific voltage to the display panel 100. Accordingly, a current based on the specific voltage may flow in the driving transistor included in the sub-pixel circuit 110 of the display panel 100.

The sensing unit 200 may sense the current flowing in the driving transistor and output sensing data to the correction unit 300, and the correction unit 300 may acquire or update a compensation value for correcting the image data based on the sensing data output from the sensing unit 200.

An example of each component illustrated in FIG. 14 is described below in more detail.

The sub-pixel circuit 110 may provide a driving current to the inorganic light emitting element 120 during the display driving. Specifically, the sub-pixel circuit 110 may provide a driving current of which magnitude and duration are controlled to the inorganic light emitting element 120 based on an image data voltage (e.g., a constant current generator data voltage and a PWM data voltage) applied from the driver 500.

In embodiments, although not shown in the drawings, the constant current generator circuit 111 and the PWM circuit 112 respectively include a driving transistor. Hereinafter, for the convenience of explanation, the driving transistor included in the constant current generator circuit 111 will be referred to as a first driving transistor, and the driving transistor included in the PWM circuit 112 will be referred to as a second driving transistor.

When the sensing driving is performed, if the first specific voltage is applied to the constant current generator circuit 111, a first current corresponding to the first specific voltage flows in the first driving transistor, and if the second specific voltage is applied to the PWM circuit 112, a second current corresponding to the second specific voltage flows in the second driving transistor.

Accordingly, the sensing unit 200 may respectively sense the first and second currents, and respectively output first sensing data corresponding to the first current and second sensing data corresponding to the second current to the correction unit 300. For this, the sensing unit 200 may include a current detector and an analog to digital converter (ADC). Here, the current detector may be implemented by using a current integrator including an operational amplifier (OP-AMP) and a capacitor, but the disclosure is not limited thereto.

The correction unit 300 may correct an image data voltage applied to the sub-pixel circuit 110 based on the sensing data.

Specifically, the correction unit 300 may identify a first reference data value corresponding to the first specific voltage in the reference data per voltage, compare the identified first reference data value and the first sensing data value output from the sensing unit 200, and calculate or acquire a first compensation value for correcting the constant current generator data voltage.

Also, the correction unit 300 may identify a second reference data value corresponding to the second specific voltage in the sensing data per voltage, compare the identified second reference data value and the second sensing data value output from the sensing unit 200, and calculate or acquire a second compensation value for correcting the PWM data voltage.

The first and second compensation values acquired as above may be stored or updated in a memory inside or outside the correction unit 300, as described above, and they may be used in correcting the image data voltage when the display driving is performed afterwards.

Specifically, the correction unit 300 may correct image data to be provided to the driver 500 (in particular, the data driver) by using the compensation values, and thereby correct the image data voltage applied to the sub-pixel circuit 110. As the data driver provides the image data voltage to the sub-pixel circuit 110 based on the input image data, the correction unit 300 may correct the image data voltage applied to the sub-pixel circuit 110 by correcting the image data value.

That is, when the display driving is performed, the correction unit 300 may correct the constant current generator data value in the image data based on the first compensation value. Also, the correction unit 300 may correct the PWM data value in the image data based on the second compensation value. Accordingly, the correction unit 300 may provide the corrected constant current generator data and PWM data to the driver 500, and thereby respectively correct the constant current generator data voltage and the PWM data voltage applied to the sub-pixel circuit 110.

In embodiments, the driver 500 may include a gate driver providing scan signals and emission signals for driving the pixels on the pixel array in the units of the row lines. Here, in various embodiments, the gate driver providing scan signals may be referred to as a scan driver, and the gate driver providing emission signals may be referred to as an emission driver, to be distinguished from each other.

Also, the driver 500 may include a data driver for providing an image data voltage (e.g., a constant current generator data voltage and a PWM data voltage) and a specific voltage (e.g., the first specific voltage and the second specific voltage) to the sub-pixel circuits. In this case, the data driver may include a digital to analog converter (DAC) for converting the image data and the specific voltage data provided from the TCON 400 respectively into an image data voltage and a specific voltage.

Figure 15A:
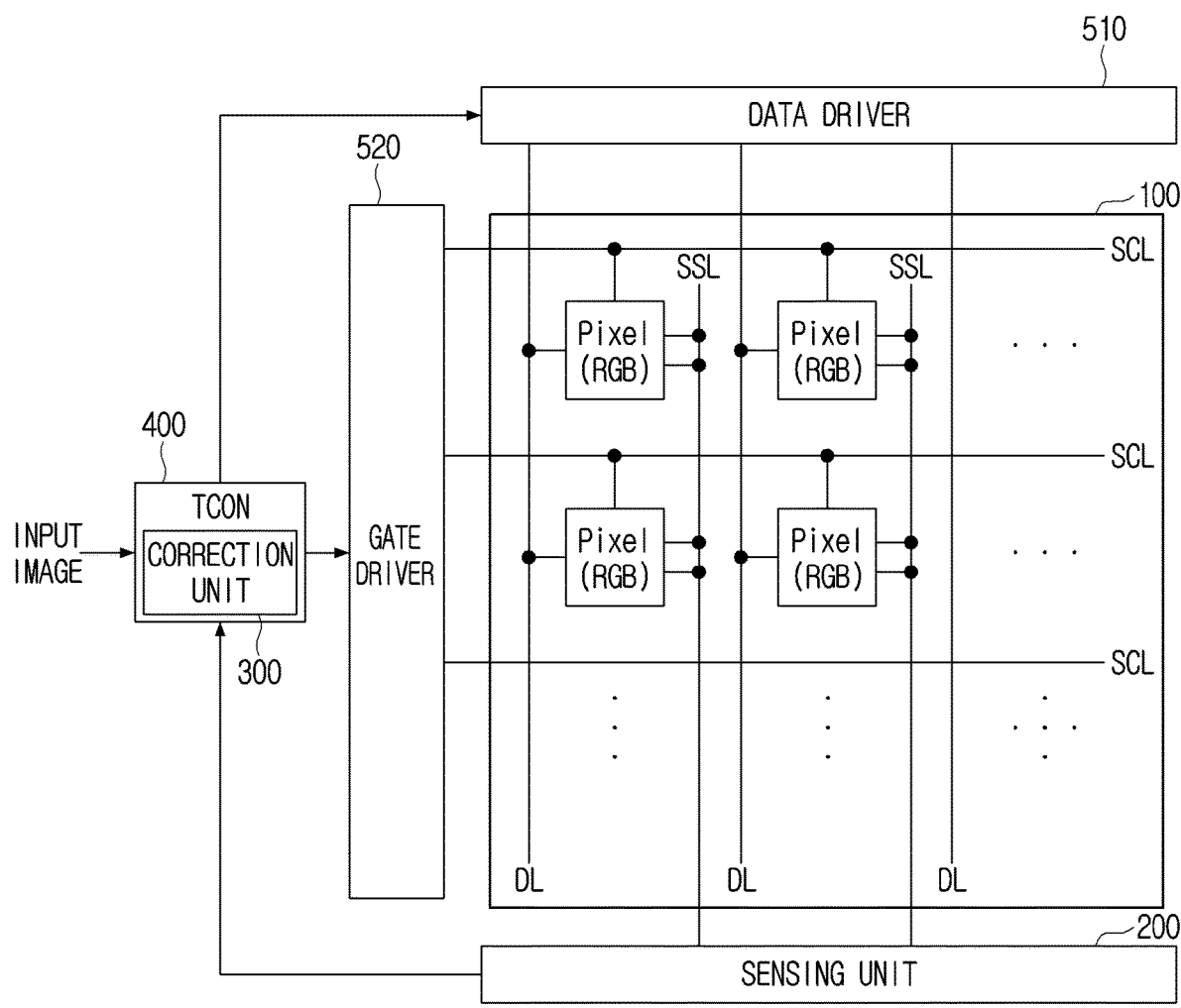
FIG. 15A is a diagram illustrating an implementation example of a sensing unit according to an embodiment.
Figure 15B:
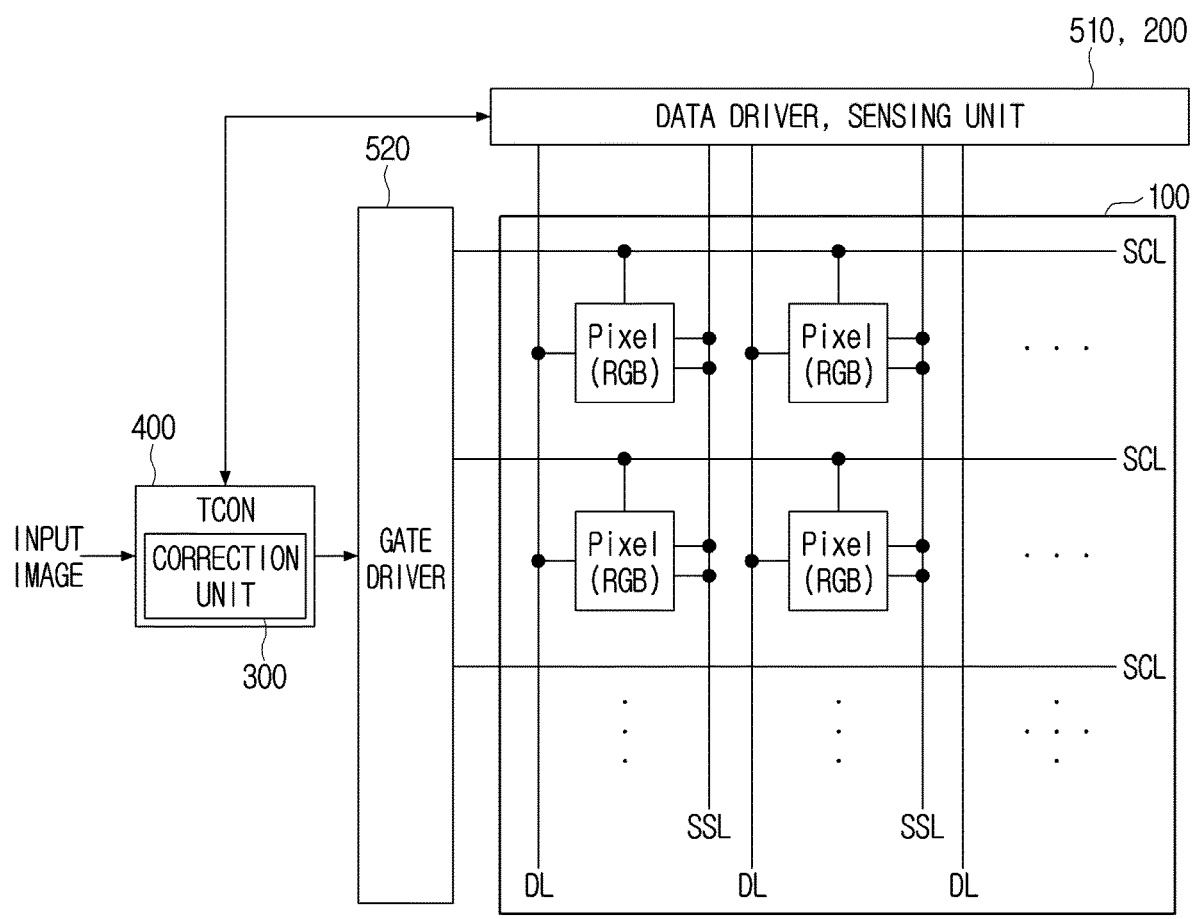
FIG. 15B is a diagram illustrating an implementation example of a sensing unit according to another embodiment.

FIGS. 15A and 15B are diagrams illustrating implementation examples of the sensing unit 200. Referring to FIGS. 15A and 15B, the display panel 100 includes a plurality of pixels disposed in each region wherein a plurality of data lines (DLs) and a plurality of scan liens (SCLs) intersect in a matrix form.

In this case, each pixel may include three sub-pixels such as R, G, and B. Also, the display panel 100 may include the inorganic light emitting elements 120 of colors corresponding to the sub-pixels, and the sub-pixel circuits 110 provided for each inorganic light emitting element, as described above.

Here, the data line (DL) is a wiring line for applying an image data voltage (specifically, a constant current generator data voltage and a PWM data voltage) or a specific voltage (specifically, the first specific voltage and the second specific voltage) applied from the data driver 510 to each sub-pixel circuit 110 of the display panel 100, and the scan line (SCL) is a wiring line for applying a scan signal or an emission signal applied from the gate driver 520 to each sub-pixel circuit 110 of the display panel 100 and driving the pixels (or the sub-pixels) in the units of the row lines.

Accordingly, an image data voltage or a specific voltage applied from the data driver 510 through the data line (DL) may be applied to the sub-pixel circuits of the row lines selected through a scan signal (e.g., SPWM(n), SCCG(n), and SP(n)) applied from the gate driver 520.

In this case, voltages (an image data voltage and a specific voltage) to be applied to each of R, G, and B sub-pixels may be time division multiplexed and applied to each pixel of the display panel 100. In embodiments, the time division multiplexed voltages may be respectively applied to the corresponding sub-pixel circuits through a DeMUX circuit.

Depending on embodiments, unlike FIGS. 15A and 15B, a separate data line may be provided for each of R, G, and B sub-pixels, and in this case, the voltages (an image data voltage and a specific voltage) to be applied to each of the R, G, and B sub-pixels may be simultaneously applied to the corresponding sub-pixels through the corresponding data lines. In this case, a DeMUX circuit may not be needed.

This is the same for a sensing line (SSL). That is, according to an embodiment of the disclosure, a sensing line (SSL) may be provided for each column line of a pixel, as shown in FIGS. 15A and 15B. In this case, a DeMUX circuit is needed for an operation of the sensing unit 200 for each of R, G, and B sub-pixels.

Also, unlike the embodiments shown in FIGS. 15A and 15B, in case a sensing line (SSL) is provided in units of column lines of a sub-pixel, a separate DeMUX circuit is not needed for an operation of the sensing unit 200 for each of R, G, and B sub-pixels. However, compared to the embodiments shown in FIGS. 15A and 15B, unit components of the sensing unit 200 to described below will be needed three times more.

In embodiments, in FIGS. 15A and 15B, only one scan line (SCL) is illustrated for one row line, for the convenience of illustration. However, the actual number of the scan lines may vary in any way depending on the driving method of the pixel circuits 110 included in the display panel 100 or implementation examples. For example, for every row line, scan lines for providing the aforementioned scan signals (SPWM(n), SCCG(n), and SP(n)) or emission signals (SET(n), Emi_PWM(n), Emi_PAM(n), and Sweep(n)) may respectively be provided.

In embodiments, the first and second currents flowing in the first and second driving transistors based on specific voltages as described above may be transmitted to the sensing unit 200 through the sensing line (SSL). Accordingly, the sensing unit 200 may sense each of the first and second currents, and respectively output the first sensing data corresponding to the first current and the second sensing data corresponding to the second current to the correction unit 300.

In this case, according to an embodiment of the disclosure, the sensing unit 200 may be implemented as a separate integrated circuit (IC) from the data driver 510 as shown in FIG. 15A, or it may be implemented as one IC together with the data driver 510 as shown in FIG. 15B.

The correction unit 300 may correct the constant current generator data voltage based on the first sensing data output from the sensing unit 200, and correct the PWM data voltage based on the second sensing data, as described above.

In embodiments, in FIGS. 15A and 15B, an example wherein the first and second currents are transmitted to the sensing unit 200 through a separate sensing line (SSL) from the data line (DL) was suggested. However, embodiments are not limited thereto. For example, in case the data driver 510 and the sensing unit 200 are implemented as one IC as in FIG. 15B, an embodiment wherein the first and second currents are transmitted to the sensing unit 200 through the data line (DL) without the sensing line (SSL) may be possible.

Figure 16A:
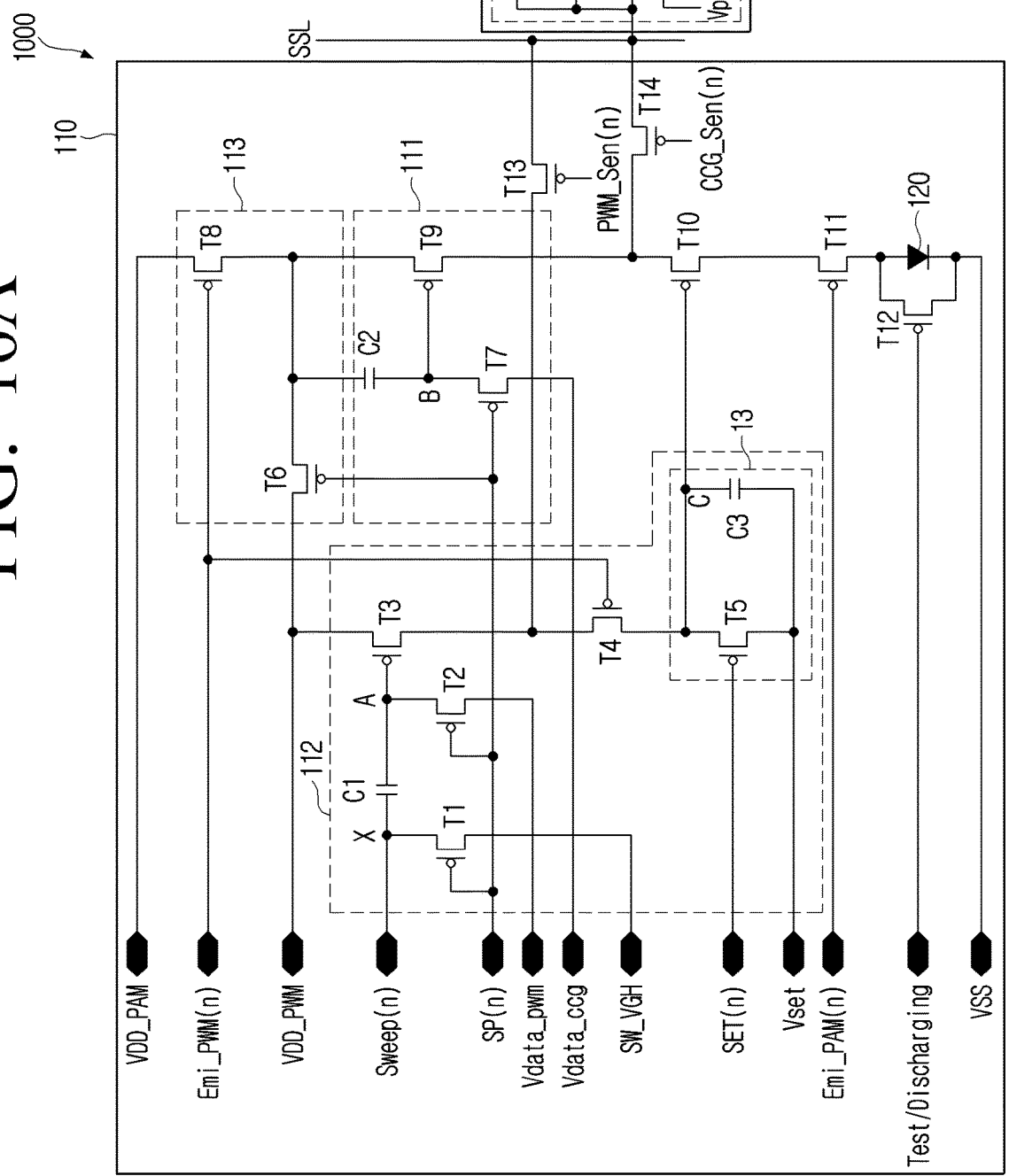
FIG. 16A is a detailed circuit diagram of a sub-pixel circuit and a sensing unit according to an embodiment.

FIG. 16A is a detailed circuit diagram of the sub-pixel circuit 110 and the sensing unit 200 according to an embodiment of the disclosure. FIG. 16A specifically illustrates a circuit related to one sub-pixel, i.e., one inorganic light emitting element 120, a sub-pixel circuit 110 for driving the inorganic light emitting element 120, and unit components of the sensing unit 200 for sensing a current flowing in the driving transistors T3, T9 included in the sub-pixel circuit 110.

According to FIG. 16A, the sub-pixel circuit 110 may include a constant current generator circuit 111, a PWM circuit 112, a driving voltage change unit 113, a first switching transistor T10, a second switching transistor T11, a transistor T12, a transistor T13, and a transistor T14.

The constant current generator circuit 111 includes a first driving transistor T9, a capacitor C2 connected between the source terminal and the gate terminal of the first driving transistor T9, and a transistor T7 that is controlled to be turned on/turned off according to a scan signal SP(n), and that is for applying a constant current generator data voltage applied through a data signal line Vdata_ccg to the gate terminal of the first driving transistor T9 while it is turned on.

The driving voltage change unit 113 may change a driving voltage applied to the first driving transistor T9. Specifically, the driving voltage change unit 113 may apply the second driving voltage (VDD_PWM) to the source terminal of the first driving transistor T9 during a data setting section, and apply the first driving voltage (VDD_PAM) to the source terminal of the first driving transistor T9 during a light emitting section, according to control by the driver 500.

For this, the driving voltage change unit 113 may include a transistor T6 and a transistor T8 connected as shown in the drawing.

In embodiments, the first driving voltage (VDD_PAM) and the second driving voltage (VDD_PWM) may be applied from the power IC to the sub-pixel circuits 110 through separate wirings. Accordingly, they do not influence each other. Also, the first driving voltage (VDD_PAM) and the second driving voltage (VDD_PWM) may be voltages of the same magnitude, but the disclosure is not limited thereto.

The PWM circuit 112 includes a second driving transistor T3, a capacitor C1 for coupling a sweep signal which is a voltage signal sweeping between two different voltages (SW_VGH and SW_VGL) to the gate terminal of the second driving transistor T3, and a transistor T2 that is controlled to be turned on/turned off according to a scan signal SP(n), and that is for applying a PWM data voltage applied through a data signal line Vdata_pwm to the gate terminal of the second driving transistor T3 while it is turned on.

In embodiments, the PWM circuit 112 includes a reset unit 13. The reset unit 13 is a component for forcefully turning on the first switching transistor T10 before each light emitting section starts. The configuration and operation of the reset unit 13 are the same as what is described above in the explanation of the embodiments related to the internal compensation method.

In embodiments, the drain terminal of the second driving transistor T3 is connected to the gate terminal of the first switching transistor T10 through a transistor T4 that is turned on according to an emission signal Emi_PWM(n). The PWM circuit 112 may control the turning-on/turning off operations of the first switching transistor T10 through the operation of the reset unit 13 and the turning-on/turning off operations of the second driving transistor T3, and thereby control the time during which a driving current flows in the inorganic light emitting element 120 in a light emitting section.

In embodiments, the PWM circuit 112 includes a transistor T1. In embodiments, when the transistor T1 is turned on according to an SP(n) signal, a high voltage (SW_VGH) of a sweep signal is applied to the X node. Through such an operation, phenomena of disuniformity of brightness and horizontal crosstalk that may occur by a sweep load can be minimized. An example of this is described in greater detail below.

The source terminal of the second switching transistor T11 is connected to the drain terminal of the first switching transistor T10, and its drain terminal is connected to the anode terminal of the inorganic light emitting element 120. The second switching transistor T11 may be turned on/turned off according to a control signal Emi_PAM(n), and electronically connect/separate the first switching transistor T10 and the inorganic light emitting element 120. The turning-on/turning-off timing of the second switching transistor T11 is related to implementation of a black gray scale, and an example of this is described in greater detail below.

The transistor T12 is connected between the anode terminal and the cathode terminal of the inorganic light emitting element 120. The transistor T12 may be used for different uses respectively before and after the inorganic light emitting element 120 is mounted on the TFT layer to be described below and electronically connected with the sub-pixel circuit 110.

For example, before the inorganic light emitting element 120 and the sub-pixel circuit 110 are connected with each other, the transistor T12 may be turned on according to a control signal (TEST) to check whether the sub-pixel circuit 110 is abnormal.

Also, after the inorganic light emitting element 120 and the sub-pixel circuit 110 are connected with each other, the transistor T12 may perform a role of a discharging transistor. That is, the transistor T12 may be turned on according to a control signal (Discharging) for discharging a charge remaining in the inorganic light emitting element 120.

When the transistor T12 is turned on, the anode terminal and the cathode terminal of the inorganic light emitting element 120 are short-circuited, and thus the potential difference between both ends of the inorganic light emitting element 120 may be removed.

Here, the Discharging signal is not a gate signal applied to the display panel 100 in the order of the row lines, but is a global signal applied identically to all of the row lines of the display panel 100 simultaneously.

The source terminal of the transistor T14 is connected to the drain terminal of the first driving transistor T9, and its drain terminal is connected to the sensing unit 200. The transistor T14 may be turned on according to a control signal CCG_Sen(n) while the sensing driving is performed, and transmit the first current flowing in the first driving transistor T9 to the sensing unit 200 through the sensing line (SSL).

The source terminal of the transistor T13 is connected to the drain terminal of the second driving transistor T3, and its drain terminal is connected to the sensing unit 200. The transistor T13 may be turned on according to a control signal PWM_Sen(n) while the sensing driving is performed, and transmit the second current flowing in the second driving transistor T3 to the sensing unit 200 through the sensing line (SSL).

The cathode terminal of the inorganic light emitting element 120 is connected to a ground voltage (VSS) terminal.

In embodiments, according to FIG. 16A, the unit components of the sensing unit 200 includes a current integrator 210 and an analog to digital converter (ADC) 220. The current integrator 210 may include an amp 211, an integration capacitor 212, a first switch 213, and a second switch 214.

The amp 211 may include an inversion input terminal (−) that is connected to the sensing line (SSL) and receives input of the first and second currents flowing in the first and second driving transistors T9, T3 of the sub-pixel circuit 110, a non-inversion input terminal (+) that receives input of a reference voltage (Vpre), and an output terminal (Vout).

The integration capacitor 212 may be connected between the inversion input terminal (−) and the output terminal (Vout) of the amp 211, and the first switch 213 may be connected to both ends of the integration capacitor 212. In embodiments, both ends of the second switch 214 may be respectively connected to the output terminal (Vout) of the amp 211 and the input end of the ADC 220, and the second switch 214 may be switched according to a control signal Sam.

In embodiments, the unit components of the sensing unit 200 shown in FIG. 16A may be provided for each sensing line (SSL). Accordingly, for example, in case a sensing line is provided for each column line of a pixel in the display panel 100 including 480 pixel column lines, the sensing unit 200 may include 480 of the unit components. As another example, in case a sensing line is provided for each column line of R, G, and B sub-pixels in the display panel 100 including 480 pixel column lines, the sensing unit 200 may include 1440(=480*3) of the unit components.

Figure 16B:
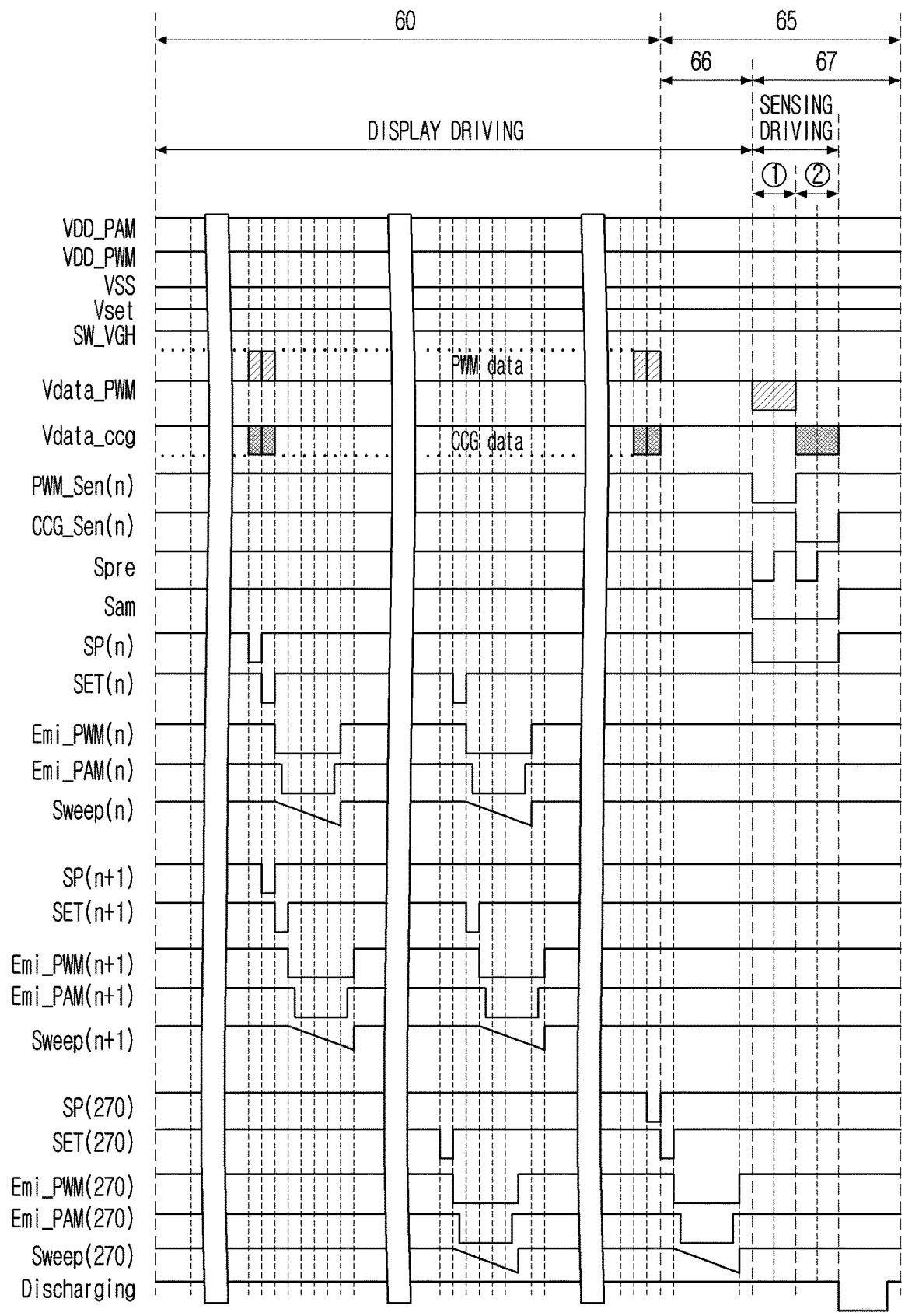
FIG. 16B is a timing diagram of various kinds of signals for driving a display panel including the sub-pixel circuit and the sensing unit illustrated in FIG. 16A during an image frame period and a blanking interval, according to an embodiment.

FIG. 16B is a timing diagram of various kinds of signals for driving a display panel including the sub-pixel circuit and the sensing unit illustrated in FIG. 16A during an image frame period and a blanking interval. Specifically, FIG. 16B illustrates various kinds of control signals, driving voltage signals, and data signals applied to the sub-pixel circuits 110 during one image frame period and a blanking interval.

Referring to FIG. 16B, the display panel 100 may be driven in the order of display driving and sensing driving.

During a display driving section, control signals SP, SET, Emi_PWM, Emi_PAM, and Sweep are applied to the display panel 100 as illustrated in FIG. 16B. For example, during a display driving section, control signals SP(n), SET(n), Emi_PWM(n), Emi_PAM(n), and Sweep(n) may be applied to the sub-pixel circuits 110 included in the $n^{th}$ row line of the display panel 100, as illustrated in FIG. 16B.

As described above, the sub-pixel circuits included in each row line of the display panel 100 may be driven in the order of a data setting section and a plurality of light emitting sections. Also, the entire sub-pixel circuits of the display panel 100 may be driven in the order of the row lines.

Referring to FIG. 16B, it can be seen that, after a scan signal SP(n) related to an image data voltage setting operation is applied, emission signals SET(n), Emi_PWM(n), Emi_PAM(n), and Sweep(n) related to a driving current providing operation are applied a plurality of times, from the viewpoint of one row line (e.g., the $n^{th}$ row line).

Also, referring to the relation among the row lines, it can be seen that a scan signal SP(n) for the $n^{th}$ row line and a scan signal SP(n+1) for the $n+1^{th}$ row line are sequentially applied in the order of the row lines. Accordingly, it can be seen that emission signals SET(n), Emi_PWM(n), Emi_PAM(n), and Sweep(n) for the $n^{th}$ row line and emission signals SET(n+1), Emi_PWM(n+1), Emi_PAM(n+1), and Sweep(n+1) for the $n+1^{th}$ row line are also sequentially applied in the order of the row lines.

Hereinafter, an example of the detailed operation of the sub-pixel circuit 110 is described with reference to the control signals SP(n), SET(n), Emi_PWM(n), EMi_PAM (n), and Sweep(n) related to the $n^{th}$ row line in FIG. 16B and the circuit in FIG. 16A.

First, in a data setting section, if a scan signal SP(n) having a low level is applied to the sub-pixel circuit 110, the transistor T2 of the PWM circuit 112, the transistor T7 of the constant current generator circuit 111, and the transistor T6 of the driving voltage change unit 113 are turned on.

When the transistor T2 is turned on, a PWM data voltage (PWM data) applied from the second data driver is applied to the gate terminal (referred to as the A node hereinafter) of the second driving transistor T3 through a data signal line Vdata_pwm.

As the second driving voltage (VDD_PWM) is applied to the source terminal of the second driving transistor T3, a voltage corresponding to the difference between the PWM data voltage and the second driving voltage (VDD_PWM) is set between the gate terminal and the source terminal of the second driving transistor T3.

In this case, the PWM data voltage may be a voltage higher than the second driving voltage (VDD_PWM), when the threshold voltage of the second driving transistor T3 is assumed as 0[V]. Accordingly, in a state wherein the PWM data voltage is set to the A node, the second driving transistor T3 maintains a turned-off state. (This is because the PMOS-FET is turned on when a voltage smaller than the threshold voltage is applied between the gate terminal and the source terminal, and is turned off when a voltage exceeding the threshold voltage is applied.)

In embodiments, when the transistor T7 is turned on, a constant current generator data voltage (CCG data) applied from the first data driver is applied to the gate terminal (referred to as the B node hereinafter) of the first driving transistor T9 through a data signal line Vdata_ccg.

As the transistor T6 of the driving voltage change unit 113 is also turned on according to a scan signal SP(n), the second driving voltage (VDD_PWM) is applied to the source terminal of the first driving transistor T9 during a data setting section. Accordingly, a voltage corresponding to the difference between the constant current generator data voltage and the second driving voltage (VDD_PWM) is set between the gate terminal and the source terminal of the first driving transistor T9.

In this case, the constant current generator data voltage may be a voltage lower than the second driving voltage (VDD_PWM), when the threshold voltage of the first driving transistor T9 is assumed as 0[V]. Accordingly, in a state wherein the constant current generator data voltage is set to the B node, the first driving transistor T9 maintains a turned-on state. (This is because the PMOSFET is turned on when a voltage smaller than the threshold voltage is applied between the gate terminal and the source terminal, and is turned off when a voltage exceeding the threshold voltage is applied.)

In embodiments, when the first light emitting section for the $n^{th}$ row line starts, an emission signal SET(n) having a low level is applied to the transistor T5. Accordingly, Vset which is a low voltage is charged in the capacitor C3 through the turned-on transistor T5, and a low voltage is applied to the gate terminal (referred to as the C node hereinafter) of the first switching transistor T10, and the first switching transistor T10 is turned on.

Afterwards, during the first light emitting section, emission signals Emi_PWM(n), Emi_PAM(n), and Sweep(n) are applied to the sub-pixel circuit 110 as illustrated in FIG. 16B.

Specifically, when an emission signal Emi_PWM(n) having a low level is applied to the transistor T8 of the driving voltage change unit 113, the transistor T8 is turned on, and the first driving voltage (VDD_PAM) is applied to the source terminal of the first driving transistor T9.

In this case, even if the voltage applied to the source terminal of the first driving transistor T9 is changed from the second driving voltage (VDD_PWM) to the first driving voltage (VDD_PAM), the voltage between the source terminal and the gate terminal of the first driving transistor T9 may be maintained as the voltage set in the data setting section as it is by the capacitor C2. Accordingly, the first driving transistor T9 may still maintain a turned-on state.

In embodiments, when an emission signal Emi_PAM(n) having a low level is applied to the second switching transistor T11, the second switching transistor T11 is turned on.

Ultimately, through the transistor T8 turned on according to the Emi_PWM(n) signal, the first driving transistor T9 that maintains a turned-on state, the first switching transistor T10 turned on according to the SET(n) signal, and the second switching transistor T11 turned on according to the Emi_PAM(n) signal, the first driving voltage (VDD_PAM) is applied to the anode terminal of the inorganic light emitting element 120, and a driving current flows in the inorganic light emitting element 120.

In this case, the magnitude of the driving current is determined by the voltage difference between the gate terminal and the source terminal of the first driving transistor T9, in particular, the magnitude of the constant current generator data voltage set to the gate terminal of the first driving transistor T9.

In embodiments, if an emission signal Sweep(n) (e.g., a sweep voltage that linearly decreases as illustrated in FIG. 16B) is applied to the capacitor C1, the applied sweep voltage is coupled to the A node, and accordingly, the voltage of the A node also linearly decreases.

Accordingly, when the difference value of the voltage of the A node and the second driving voltage (VDD_PWM) reaches the threshold voltage value of the second driving transistor T3, the second driving transistor T3 is turned on, and the second driving voltage (VDD_PWM) having a high level is applied to the gate terminal of the first switching transistor T10 through the turned-on second driving transistor T3. (In this case, the transistor T4 is also obviously in a turned-on state according to an emission signal Emi_PWM (n) having a low level.)

Accordingly, the first switching transistor T10 is turned off, and the driving current cannot flow to the inorganic light emitting element 120 anymore, and the inorganic light emitting element 120 gets to stop light emission. In this case, the time during which the driving current flows in the inorganic light emitting element 120 is determined by the voltage difference between the gate terminal and the source terminal of the second driving transistor T3, in particular, the magnitude of the PWM data voltage set to the gate terminal of the second driving transistor T3.

In embodiments, in the light emitting sections after the second light emitting section for the $n^{th}$ row line, emission signals SET(n), Emi_PWM(n), Emi_PAM(n), and Sweep(n) are respectively applied identically. Accordingly, the inorganic light emitting elements 120 of the $n^{th}$ row line get to respectively emit light identically based on the image data voltage set in the data setting section.

In the above description, only the operations related to the $n^{th}$ row line were explained, but the operations regarding the remaining row lines may also be sufficiently understood through the aforementioned explanation.

In embodiments, referring to the timing diagram in FIG. 16B in detail, it can be seen that there is a difference between the time point when Emi_PWM(n) becomes a low level and the time point when Emi_PAM(n) becomes a low level. This is for implementing a black gray scale in the internal compensation method, as described above.

Specifically, in case a PWM data voltage corresponding to a black gray scale is set to the A node, the first switching transistor T10 should be turned off as soon as a light emitting section starts. That is, theoretically, the second driving voltage (VDD_PWM) is applied to the C node through the turned-on second driving transistor T3 and the turned-on transistor T4 at a time point when an emission signal Emi_PWM(n) becomes low, and the first switching transistor T10 should be turned off immediately. (If the first switching transistor T10 is turned off immediately, a driving current may not flow in the inorganic light emitting element 120 at all, and a black gray scale may be expressed.)

However, in practice, time is spent until the second driving voltage (VDD_PWM) is charged to the C node, and the first switching transistor T10 is not turned off immediately. Specifically, after the second driving voltage (VDD_PWM) is applied to the C node and charging to the capacitor C3 started and until a voltage that may turn off the first switching transistor T10 is charged to the C node, the first switching transistor T10 maintains a turned-on state, and accordingly, a leakage current is provided from the first switching transistor T10 to the inorganic light emitting element 120.

Ultimately, in case the first switching transistor T10 and the inorganic light emitting element 120 are directly connected without the second switching transistor T11, even if a PWM data voltage corresponding to a black gray scale is set to the A node, a current leaked from the first switching transistor T10 flows in the inorganic light emitting element 120 during a specific time, and thus a problem occurs in correct implementation of a black gray scale.

For resolving such a problem, according to an embodiment of the disclosure, the second switching transistor T11 may be arranged between the first switching transistor T10 and the inorganic light emitting element 120, and the driver 500 may apply an emission signal Emi_PAM(n) so that the second switching transistor T11 is turned on after a specific time passes from a time point when an emission signal Emi_PWM(n) becomes a low level. Here, the specific time may be a time that is greater than or equal to the time during which the voltage of the C node is charged from a Vset voltage to a voltage that may turn off the first switching transistor T10.

Accordingly, a leakage current that is generated as the first switching transistor T10 is not turned off immediately even though a PWM data voltage corresponding to a black gray scale is set to the A node may be blocked by the second switching transistor T11. Therefore, a black gray scale can be implemented more correctly.

In embodiments, even if the second switching transistor T11 is turned off until the first switching transistor T10 is turned off by adjusting the driving timing of an Emi_PWM(n) signal and an Emi_PAM(n) signal as described above, a leakage current (e.g., an off current) of the second switching transistor T11 may be provided to the inorganic light emitting element 120 in every light emitting section.

If charges are accumulated in the junction capacitance component of the inorganic light emitting element 120 due to such a leakage current, and a voltage greater than or equal to a forward voltage is applied to both ends of the inorganic light emitting element 120, the leakage current may flow in the inorganic light emitting element 120, and cause a problem in implementation of a black gray scale.

Thus, according to an embodiment of the disclosure, a potential difference between both ends of the inorganic light emitting element may be removed by applying a Discharging signal having a low level to the gate terminal of the transistor T12 within the non-light emitting section 67, as illustrated in FIG. 16B. Accordingly, more correct implementation of a black gray scale can be guaranteed.

In FIG. 16B, an example wherein an operation for discharging a charge remaining in the inorganic light emitting element (e.g., an operation for removing a potential difference between both ends of the inorganic light emitting element) is performed once for one image frame within the non-light emitting section 67 that exists inside the blanking interval 65 is suggested. However, embodiments are not limited thereto, and depending on products, the operation can obviously be performed in various ways in various situations, as described above in FIGS. 7A to 7D.

In embodiments, referring to FIGS. 16A and 16B, it can be seen that in the source terminal of the first driving transistor T9 of the constant current generator circuit 111, different driving voltages are applied to a data setting section and a light emitting section through the driving voltage change unit 113.

This is for applying the second driving voltage (VDD_PWM) wherein a voltage drop does not occur by a driving current to the constant current generator circuit 111 during a data setting section, and thereby making a correct voltage set between the gate terminal and the source terminal of the first driving transistor T9.

Specifically, there is a resistance component in the display panel 100 as described above. Accordingly, when a driving current flows, an IR drop occurs, which causes a drop in the first driving voltage (VDD_PAM). Also, in the various embodiments of the disclosure, the display panel 100 is driven by the progressive driving method. Accordingly, while the sub-pixel circuits of some row lines operate in the light emitting section, the sub-pixel circuits of the other row lines operate in the data setting section.

Accordingly, in case the first driving voltage (VDD_PAM) is applied identically to the constant current generator circuits 111 in the data setting section and the light emitting section, the first driving voltage (VDD_PAM) applied to the constant current generator circuits 111 of the row lines operating in the data setting section are influenced by the drop of the first driving voltage (VDD_PAM) due to the constant current generator circuits 111 of the row lines operating in the light emitting section. This hinders setting of a correct constant current generator data voltage to the constant current generator circuits 111 of the row lines operating in the data setting section.

Also, a resistance component that exists in the actual display panel 100 has different values for each region of the display panel 100. Accordingly, when a driving current flows, a difference occurs in the IR drop value, i.e., the degree of drop of the first driving voltage (VDD_PAM) for each region of the display panel 100, and this also needs to be compensated.

For resolving the problem of an IR drop as above, according to an embodiment of the disclosure, the driver 500 may control the driving voltage change unit 113 such that the second driving voltage (VDD_PWM) wherein there is no voltage drop according to the driving current is applied to the constant current generator circuit 111 during a data setting section.

Accordingly, during a data setting section, a constant current generator data voltage may be set to the constant current generator circuit 111 based on the second driving voltage (VDD_PWM).

Afterwards, the driving voltage applied to the constant current generator circuit 111 is changed to the first driving voltage (VDD_PAM) during a light emitting section, but the voltage between the gate terminal and the source terminal of the first driving transistor T9 set in the data setting section is maintained as it is by the capacitor C2, and thus a correct constant current generator data voltage can be set to the constant current generator circuit 111 regardless of whether there is a drop of the first driving voltage (VDD_PAM) or the degree of drop.

In embodiments, a driving current does not flow in the second driving transistor T3 of the PWM circuit 112. Accordingly, during a data setting section and a light emitting section, a voltage drop does not occur in the second driving voltage (VDD_PWM), or even if a voltage drop occurs, it is of a level that can be ignored. Thus, even if the second driving voltage (VDD_PWM) is applied identically in a data setting section and a light emitting section in the PWM circuit 112, this would not cause a problem.

In embodiments, in the same way as in the aforementioned internal compensation method, a constant current generator data voltage of the same value may be used for each type of sub-pixels or all sub-pixels in the external compensation method. Accordingly, a driving current (e.g., a constant current) of the same magnitude may be provided to the inorganic light emitting elements 120 through the constant current generator circuit 111, and accordingly, the problem of wavelength variation of the LED according to the change in the magnitude of the driving current may be resolved.

In the above description, it was explained that the same constant current generator data voltage is applied to the constant current generator circuit 111 from the viewpoint of resolution of the problem of wavelength variation of the LED, for the convenience of explanation. However, in the external compensation method, a constant current generator data voltage is corrected for compensating deviations in the threshold voltages and the mobility among the first driving transistors T9, and thus a constant current generator data voltage of which value was corrected is applied to the constant current generator circuit 111 through sensing driving. Accordingly, unlike in the internal compensation method wherein a constant current generator data voltage is applied from the power IC providing DC voltages, a constant current generator data voltage is applied from the data driver in the external compensation method.

Referring to FIG. 16B again, a sensing driving period may include a PWM circuit 112 sensing period (①) and a constant current generator circuit 111 sensing period (②).

During the PWM circuit 112 sensing period (①), the second current flowing in the second driving transistor T3 is transmitted to the sensing unit 200 based on the second specific voltage.

During the constant current generator circuit 111 sensing period (②), the first current flowing in the first driving transistor T9 is transmitted to the sensing unit 200 based on the first specific voltage.

Accordingly, the sensing unit 200 may respectively output the first sensing data and the second sensing data based on the first and second currents.

In this case, according to an embodiment of the disclosure, the sensing driving may be performed within the blanking interval 65 as shown in FIG. 16B.

Accordingly, the sensing unit 200 may sense a current flowing in the driving transistors T9, T3 based on a specific voltage applied within the blanking interval 65 of one image frame, and output sensing data corresponding to the sensed current.

However, embodiments are not limited thereto. For example, the sensing driving may be performed in a booting period, a power-off period, or a screen-off period, etc. of the display apparatus 1000. Here, the booting period may mean a period after the system power was applied until the screen is turned on, the power-off period may mean a period after the screen was turned off until the system power is released, and the screen-off period may mean a period wherein the system power is being applied, but the screen is turned off.

Hereinafter, an example of the operation of the display apparatus 1000 in a sensing driving period is described in more detail with reference to FIGS. 16A and 16B.

Specifically, during the PWM circuit 112 sensing period (①), the second specific voltage is applied to the data signal line Vdata_pwm from the second data driver. The second specific voltage may be any predetermined voltage for turning on the second driving transistor T3. In this case, the transistor T2 is turned on according to a scan signal SP(n), and the second specific voltage is input to the A node through the turned-on transistor T2.

In the PWM circuit 112 sensing period (①), the transistor T13 is turned on according to a control signal PWM_Sen(n), and the second current flowing in the second driving transistor T3 is transmitted to the sensing unit 200 through the turned-on transistor T13.

In embodiments, during the PWM circuit 112 sensing period (①), the first switch 213 of the sensing unit 200 is turned on and off according to a control signal Spre. Hereinafter, description will be made by referring to a period in which the first switch 213 is turned on within the PWM circuit 112 sensing period (①) as a first initialization period, and a period in which the first switch 213 is turned off as a first sensing period.

As the first switch 213 is in a turned-on state during the first initialization period, a reference voltage (Vpre) input into the non-inversion input terminal (+) of the amp 211 is maintained in the output terminal (Vout) of the amp 211.

In the first sensing period, the first switch 213 is turned off, and thus the amp 211 operates as a current integrator and integrates the second current. In this case, the voltage difference at both ends of the integration capacitor 212 becomes bigger as the sensing time passes, i.e., as the amount of the accumulated charges increases, by the second current introduced into the inversion input terminal (−) of the amp 211 in the first sensing period.

However, because of the virtual ground characteristic of the amp 211, the voltage of the inversion input terminal (−) is maintained as the reference voltage (Vpre) regardless of the increase of the voltage difference of the integration capacitor 212 in the first sensing period, and thus the voltage of the output terminal (Vout) of the amp 211 becomes lower correspondingly to the voltage difference at both ends of the integration capacitor 212.

According to such a principle, in the first sensing period, the second current introduced into the sensing unit 200 is accumulated as an integration value Vpsen which is a voltage value through the integration capacitor 212. As the gradient of the voltage drop of the output terminal (Vout) of the amp 211 increases as the second current is bigger, the size of the integration value Vpsen becomes smaller as the second current is bigger.

The integration value Vpsen is input into the ADC 220 while the second switch 214 is maintained in a turned-on state in the first sensing period, and it is converted into the second sensing data at the ADC 220, and is then output to the correction unit 300.

In embodiments, during the constant current generator circuit 111 sensing period (②), the first specific voltage is applied to the data signal line Vdata_ccg from the first data driver. The first specific voltage is any predetermined voltage for turning on the first driving transistor T9. In this case, the transistor T7 is turned on according to a scan signal SP(n), and the first specific voltage is input to the B node through the turned-on transistor T7.

In the constant current generator circuit 111 sensing period (②), the transistor T14 is turned on according to a control signal CCG_Sen(n), and the first current flowing in the first driving transistor T9 is transmitted to the sensing unit 200 through the turned-on transistor T14.

In embodiments, during the constant current generator circuit 111 sensing period (②), the first switch 213 of the sensing unit 200 is also turned on and off according to a control signal Spre. Hereinafter, description will be made by referring to a period in which the first switch 213 is turned on within the constant current generator circuit 111 sensing period (②) as a second initialization period, and a period in which the first switch 213 is turned off as a second sensing period.

As the first switch 213 is in a turned-on state during the second initialization period, a reference voltage (Vpre) input into the non-inversion input terminal (+) of the amp 211 is maintained in the output terminal (Vout) of the amp 211.

In the second sensing period, the first switch 213 is turned off, and thus the amp 211 operates as a current integrator and integrates the first current. In this case, the voltage difference at both ends of the integration capacitor 212 becomes bigger as the sensing time passes, i.e., as the amount of the accumulated charges increases, by the first current introduced into the inversion input terminal (−) of the amp 211 in the second sensing period.

However, because of the virtual ground characteristic of the amp 211, the voltage of the inversion input terminal (−) is maintained as the reference voltage (Vpre) regardless of the increase of the voltage difference of the integration capacitor 212 in the second sensing period, and thus the voltage of the output terminal (Vout) of the amp 211 becomes lower correspondingly to the voltage difference at both ends of the integration capacitor 212.

According to such a principle, in the second sensing period, the first current introduced into the sensing unit 200 is accumulated as an integration value Vcsen which is a voltage value through the integration capacitor 212. As the gradient of the voltage drop of the output terminal (Vout) of the amp 211 increases as the first current is bigger, the size of the integration value Vcsen becomes smaller as the first current is bigger.

The integration value Vcsen is input to the ADC 220 while the second switch 214 is maintained in a turned-on state in the second sensing period, and it is converted into the first sensing data at the ADC 220, and is then output to the correction unit 300.

Accordingly, as described above, the correction unit 300 may respectively acquire first and second compensation values based on the reference data per voltage stored in the memory and the first and second sensing data output from the sensing unit 200, and store or update the acquired first and second compensation values in the memory. Afterwards, when the display driving is performed, the correction unit 300 may respectively correct the constant current generator data voltage and the PWM data voltage to be applied to the sub-pixel circuits 110 based on the first and second compensation values.

In embodiments, according to an embodiment of the disclosure, the first specific voltage and the second specific voltage may be applied to the sub-pixel circuits of one row line per image frame. That is, according to an embodiment of the disclosure, the aforementioned sensing driving may be performed for one row line per image frame.

In this case, the aforementioned sensing driving may be sequentially performed in the order of the row lines of the display panel 100. Accordingly, for example, in case the display panel 100 consists of 270 row lines, the sub-pixel circuits of the first row line may be sensing-driven after the first image frame is displayed, and the sub-pixel circuits included in the second row line may be sensing-driven after the second image frame is displayed. In such a manner, the sub-pixel circuits of the 270$^{th}$ row line may be sensing-driven after the 270$^{th}$ image frame is displayed, and accordingly, the sensing driving of the sub-pixel circuits included in all row lines included in the display panel 100 may be completed once.

In embodiments, the aforementioned sensing driving may proceed in a random order of the row lines. In this case, in the above example, the entire rows lines of the display panel 100 may be sensing-driven in a random order while 270 continuous image frames are displayed.

In embodiments, according to another embodiment of the disclosure, the first specific voltage and the second specific voltage may be applied to the sub-pixel circuits of the plurality of row lines per image frame. That is, the aforementioned sensing driving may be performed for the plurality of row lines per image frame. In this case, the aforementioned sensing driving may also proceed sequentially or proceed in a random order, in units of the plurality of row lines.

In the above description, an example wherein the sensing driving proceeds in the order of the PWM circuit 112 sensing period (①) and the constant current generator circuit 111 sensing period (②)) was suggested. However, the disclosure is not limited thereto, and it is obvious that, depending on embodiments, it is possible that the constant current generator circuit 111 sensing period (②)) proceeds first, and the PWM circuit 112 sensing period (①) proceeds after that.

Also, in the above description, an example wherein sensing driving proceeds after display driving was suggested. However, the disclosure is not limited thereto, and it is possible that sensing driving proceeds first, and display driving proceeds after that depending on embodiments.

Hereinafter, regarding the transistor T1 in FIG. 16A, the problems of disuniformity of brightness and horizontal crosstalk that may occur by a sweep load will be described, and it will be described that such problems can be resolved as a high voltage (SW_VGH) of a sweep signal is applied to the X node through the transistor T1 during a data setting section.

Figure 17A:
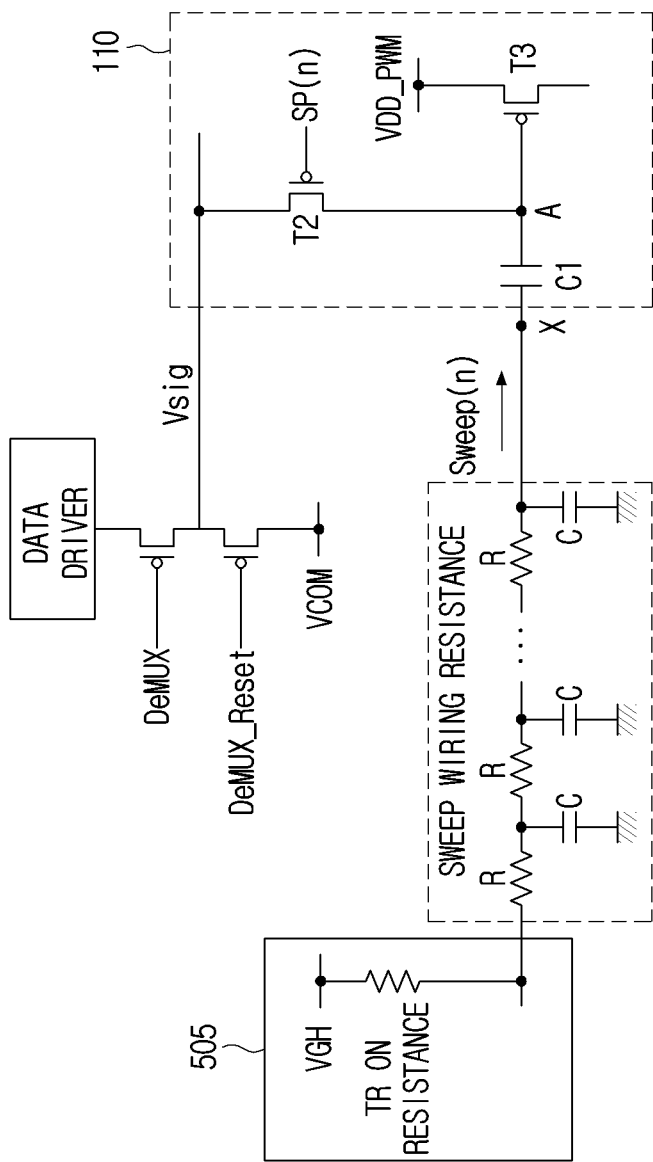
FIG. 17A is a diagram for illustrating phenomena of disuniformity of brightness and horizontal crosstalk that may occur by a sweep load in a sub-pixel circuit to which an external compensation method is applied, according to an embodiment.
Figure 17B:
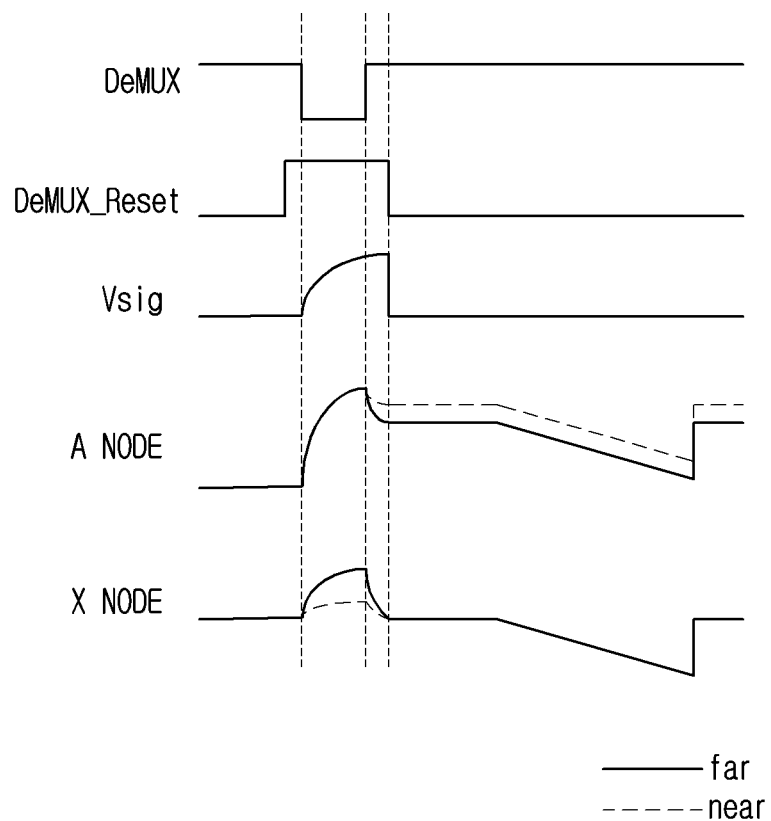
FIG. 17B is a diagram for illustrating phenomena of disuniformity of brightness and horizontal crosstalk that may occur by a sweep load in a sub-pixel circuit to which an external compensation method is applied, according to an embodiment.

FIGS. 17A and 17B are diagrams for illustrating phenomena of disuniformity of brightness and horizontal crosstalk that may occur by a sweep load in a sub-pixel circuit to which an external compensation method with respect to deviations in electronic characteristics of driving transistors is applied.

As described above, in the various embodiments of the disclosure, light emitting sections sequentially proceed in the order of the row lines of the display panel 100. Accordingly, emission signals cannot be applied to the display panel 100 at once through a global signal, and an emission driver circuit for providing an emission signal corresponding to each row line is respectively needed for each row line.

In particular, a sweep signal Sweep(n) for the PWM driving of the display panel 100 is also sequentially provided to the display panel 100 in the order of the row lines through emission driver circuits respectively corresponding to the row lines. (Hereinafter, an emission driver circuit for providing a sweep signal Sweep(n) will be referred to as a sweep driver circuit.)

In this case, in a process wherein a PWM data voltage is set to the gate terminal, i.e., the A node of the second driving transistor T3, the change of the voltage of the A node is coupled through the capacitor C1, and a change occurs in the voltage of the Sweep(n) signal line.

Afterwards, the change of the voltage occurred in the Sweep(n) signal line is restored, and in accordance thereto, the voltage set to the A node changes reversely. In this case, the changed amount of the voltage of the A node varies according to a sweep load as will be described below, and this becomes the cause of disuniformity of brightness and horizontal crosstalk.

Specifically, FIG. 17A illustrates a configuration wherein a sweep driver circuit 505 corresponding to one row line is connected with one sub-pixel circuit 110 through a wiring. Here, FIG. 17A illustrates a case wherein the transistor T1 does not exist in the sub-pixel circuit 110 in FIG. 16A.

As illustrated in FIG. 17A, a sweep signal Sweep(n) is transmitted to the sub-pixel circuit 110 through the sweep driver circuit 505. In this case, a sweep wiring resistance, i.e., an RC load exists between the sweep driver circuit 505 and the sub-pixel circuit 110, and its size becomes smaller as it gets closer to the sweep driver circuit 505, and becomes bigger as it gets farther from the sweep driver circuit 505.

FIG. 17B illustrates waveforms of the various kinds of signals illustrated in FIG. 17A. Also, the label "far" illustrated in FIG. 17B indicates changes of the voltages of the A node and the X node of the sub-pixel circuit 110 arranged relatively far from the sweep driver circuit 505, and the label "near" indicates changes of the voltages of the A node and the X node of the sub-pixel circuit 110 arranged relatively close to the sweep driver circuit 505, respectively. In embodiments, for example, the A node and the X node of the sub-pixel circuit 110 corresponding to the label "far" may be further from the sweep driver circuit 505 than the A node and the X node of the sub-pixel circuit 110 corresponding to the label "near".

When a scan signal SP(n) having a low level is applied to the sub-pixel circuit 110 in a data setting section, a PWM data voltage applied from the data driver is applied to the A node through a Vsig wiring and the transistor T2. Here, the PWM data voltage is a PWM data voltage corresponding to any one sub-pixel among R, G, and B sub-pixels selected by the DeMUX circuit.

In this process, as illustrated in FIG. 17B, as the voltage of the A node changes, the change is coupled to the X node through the capacitor C1, and a change occurs in the voltage of the X node, i.e., the voltage of the Sweep(n) signal line.

Afterwards, the voltage of the Sweep(n) signal line (the voltage of the X node) is restored to the original voltage level again by the operation of the sweep driver circuit 505, and the change of the voltage of the X node occurred in this process is coupled through the capacitor C1, and brings out a change in the voltage of the A node, reversely.

In particular, it can be seen that, due to an effect by a sweep load, there is a bigger change in the voltage of the A node in the case of a sub-pixel circuit 110 of which X node exists in a farther place from the sweep driver circuit 505. (refer to the label "far" and the label "near")

Accordingly, even if the same PWM data voltage is applied, a different voltage is set to the sub-pixel circuit 110 according to a sweep load, and this becomes the cause of disuniformity of brightness. Also, the problem of disuniformity of brightness according to a sweep load as described above becomes the cause of generation of horizontal crosstalk from the viewpoint of the entire display panel 100.

The problems of disuniformity of brightness and horizontal crosstalk as above are caused as the voltage of the X node changes together when a PWM data voltage is applied to the A node. Thus, the problems can be resolved by preventing the voltage of the X node from being changed even if a PWM data voltage is applied to the A node during a data setting section.

Figure 17C:
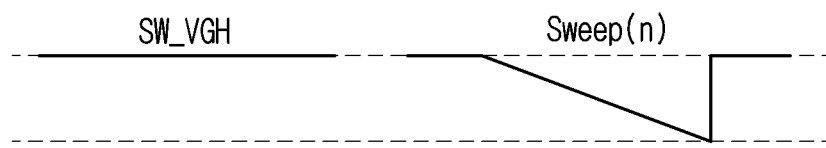
FIG. 17C is a diagram illustrating a high voltage (SW_VGH) of a sweep signal according to an embodiment.

According to an embodiment of the disclosure, while a PWM data voltage is set to the A node, a high voltage (SW_VGH) of a sweep signal as shown in FIG. 17C may be applied to the X node. In this case, the high voltage (SW_VGH) of the sweep signal may be a global signal that is applied identically from the power IC to all of the sub-pixel circuits 110 of the display panel 100.

To be more specific, referring to FIG. 16A, the PWM circuit 112 includes a transistor T1 of which source terminal is connected to the SW_VGH signal line, and of which gate terminal is connected to the SP(n) signal line, and of which drain terminal is connected to the X node. In this case, the source terminal of the transistor T1 may be directly connected to the wiring through which the high voltage (SW_VGH) of the sweep signal is applied from the power IC.

Accordingly, while a low voltage is applied through the SP(n) signal line and a PWM data voltage is set to the A node, the high voltage (SW_VGH) of the sweep signal that is applied through the turned-on transistor T1 is forcefully applied to the X node, and the voltage of the X node may be maintained as the high voltage (SW_VGH) of the sweep signal regardless of the change of the voltage of the A node.

Accordingly, phenomena of disuniformity of brightness and horizontal crosstalk that may occur by a sweep load can be prevented or minimized.

Hereinafter, other embodiments of the display apparatus to which the external compensation method is applied will be described with reference to FIGS. 18A to 20B. In this case, the embodiments illustrated in FIGS. 18A to 20B have similar configurations and operation principles as those described above through FIGS. 16A to 17C, and thus overlapping explanation will be omitted, and explanation will be made focused on differences.

Figure 18A:
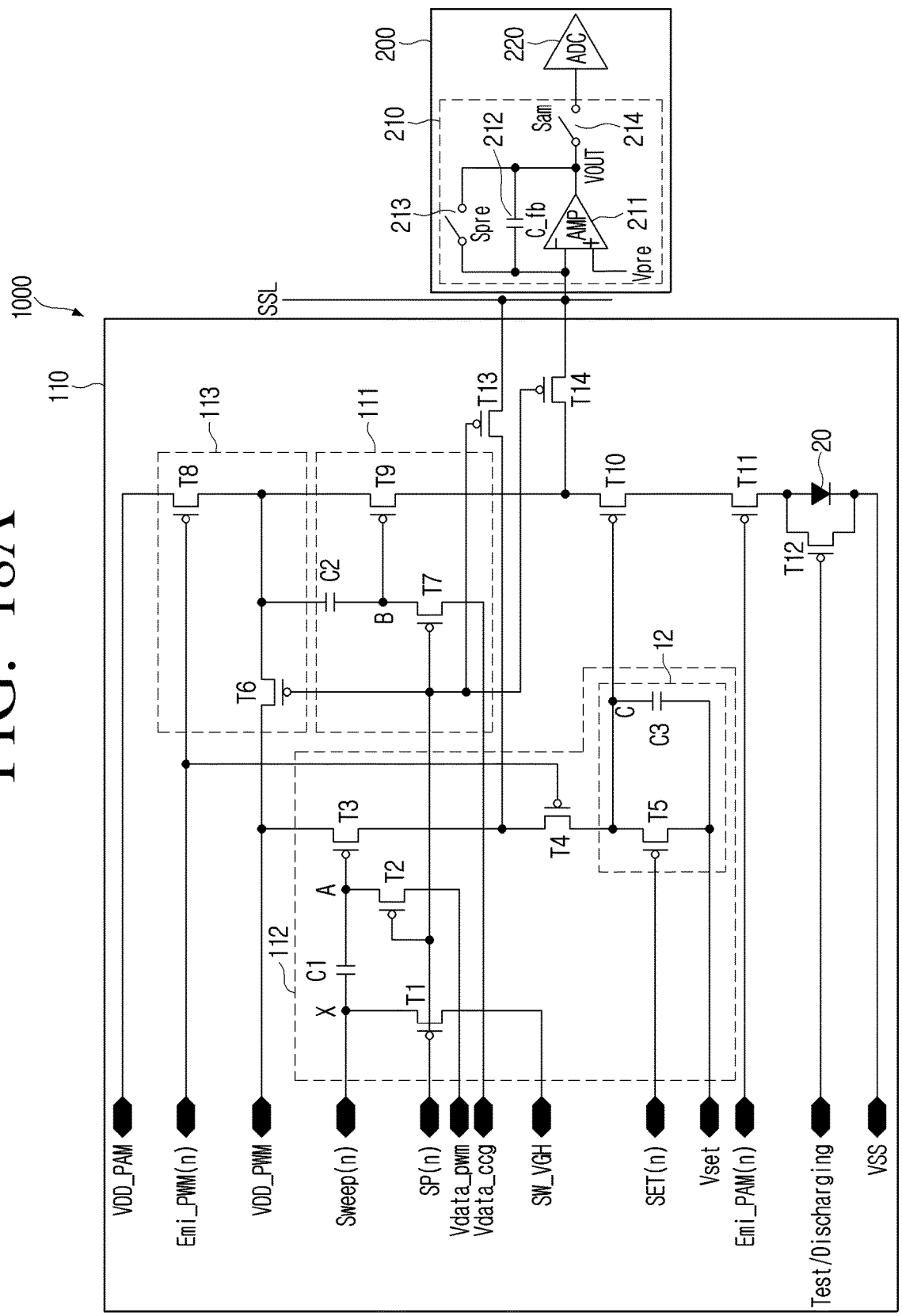
FIG. 18A is a detailed circuit diagram of a sub-pixel circuit and a sensing unit according to another embodiment.
Figure 18B:
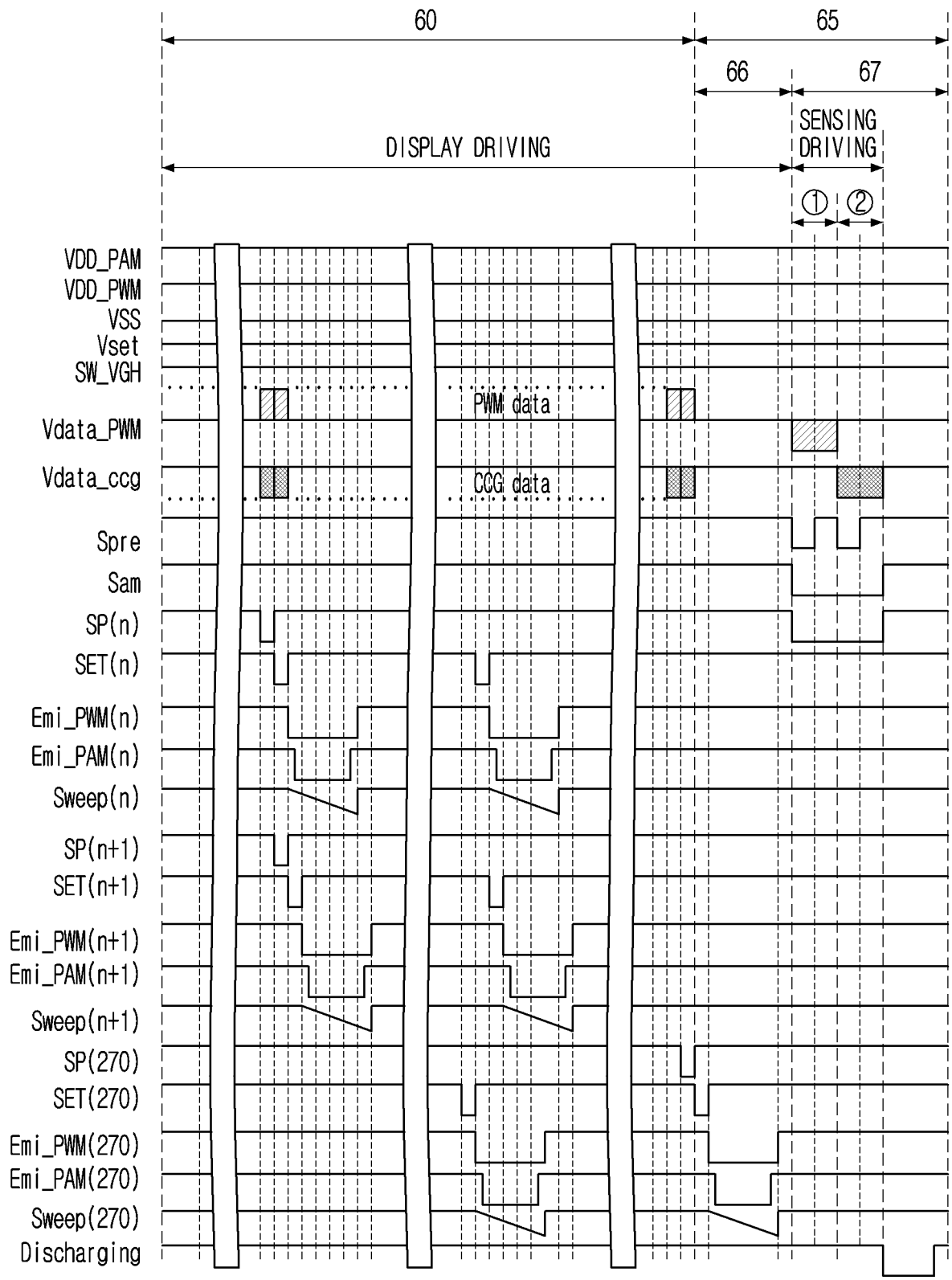
FIG. 18B is a timing diagram of various kinds of signals for driving a display panel including the sub-pixel circuit and the sensing unit illustrated in FIG. 18A during an image frame period and a blanking interval, according to an embodiment.

FIG. 18A is a detailed circuit diagram of the sub-pixel circuit 110 and the sensing unit 200 according to another embodiment of the disclosure, and FIG. 18B is a timing diagram of various kinds of signals for driving a display panel including the sub-pixel circuit and the sensing unit illustrated in FIG. 18A during an image frame period and a blanking interval.

The sub-pixel circuit 110 shown in FIG. 18A is different from that in FIG. 16A only in the feature of using a scan signal SP(n) without using a separate control signal (PWM_Sen(n) and CCG_Sen(n) in FIG. 16A) for controlling the turning-on/turning-off of the transistor T13 and the transistor T14, and is identical to the sub-pixel circuit 110 shown in FIG. 16A in the remaining features. The driving timing diagram shown in FIG. 18B is also identical to the driving timing diagram in FIG. 16B excluding the feature that there are no control signals PWM_Sen(n) and CCG_Sen(n).

Referring to FIGS. 18A and 18B, as a scan signal SP(n) having a low level is applied in a data setting section, not only the transistors T1, T2, T6, and T7, but also the transistors T13 and T14 are turned on together. However, in this case, flowing of a current to the sensing unit 200 may be blocked by turning off a switch inside the amp 211. Accordingly, during the data setting section, a sensing driving operation is not performed, but only a data setting operation is performed.

In embodiments, during a sensing driving period, the aforementioned switch inside the amp 211 may be turned on. Accordingly, during the sensing driving period, the aforementioned first and second currents flow to the sensing unit 200, and accordingly, the aforementioned sensing driving may be performed.

In this case, the second specific voltage is applied to the gate terminal of the second driving transistor T3 during the PWM circuit 112 sensing period (①), and the first specific voltage is applied to the gate terminal of the first driving transistor T9 during the constant current generator circuit 111 sensing period (②), and the time during which the second specific voltage is applied and the time during which the first specific voltage is applied do not overlap with each other. Accordingly, in embodiments, even if a separate control signal (PWM_Sen(n) and CCG_Sen(n)) is not used, the sensing driving operation described through FIGS. 14A and 14B can be performed in the same manner.

Other than the above, the remaining contents regarding the display driving and the sensing driving of the sub-pixel circuit 110, and prevention of phenomena of disuniformity of brightness and horizontal crosstalk by a sweep load, etc. can be sufficiently understood through the contents described above in FIGS. 16A to 17C, and thus overlapping explanation will be omitted.

Figure 19A:
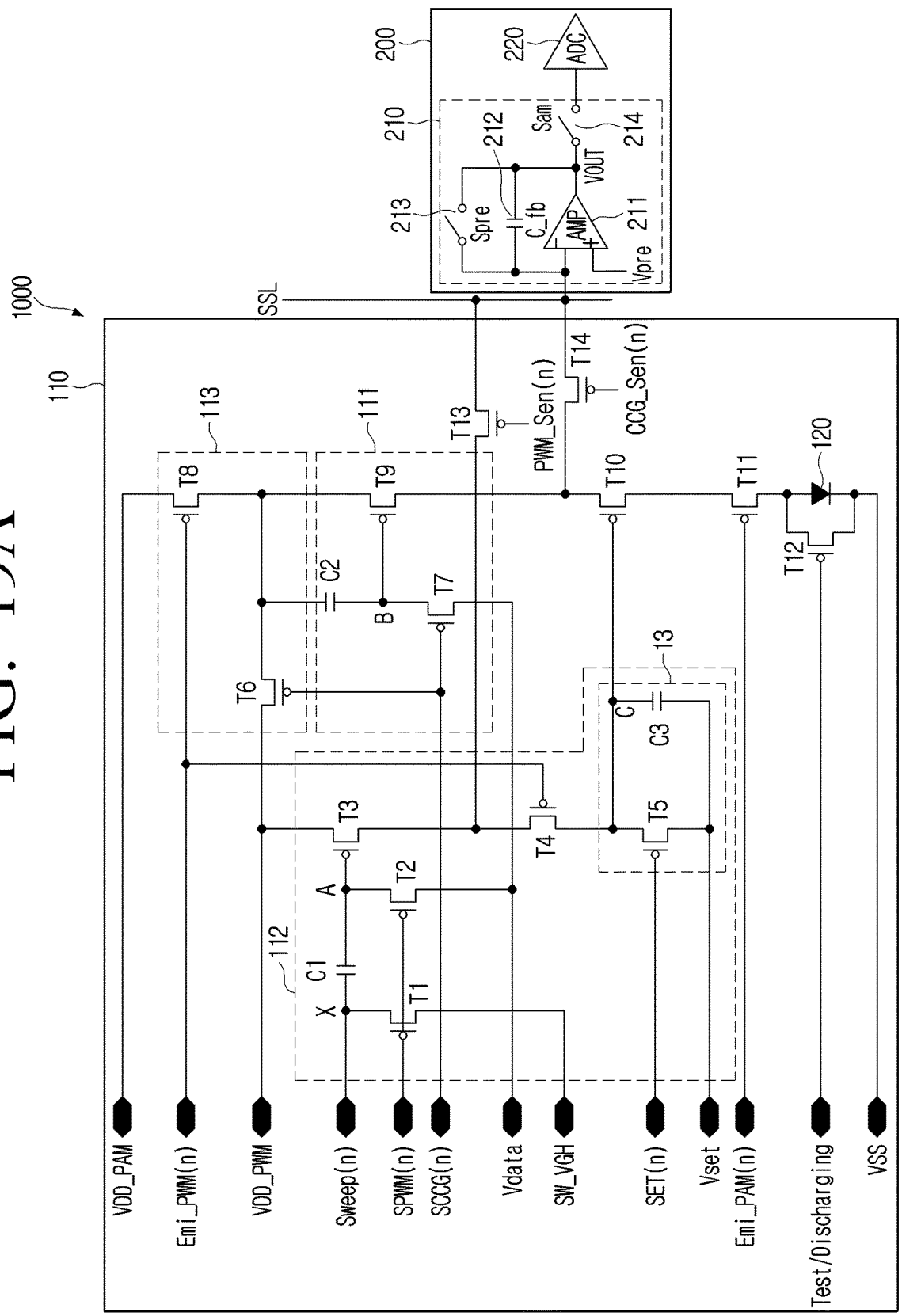
FIG. 19A is a detailed circuit diagram of a sub-pixel circuit and a sensing unit according to still another embodiment.
Figure 19B:
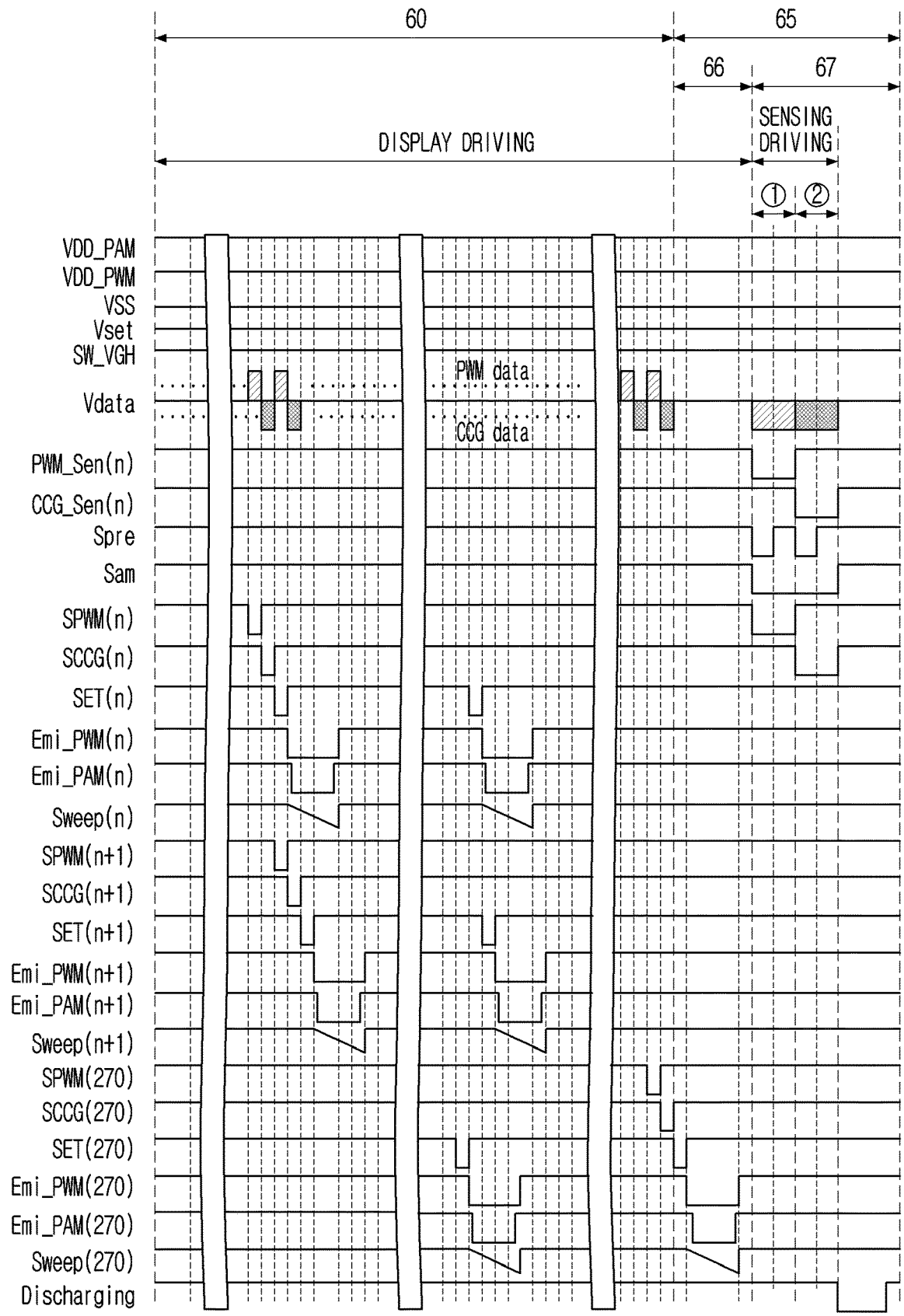
FIG. 19B is a timing diagram of various kinds of signals for driving a display panel including the sub-pixel circuit and the sensing unit illustrated in FIG. 19A during an image frame period and a blanking interval, according to an embodiment.

FIG. 19A is a detailed circuit diagram of the sub-pixel circuit 110 and the sensing unit 200 according to still another embodiment of the disclosure, and FIG. 19B is a timing diagram of various kinds of signals for driving a display panel including the sub-pixel circuit and the sensing unit illustrated in FIG. 19A during an image frame period and a blanking interval.

The sub-pixel circuit 110 shown in FIG. 19A is identical to the sub-pixel circuit 110 shown in FIG. 16A excluding the feature that an image data voltage and a specific voltage are applied through one data signal line Vdata.

In this case, a PWM data voltage and a constant current generator data voltage are time division multiplexed and applied from one data driver to the sub-pixel circuit 110 through the data signal line Vdata during a data setting section. Also, during a sensing driving period, the second specific voltage and the first specific voltage are time division multiplexed and applied from the one data driver to the sub-pixel circuit 110 through the data signal line Vdata.

Accordingly, two scan signals are needed for applying the PWM data voltage and the constant current generator data voltage that are time division multiplexed and applied during the data setting section to the A node and the B node respectively, and for applying the second specific voltage and the first specific voltage that are time division multiplexed and applied during the sensing driving period to the A node and the B node respectively, and the scan signal SPWM(n) and the scan signal SCCG(n) in FIGS. 19A and 19B show the two scan signals as above.

Referring to FIGS. 19A and 19B, when a scan signal SPWM(n) having a low level is applied to the sub-pixel circuit 110 in a data setting section, a PWM data voltage (PWM data) is applied to the A node through the turned-on transistor T2. Also, when a scan signal SCCG(n) having a low level is applied to the sub-pixel circuit 110, a constant current generator data voltage (CCG data) is applied to the B node through the turned-on transistor T7.

In embodiments, during the PWM circuit 112 sensing period (1̂) in the sensing driving period, when a scan signal SPWM(n) having a low level is applied to the sub-pixel circuit 110, the second specific voltage is input to the A node through the turned-on transistor T2. Also, when a scan signal SCCG(n) having a low level is applied to the sub-pixel circuit 110, the first specific voltage is input to the B node through the turned-on transistor T7.

In embodiments, in FIG. 19B, an example wherein scan signals are applied in the order of SPWM(n) and SCCG(n) is suggested, but the disclosure is not limited thereto, and it is obvious that an SCCG(n) signal can be applied first, and an SPWM(n) signal can be applied after that, depending on embodiments.

Other than the above, the remaining contents regarding the display driving and the sensing driving of the sub-pixel circuit 110, and prevention of phenomena of disuniformity of brightness and horizontal crosstalk by a sweep load, etc. can be sufficiently understood through the contents described above in FIGS. 16A to 17C, and thus overlapping explanation will be omitted.

Figure 20A:
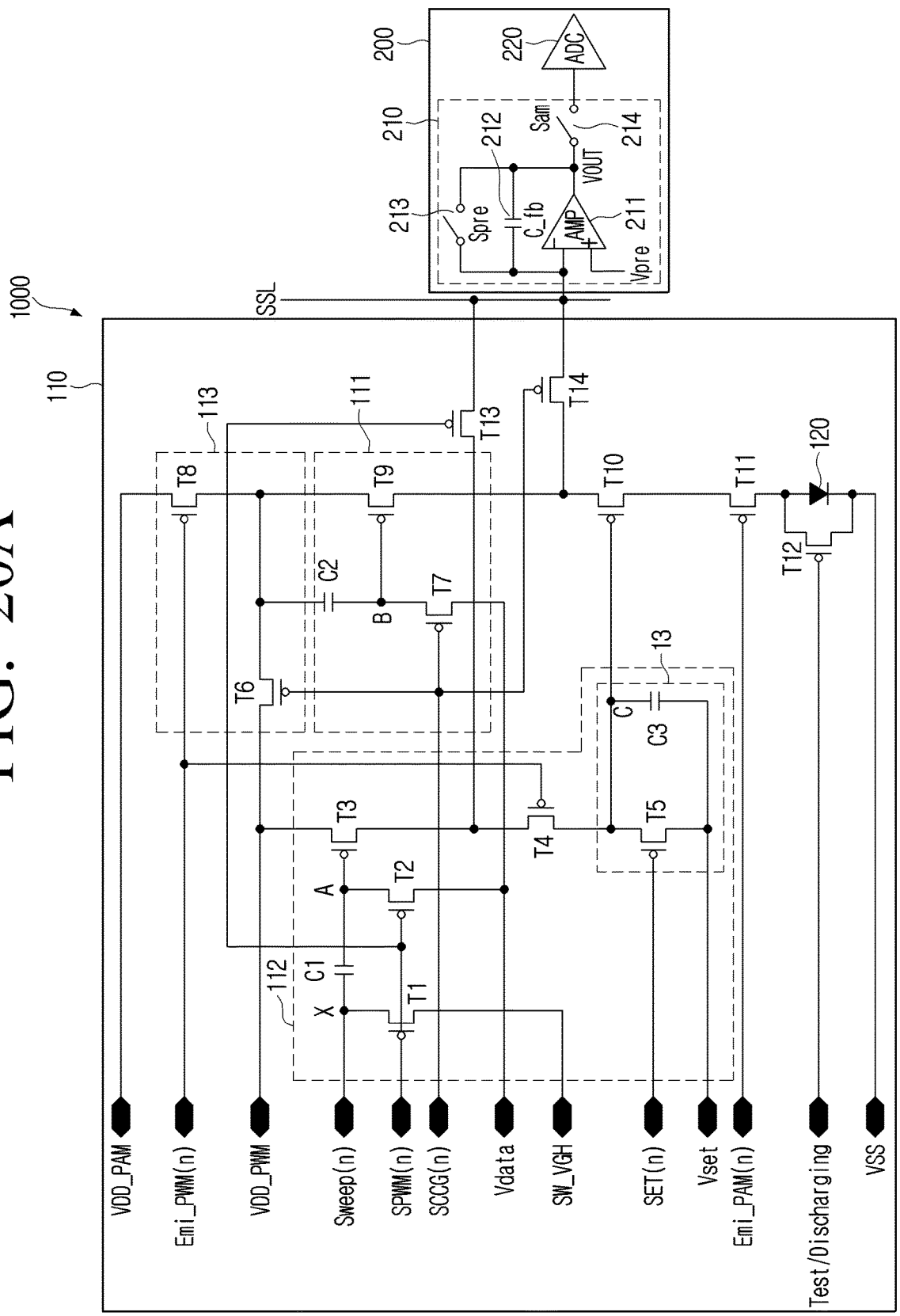
FIG. 20A is a detailed circuit diagram of a sub-pixel circuit and a sensing unit according to still another embodiment.
Figure 20B:
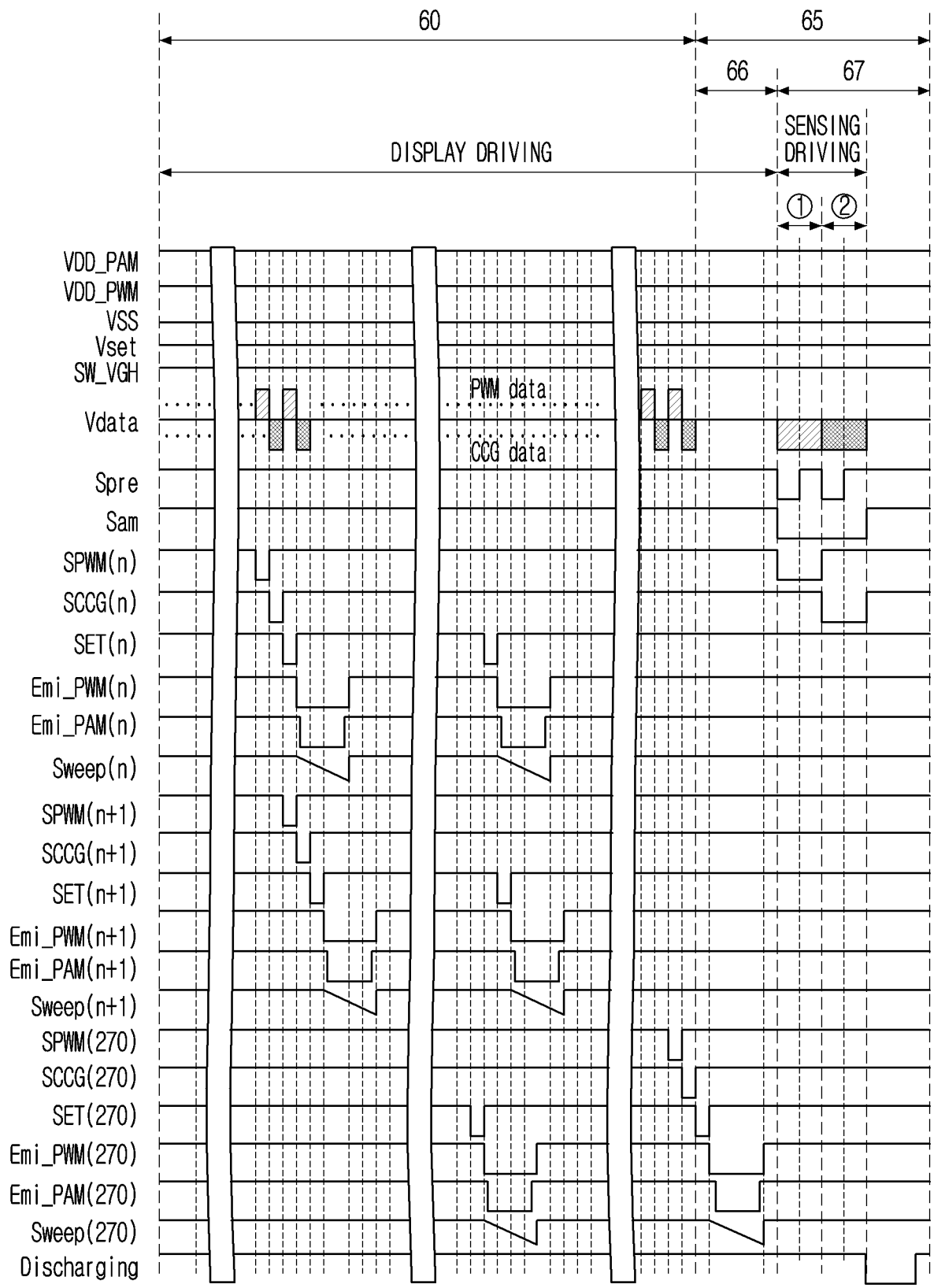
FIG. 20B is a timing diagram of various kinds of signals for driving a display panel including the sub-pixel circuit and the sensing unit illustrated in FIG. 20A during an image frame period and a blanking interval, according to an embodiment.

FIG. 20A is a detailed circuit diagram of the sub-pixel circuit 110 and the sensing unit 200 according to still another embodiment of the disclosure, and FIG. 20B is a timing diagram of various kinds of signals for driving a display panel including the sub-pixel circuit and the sensing unit illustrated in FIG. 20A during an image frame period and a blanking interval.

The sub-pixel circuit 110 illustrated in FIG. 20A is similar to the sub-pixel circuit 110 in FIG. 19A, in that it receives application of an image data voltage (a PWM data voltage, a constant current generator data voltage) and a specific voltage (the second specific voltage, the first specific voltage) through one data signal line Vdata.

Accordingly, referring to FIGS. 20A and 20B, it can be seen that by using two scan signals (or scan signal lines) such as SPWM(n) and SCCG(n), an image data voltage and a specific voltage are respectively applied to the sub-pixel circuit 110 in a data setting section and a sensing driving period.

In embodiments, the sub-pixel circuit 110 illustrated in FIG. 20A is similar to the embodiment of FIG. 18A, in that scan signals are used for controlling the turning-on/turning-off of the transistor T13 and the transistor T14, without using separate control signals (PWM_Sen(n) and CCG_Sen(n) in FIG. 16A or FIG. 19A).

In the case of the embodiment of FIG. 20A, two scan signals such as SPWM(n) and SCCG(n) are used, and thus the gate terminal of the transistor T13 is connected to the scan signal SPWM(n), and the gate terminal of the transistor T14 is connected to the scan signal SCCG(n), as illustrated in the drawing.

In embodiments, in the case of the embodiments in FIGS. 20A and 20B, a current may be made to flow to the sensing unit 200 only during a sensing driving period, by turning off the switch inside the amp 211 during a data setting section, and turning on the switch inside the amp 211 during a sensing driving period, as described above in FIGS. 18A and 18B.

Other than the above, the remaining contents regarding the display driving and the sensing driving of the sub-pixel circuit 110, and prevention of phenomena of disuniformity of brightness and horizontal crosstalk by a sweep load, etc. can be sufficiently understood through the contents described above in FIGS. 16A to 17C, and thus overlapping explanation will be omitted.

In embodiments, like in the case of a display apparatus to which the internal compensation method is applied, a method of connecting a low voltage (SW_VGL) input of a sweep signal to an X node can be considered for resolving the problem of horizontal crosstalk in a display apparatus to which the external compensation method is applied.

Figure 21A:
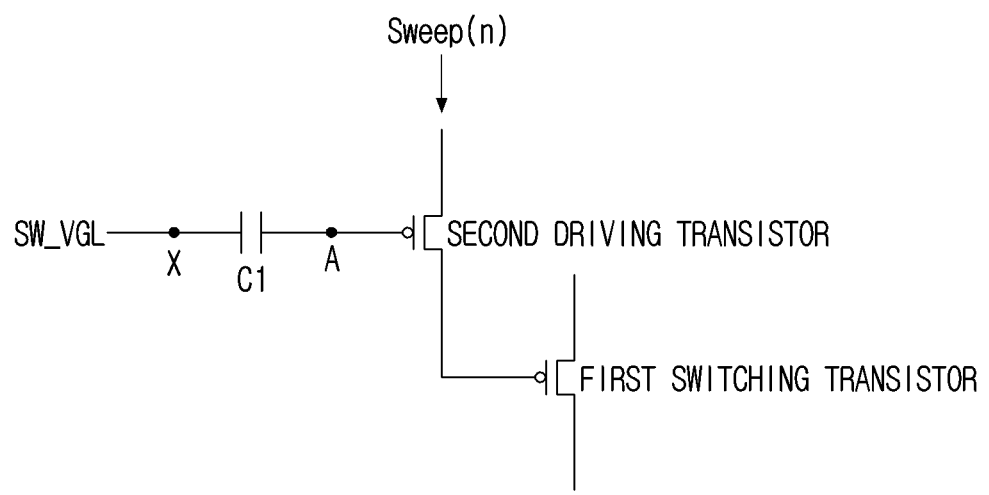
FIG. 21A is a diagram for illustrating an embodiment wherein a low voltage (SW_VGL) input of a sweep signal is connected to an X node, according to an embodiment.
Figure 21B:
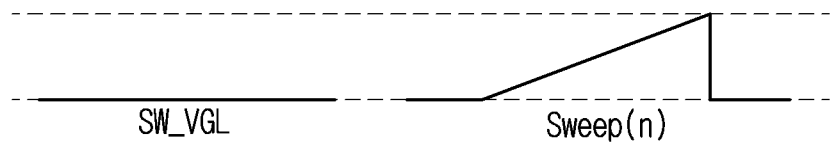
FIG. 21B is a diagram illustrating a low voltage (SW_VGL) of a sweep signal according to an embodiment.

FIGS. 21A and 21B are diagrams for illustrating embodiments wherein a low voltage (SW_VGL) input of a sweep signal is connected to an X node.

According to an embodiment of the disclosure, a low voltage (SW_VGL) of a sweep signal may be applied to the X node, as illustrated in FIG. 21A. In this case, the low voltage (SW_VGL) of the sweep signal may be a global signal that is applied from the power IC to all of the sub-pixel circuits 110 of the display panel 100 identically.

Specifically, the X node may be directly connected to the power IC through a wiring by which the low voltage (SW_VGL) of the sweep signal is applied. Accordingly, even if the voltage of the A node changes by application of a PWM data voltage, the voltage of the X node may be maintained as the low voltage (SW_VGL) of the sweep signal without being influenced by coupling through the capacitor C1.

In embodiments, according to what is illustrated in FIG. 21A, a sweep signal Sweep(n) for PWM driving may be applied to the source terminal of the second driving transistor. In this case, the sweep signal Sweep(n) may be a voltage signal in a form that linearly increases from a low voltage to a high voltage as illustrated in FIG. 21B.

As described above, the PWM circuit controls the time during which a driving current flows in the inorganic light emitting element 120 by controlling turning-on/turning-off operations of the first switching transistor through turning-on/turning-off operations of the second driving transistor, and this is also the same in the embodiment of FIG. 21A.

Specifically, in a state wherein a PWM data voltage is set to the A node, when the voltage of the source terminal of the second driving transistor increases according to a sweep signal Sweep(n), the voltage difference between the gate terminal and the source terminal of the second driving transistor decreases.

When the voltage difference between the gate terminal and the source terminal of the second driving transistor that was decreasing reaches the threshold voltage of the second driving transistor, the second driving transistor is turned on, and the first switching transistor is turned off.

In embodiments, the PWM driving mechanism as above may be the same as in the aforementioned embodiment (the embodiment wherein a sweep signal Sweep(n) is applied to the X node).

According to the embodiment described above, the aforementioned problems of disuniformity of brightness and horizontal crosstalk by a sweep load can be resolved. Also, even if a sweep signal is applied to the source terminal of the second driving transistor, this would not cause a problem in PWM driving of the display panel 100.

Figure 22A:
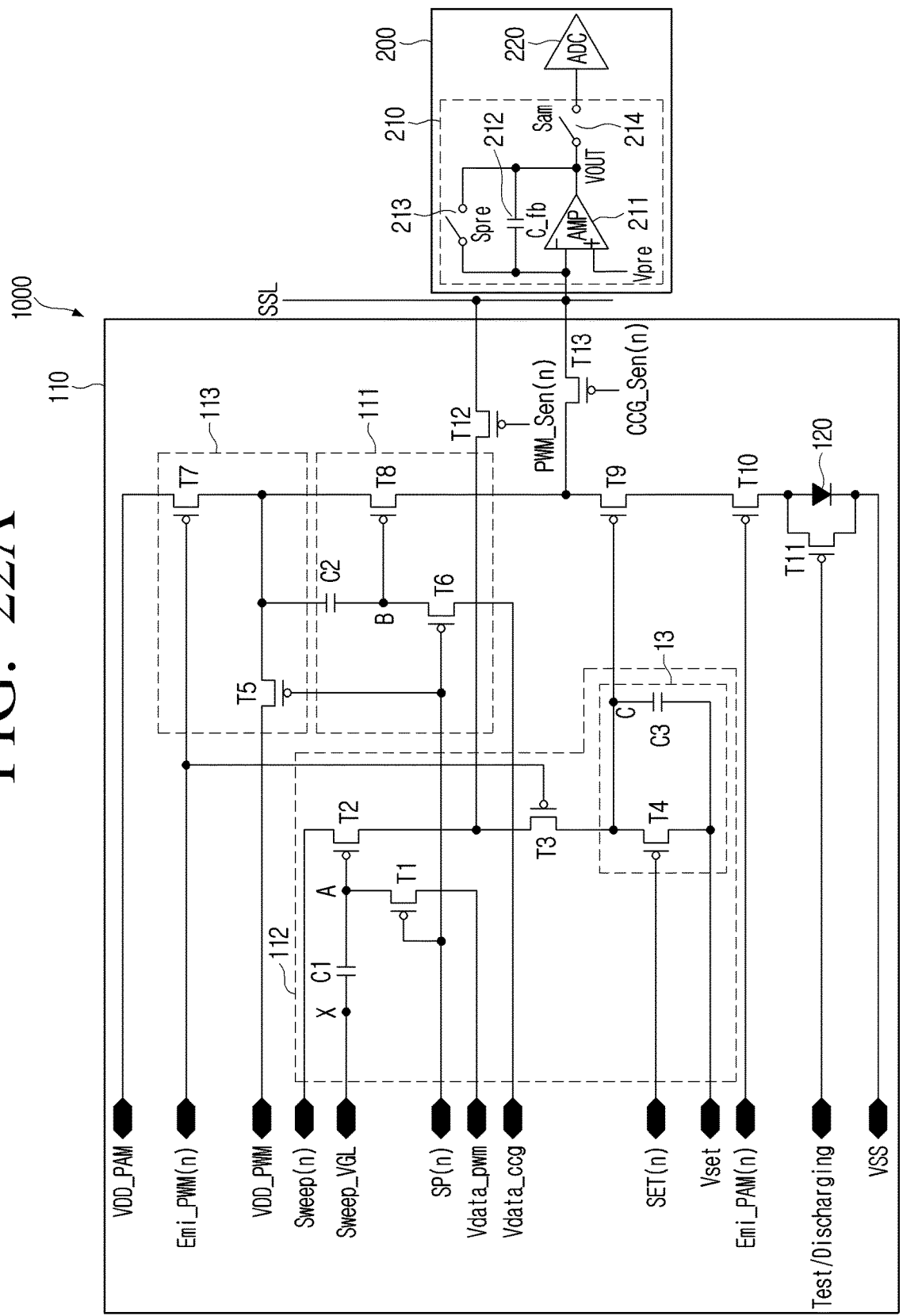
FIG. 22A is a detailed circuit diagram of a sub-pixel circuit and a sensing unit according to an embodiment.
Figure 22B:
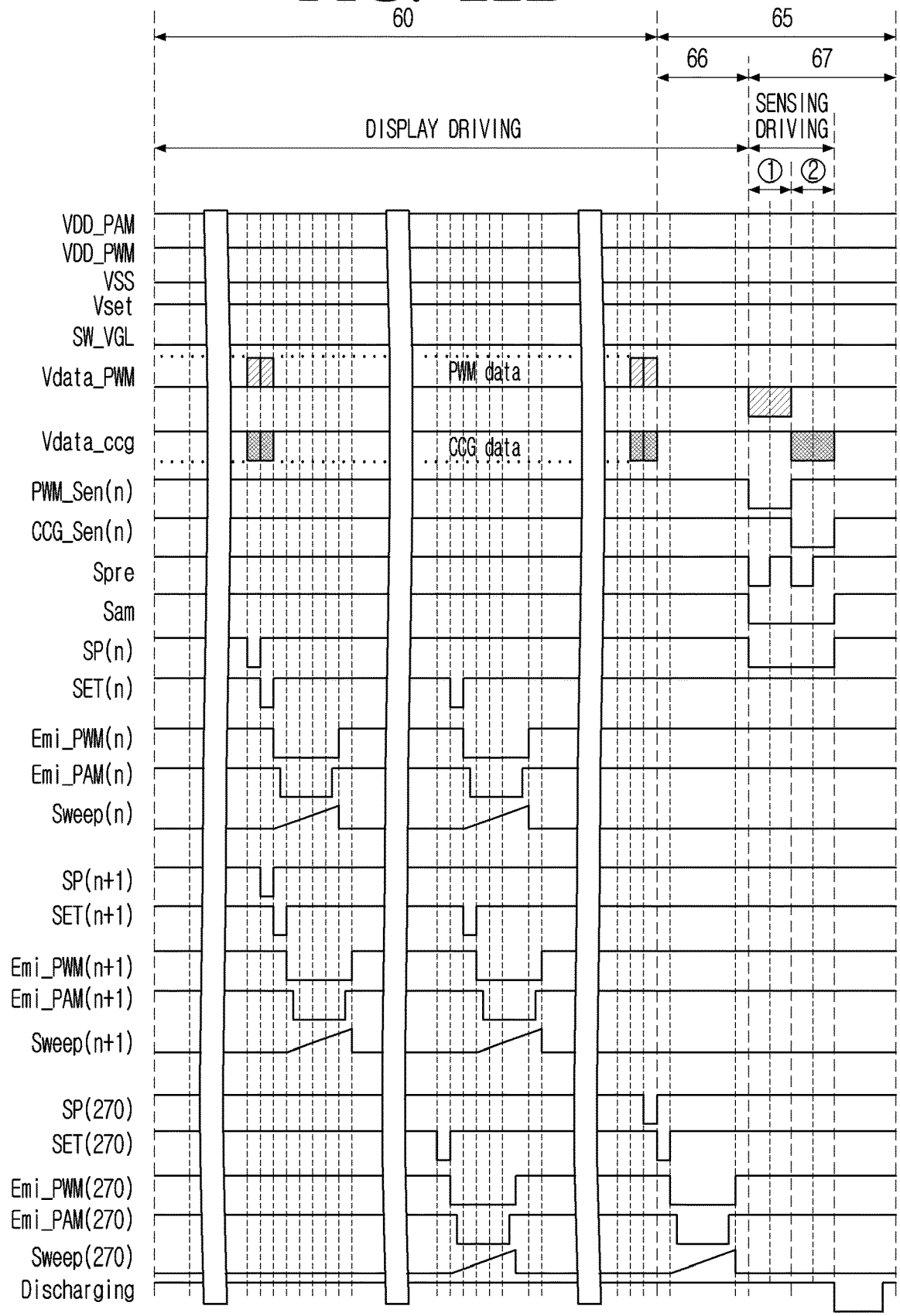
FIG. 22B is a timing diagram of various kinds of signals for driving a display panel including the sub-pixel circuit and the sensing unit in FIG. 22A during an image frame period and a blanking interval, according to an embodiment.

FIG. 22A is a detailed circuit diagram of the sub-pixel circuit 110 and the sensing unit 200 according to an embodiment of the disclosure to which the embodiments described through FIGS. 21A and 21B are applied, and FIG. 22B is a timing diagram of various kinds of signals for driving a display panel including the sub-pixel circuit and the sensing unit in FIG. 22A during an image frame period and a blanking interval.

The embodiments illustrated in FIGS. 22A and 22B have similar configurations and operation principles as those described above through FIGS. 16A to 16B, and thus overlapping explanation will be omitted, and explanation will be made focused on differences.

In the sub-pixel circuit 110 in FIG. 22A, the SW_VGL signal line is directly connected to the X node. Accordingly, unlike in the sub-pixel circuit 110 in FIG. 16A, a transistor T1 for applying an SW_VGH signal to the X node during a data setting section is not needed.

Referring to FIG. 22A, it can be seen that a transistor does not exist in a location corresponding to the transistor T1 in FIG. 16A. Accordingly, comparing the reference numerals in FIGS. 22A and 16A, it can be seen that the reference numerals for the transistors in the same locations in FIG. 22A are described as numbers preceding the corresponding reference numerals in FIG. 16A by one.

In embodiments, in the sub-pixel circuit 110 in FIG. 16A, a sweep voltage that linearly decreases from a high voltage (SW_VGH) of a sweep signal to a low voltage of the sweep signal as illustrated in FIG. 16B is applied to the X node during a light emitting section.

However, in the sub-pixel circuit 110 in FIG. 22A, it can be seen that a sweep voltage that linearly increases from a low voltage (SW_VGL) of a sweep signal to a high voltage of the sweep signal as illustrated in FIG. 22B is applied to the source terminal of the second driving transistor T2 during a light emitting section.

The operation of the PWM circuit 112 according to a sweep signal Sweep(n) in the embodiment of FIG. 22A is explained in detail as below based on an example.

For example, in a state wherein a voltage of +13[V] (specifically, a PWM data voltage (+14[V])+the threshold voltage (−1[V]) of the second driving transistor T2) is set to the A node during a data setting section, if a sweep signal (e.g., a voltage that linearly increases from +10[V] to +15[V]) is applied to the source terminal of the second driving transistor T2, the voltage difference between the gate terminal and the source terminal of the second driving transistor T2 decreases from +3[V] to −2[V].

In this case, when the voltage difference between the gate terminal and the source terminal of the second driving transistor T2 that was decreasing from +3[V] reaches the threshold voltage (−1[V]) of the second driving transistor T2, the second driving transistor T2 is turned on. Also, +14[V] which is the sweep voltage when the second driving transistor T2 is turned on is applied to the first switching transistor T9, and the first switching transistor T9 is turned off.

It In embodiments, the operation mechanism of the PWM circuit 112 in FIG. 22A as above may be the same as the operation mechanism of the PWM circuit 112 described in FIGS. 16A and 16B, while there are only differences in the form of the sweep signal and the terminal to which the sweep signal is input.

The remaining contents regarding the configuration and the driving of the sub-pixel circuit 110 illustrated in FIGS. 22A and 22B can be sufficiently understood through the contents described above in FIGS. 16A and 16B, and thus overlapping explanation will be omitted.

FIGS. 23A to 25B illustrate other embodiments of the disclosure to which the embodiments described through FIGS. 21A and 21B are applied. The embodiments illustrated in FIGS. 23A to 25B have similar configurations and operation principles as those described above through FIGS. 22A and 22B, and thus overlapping explanation will be omitted.

Figure 23A:
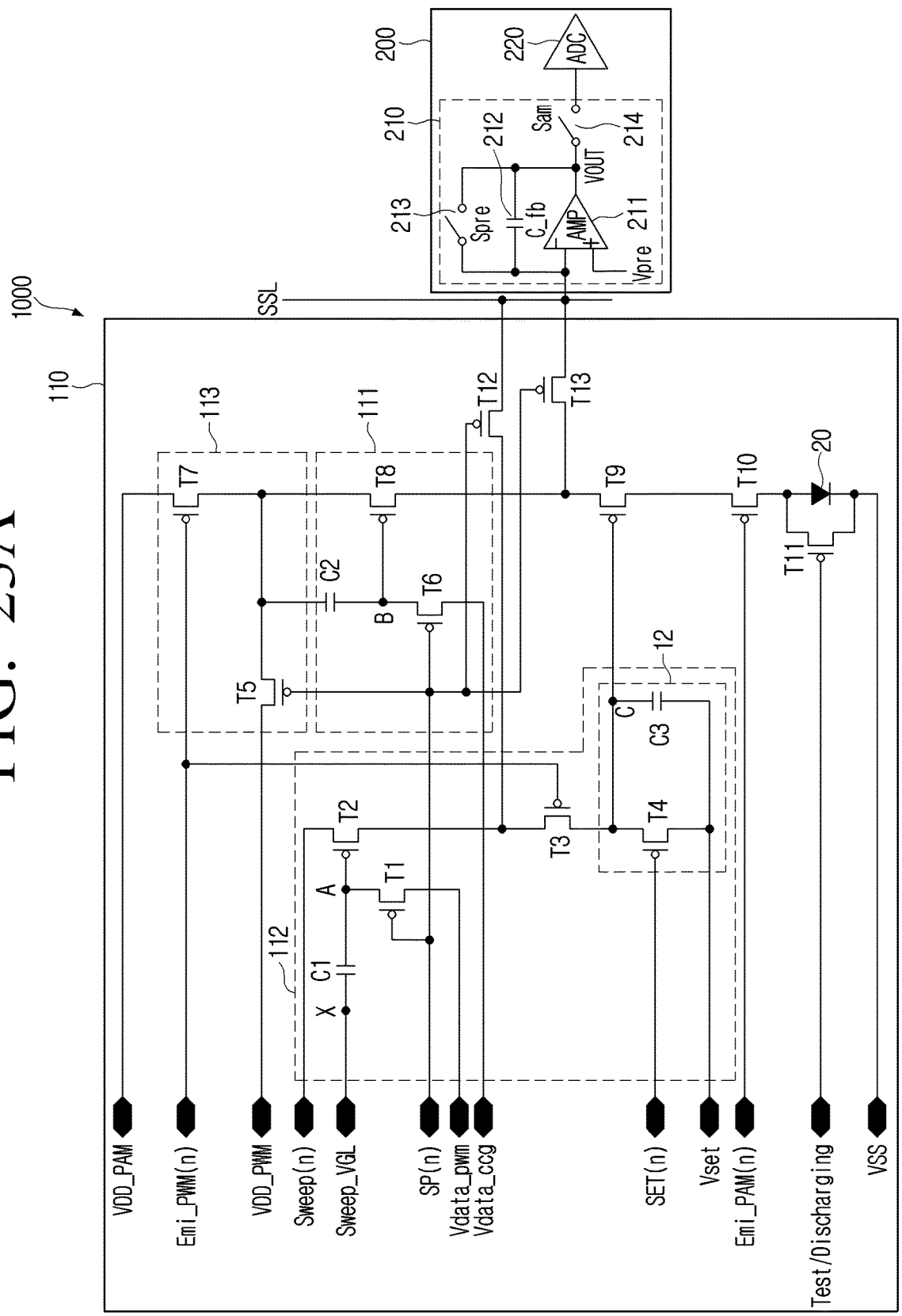
FIG. 23A is a detailed circuit diagram of a sub-pixel circuit and a sensing unit according to another embodiment.
Figure 23B:
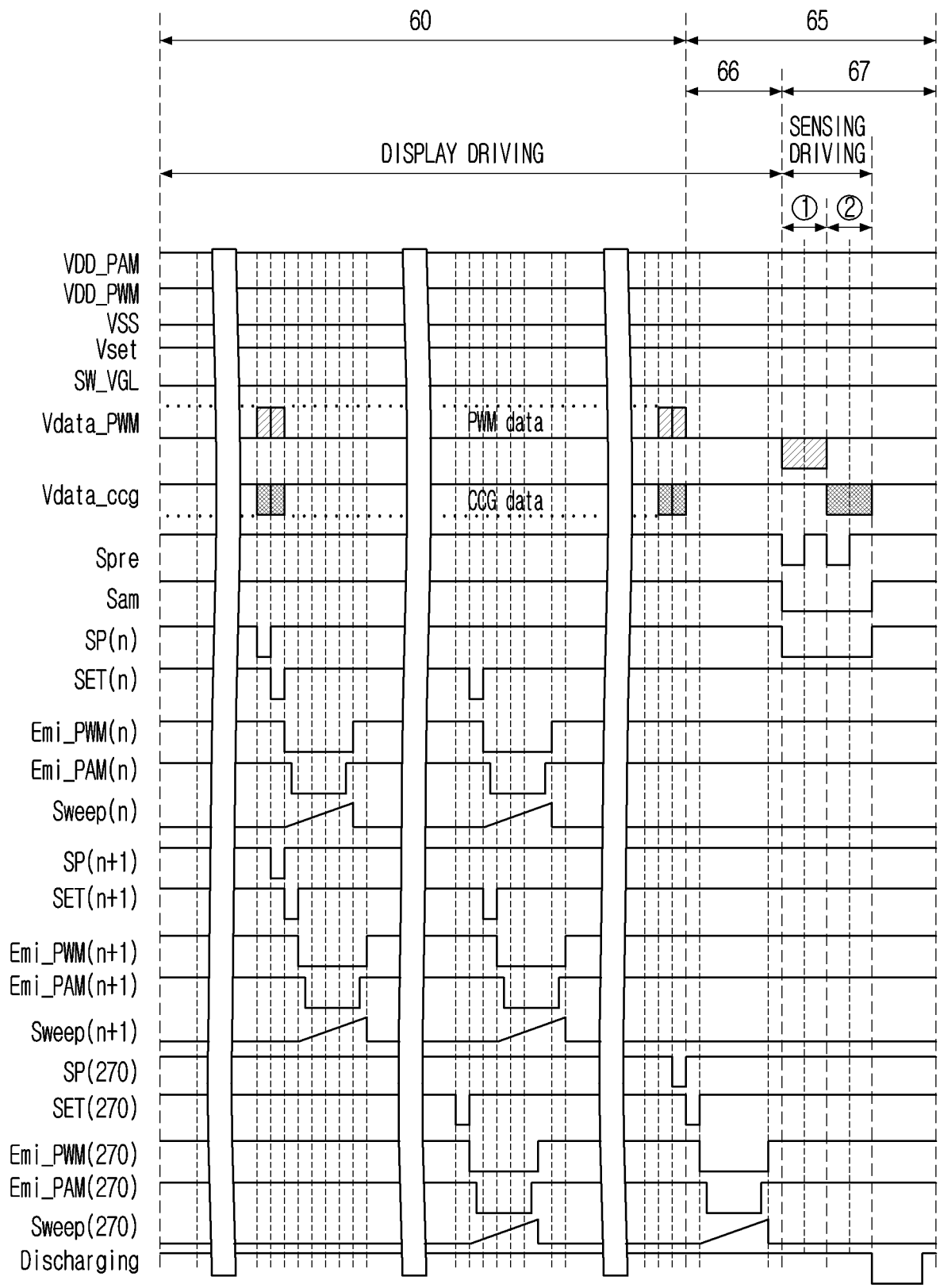
FIG. 23B is a timing diagram of various kinds of signals for driving a display panel including the sub-pixel circuit and the sensing unit in FIG. 23A during an image frame period and a blanking interval, according to an embodiment.

FIG. 23A is a detailed circuit diagram of the sub-pixel circuit 110 and the sensing unit 200 according to another embodiment of the disclosure, and FIG. 23B is a timing diagram of various kinds of signals for driving a display panel including the sub-pixel circuit and the sensing unit in FIG. 23A during an image frame period and a blanking interval.

The sub-pixel circuit 110 shown in FIG. 23A is different from that in FIG. 22A only in the feature of using a scan signal SP(n) without using a separate control signal (PWM_Sen(n) and CCG_Sen(n) in FIG. 22A) for controlling the turning-on/turning-off of the transistor T12 and the transistor T13, and is identical to the sub-pixel circuit 110 shown in FIG. 22A in the remaining features. The driving timing diagram shown in FIG. 23B is also identical to the driving timing diagram in FIG. 22B excluding the feature that there are no control signals PWM_Sen(n) and CCG_Sen(n).

Referring to FIGS. 23A and 23B, as a scan signal SP(n) having a low level is applied in a data setting section, not only the transistors T1, T5, and T6, but also the transistors T12 and T13 are turned on together. However, in this case, flowing of a current to the sensing unit 200 may be blocked by turning off a switch inside the amp 211. Accordingly, during the data setting section, a sensing driving operation is not performed, but only a data setting operation is performed.

In embodiments, during a sensing driving period, the switch inside the amp 211 may be turned on. Accordingly, during the sensing driving period, the aforementioned first and second currents flow to the sensing unit 200, and accordingly, the aforementioned sensing driving may be performed.

In this case, the second specific voltage is applied to the gate terminal of the second driving transistor T2 during the PWM circuit 112 sensing period (①), and the first specific voltage is applied to the gate terminal of the first driving transistor T8 during the constant current generator circuit 111 sensing period (②), and the time during which the second specific voltage is applied and the time during which the first specific voltage is applied do not overlap with each other. Accordingly, even if a separate control signal (PWM_Sen(n) and CCG_Sen(n)) is not used, the sensing driving can be performed without a problem.

Other than the above, the remaining contents regarding the display driving and the sensing driving of the sub-pixel circuit 110 can be sufficiently understood through the contents described above in FIGS. 16A and 16B, and the contents regarding prevention of phenomena of disuniformity of brightness and horizontal crosstalk by a sweep load, etc. can be sufficiently understood through the contents described above in FIGS. 21A to 22B, and thus overlapping explanation will be omitted.

Figure 24A:
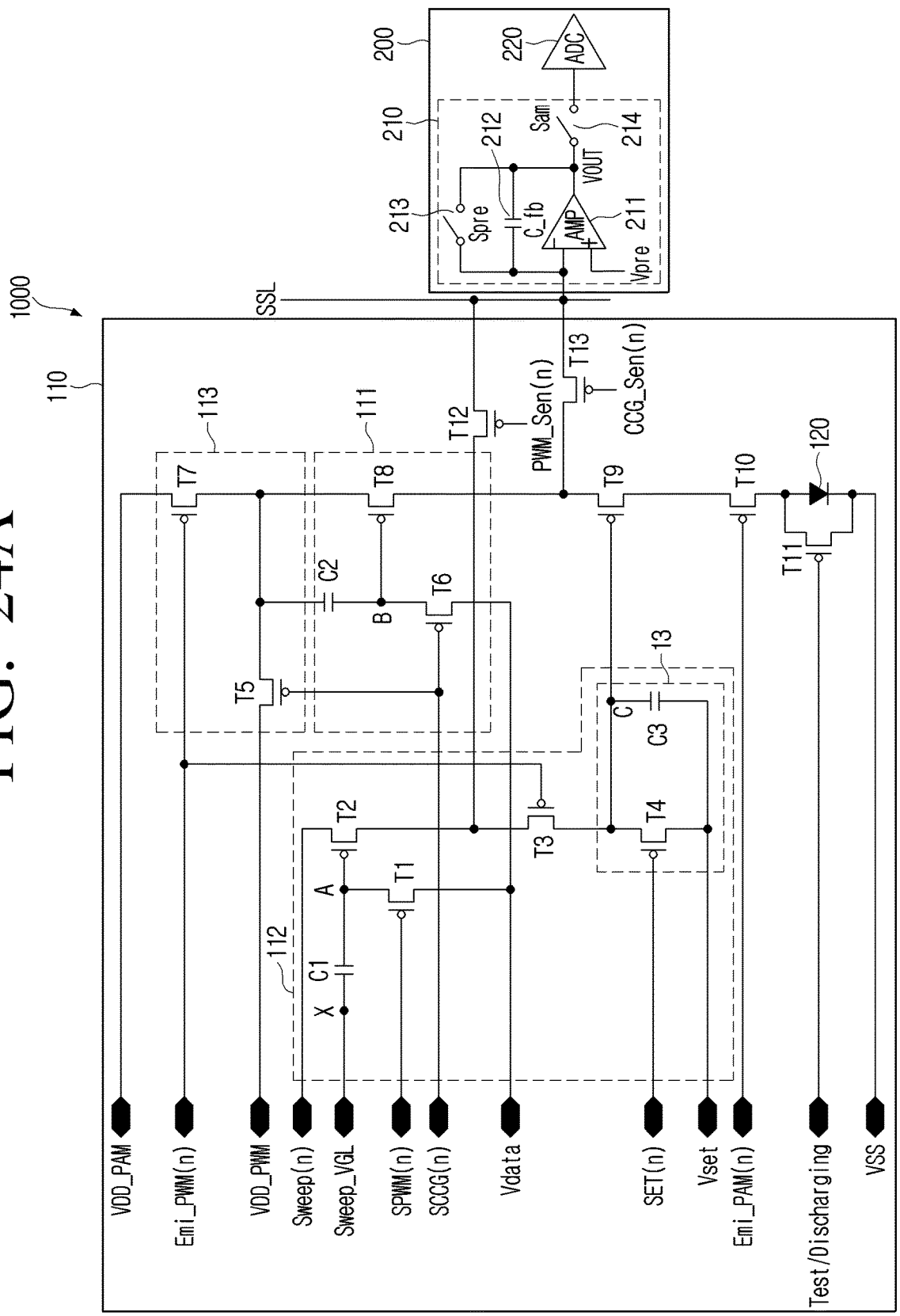
FIG. 24A is a detailed circuit diagram of a sub-pixel circuit and a sensing unit according to still another embodiment.
Figure 24B:
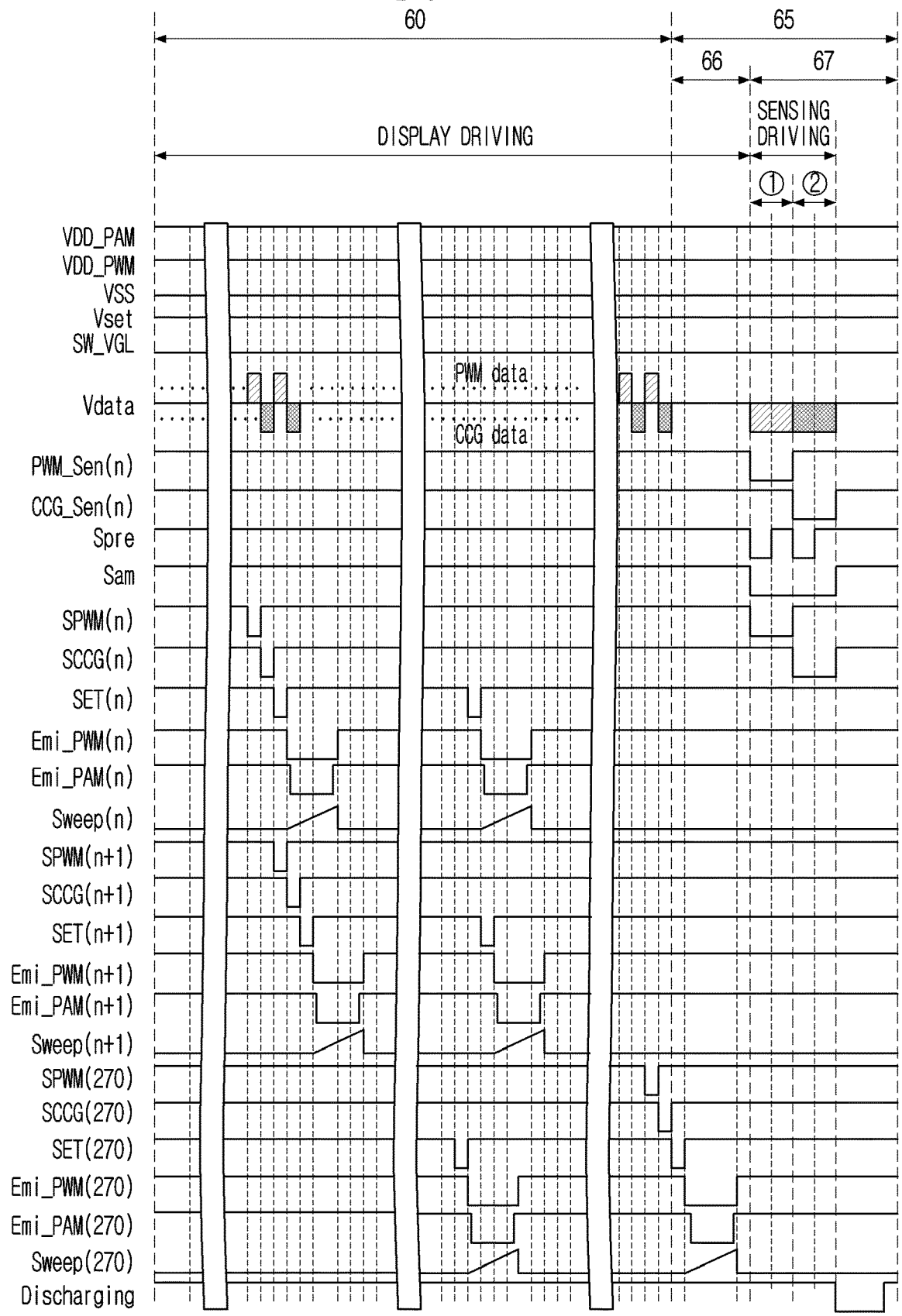
FIG. 24B is a timing diagram of various kinds of signals for driving a display panel including the sub-pixel circuit and the sensing unit illustrated in FIG. 24A during an image frame period and a blanking interval, according to an embodiment.

FIG. 24A is a detailed circuit diagram of the sub-pixel circuit 110 and the sensing unit 200 according to still another embodiment of the disclosure, and FIG. 24B is a timing diagram of various kinds of signals for driving a display panel including the sub-pixel circuit and the sensing unit illustrated in FIG. 24A during an image frame period and a blanking interval.

The sub-pixel circuit 110 shown in FIG. 24A is identical to the sub-pixel circuit 110 shown in FIG. 22A excluding the feature that an image data voltage and a specific voltage are applied through one data signal line Vdata. In this case, two scan signals are needed as described above in the explanation regarding FIGS. 19A and 19B, and the scan signal SPWM(n) and the scan signal SCCG(n) in FIGS. 24A and 24B show the two scan signals as above.

Referring to FIGS. 24A and 24B, when a scan signal SPWM(n) having a low level is applied to the sub-pixel circuit 110 in a data setting section, a PWM data voltage (PWM data) is applied to the A node through the turned-on transistor T1. Also, when a scan signal SCCG(n) having a low level is applied to the sub-pixel circuit 110, a constant current generator data voltage (CCG data) is applied to the B node through the turned-on transistor T6.

In embodiments, during the PWM circuit 112 sensing period (①) in the sensing driving period, when a scan signal SPWM(n) having a low level is applied to the sub-pixel circuit 110, the second specific voltage is input to the A node through the turned-on transistor T1. Also, when a scan signal SCCG(n) having a low level is applied to the sub-pixel circuit 110, the first specific voltage is input to the B node through the turned-on transistor T6.

In embodiments, in FIG. 24B, an example wherein scan signals are applied in the order of SPWM(n) and SCCG(n) is suggested, but the disclosure is not limited thereto, and it is obvious that an SCCG(n) signal can be applied first, and an SPWM(n) signal can be applied after that, depending on embodiments.

Other than the above, the remaining contents regarding the display driving and the sensing driving of the sub-pixel circuit 110 can be sufficiently understood through the contents described above in FIGS. 16A and 16B, and the contents regarding prevention of phenomena of disuniformity of brightness and horizontal crosstalk by a sweep load, etc. can be sufficiently understood through the contents described above in FIGS. 21A to 22B, and thus overlapping explanation will be omitted.

Figure 25A:
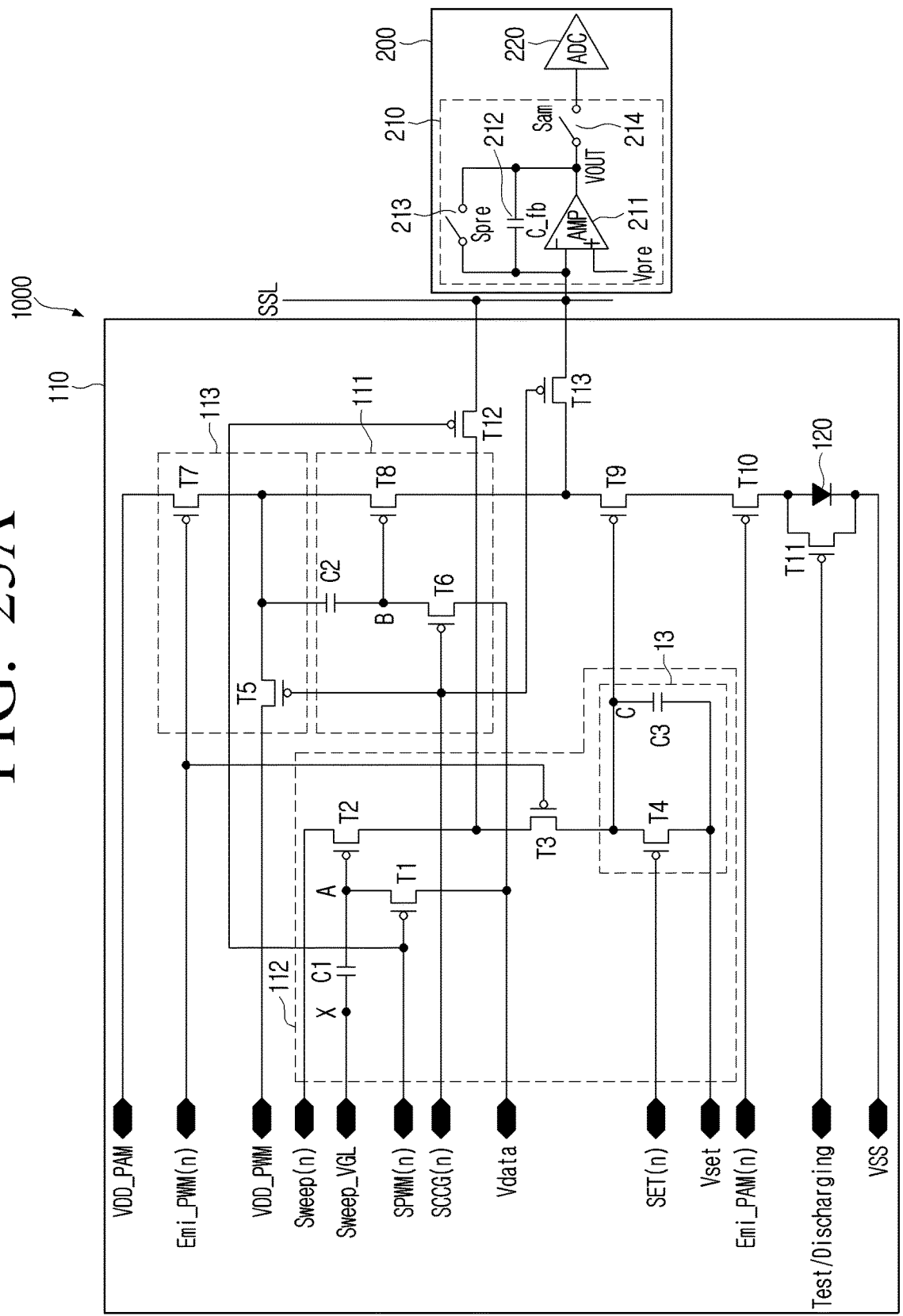
FIG. 25A is a detailed circuit diagram of a sub-pixel circuit and a sensing unit according to still another embodiment.
Figure 25B:
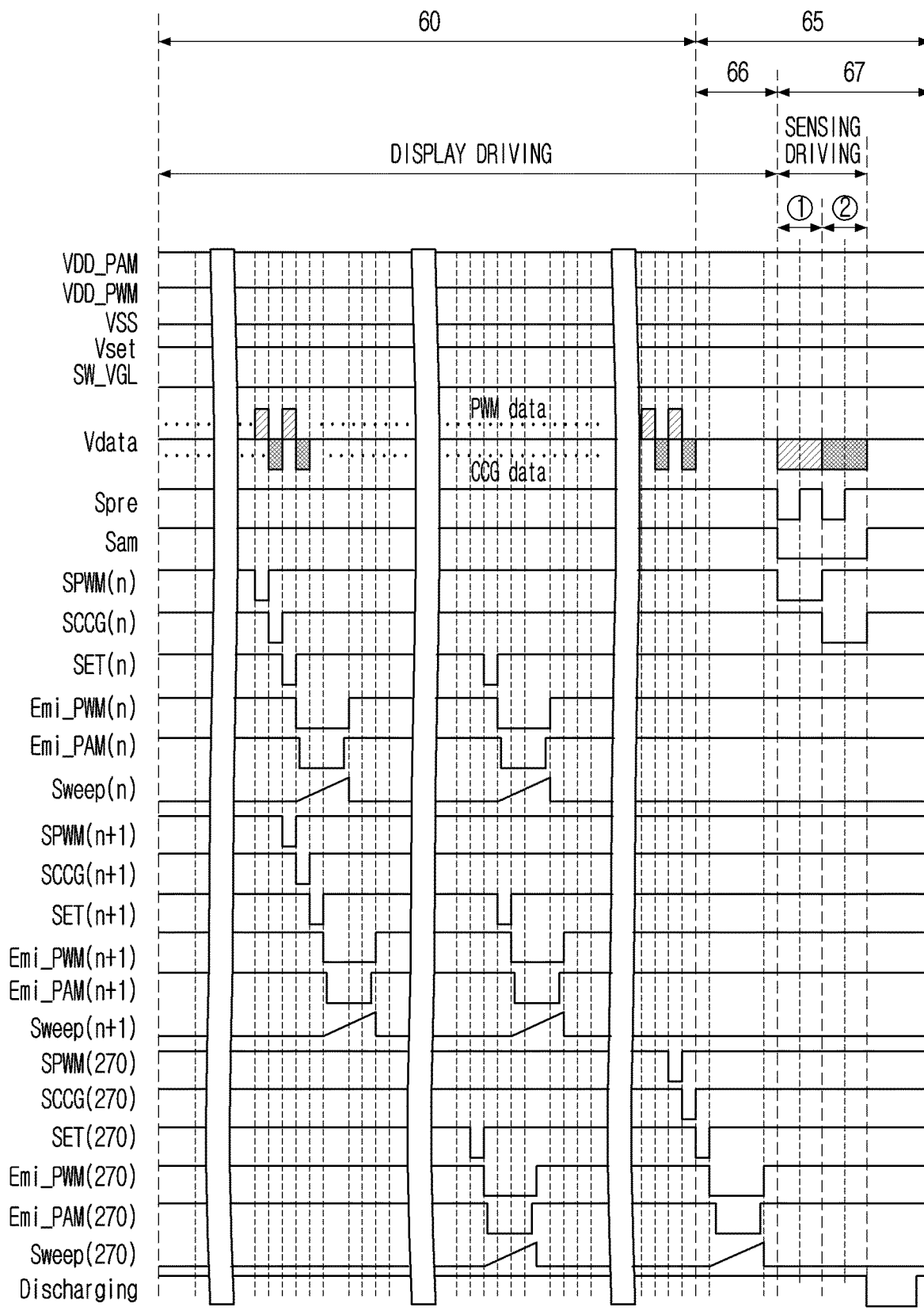
FIG. 25B is a timing diagram of various kinds of signals for driving a display panel including the sub-pixel circuit and the sensing unit illustrated in FIG. 25A during an image frame period and a blanking interval, according to an embodiment.

FIG. 25A is a detailed circuit diagram of the sub-pixel circuit 110 and the sensing unit 200 according to still another embodiment of the disclosure, and FIG. 25B is a timing diagram of various kinds of signals for driving a display panel including the sub-pixel circuit and the sensing unit illustrated in FIG. 25A during an image frame period and a blanking interval.

The sub-pixel circuit 110 illustrated in FIG. 25A is similar to the sub-pixel circuit 110 in FIG. 24A, in that it receives application of an image data voltage (a PWM data voltage, a constant current generator data voltage) and a specific voltage (the second specific voltage, the first specific voltage) through one data signal line Vdata.

Accordingly, referring to FIGS. 25A and 25B, it can be seen that by using two scan signals (or scan signal lines) such as SPWM(n) and SCCG(n), an image data voltage and a specific voltage are respectively applied to the sub-pixel circuit 110 in a data setting section and a sensing driving period.

In embodiments, the sub-pixel circuit 110 illustrated in FIG. 25A is similar to the embodiment of FIG. 23A, in that scan signals are used for controlling the turning-on/turning-off of the transistor T12 and the transistor T13, without using separate control signals (PWM_Sen(n) and CCG_Sen(n) in FIG. 24A).

In the case of the embodiment of FIG. 25A, two scan signals such as SPWM(n) and SCCG(n) are used, and thus the gate terminal of the transistor T12 is connected to the scan signal SPWM(n), and the gate terminal of the transistor T13 is connected to the scan signal SCCG(n), as illustrated in the drawing.

In embodiments, in the case of the embodiments in FIGS. 25A and 25B, a current may be made to flow to the sensing unit 200 only during a sensing driving period, by turning off the switch inside the amp 211 during a data setting section, and turning on the switch inside the amp 211 during a sensing driving period, as described above in FIGS. 23A and 23B.

Other than the above, the remaining contents regarding the display driving and the sensing driving of the sub-pixel circuit 110 can be sufficiently understood through the contents described above in FIGS. 16A and 16B, and the contents regarding prevention of phenomena of disuniformity of brightness and horizontal crosstalk by a sweep load, etc. can be sufficiently understood through the contents described above in FIGS. 21A to 22B, and thus overlapping explanation will be omitted.

Hereinafter, other embodiments of the display apparatus to which the external compensation method is applied will be described with reference to FIGS. 26A to 33B.

Here, FIGS. 26A to 29B illustrate embodiments to which a method of applying a high voltage (SW_VGH) of a sweep signal to an X node to which the sweep signal is applied during a data setting section is applied, regarding the problems of disuniformity of brightness and horizontal crosstalk by a sweep load. In embodiments, FIGS. 30A to 33B illustrate embodiments to which a method of applying a low voltage (SW_VGL) of a sweep signal to an X node, and applying a sweep signal to the source terminal of the second driving transistor is applied, regarding the problems of disuniformity of brightness and horizontal crosstalk by a sweep load.

Among the aforementioned contents, regarding the contents that can be applied identically to the embodiments illustrated in FIGS. 26A to 33B, overlapping explanation will be omitted, or brief explanation will be made, even if there may be slight differences (e.g., a case wherein there is only a difference in the reference numerals of the transistors, etc.).

Figure 26A:
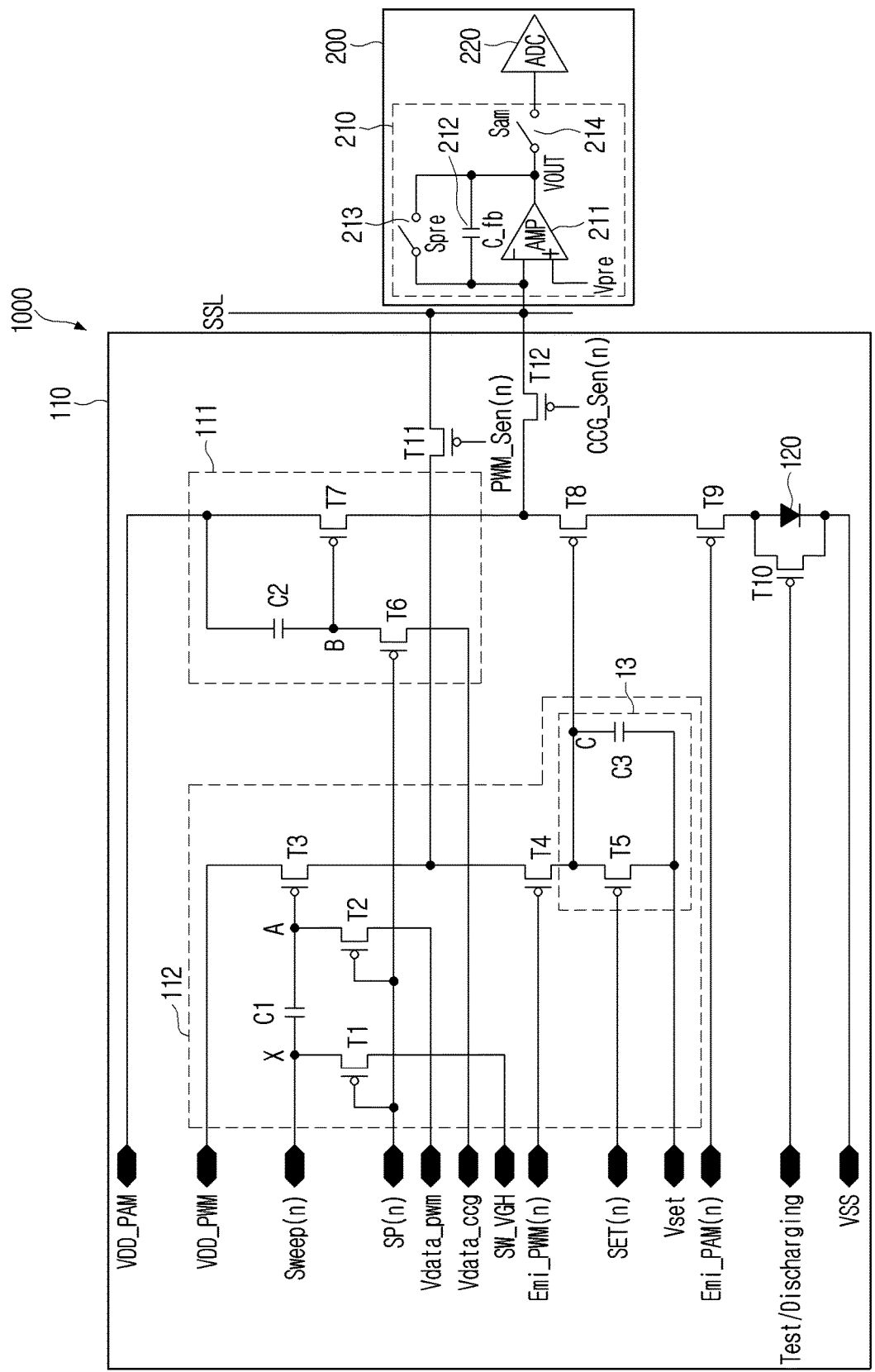
FIG. 26A is a detailed circuit diagram of a sub-pixel circuit and a sensing unit according to an embodiment.

FIG. 26A is a detailed circuit diagram of the sub-pixel circuit 110 and the sensing unit 200 according to an embodiment of the disclosure.

According to FIG. 26A, the sub-pixel circuit 110 includes a constant current generator circuit 111, a PWM circuit 112, a first switching transistor T8, a second switching transistor T9, a transistor T10, a transistor T11, and a transistor T12.

The constant current generator circuit 111 includes a first driving transistor T7, a capacitor C2 connected between the source terminal and the gate terminal of the first driving transistor T7, and a transistor T6 that is controlled to be turned on/turned off according to a scan signal SP(n), and that is for applying a constant current generator data voltage applied through a data signal line Vdata_ccg to the gate terminal of the first driving transistor T7 while it is turned on.

The PWM circuit 112 includes a second driving transistor T3 of which source terminal is connected to a second driving voltage (VDD_PWM) terminal, a capacitor C1 for coupling a sweep signal which sweeps between two different voltages to the gate terminal of the second driving transistor T3, and a transistor T2 that is controlled to be turned on/turned off according to a scan signal SP(n), and that is for applying a PWM data voltage applied through a data signal line Vdata_pwm to the gate terminal of the second driving transistor T3 while it is turned on.

Also, the PWM circuit 112 includes a reset unit 13. The reset unit 13 is a component for forcefully turning on the first switching transistor T8 before each light emitting section starts. The detailed content regarding the reset unit 13 is as described above.

In addition, the PWM circuit 112 includes a transistor T1 of which source terminal is connected to the SW_VGH signal line, and of which gate terminal is connected to the SP(n) signal line, and of which drain terminal is connected to the X node. In this case, the source terminal of the transistor T1 may be directly connected to the wiring through which the high voltage (SW_VGH) of the sweep signal is applied from the power IC.

Accordingly, while a low voltage is applied through the SP(n) signal line and a PWM data voltage is set to the A node, the high voltage (SW_VGH) of the sweep signal that is applied through the turned-on transistor T1 is forcefully applied to the X node, and the voltage of the X node may be maintained as the high voltage (SW_VGH) of the sweep signal regardless of the change of the voltage of the A node.

Accordingly, phenomena of disuniformity of brightness and horizontal crosstalk that may occur by a sweep load can be prevented or minimized, as described above.

In embodiments, referring to FIG. 26A, it can be seen that the drain terminal of the second driving transistor T3 is connected to the gate terminal of the first switching transistor T8 through a transistor T4 that is turned on according to an emission signal Emi_PWM(n).

Accordingly, the PWM circuit 112 may control the time during which a driving current flows in the inorganic light emitting element 120 in a light emitting section, by controlling turning-on/turning-off operations of the first switching transistor T8 through an operation of the reset unit 13 and turning-on/turning-off operations of the second driving transistor T3.

The source terminal of the second switching transistor T9 is connected to the drain terminal of the first switching transistor T8, and its drain terminal is connected to the anode terminal of the inorganic light emitting element 120. The second switching transistor T9 may be turned on/turned off according to a control signal Emi_PAM(n), and electronically connect/separate the first switching transistor T8 and the inorganic light emitting element 120. The turning-on/turning-off timing of the second switching transistor T9 is related to implementation of a black gray scale.

The transistor T10 is connected between the anode terminal and the cathode terminal of the inorganic light emitting element 120. The transistor T10 operates identically to the transistor T12 in FIG. 16A, and performs the same function, and thus overlapping explanation will be omitted.

The source terminal of the transistor T12 is connected to the drain terminal of the first driving transistor T7, and its drain terminal is connected to the sensing unit 200. The transistor T12 operates identically to the transistor T14 in FIG. 16A, and performs the same function, and thus overlapping explanation will be omitted.

The source terminal of the transistor T11 is connected to the drain terminal of the second driving transistor T3, and its drain terminal is connected to the sensing unit 200. The transistor T11 operates identically to the transistor T13 in FIG. 16A, and performs the same function, and thus overlapping explanation will be omitted.

The cathode terminal of the inorganic light emitting element 120 is connected to a ground voltage (VSS) terminal.

The unit components of the sensing unit 200 are identical to the unit components of the sensing unit 200 in FIG. 16A, and thus overlapping explanation will be omitted.

Figure 26B:
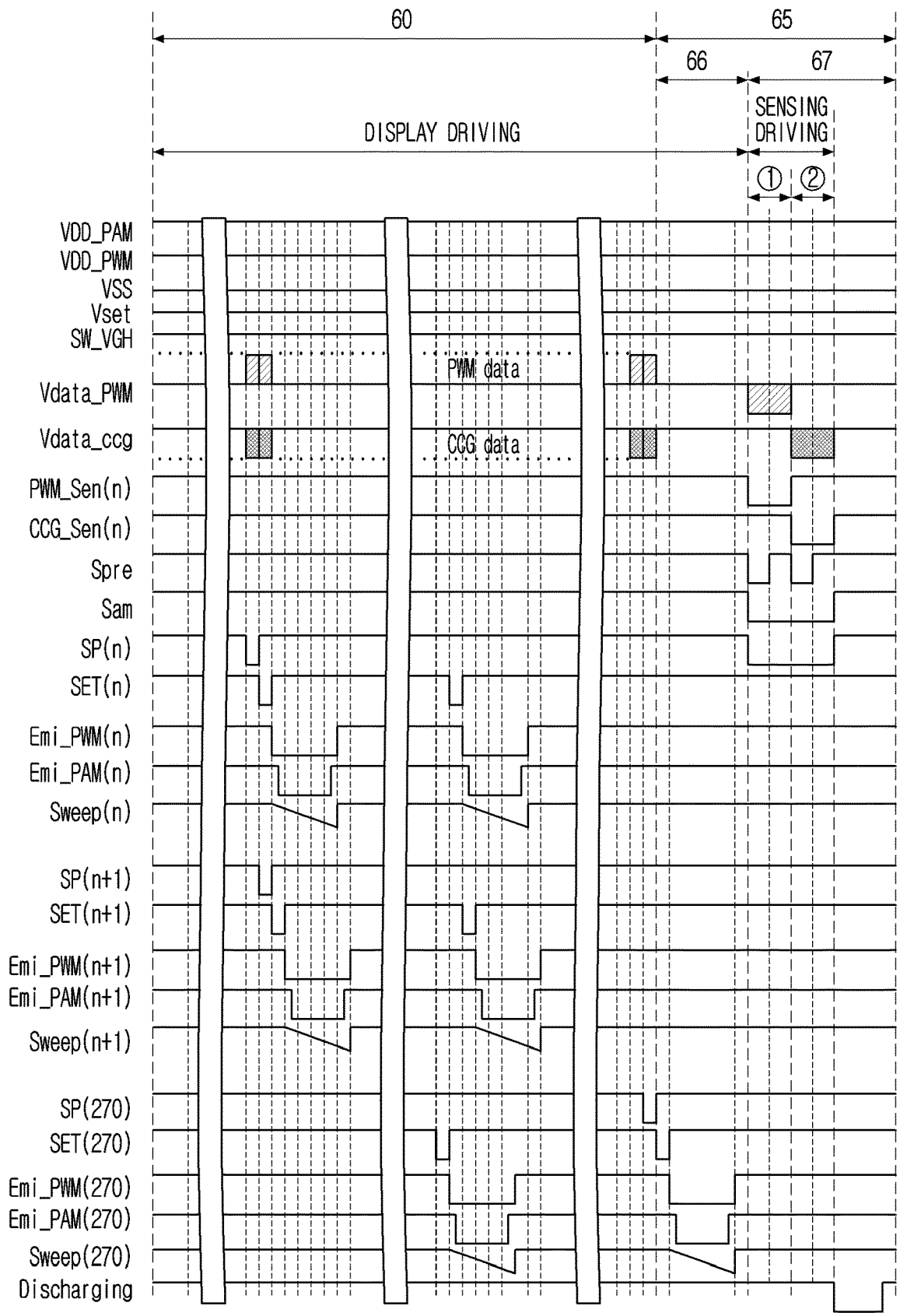
FIG. 26B is a timing diagram of various kinds of signals for driving a display panel including the sub-pixel circuit and the sensing unit illustrated in FIG. 26A during an image frame period and a blanking interval, according to an embodiment.

FIG. 26B is a timing diagram of various kinds of signals for driving a display panel including the sub-pixel circuit and the sensing unit illustrated in FIG. 26A during an image frame period and a blanking interval. Specifically, FIG. 26B illustrates various kinds of control signals, driving voltage signals, and data signals applied to the sub-pixel circuits 110 during one image frame period and a blanking interval.

Referring to FIG. 26B, the display panel 100 may be driven in the order of display driving and sensing driving.

During a display driving section, control signals SP, SET, Emi_PWM, Emi_PAM, and Sweep are applied to the display panel 100 as illustrated in FIG. 26B. For example, during a display driving section, control signals SP(n), SET(n), Emi_PWM(n), Emi_PAM(n), and Sweep(n) may be applied to the sub-pixel circuits 110 included in the $n^{th}$ row line of the display panel 100, as illustrated in FIG. 26B.

The sub-pixel circuits included in each row line of the display panel 100 may be driven in the order of a data setting section and a plurality of light emitting sections. Also, the sub-pixel circuits included in all row lines of the display panel 100 may be driven in the order of the row lines.

Hereinafter, a specific operation of the sub-pixel circuit 110 will be described with reference to control signals related to the $n^{th}$ row line (SP(n), SET(n), Emi_PWM(n), Emi_PAM(n), and Sweep(n)) in FIG. 26B, and the circuit in FIG. 26A.

First, in a data setting section, when a scan signal SP(n) having a low level is applied to the sub-pixel circuit 110, the transistor T2 of the PWM circuit 112, and the transistor T6 of the constant current generator circuit 111 are turned on.

When the transistor T2 is turned on, a PWM data voltage (PWM data) applied from the second data driver is applied to the gate terminal (referred to as the A node hereinafter) of the second driving transistor T3 through a data signal line Vdata_pwm.

In this case, the PWM data voltage may be a voltage higher than the second driving voltage (VDD_PWM). Accordingly, in a state wherein the PWM data voltage is set to the A node, the second driving transistor T3 maintains a turned-off state.

In embodiments, when the transistor T6 is turned on, a constant current generator data voltage (CCG data) applied from the first data driver is applied to the gate terminal (referred to as the B node hereinafter) of the first driving transistor T7 through a data signal line Vdata_ccg.

The sub-pixel circuit 110 in FIG. 26A does not include the driving voltage change unit 113 unlike the embodiments described above in FIGS. 16A to 25B. Instead, it can be seen that the source terminal of the first driving transistor T7 is directly connected to the first driving voltage (VDD_PAM) terminal (or line). Accordingly, a voltage corresponding to the difference between the first driving voltage (VDD_PAM) and the constant current generator data voltage is set between the source terminal and the gate terminal of the first driving transistor T7.

In this case, the constant current generator data voltage may be a voltage lower than the first driving voltage (VDD_PAM). Accordingly, in a state wherein the constant current generator data voltage is set to the B node, the first driving transistor T7 maintains a turned-on state.

In embodiments, when the first light emitting section for the $n^{th}$ row line starts, an emission signal SET(n) having a low level is applied to the transistor T5. Accordingly, Vset which is a low voltage is charged in the capacitor C3 through the turned-on transistor T5, and a low voltage is applied to the gate terminal (referred to as the C node hereinafter) of the first switching transistor T8, and the first switching transistor T8 is turned on.

Afterwards, during the first light emitting section, emission signals Emi(n) and Sweep(n) are applied to the sub-pixel circuit 110 as illustrated in FIG. 26B.

Specifically, when an emission signal Emi_PAM(n) having a low level is applied to the second switching transistor T9, the second switching transistor T9 is turned on.

Accordingly, through the first driving transistor T7 that maintains a turned-on state, the first switching transistor T8 that was turned on according to the SET(n) signal, and the second switching transistor T9 that was turned on according to the Emi_PAM(n) signal, a driving current gets to flow to the inorganic light emitting element 120.

In this case, the magnitude of the driving current is determined by the voltage difference between the source terminal and the gate terminal of the first driving transistor T7, in particular, the magnitude of the constant current generator data voltage set to the gate terminal of the first driving transistor T7.

In embodiments, if an emission signal Sweep(n) (e.g., a sweep voltage that linearly decreases as illustrated in FIG. 26B) is applied to the capacitor C1, the applied sweep voltage is coupled to the A node, and accordingly, the voltage of the A node also linearly decreases.

Accordingly, when the difference value of the voltage of the A node and the second driving voltage (VDD_PWM) reaches the threshold voltage value of the second driving transistor T3, the second driving transistor T3 is turned on, and the second driving voltage (VDD_PWM) having a high level is applied to the gate terminal of the first switching transistor T8 through the turned-on second driving transistor T3. (In this case, the transistor T4 is also obviously in a turned-on state according to an emission signal Emi_PWM (n) having a low level.)

Accordingly, the first switching transistor T8 is turned off, and the driving current cannot flow to the inorganic light emitting element 120 anymore, and the inorganic light emitting element 120 gets to stop light emission.

In this case, the time during which the driving current is provided to the inorganic light emitting element 120 is determined by the voltage difference between the source terminal and the gate terminal of the second driving transistor T3, in particular, the magnitude of the PWM data voltage set to the gate terminal of the second driving transistor T3. (For example, as the PWM data voltage is higher, the time until the difference value between the voltage of the A node and the second driving voltage (VDD_PWM) reaches the threshold voltage value of the second driving transistor T3 becomes longer.)

In embodiments, in the light emitting sections after the second light emitting section for the $n^{th}$ row line, emission signals SET(n), Emi_PWM(n), Emi_PAM(n), and Sweep(n) are respectively applied identically. Accordingly, the inorganic light emitting elements 120 of the $n^{th}$ row line get to respectively emit light identically in the light emitting sections after the second light emitting section based on the image data voltage set in the data setting section.

In embodiments, according to FIG. 26B, it can be seen that a discharging signal having a low level is applied to the sub-pixel circuits 110 within the non-light emitting section 67 after the display driving and the sensing driving are completed. Accordingly, the charges that remained in the inorganic light emitting elements 120 can be completely discharged through the turned-on transistor T10, as described above.

In the above description, only the operations related to the $n^{th}$ row line were explained, but the operations regarding the remaining row lines may also be sufficiently understood through the aforementioned explanation.

In embodiments, referring to the timing diagram in FIG. 26B in detail, it can be seen that there is a difference between the time point when the emission signal Emi_PWM(n) becomes a low level and the time point when the emission signal Emi_PAM(n) becomes a low level. This is for implementing a black gray scale, as described above in FIG. 16B. As a content related to this, the content described above in FIG. 16B can be applied as it is, and there is only a difference in the reference numerals of the transistors, and thus additional overlapping explanation will be omitted.

In embodiments, referring to FIG. 26B, a sensing driving period may include a PWM circuit 112 sensing period (①) and a constant current generator circuit 111 sensing period (②).

In this case, according to an embodiment of the disclosure, the sensing driving may be performed within the blanking interval 65 as shown in FIG. 26B.

Accordingly, the sensing unit 200 may sense a current flowing in the driving transistors T7, T3 based on a specific voltage applied within the blanking interval 65 of one image frame, and output sensing data corresponding to the sensed current.

However, depending on embodiments, the sensing driving may be performed during a booting period, a power-off period, or a screen-off period, etc. of the display apparatus 1000.

Specifically, during the PWM circuit 112 sensing period (①), the second specific voltage applied through the data signal line Vdata_pwm is input to the A node. Also, in the PWM circuit 112 sensing period (①), the transistor T11 is turned on according to a control signal PWM_Sen(n), and the second current flowing in the second driving transistor T3 is transmitted to the sensing unit 200 through the turned-on transistor T11. Accordingly, the sensing unit 200 may output the second sensing data corresponding to the second current to the correction unit 300.

In embodiments, during the constant current generator circuit 111 sensing period (②), the first specific voltage applied through the data signal line Vdata_ccg is input to the B node. Also, in the constant current generator circuit 111 sensing period (②), the transistor T12 is turned on according to a control signal CCG_Sen(n), and the first current flowing in the first driving transistor T7 is transmitted to the sensing unit 200 through the turned-on transistor T12. Accordingly, the sensing unit 200 may output the first sensing data corresponding to the first current to the correction unit 300.

The operations of the sensing unit 200 in the first initialization period and the first sensing period of the PWM circuit 112 sensing period (①), and the specific operations of the sensing unit 200 in the second initialization period and the second sensing period of the constant current generator circuit 111 sensing period (②) are as described above in FIG. 16B, and thus overlapping explanation will be omitted.

The correction unit 300 may respectively acquire first and second compensation values based on the first and second sensing data output from the sensing unit 200, and store or update the acquired first and second compensation values in the memory. Afterwards, when the display driving is performed, the correction unit 300 may respectively correct the constant current generator data voltage and the PWM data voltage to be applied to the sub-pixel circuits 110 based on the first and second compensation values.

In embodiments, the aforementioned sensing driving may be performed for one row line per image frame, or for the plurality of row lines per image frame. In this case, the aforementioned sensing driving may proceed sequentially in the order of the row lines or proceed in a random order, as described above.

Also, the aforementioned sensing driving may proceed in the order of the PWM circuit 112 sensing period (①) and the constant current generator circuit 111 sensing period (②), as illustrated in the drawing. However, the disclosure is not limited thereto, and depending on embodiments, the constant current generator circuit 111 sensing period (②) may proceed first, and the PWM circuit 112 sensing period (①) may proceed after that.

Also, in the above description, an example wherein sensing driving proceeds after display driving was suggested, but depending on embodiments, sensing driving may proceed first, and display driving may proceed after that.

In embodiments, the sub-pixel circuit 110 in FIG. 26A may not separately include the driving voltage change unit 113, and to the source terminal of the first driving transistor T7, the first driving voltage (VDD_PAM) may be applied in all of the data setting section and the respective light emitting sections.

Accordingly, in the sub-pixel circuit 110 in FIG. 26A, the first driving voltage (VDD_PAM) applied to the sub-pixel circuits operating in the data setting section is influenced by the drop of the first driving voltage (VDD_PAM) due to the sub-pixel circuits operating in the light emitting sections.

This hinders setting of a correct constant current generator data voltage to the constant current generator circuits 111 belonging to the row lines operating in the data setting section, as described above.

For resolving the problem of the drop of the first driving voltage (VDD_PAM) as above, a method of correcting a constant current generator data voltage may be used in the embodiments in FIGS. 26A to 33B.

That is, in the embodiments in FIGS. 16A to 25B, the problem of the IR drop of the first driving voltage (VDD_PAM) was resolved by controlling a driving voltage applied to the source terminal of the first driving transistor (T9 or T8) through the driving voltage change unit 113. However, in the embodiments in FIGS. 26A to 33B, the problem of the IR drop of the first driving voltage (VDD_PAM) is resolved by correcting a constant current generator data voltage applied to the gate terminal of the first driving transistor (T7 or T6).

Specifically, according to an embodiment of the disclosure, data (or information) regarding the IR drop values for each region of the display panel 100 according to the magnitude of the driving current may be stored in a storage unit (e.g., a memory, etc.).

Here, the magnitude of the driving current refers to an average current value provided by the driving voltage provision unit (e.g., the power IC) to the display panel 100 for displaying an image frame on the display panel 100, and the value may vary according to an image displayed by an image frame.

Also, the driving current and the IR drop values for each region in accordance thereto may be sensed and calculated in advance in the manufacturing step of the display apparatus 1000, and stored in the storage unit. In addition, the driving current and the IR drop values for each region in accordance thereto may be sensed and calculated in advance before an image is displayed in the using step of the display apparatus 1000, and updated.

Accordingly, the correction unit 300 may correct the constant current generator data to be applied to the display panel 100 based on the IR drop values for each region of the display panel 100 corresponding to the magnitude of the driving current necessary for displaying the current image frame.

Accordingly, the data driver may generate a constant current generator data voltage based on the corrected constant current generator data, and apply the voltage to the display panel 100, and thereby compensate the IR drop of the first driving voltage (VDD_PAM) due to the driving current necessary for displaying the current image frame.

In the above description, the IR drop values for each region of the display panel 100 may be IR drop values for each row line of the display panel 100, but are not limited thereto.

Hereinafter, various embodiments of the disclosure will be described with reference to FIGS. 27A to 29B. Here, the embodiments illustrated in FIGS. 27A to 29B have similar configurations and operation principles as those described above through FIGS. 26A and 26B, and thus overlapping explanation will be omitted, and explanation will be made focused on differences.

Figure 27A:
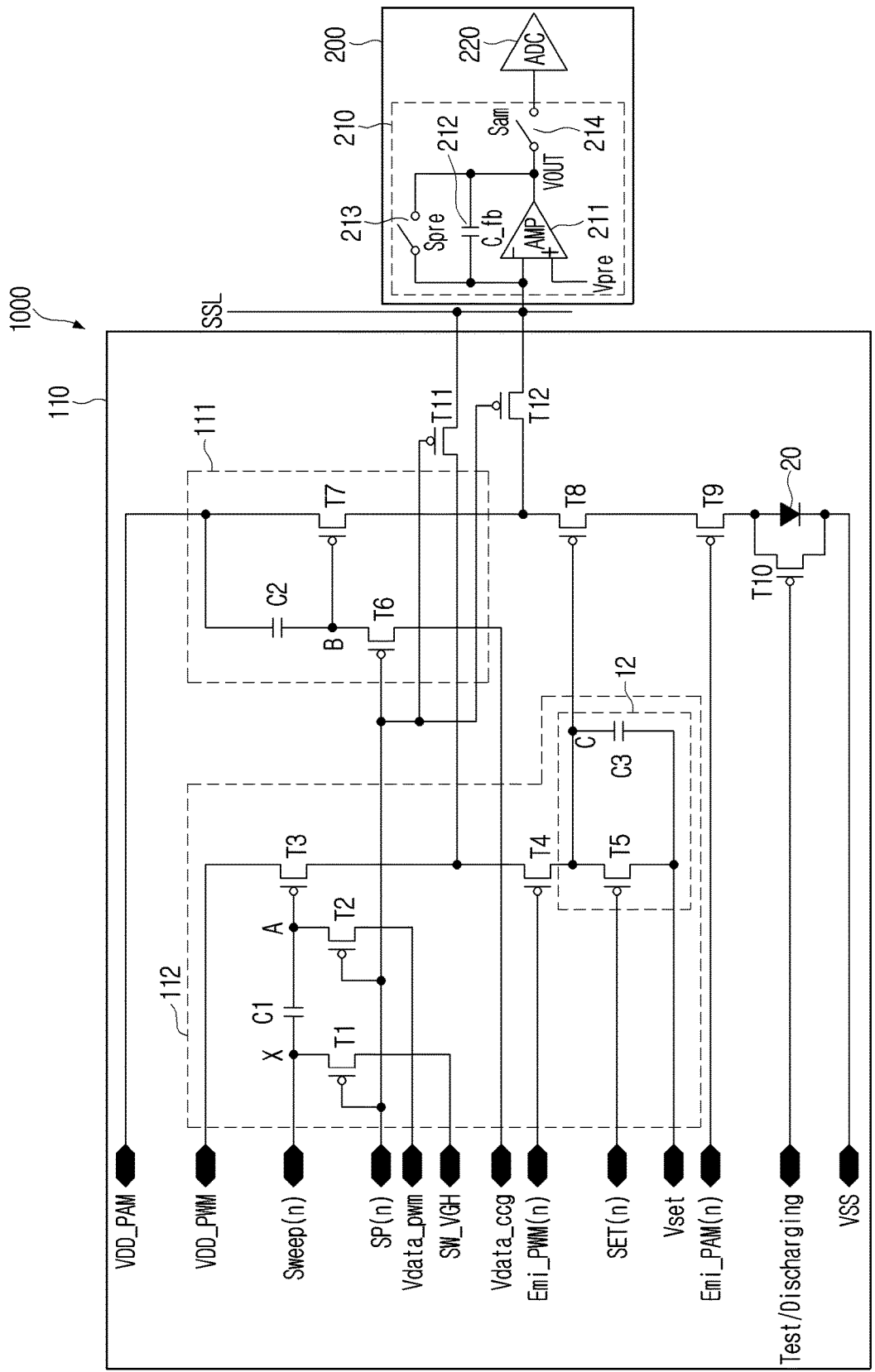
FIG. 27A is a detailed circuit diagram of a sub-pixel circuit and a sensing unit according to another embodiment.
Figure 27B:
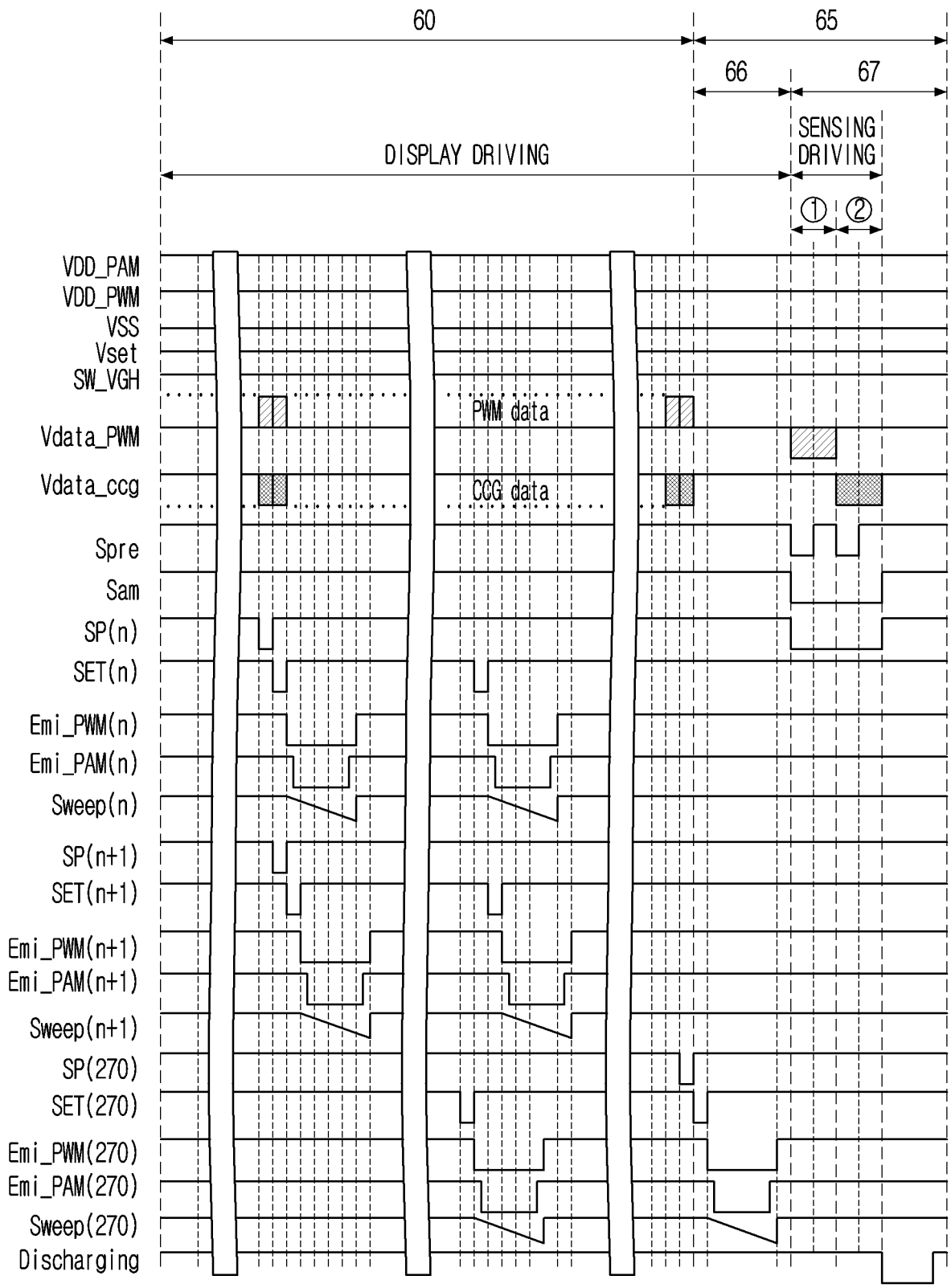
FIG. 27B is a timing diagram of various kinds of signals for driving a display panel including the sub-pixel circuit and the sensing unit illustrated in FIG. 27A during an image frame period and a blanking interval, according to an embodiment.

FIG. 27A is a detailed circuit diagram of the sub-pixel circuit 110 and the sensing unit 200 according to another embodiment of the disclosure, and FIG. 27B is a timing diagram of various kinds of signals for driving a display panel including the sub-pixel circuit and the sensing unit illustrated in FIG. 27A during an image frame period and a blanking interval.

The sub-pixel circuit 110 shown in FIG. 27A is different from that in FIG. 26A only in the feature of using a scan signal SP(n) without using a separate control signal (PWM_Sen(n) and CCG_Sen(n) in FIG. 26A) for controlling the turning-on/turning-off of the transistor T11 and the transistor T12, and is identical to the sub-pixel circuit 110 shown in FIG. 26A in the remaining features. The driving timing diagram shown in FIG. 27B is also identical to the driving timing diagram in FIG. 26B excluding the feature that there are no control signals PWM_Sen(n) and CCG_Sen(n).

Referring to FIGS. 27A and 27B, as a scan signal SP(n) having a low level is applied in a data setting section, not only the transistors T1, T2, and T6, but also the transistors T11 and T12 are turned on together. However, in this case, flowing of a current to the sensing unit 200 may be blocked by turning off a switch inside the amp 211. Accordingly, during the data setting section, a sensing driving operation is not performed, but only a data setting operation is performed.

In embodiments, during a sensing driving period, the aforementioned switch inside the amp 211 may be turned on. Accordingly, during the sensing driving period, the aforementioned first and second currents flow to the sensing unit 200, and accordingly, the aforementioned sensing driving may be performed.

In this case, the second specific voltage is applied to the gate terminal of the second driving transistor T3 during the PWM circuit 112 sensing period ($\hat{1}$), and the first specific voltage is applied to the gate terminal of the first driving transistor T7 during the constant current generator circuit 111 sensing period ($\hat{2}$), and the time during which the second specific voltage is applied and the time during which the first specific voltage is applied do not overlap with each other. Accordingly, even if a separate control signal (PWM_Sen(n) and CCG_Sen(n)) is not used, the sensing driving operation described through FIGS. 26A and 26B can be performed in the same manner.

Other than the above, the remaining contents regarding the display driving and the sensing driving of the sub-pixel circuit 110, and prevention of phenomena of disuniformity of brightness and horizontal crosstalk by a sweep load, etc. can be sufficiently understood through the contents described above in FIGS. 26A and 26B, and thus overlapping explanation will be omitted.

Figure 28A:
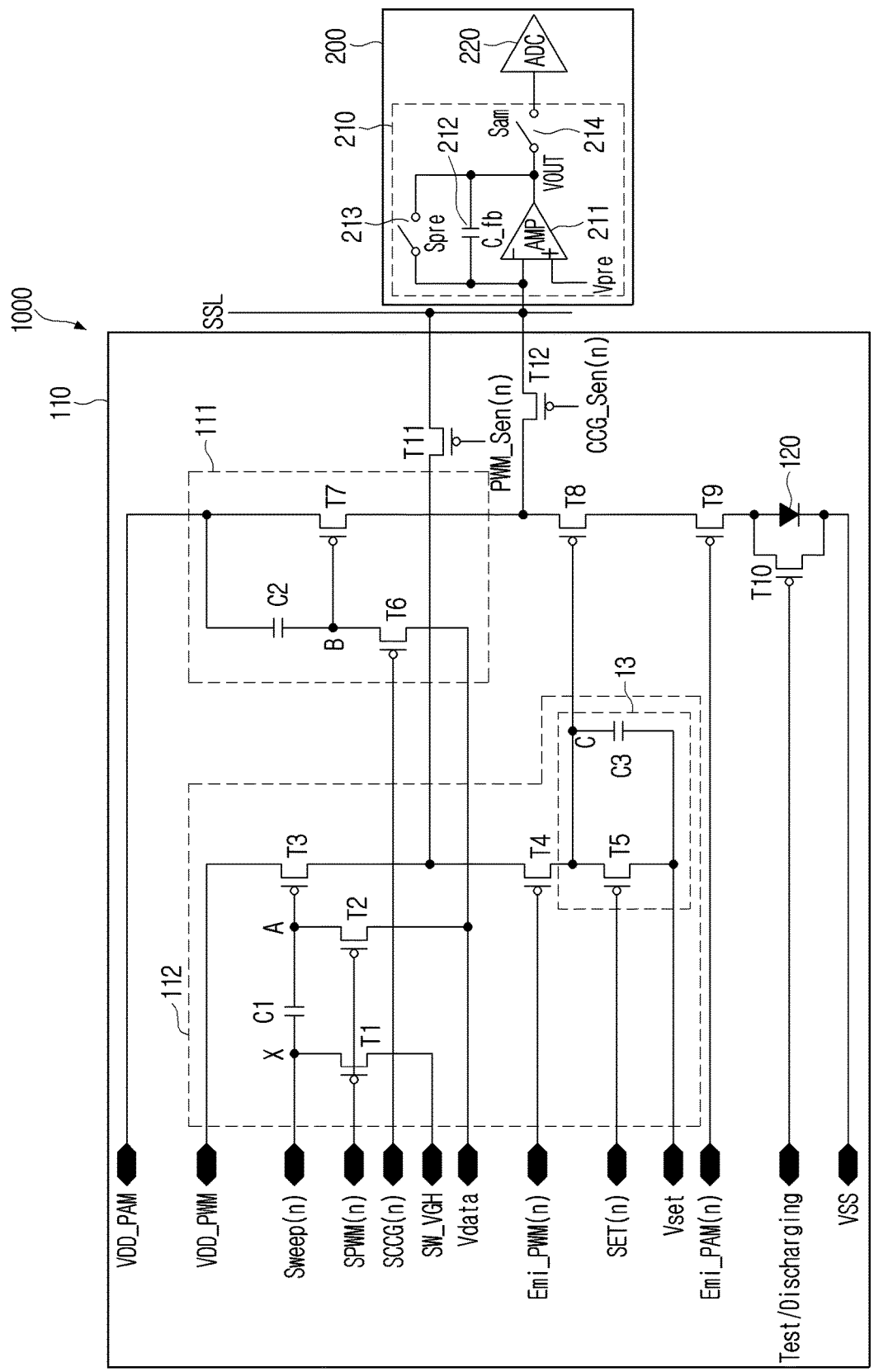
FIG. 28A is a detailed circuit diagram of a sub-pixel circuit and a sensing unit according to still another embodiment.
Figure 28B:
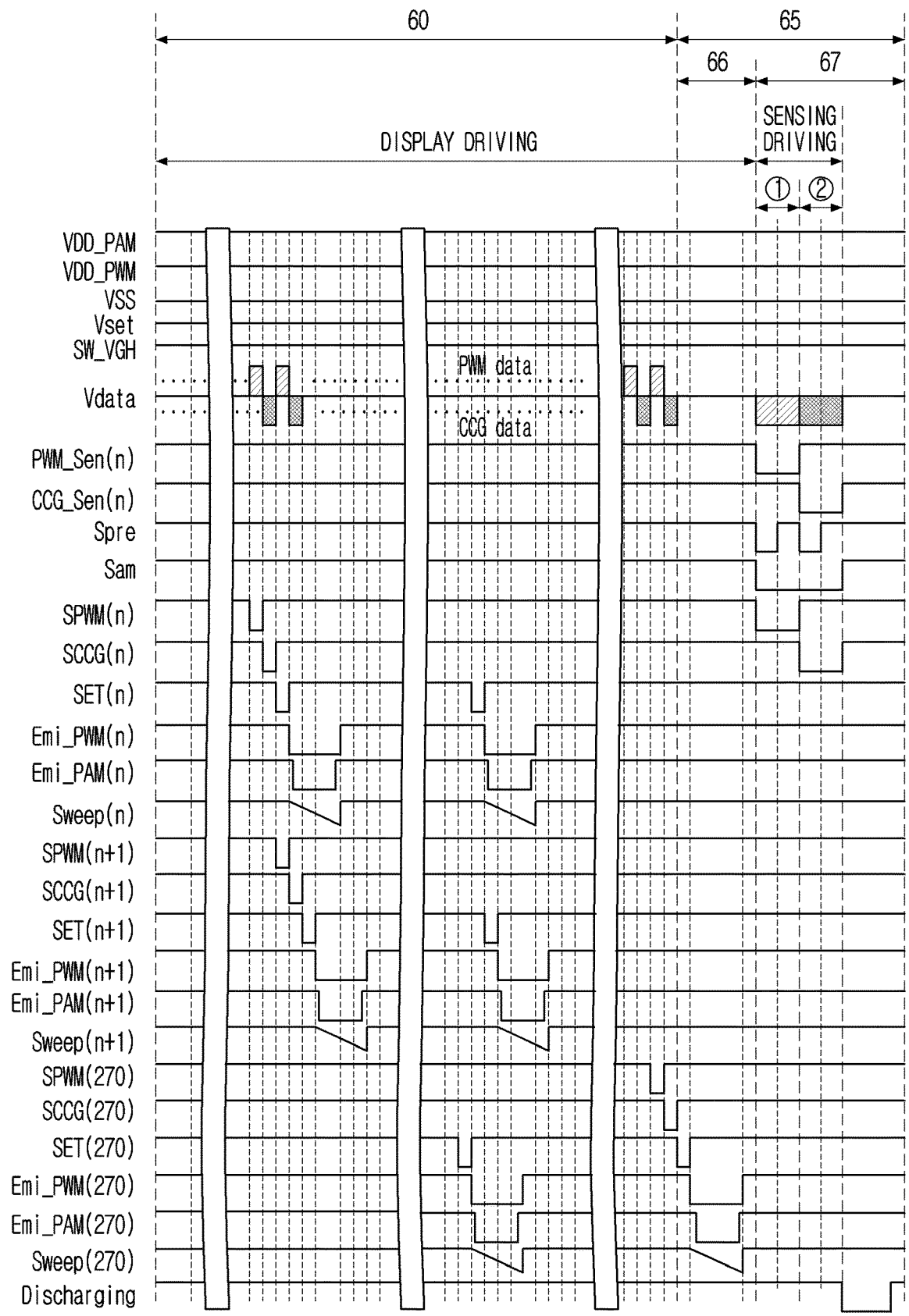
FIG. 28B is a timing diagram of various kinds of signals for driving a display panel including the sub-pixel circuit and the sensing unit illustrated in FIG. 28A during an image frame period and a blanking interval, according to an embodiment.

FIG. 28A is a detailed circuit diagram of the sub-pixel circuit 110 and the sensing unit 200 according to still another embodiment of the disclosure, and FIG. 28B is a timing diagram of various kinds of signals for driving a display panel including the sub-pixel circuit and the sensing unit illustrated in FIG. 28A during an image frame period and a blanking interval.

The sub-pixel circuit 110 shown in FIG. 28A is identical to the sub-pixel circuit 110 shown in FIG. 26A excluding the feature that an image data voltage and a specific voltage are applied through one data signal line Vdata.

In this case, a PWM data voltage and a constant current generator data voltage are time division multiplexed and applied from one data driver to the sub-pixel circuit 110 through the data signal line Vdata during a data setting section. Also, during a sensing driving period, the second specific voltage and the first specific voltage are time division multiplexed and applied from the one data driver to the sub-pixel circuit 110 through the data signal line Vdata.

Accordingly, two scan signals are needed for applying the PWM data voltage and the constant current generator data voltage that are time division multiplexed and applied during the data setting section to the A node and the B node respectively, and for applying the second specific voltage and the first specific voltage that are time division multiplexed and applied during the sensing driving period to the A node and the B node respectively, and the scan signal SPWM(n) and the scan signal SCCG(n) in FIGS. 28A and 28B show the two scan signals as above.

Referring to FIGS. 28A and 28B, when a scan signal SPWM(n) having a low level is applied to the sub-pixel circuit 110 in a data setting section, a PWM data voltage (PWM data) is applied to the A node through the turned-on transistor T2. Also, when a scan signal SCCG(n) having a low level is applied to the sub-pixel circuit 110, a constant current generator data voltage (CCG data) is applied to the B node through the turned-on transistor T6.

In embodiments, during the PWM circuit 112 sensing period ($\hat{1}$) in the sensing driving period, when a scan signal SPWM(n) having a low level is applied to the sub-pixel circuit 110, the second specific voltage is input to the A node through the turned-on transistor T2. Also, when a scan signal SCCG(n) having a low level is applied to the sub-pixel circuit 110, the first specific voltage is input to the B node through the turned-on transistor T6.

In embodiments, in FIG. 28B, an example wherein scan signals are applied in the order of SPWM(n) and SCCG(n) is suggested, but the disclosure is not limited thereto, and it is obvious that an SCCG(n) signal can be applied first, and an SPWM(n) signal can be applied after that, depending on embodiments.

Other than the above, the remaining contents regarding the display driving and the sensing driving of the sub-pixel circuit 110, and prevention of phenomena of disuniformity of brightness and horizontal crosstalk by a sweep load, etc. can be sufficiently understood through the contents described above in FIGS. 26A to 26B, and thus overlapping explanation will be omitted.

Figure 29A:
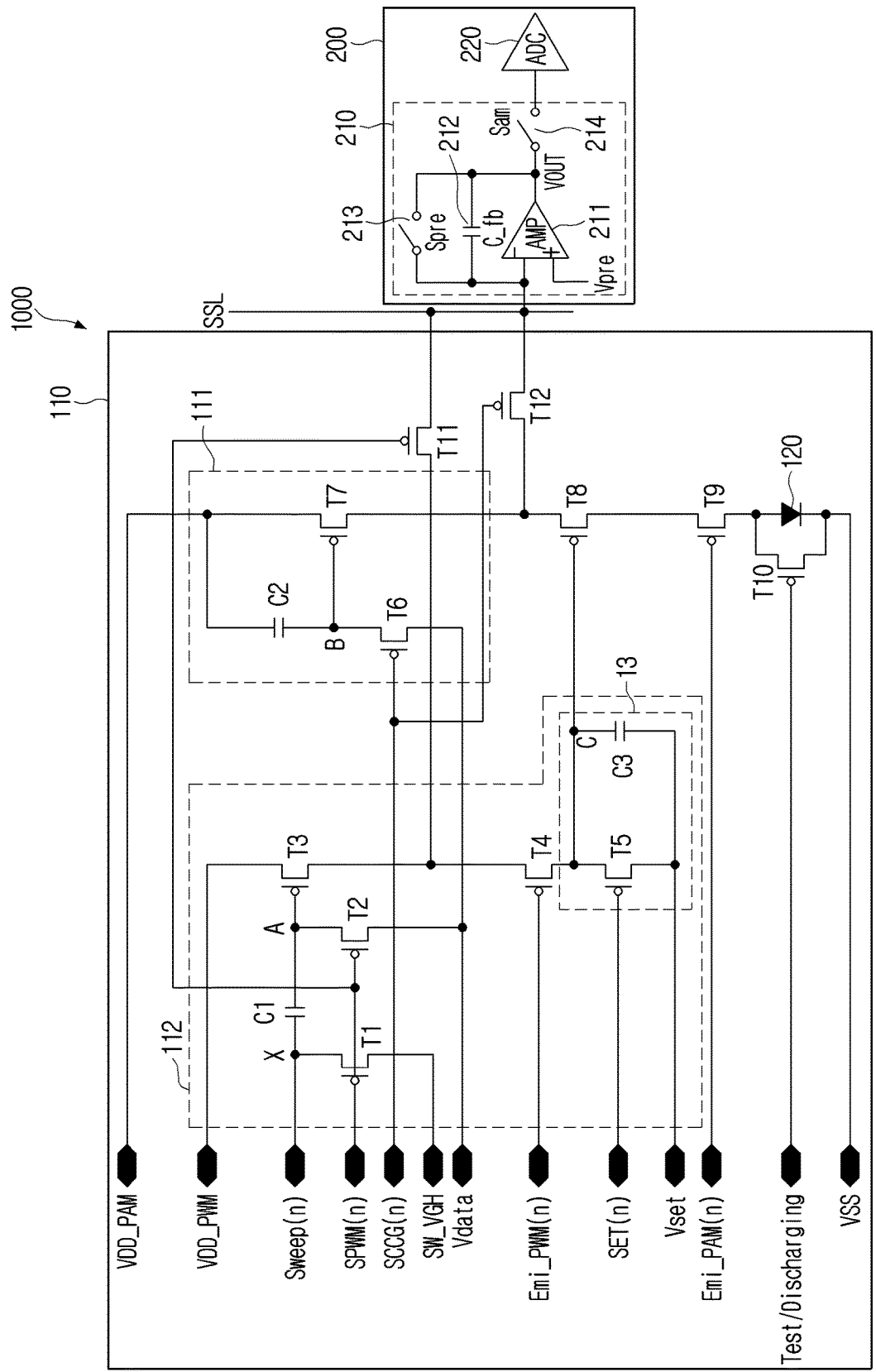
FIG. 29A is a detailed circuit diagram of a sub-pixel circuit and a sensing unit according to still another embodiment.
Figure 29B:
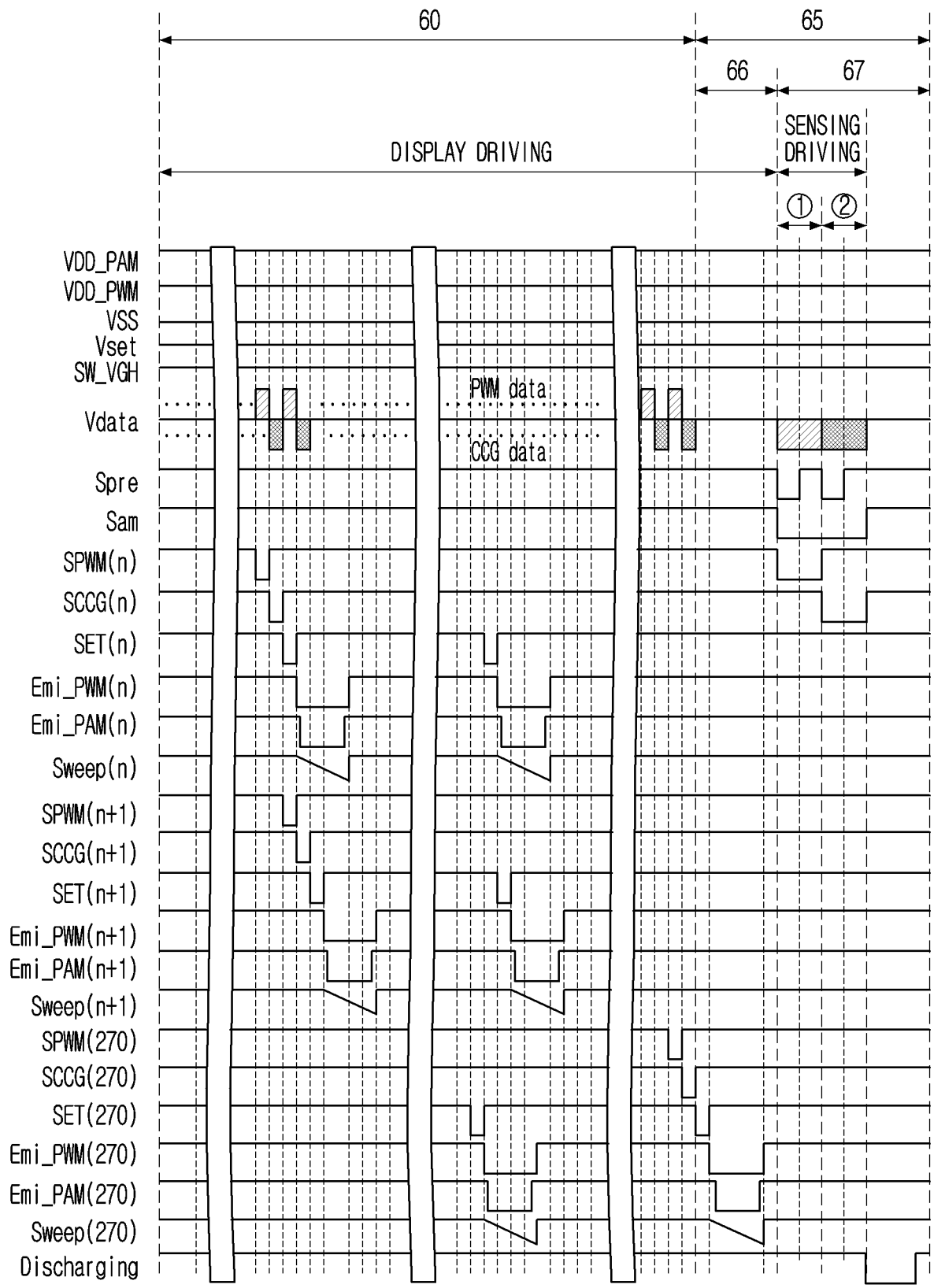
FIG. 29B is a timing diagram of various kinds of signals for driving a display panel including the sub-pixel circuit and the sensing unit illustrated in FIG. 29A during an image frame period and a blanking interval, according to an embodiment.

FIG. 29A is a detailed circuit diagram of the sub-pixel circuit 110 and the sensing unit 200 according to still another embodiment of the disclosure, and FIG. 29B is a timing diagram of various kinds of signals for driving a display panel including the sub-pixel circuit and the sensing unit illustrated in FIG. 29A during an image frame period and a blanking interval.

The sub-pixel circuit 110 illustrated in FIG. 29A is similar to the sub-pixel circuit 110 in FIG. 26A, in that it receives application of an image data voltage (a PWM data voltage, a constant current generator data voltage) and a specific voltage (the second specific voltage, the first specific voltage) through one data signal line Vdata.

Accordingly, referring to FIGS. 29A and 29B, it can be seen that by using two scan signals (or scan signal lines) such as SPWM(n) and SCCG(n), an image data voltage and a specific voltage are respectively applied to the sub-pixel circuit 110 in a data setting section and a sensing driving period.

In embodiments, the sub-pixel circuit 110 illustrated in FIG. 29A is similar to the embodiment of FIG. 27A, in that scan signals are used for controlling the turning-on/turning-off of the transistor T11 and the transistor T12, without using separate control signals (PWM_Sen(n) and CCG_Sen(n) in FIG. 28A).

In the case of the embodiment of FIG. 29A, two scan signals such as SPWM(n) and SCCG(n) are used, and thus the gate terminal of the transistor T11 is connected to the scan signal SPWM(n) line, and the gate terminal of the transistor T12 is connected to the scan signal SCCG(n) line, as illustrated in the drawing.

In embodiments, in the case of the embodiments in FIGS. 29A and 29B, a current may be made to flow to the sensing unit 200 only during a sensing driving period, by turning off the switch inside the amp 211 during a data setting section, and turning on the switch inside the amp 211 during a sensing driving period, as described above in FIGS. 27A and 27B.

Other than the above, the remaining contents regarding the display driving and the sensing driving of the sub-pixel circuit 110, and prevention of phenomena of disuniformity of brightness and horizontal crosstalk by a sweep load, etc. can be sufficiently understood through the contents described above in FIGS. 26A and 26B, and thus overlapping explanation will be omitted.

Hereinafter, embodiments to which a method of applying a low voltage (SW_VGL) of a sweep signal to the X node, and applying a sweep signal to the source terminal of the second driving transistor is applied will be described with reference to FIGS. 30A to 33B.

Figure 30A:
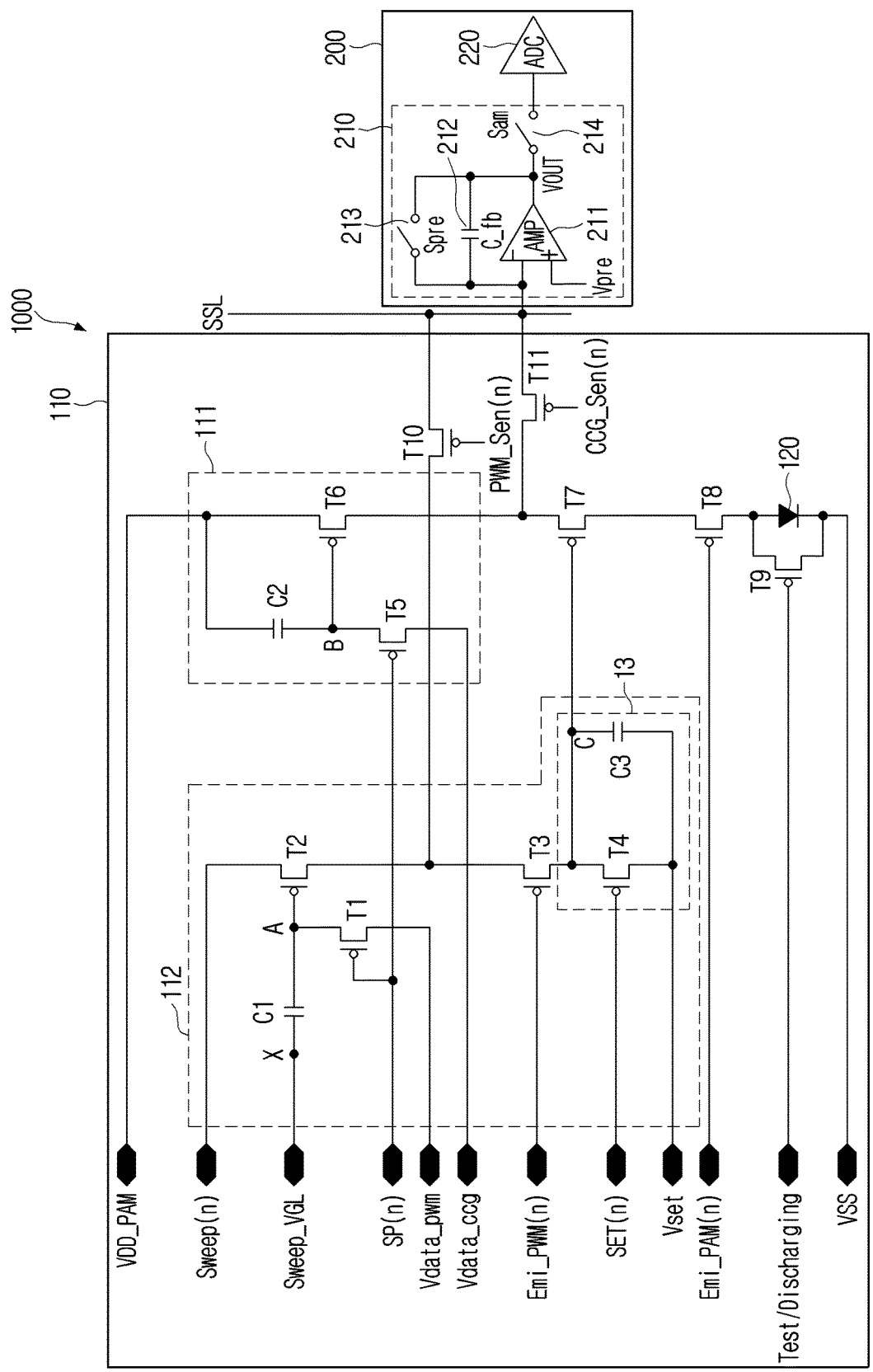
FIG. 30A is a detailed circuit diagram of a sub-pixel circuit and a sensing unit according to an embodiment.
Figure 30B:
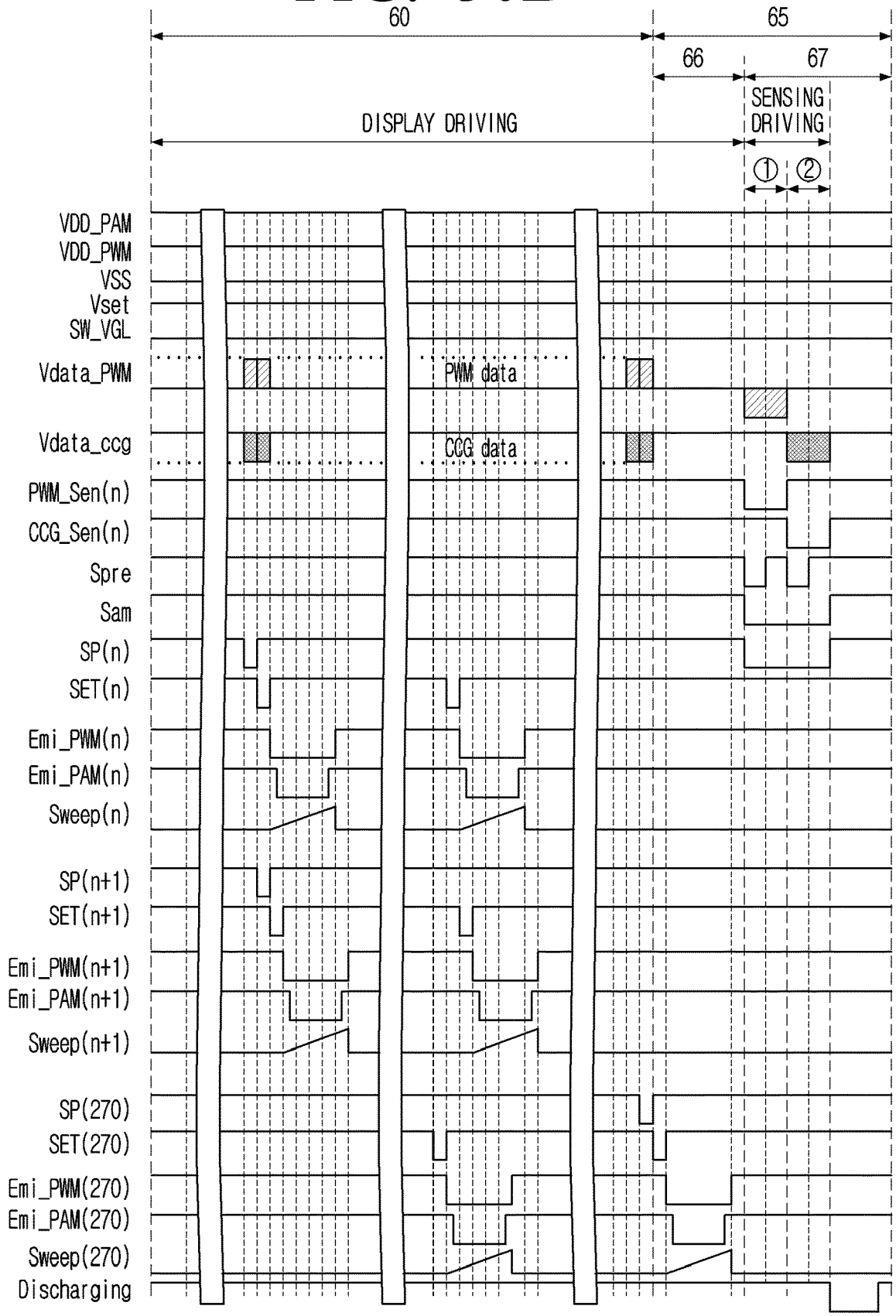
FIG. 30B is a timing diagram of various kinds of signals for driving a display panel including the sub-pixel circuit and the sensing unit illustrated in FIG. 30A during an image frame period and a blanking interval, according to an embodiment.

FIG. 30A is a detailed circuit diagram of the sub-pixel circuit 110 and the sensing unit 200 according to an embodiment of the disclosure, and FIG. 30B is a timing diagram of various kinds of signals for driving a display panel including the sub-pixel circuit and the sensing unit illustrated in FIG. 30A during an image frame period and a blanking interval.

The embodiments illustrated in FIGS. 30A and 30B have similar configurations and operation principles as those described above through FIGS. 26A and 26B, and thus overlapping explanation will be omitted, and explanation will be made focused on differences.

In the sub-pixel circuit 110 in FIG. 30A, the SW_VGL signal line is directly connected to the X node. Accordingly, unlike in the sub-pixel circuit 110 in FIG. 26A, a transistor T1 for applying an SW_VGH signal to the X node during a data setting section is not needed.

Referring to FIG. 30A, it can be seen that a transistor does not exist in a location corresponding to the transistor T1 in FIG. 26A. Accordingly, comparing the reference numerals in FIGS. 30A and 26A, it can be seen that the reference numerals for the transistors in the same locations in FIG. 30A are described as numbers preceding the corresponding reference numerals in FIG. 26A by one.

In embodiments, in the sub-pixel circuit 110 in FIG. 26A, a sweep voltage that linearly decreases from a high voltage (SW_VGH) of a sweep signal to a low voltage of the sweep signal as illustrated in FIG. 26B is applied to the X node during a light emitting section.

However, in the sub-pixel circuit 110 in FIG. 30A, it can be seen that a sweep voltage that linearly increases from a low voltage (SW_VGL) of a sweep signal to a high voltage of the sweep signal as illustrated in FIG. 30B is applied to the source terminal of the second driving transistor T2 during a light emitting section.

The operation of the PWM circuit 112 according to a sweep signal Sweep(n) in the embodiment of FIG. 30A is explained in detail as below based on an example.

For example, in a state wherein a voltage of +13[V] (specifically, a PWM data voltage (+14[V])+the threshold voltage (−1[V]) of the second driving transistor T2) is set to the A node during a data setting section, if a sweep signal (e.g., a voltage that linearly increases from +10[V] to +15[V]) is applied to the source terminal of the second driving transistor T2, the voltage difference between the gate terminal and the source terminal of the second driving transistor T2 decreases from +3[V] to −2[V].

In this case, when the voltage difference between the gate terminal and the source terminal of the second driving transistor T2 that was decreasing from +3[V] reaches the threshold voltage (−1[V]) of the second driving transistor T2, the second driving transistor T2 is turned on. Also, +14[V] which is the sweep voltage when the second driving transistor T2 is turned on is applied to the first switching transistor T7, and the first switching transistor T7 is turned off.

In embodiments, the operation mechanism of the PWM circuit 112 in FIG. 30A as above may be the same as the operation mechanism of the PWM circuit 112 described in FIGS. 26A and 26B, while there are only differences in the form of the sweep signal and the terminal to which the sweep signal is input.

The remaining contents regarding the configuration and the driving of the sub-pixel circuit 110 illustrated in FIGS. 30A and 30B can be sufficiently understood through the contents illustrated in the drawings and the contents described above in FIGS. 26A and 26B, and thus overlapping explanation will be omitted.

Figure 31A:
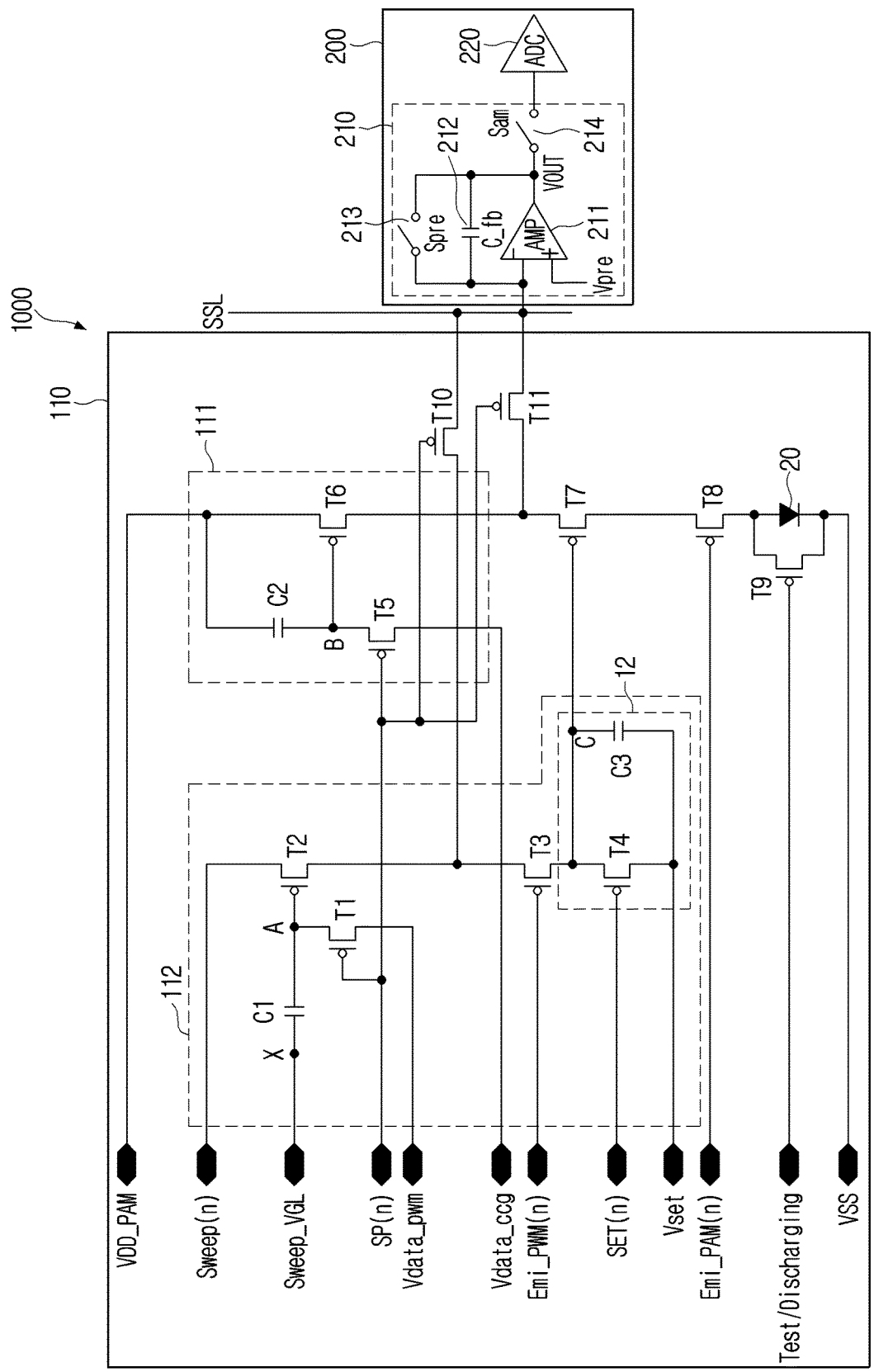
FIG. 31A is a detailed circuit diagram of a sub-pixel circuit and a sensing unit according to another embodiment.
Figure 31B:
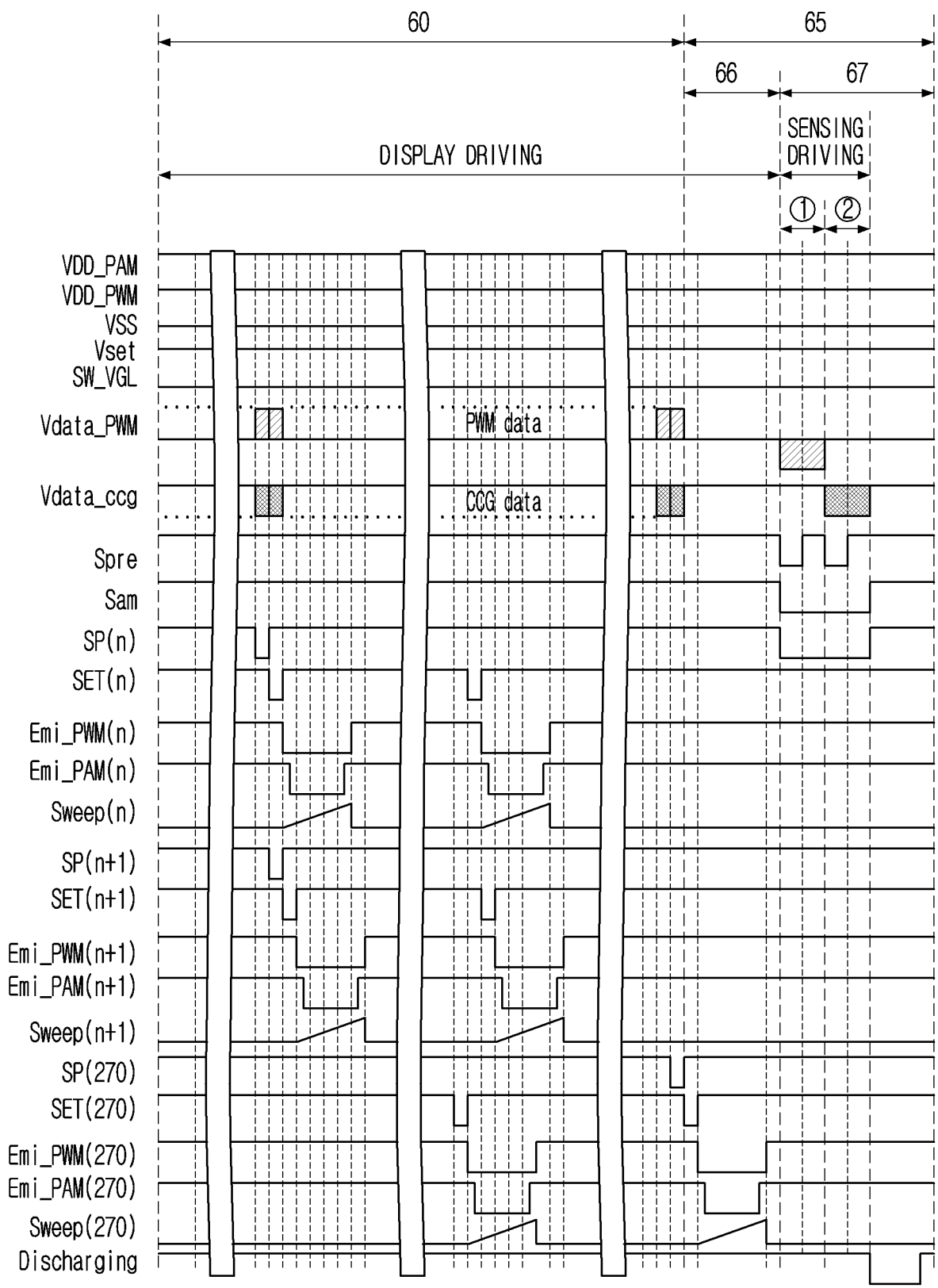
FIG. 31B is a timing diagram of various kinds of signals for driving a display panel including the sub-pixel circuit and the sensing unit illustrated in FIG. 31A during an image frame period and a blanking interval, according to an embodiment.

FIG. 31A is a detailed circuit diagram of the sub-pixel circuit 110 and the sensing unit 200 according to another embodiment of the disclosure, and FIG. 31B is a timing diagram of various kinds of signals for driving a display panel including the sub-pixel circuit and the sensing unit illustrated in FIG. 31A during an image frame period and a blanking interval.

The sub-pixel circuit 110 shown in FIG. 31A is different from that in FIG. 30A only in the feature of using a scan signal SP(n) without using a separate control signal (PWM_Sen(n) and CCG_Sen(n) in FIG. 30A) for controlling the turning-on/turning-off of the transistor T10 and the transistor T11, and is identical to the sub-pixel circuit 110 shown in FIG. 30A in the remaining features. The driving timing diagram shown in FIG. 31B is also identical to the driving timing diagram in FIG. 30B excluding the feature that there are no control signals PWM_Sen(n) and CCG_Sen(n).

Referring to FIGS. 31A and 31B, as a scan signal SP(n) having a low level is applied in a data setting section, not only the transistors T1 and T5, but also the transistors T10 and T11 are turned on together. However, in this case, flowing of a current to the sensing unit 200 may be blocked by turning off a switch inside the amp 211. Accordingly, during the data setting section, a sensing driving operation is not performed, but only a data setting operation is performed.

In embodiments, during a sensing driving period, the switch inside the amp 211 may be turned on. Accordingly, during the sensing driving period, the aforementioned first and second currents flow to the sensing unit 200, and accordingly, the aforementioned sensing driving may be performed.

In this case, the second specific voltage is applied to the gate terminal of the second driving transistor T2 during the PWM circuit 112 sensing period (①), and the first specific voltage is applied to the gate terminal of the first driving transistor T6 during the constant current generator circuit 111 sensing period (②), and the time during which the second specific voltage is applied and the time during which the first specific voltage is applied do not overlap with each other. Accordingly, even if a separate control signal (PWM_Sen(n) and CCG_Sen(n)) is not used, the sensing driving can be performed without a problem.

The remaining contents regarding the configuration and the driving of the sub-pixel circuit 110 illustrated in FIGS. 31A and 31B can be sufficiently understood through the contents illustrated in the drawings and the contents described above, and thus overlapping explanation will be omitted.

Figure 32A:
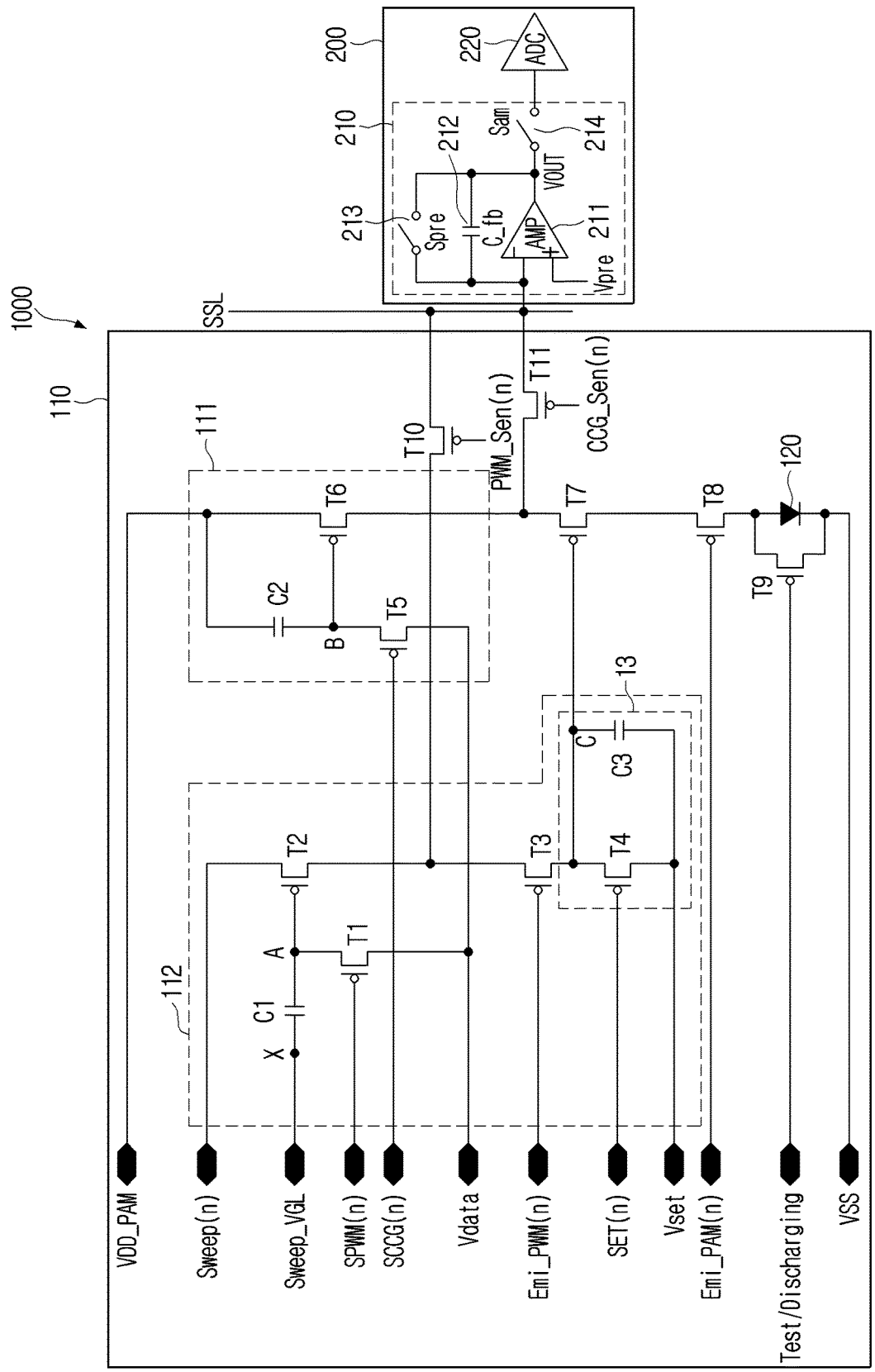
FIG. 32A is a detailed circuit diagram of a sub-pixel circuit and a sensing unit according to still another embodiment.
Figure 32B:
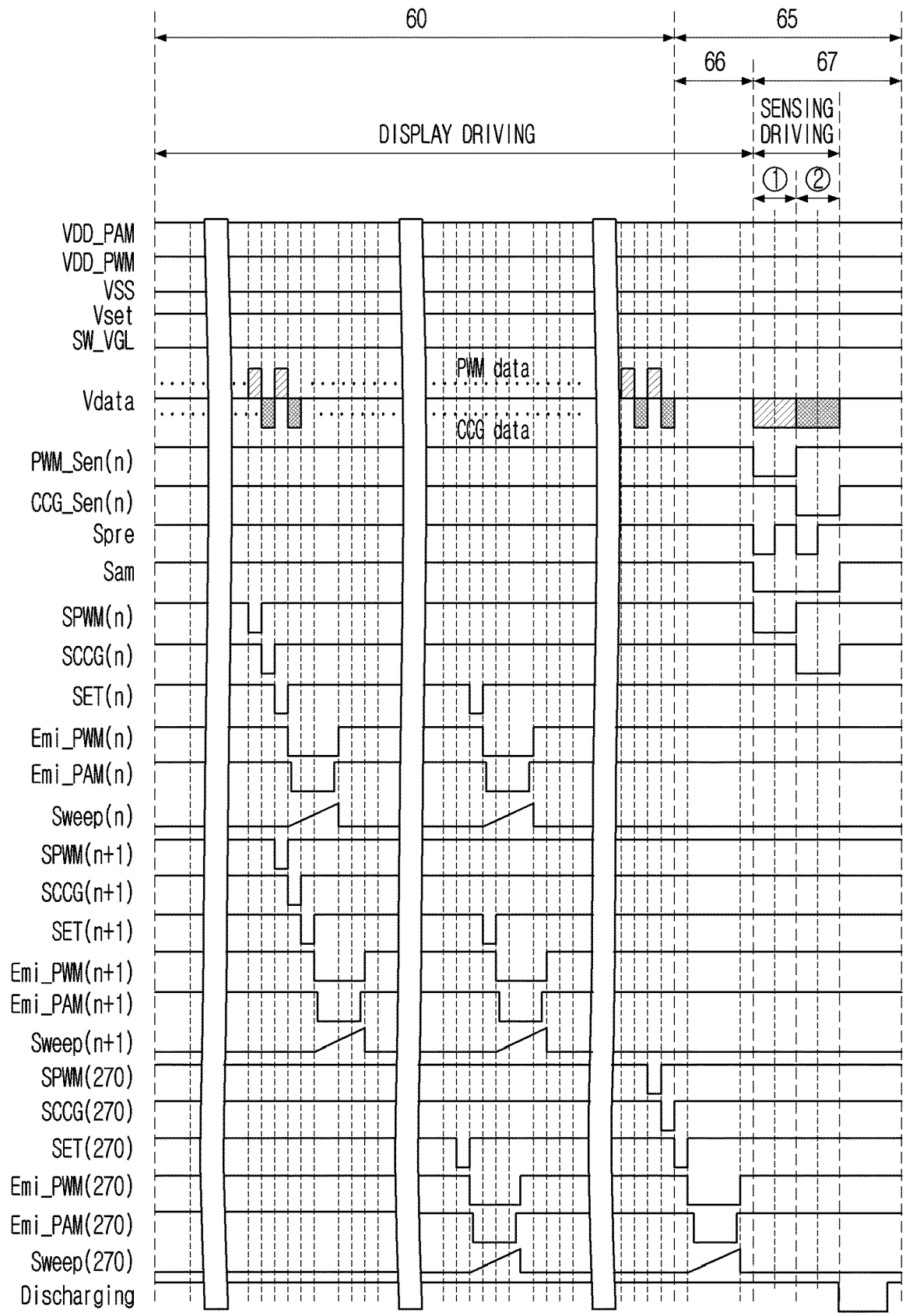
FIG. 32B is a timing diagram of various kinds of signals for driving a display panel including the sub-pixel circuit and the sensing unit illustrated in FIG. 32A during an image frame period and a blanking interval, according to an embodiment.

FIG. 32A is a detailed circuit diagram of the sub-pixel circuit 110 and the sensing unit 200 according to still another embodiment of the disclosure, and FIG. 32B is a timing diagram of various kinds of signals for driving a display panel including the sub-pixel circuit and the sensing unit illustrated in FIG. 32A during an image frame period and a blanking interval.

The sub-pixel circuit 110 shown in FIG. 32A is identical to the sub-pixel circuit 110 shown in FIG. 30A excluding the feature that an image data voltage and a specific voltage are applied through one data signal line Vdata. In this case, two scan signals are needed as described above, and the scan signal SPWM(n) and the scan signal SCCG(n) in FIGS. 32A and 32B show the two scan signals as above.

Referring to FIGS. 32A and 32B, when a scan signal SPWM(n) having a low level is applied to the sub-pixel circuit 110 in a data setting section, a PWM data voltage (PWM data) is applied to the A node through the turned-on transistor T1. Also, when a scan signal SCCG(n) having a low level is applied to the sub-pixel circuit 110, a constant current generator data voltage (CCG data) is applied to the B node through the turned-on transistor T5.

In embodiments, during the PWM circuit 112 sensing period (1̂) in the sensing driving period, when a scan signal SPWM(n) having a low level is applied to the sub-pixel circuit 110, the second specific voltage is input to the A node through the turned-on transistor T1. Also, when a scan signal SCCG(n) having a low level is applied to the sub-pixel circuit 110, the first specific voltage is input to the B node through the turned-on transistor T5.

In embodiments, in FIG. 32B, an example wherein scan signals are applied in the order of SPWM(n) and SCCG(n) is suggested, but the disclosure is not limited thereto, and it is obvious that an SCCG(n) signal can be applied first, and an SPWM(n) signal can be applied after that, depending on embodiments.

The remaining contents regarding the configuration and the driving of the sub-pixel circuit 110 illustrated in FIGS. 32A and 32B can be sufficiently understood through the contents illustrated in the drawings and the contents described above, and thus overlapping explanation will be omitted.

Figure 33A:
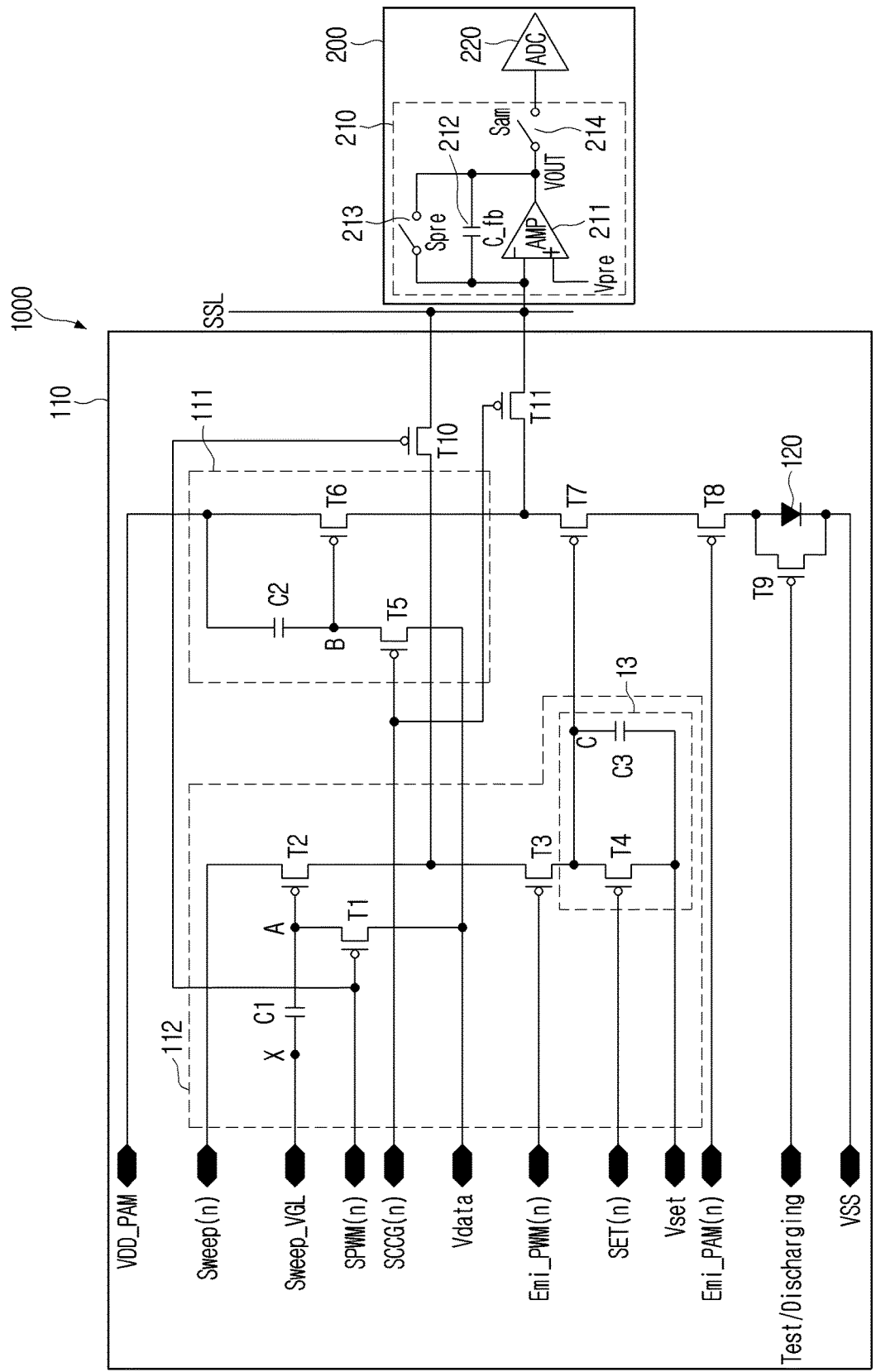
FIG. 33A is a detailed circuit diagram of a sub-pixel circuit and a sensing unit according to still another embodiment.
Figure 33B:
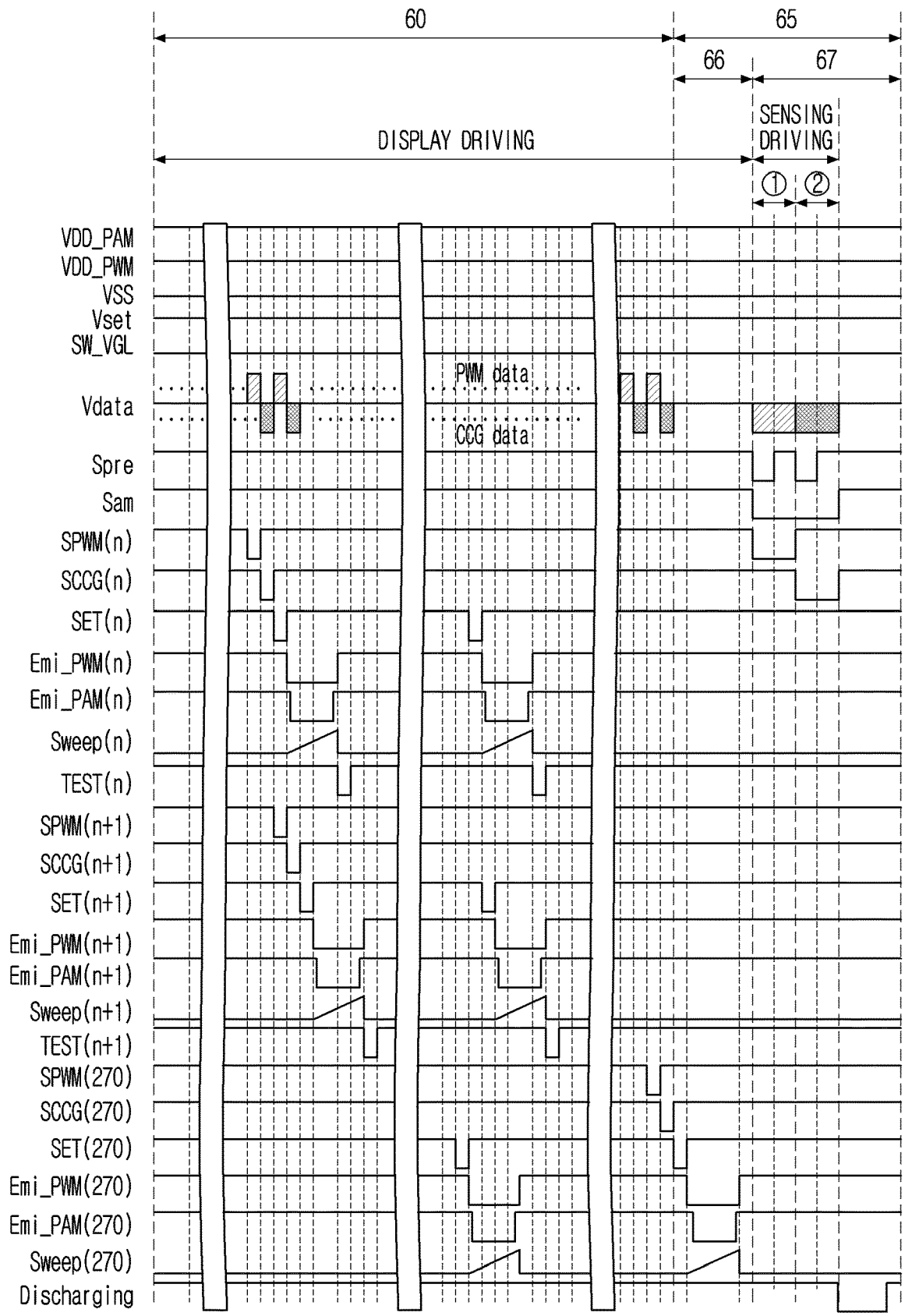
FIG. 33B is a timing diagram of various kinds of signals for driving a display panel including the sub-pixel circuit and the sensing unit illustrated in FIG. 33A during an image frame period and a blanking interval, according to an embodiment.

FIG. 33A is a detailed circuit diagram of the sub-pixel circuit 110 and the sensing unit 200 according to still another embodiment of the disclosure, and FIG. 33B is a timing diagram of various kinds of signals for driving a display panel including the sub-pixel circuit and the sensing unit illustrated in FIG. 33A during an image frame period and a blanking interval.

The sub-pixel circuit 110 illustrated in FIG. 33A is similar to the sub-pixel circuit 110 in FIG. 32A, in that it receives application of an image data voltage (a PWM data voltage, a constant current generator data voltage) and a specific voltage (the second specific voltage, the first specific voltage) through one data signal line Vdata.

Accordingly, referring to FIGS. 33A and 33B, it can be seen that by using two scan signals (or scan signal lines) such as SPWM(n) and SCCG(n), an image data voltage and a specific voltage are respectively applied to the sub-pixel circuit 110 in a data setting section and a sensing driving period.

In embodiments, the sub-pixel circuit 110 illustrated in FIG. 33A is similar to the embodiment of FIG. 31A, in that scan signals are used for controlling the turning-on/turning-off of the transistor T10 and the transistor T11, without using separate control signals (PWM_Sen(n) and CCG_Sen(n) in FIG. 32A).

In the case of the embodiment of FIG. 33A, two scan signals such as SPWM(n) and SCCG(n) are used, and thus the gate terminal of the transistor T10 is connected to the scan signal SPWM(n), and the gate terminal of the transistor T11 is connected to the scan signal SCCG(n), as illustrated in the drawing.

In embodiments, in the case of the embodiments in FIGS. 33A and 33B, a current may be made to flow to the sensing unit 200 only during a sensing driving period, by turning off the switch inside the amp 211 during a data setting section, and turning on the switch inside the amp 211 during a sensing driving period, as described above.

Other than the above, the remaining contents regarding the configuration and the driving of the sub-pixel circuit 110 illustrated in FIGS. 33A and 33B can be sufficiently understood through the contents illustrated in the drawings and the contents described above, and thus overlapping explanation will be omitted.

In the above description, in the embodiments wherein a PWM data voltage and a constant current generator data voltage are respectively applied through separate wirings such as Vdata_pwm and Vdata_ccg, two kinds of data drivers are used for providing a constant current generator data voltage and a PWM data voltage, and thus there is relatively little risk of heat generation from the data drivers. Also, as a scan signal SP(n) can be provided by using one kind of scan driver, the configuration can become relatively simple. However, as two kinds of data drivers are used, the cost relatively increases, and as two kinds of data signal lines are needed, the design of the display panel can become relatively complex.

In embodiments, in the above description, in the embodiments wherein a PWM data voltage and a constant current generator data voltage are respectively applied through one wiring such as Vdata, one kind of data driver is used, and thus the cost relatively decreases, and as one kind of data signal line Vdata is enough, the design can become relatively simple.

However, as a relatively high PWM data voltage and a relatively low constant current generator data voltage are alternatingly applied to the display panel 100 through one kind of data driver, there is a risk of heat generation from the data driver, and as two kinds of scan drivers are needed for providing a scan signal SPWM(n) and a scan signal SCCG(n), the configuration can become relatively complex.

Hereinafter, other embodiments of the display apparatus to which the internal compensation method is applied will be described through FIGS. 34 to 37B. In describing FIGS. 34 to 37B, explanation regarding contents that overlap with what is described in the aforementioned embodiments related to the internal compensation method will be omitted.

Figure 34:
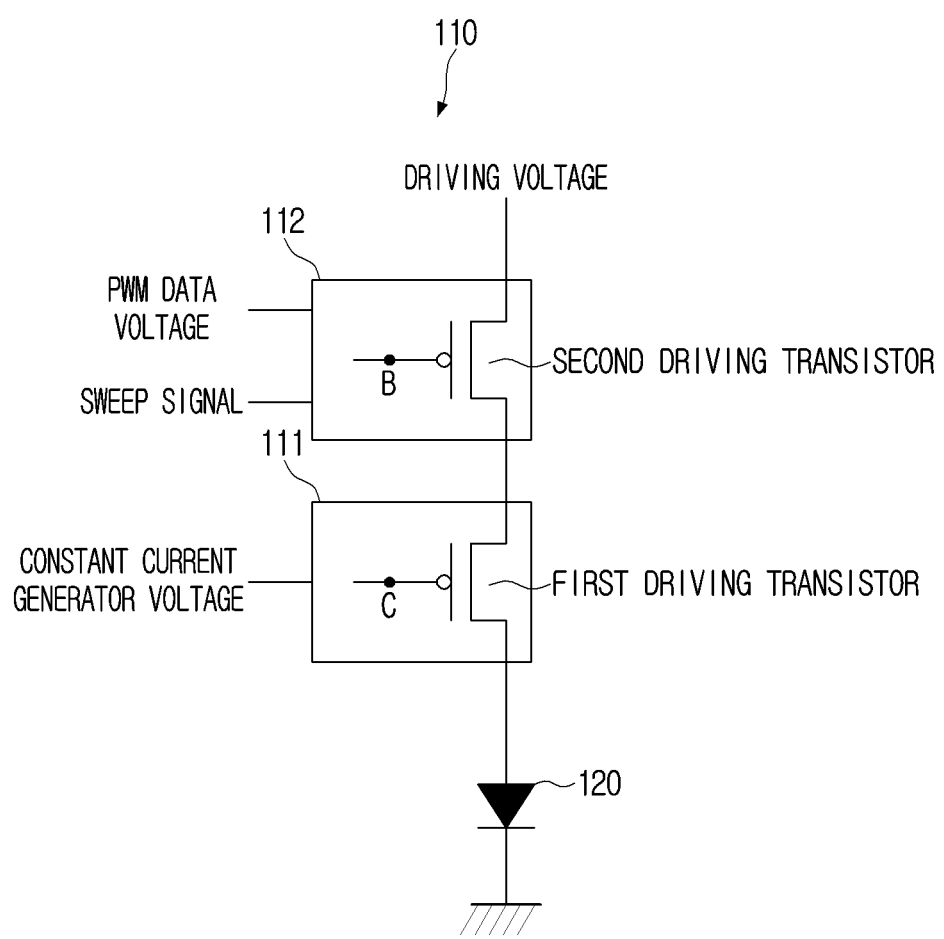
FIG. 34 is a schematic block diagram of a sub-pixel circuit according to an embodiment.

FIG. 34 is a schematic block diagram of the sub-pixel circuit 110 according to an embodiment of the disclosure. According to FIG. 34, the sub-pixel circuit 110 includes a constant current generator circuit 111 and a PWM circuit 112.

The constant current generator circuit 111 includes a first driving transistor, and it may provide a constant current to the inorganic light emitting element 120 based on a constant current generator data voltage applied from the driver 500.

As described above, according to an embodiment of the disclosure, the same constant current generator data voltage may be applied to all of the constant current generator circuits 111 of the display panel 100. In this case, the constant current generator circuits 111 may provide a constant current of a constant (or same) magnitude to all of the inorganic light emitting elements 120 of the display panel 100.

In embodiments, for compensating a deviation in the threshold voltages among the first driving transistors, when a constant current generator data voltage is applied during a data setting section, the constant current generator circuit 111 may apply a voltage which is the sum of the constant current generator data voltage and the threshold voltage of the first driving transistor to the gate terminal (the C node) of the first driving transistor.

Afterwards, in a light emitting section, the constant current generator circuit 111 may apply a constant current of a magnitude based on a value corresponding to a square of a voltage which is obtained by subtracting the threshold voltage of the first driving transistor from the voltage between the gate terminal and the source terminal of the first driving transistor, i.e., $(|Vgs|-|Vth|)^2$ to the inorganic light emitting element 120.

In this case, to the gate terminal of the first driving transistor, a voltage (VCCG+Vth) which is the sum of the constant current generator data voltage (e.g., VCCG) and the threshold voltage (e.g., Vth) of the first driving transistor is applied during the data setting section, and thus if the threshold voltage of the first driving transistor is subtracted from the voltage between the gate terminal and the source terminal of the first driving transistor, the threshold voltage of the first driving transistor is erased.

To be more specific, the first driving transistor is PMOS TFT, and thus $(|Vgs|-|Vth|)^2=(Vsg+Vth)^2$. In this case, it can be seen that Vsg=Vs−(VCCG+Vth), and thus Vsg+Vth=Vs−(VCCG+Vth)+Vth, and Vth is deleted.

Accordingly, the magnitude of the constant current provided by the constant current generator circuit 111 becomes irrelevant to the threshold voltage of the first driving transistor, and thus the threshold voltage deviation between the first driving transistors can be compensated as such.

The PWM circuit 112 includes a second driving transistor, and may control the time during which the constant current is provided to the inorganic light emitting element 120 based on the PWM data voltage and the sweep signal applied from the driver 500.

Specifically, the PWM circuit 112 may control the time during which the constant current flows to the inorganic light emitting element 120 by applying a driving voltage to the constant current generator circuit 111 (specifically, the source terminal of the first driving transistor) only during the time period in which the second driving transistor is turned on in the light emitting section.

Referring to FIG. 34, the constant current generator circuit 111 may provide a constant current to the inorganic light emitting element 120 by applying the driving voltage applied through the second driving transistor of the PWM circuit 112 to the inorganic light emitting element 120.

In this case, the driving voltage is provided to the constant current generator circuit 111 from the PWM circuit 112 only while the second driving transistor is turned on in the light emitting section. Also, a time period in which the second driving transistor is turned on in the light emitting section is determined on the basis of the PWM data voltage and the sweep voltage.

Accordingly, the PWM circuit 112 may control the time during which the constant current is provided to the inorganic light emitting element 120 based on the PWM data voltage and the sweep signal.

In embodiments, in order to compensate the deviation in the threshold voltages of the second driving transistors, according to an embodiment of the disclosure, while the second driving transistor operates as a source follower in the data setting section, the PWM circuit 112 may obtain the threshold voltage of the second driving transistor.

The threshold voltage of the second driving transistor obtained as such may be applied to the gate terminal of the second driving transistor, and the threshold voltage of the second driving transistor may be compensated therethrough.

To be more specific, during the light emitting section, the voltage of the gate terminal of the second driving transistor changes from a voltage (−VPWM+Vth) which is the sum of the PWM data voltage component (e.g., −VPWM) and the threshold voltage component (e.g., +Vth) of the second driving transistor according to the sweep voltage. (In practice, there is also a reference voltage component +Vref as will be described later, but it will be omitted for the convenience of explanation.)

Here, the sweep voltage is a voltage signal that sweeps between two different voltages once. In addition, the sweep voltage may be a part selected based on an emission signal Emi(n), which will be described later, among sweep signals in a form wherein a voltage linearly changing from the first voltage to the second voltage is continuously repeated. Here, the sweep signal is a global signal applied identically to all of the sub-pixel circuits 110 of the display panel 100, and the change rate of the sweep voltage according to time is constant.

In embodiments, the second driving transistor is turned on when the voltage of the gate terminal is lower than the voltage corresponding to the sum of the voltage of the source terminal and the threshold voltage. As will be described below, a driving voltage (e.g., VDD_PAM) is applied to the source terminal of the second driving transistor in the light emitting section, and thus the second driving transistor is turned on when the voltage of the gate terminal becomes lower than the sum (VDD_PAM+Vth) of the driving voltage VDD_PAM and the threshold voltage Vth.

Accordingly, in the light emitting section, the second driving transistor is turned on when the voltage of the gate terminal changes from −VPWM+Vth according to the sweep voltage, and becomes VDD_PAM+Vth. Accordingly, the threshold voltage value (e.g., the Vth value) of the second driving transistor does not exert any influence at all on the time when the second driving transistor is turned on. That is, the time when the second driving transistor is turned on in the light emitting section may be determined regardless of the threshold voltage value (the Vth value) of the second driving transistor.

As such, the deviation in the threshold voltages among the second driving transistors can be compensated.

Figure 35A:
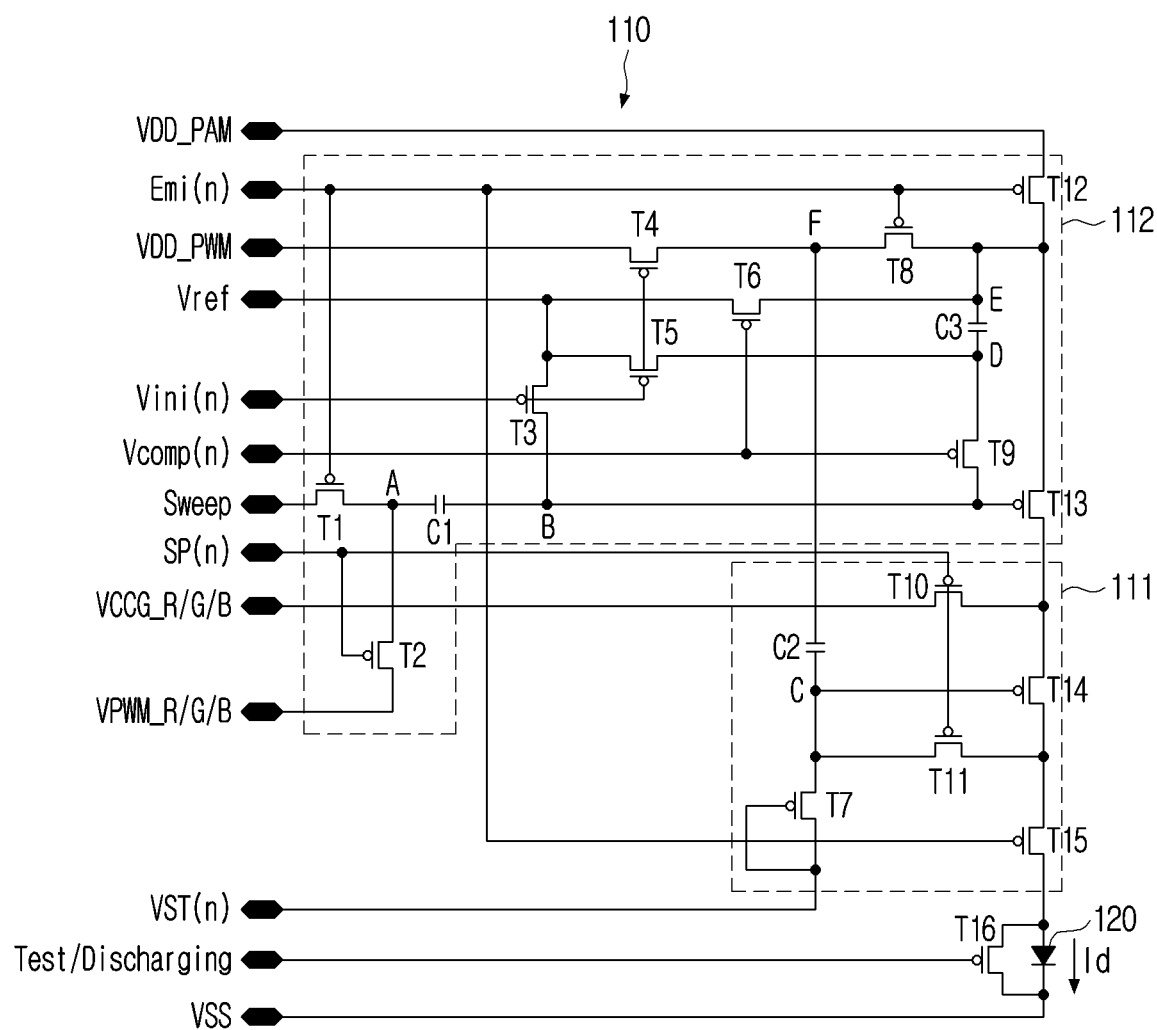
FIG. 35A is a detailed circuit diagram of a sub-pixel circuit according to an embodiment.

FIG. 35A is a detailed circuit diagram of the sub-pixel circuit 110 according to an embodiment of the disclosure which has the configuration as in FIG. 34. Referring to FIG. 35A, the sub-pixel circuit 110 includes a constant current generator circuit 111, a PWM circuit 112, and a transistor T16. In this case, as described above, the constant current generator circuit 111 includes a first driving transistor T14, and the PWM circuit 112 includes a second driving transistor T13, respectively.

The transistor T16 is connected between the anode terminal and the cathode terminal of the inorganic light emitting element 120. The transistor T16 may be used for different uses respectively before and after the inorganic light emitting element 120 is mounted on the TFT layer and electronically connected with the sub-pixel circuit 110.

For example, before the inorganic light emitting element 120 and the sub-pixel circuit 110 are electronically connected with each other, the transistor T16 may be turned on according to a Test signal to check whether the sub-pixel circuit 110 is abnormal.

In embodiments, after the inorganic light emitting element 120 and the sub-pixel circuit 110 are connected with each other, the transistor T16 may perform a role of a discharging transistor. That is, the transistor T16 may be turned on according to a Discharging signal for discharging a charge remaining in the junction capacitance component of the inorganic light emitting element 120.

When the transistor T16 is turned on, the anode terminal and the cathode terminal of the inorganic light emitting element 120 are short-circuited, and thus the potential difference between both ends of the inorganic light emitting element 120 may be removed.

Here, the Discharging signal is a control signal provided from the TCON through the level shifter to control the turning-on/turning-off of the transistor T16, and is a global signal applied identically to all of the sub-pixel circuits 110 of the display panel 100.

In embodiments, VDD_PAM refers to a first driving voltage (e.g., +12[V]), VDD_PWM refers to a second driving voltage (e.g., +12[V]), and VSS refers to a ground voltage (e.g., 0[V]). Also, Vref refers to a reference voltage (e.g., +5[V]). Vref may be used to obtain a threshold voltage of the second driving transistor T13, as will be described later. The VDD_PAM, VDD_PWM, VSS, and Vref may be provided from the aforementioned power IC, but are not limited thereto.

Vini(n) refers to a scan signal applied to the sub-pixel circuit 110 in the data setting section, for applying the reference voltage (Vref) to the B node and the D node, and applying the second driving voltage (VDD_PWM) to the F node. The Vref applied to the B node and the D node may be used to obtain the threshold voltage of the second driving transistor T13, and the second driving voltage (VDD_PWM) applied to the F node may become a reference potential when the constant current generator data voltage is set.

VST(n) refers to a scan signal applied to the sub-pixel circuit 110 in the data setting section in order to initialize the voltage of the C node. When the voltage of the C node is initialized according to a VST(n) signal, the first driving transistor T14 gets in a turned-on state.

SP(n) refers to a scan signal applied to the sub-pixel circuit 110 in the data setting section, for applying a constant current generator data voltage (VCCG_R/G/B) to the C node, and applying a PWM data voltage (VPWM_R/G/B) to the A node.

Vcomp(n) refers to a scan signal applied to the sub-pixel circuit 110 in the data setting section, for applying the threshold voltage of the second driving transistor to the B node.

Emi(n) refers to an emission signal applied to the sub-pixel circuit 110 in the light emitting section, for applying the first driving voltage (VDD_PAM) to the E node and the F node, and applying the sweep voltage to the A node, and turning on the transistor T15.

In the above gate signals (scan signals and emission signals), n represents the $n^{th}$ row line. As described above, the driver 500 may drive the display panel 100 for each row line (or scan line or gate line), and thus each of the Vini(n), VST(n), SP(n), Vcomp(n), and Emi(n) may be applied identically to the sub-pixel circuits 110 included in the $n^{th}$ row line.

Sweep refers to a sweep signal. Here, a sweep signal may be generated in the TCON and applied identically to all of the sub-pixel circuits 110 of the display panel 100 through a level shifter, unlike the Sweep(n) shown in the embodiments in FIGS. 9A to 33B. That is, to all of the sub-pixel circuits 110 of the display panel 100, the same sweep signal may be applied. In this case, the sweep signal may be a global signal in a form wherein a voltage linearly changing from the first voltage to the second voltage is continuously repeated.

In embodiments, to the A node, a portion of a sweep signal is applied while the transistor T1 is turned on according to an emission signal Emi(n). As such, a portion of a sweep signal selectively applied to the A node may be the aforementioned sweep voltage.

In this case, the transistors T1 of the display panel 100 are turned on in the order of the row lines according to the emission signal, and accordingly, apart from the fact that the sweep signal is a global signal applied identically to all of the row lines, the waveform of the sweep voltage applied to the A node of the sub-pixel circuits 110 may vary according to the row lines.

VPWM_R/G/B refers to a PWM data voltage applied to the sub-pixel circuit 110.

VCCG_R/G/B refers to a constant current generator data voltage applied to the sub-pixel circuit 110. As described above, according to an embodiment of the disclosure, a constant current generator data voltage of the same magnitude may be applied to the display panel 100 for each type of the sub-pixels. Depending on embodiments, the same constant current generator data voltage may be applied from the power IC to all of the sub-pixel circuits 110 of the display panel 100, regardless of the types of the sub-pixels.

In embodiments, for resolving the aforementioned problem of an IR drop, in the embodiment of FIG. 35A, separate driving voltages (VDD_PAM and VDD_PWM) applied through separate wirings are also respectively applied to the constant current generator circuit 111 in the data setting section and the light emitting section.

That is, in the embodiment of FIG. 35A, the second driving voltage (VDD_PWM) is applied to the constant current generator circuit 111 according to a Vini(n) signal in the data setting section, and the first driving voltage (VDD_PAM) is applied to the constant current generator circuit 111 according to an Emi(n) signal in the light emitting section.

Accordingly, even if a voltage drop occurs in the first driving voltage (VDD_PAM) due to the sub-pixel circuits operating in the light emitting section, a separate second driving voltage (VDD_PWM) irrelevant to the driving current is applied to the sub-pixel circuits operating in the data setting section, and thus setting of a stable constant current generator data voltage becomes possible.

Figure 35B:
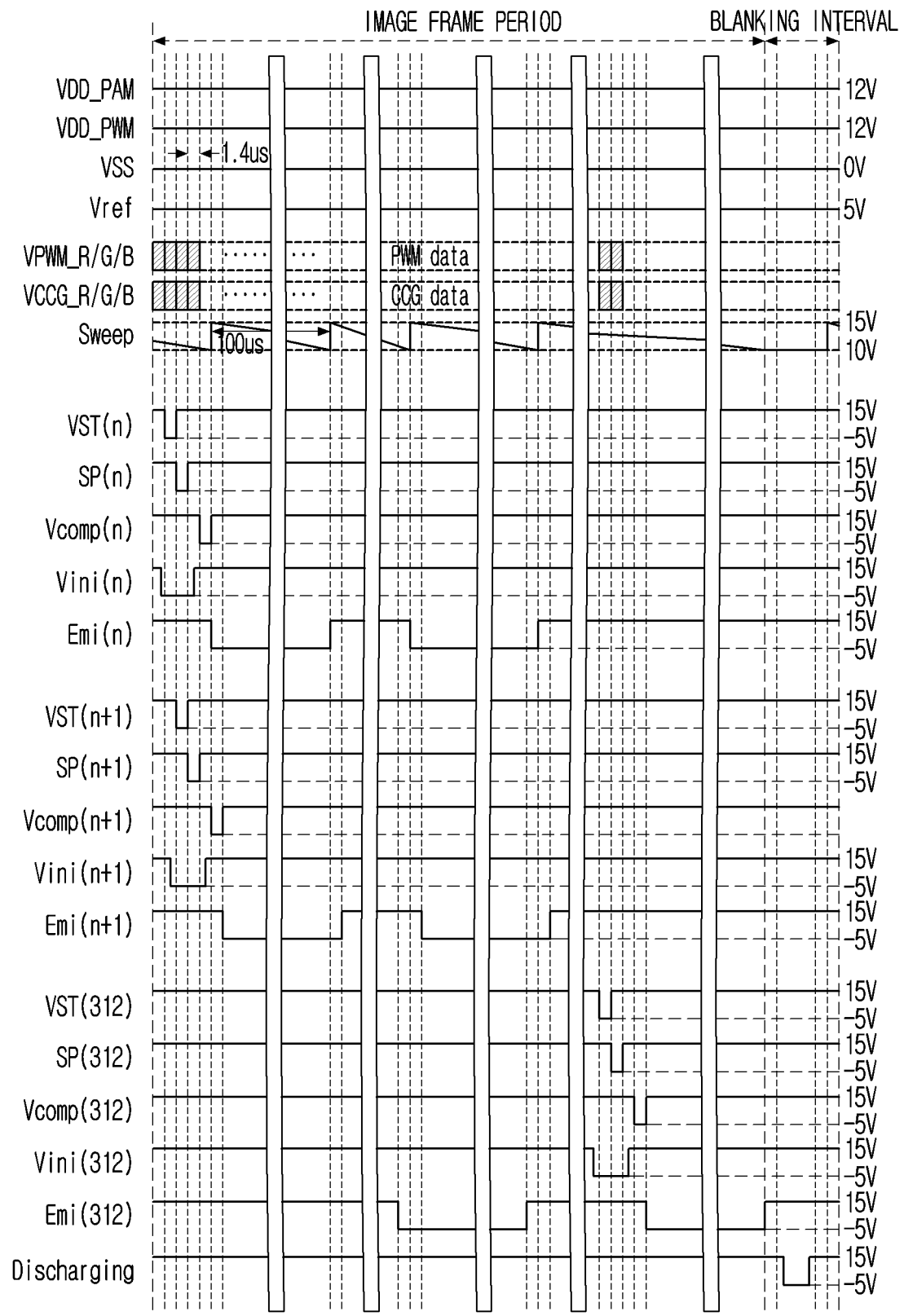
FIG. 35B is a timing diagram of various kinds of signals for driving a display panel including the sub-pixel circuit in FIG. 35A during an image frame period and a blanking interval, according to an embodiment.

FIG. 35B is a timing diagram of various kinds of signals for driving the display panel 100 including the sub-pixel circuit 110 in FIG. 35A during an image frame period and a blanking interval. In FIG. 35B, an example wherein the display panel 100 includes 312 row lines is suggested.

As described above, according to an embodiment of the disclosure, for one image frame, one data setting section and a plurality of light emitting sections may proceed for each row line. For this, referring to FIG. 35B, it can be seen that during an image frame period, scan signals (VST, SP, Vcomp, Vini) for a data setting operation are applied once for each row line, and an emission signal (Emi) for a light emitting operation is applied multiple times for each row line.

In embodiments, as described above, according to an embodiment of the disclosure, a data setting section and a light emitting section may proceed in the order of the row lines. For this, referring to FIG. 35B, it can be seen that each of the gate signals (VST, SP, Vcomp, Vini, Emi) is sequentially applied in the order of the row lines.

That is, for example, a VST(n) signal having a low level and a VST(n+1) signal having a low level are applied with a difference as much as 1 H time (1.4 µs in the example of FIG. 9B) from each other. This is the same for the remaining gate signals (SP signals (SP(n) and SP(n+1)), Vcomp signals (Vcomp(n) and Vcomp(n+1)), Vini signals (Vini(n) and Vini(n+1)), Emi signals (Emi(n) and Emi(n+1))).

In embodiments, referring to FIG. 35B, it can be seen that a Discharging signal having a low level is applied in a non-light emitting section in a blanking interval. As the Discharging signal is a global signal, it is applied identically to all of the sub-pixel circuits 110 of the display panel 100, and accordingly, charges remaining in all of the inorganic light emitting elements 120 of the display panel 100 may be discharged. That is, the potential difference between both ends of all of the inorganic light emitting elements 120 included in the display panel 100 may be removed.

As such, the potential difference between both ends of the inorganic light emitting element 120 is removed by a predetermined cycle, and accordingly, implementation of a correct black gray scale can be guaranteed, as described above.

In FIG. 35B, an example wherein an operation for discharging a charge remaining in the inorganic light emitting element (e.g., an operation for removing a potential difference between both ends of the inorganic light emitting element) is performed once for one image frame within a non-light emitting section that exists inside a blanking interval is suggested. However, embodiments are not limited thereto, and depending on products, the operation may be performed in various ways in various situations, as described above in FIGS. 7A to 7D.

In embodiments, as the detailed operations of the sub-pixel circuit 110 in a data setting section and a light emitting section can be understood through the circuit diagram shown in FIG. 35A and the driving timing diagram shown in FIG. 35B, more detailed explanation in that regard will be omitted below.

Figure 36A:
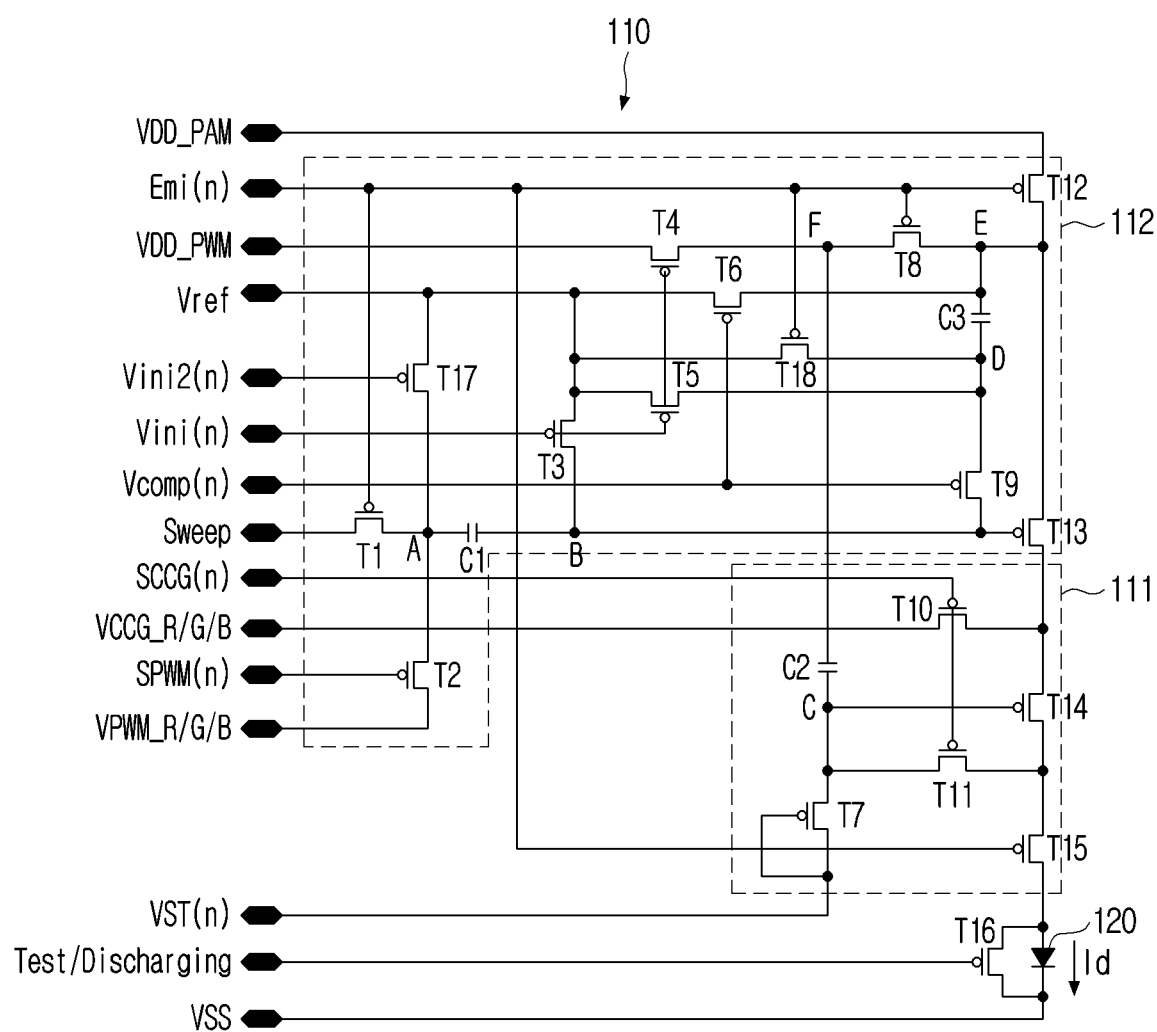
FIG. 36A is a detailed circuit diagram of a sub-pixel circuit according to another embodiment.

FIG. 36A is a detailed circuit diagram of the sub-pixel circuit 110 according to another embodiment of the disclosure which has the configuration as in FIG. 34. Referring to FIG. 36A, the sub-pixel circuit 110 includes a constant current generator circuit 111, a PWM circuit 112, and a transistor T16. In this case, the constant current generator circuit 111 includes a first driving transistor T14, and the PWM circuit 112 includes a second driving transistor T13, respectively.

The transistor T16 has the same connecting structure and function as those of the transistor T16 in FIG. 35A, and thus overlapping explanation will be omitted. This is also the same for the Test/Discharging signals.

The contents regarding VDD_PAM, VDD_PWM, VSS, and Vref are also the same as what is described above in FIG. 35A, and thus overlapping explanation will be omitted.

Vini(n) refers to a scan signal applied to the sub-pixel circuit 110 in the data setting section, for applying the reference voltage (Vref) to the B node and the D node, and applying the second driving voltage (VDD_PWM) to the F node. The Vref applied to the B node and the D node may be used to obtain the threshold voltage of the second driving transistor T13, and the second driving voltage (VDD_PWM) applied to the F node may become a reference potential when the constant current generator data voltage is set.

VST(n) refers to a scan signal applied to the sub-pixel circuit 110 in the data setting section in order to initialize the voltage of the C node. When the voltage of the C node is initialized according to a VST(n) signal, the first driving transistor T14 gets in a turned-on state.

Vini2(n) refers to a scan signal applied to the sub-pixel circuit 110 in the data setting section, for applying the reference voltage Vref to the A node. The Vref applied to the A node may be used to apply the threshold voltage of the second driving transistor T13 to the B node (e.g., the gate terminal of the second driving transistor T13), as will be described later.

SCCG(n) refers to a scan signal applied to the sub-pixel circuit 110 in the data setting section, for applying a constant current generator data voltage (VCCG_R/G/B) to the C node.

SPWM(n) refers to a scan signal applied to the sub-pixel circuit 110 in the data setting section, for applying a PWM data voltage (VPWM_R/G/B) to the A node.

Vcomp(n) refers to a scan signal applied to the sub-pixel circuit 110 in the data setting section, for applying the threshold voltage of the second driving transistor to the B node.

Emi(n) refers to an emission signal applied to the sub-pixel circuit 110 in the light emitting section, for applying the first driving voltage (VDD_PAM) to the E node and the F node, and applying the sweep voltage to the A node, and turning on the transistor T15.

In the above gate signals (scan signals and emission signals), n represents the $n^{th}$ row line. As described above, the driver 500 may drive the display panel 100 for each row line (or scan line or gate line), and thus each of the Vini(n), Vini2(n), VST(n), SCCG(n), SPWM(n), Vcomp(n), and Emi(n) may be applied identically to the sub-pixel circuits 110 included in the $n^{th}$ row line.

Sweep refers to a sweep signal. A sweep signal is a global signal that is applied identically to all of the sub-pixel circuits 110 of the display panel 100, and it may have a form wherein a voltage linearly changing from the first voltage to the second voltage is continuously repeated. To the A node, a portion of a sweep signal is applied while the transistor T1 is turned on according to an emission signal Emi(n), and a portion of a sweep signal selectively applied to the A node may be the aforementioned sweep voltage. As the contents related to a sweep signal are the same as what is described above in FIG. 35A, further overlapping explanation will be omitted.

VPWM_R/G/B refers to a PWM data voltage applied to the sub-pixel circuit 110.

VCCG_R/G/B refers to a constant current generator data voltage applied to the sub-pixel circuit 110.

In embodiments, in the embodiment of FIG. 36A, the second driving voltage (VDD_PWM) is applied to the constant current generator circuit 111 according to a Vini(n) signal in the data setting section, and the first driving voltage (VDD_PAM) is applied to the constant current generator circuit 111 according to an Emi(n) signal in the light emitting section. Accordingly, even if a voltage drop occurs in the first driving voltage (VDD_PAM) due to the sub-pixel circuits operating in the light emitting section, a constant current generator data voltage may be set stably to the sub-pixel circuits operating in the data setting section.

Figure 36B:
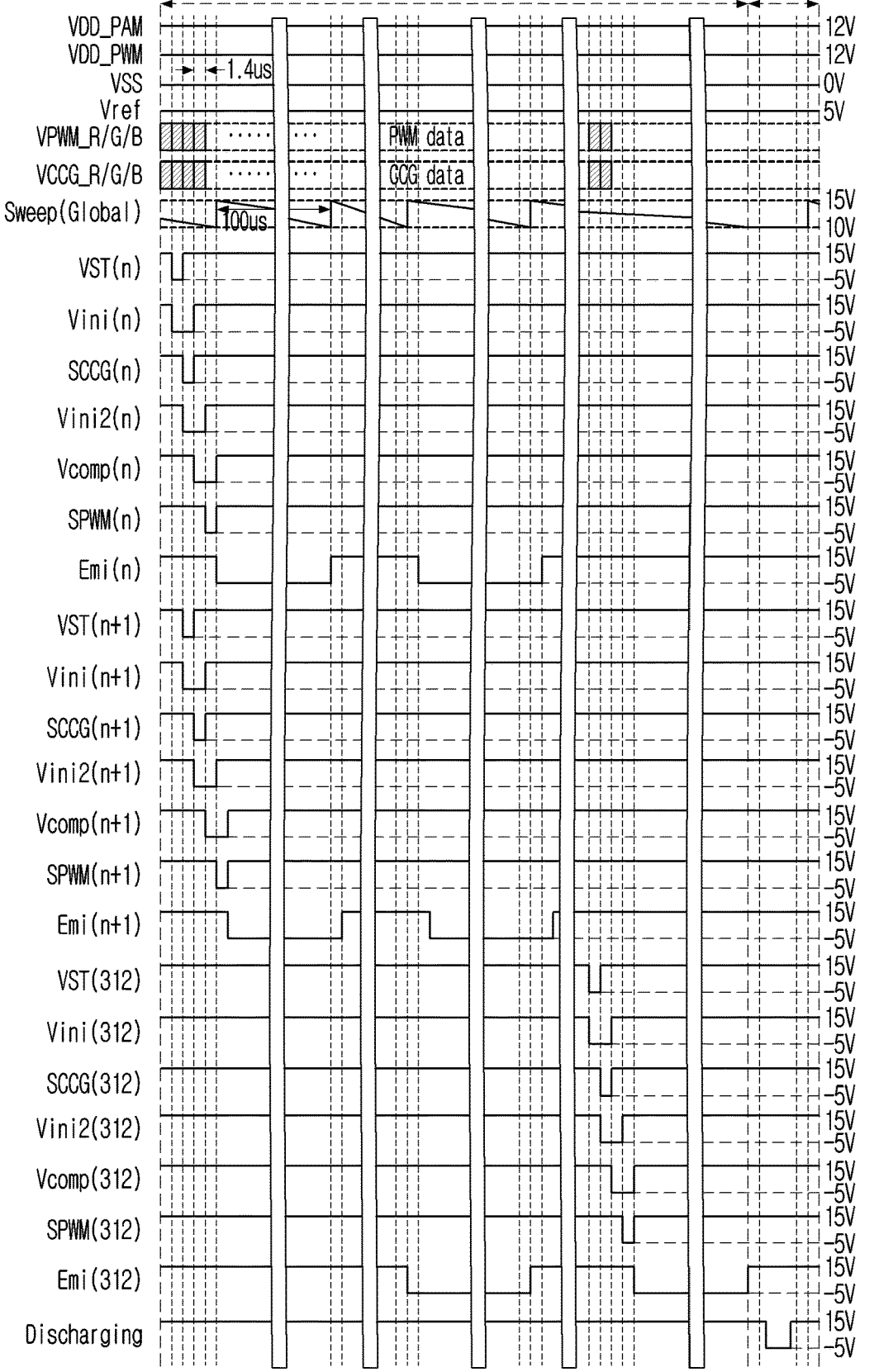
FIG. 36B is a timing diagram of various kinds of signals for driving a display panel including the sub-pixel circuit in FIG. 36A during an image frame period and a blanking interval, according to an embodiment.

FIG. 36B is a timing diagram of various kinds of signals for driving the display panel 100 including the sub-pixel circuit 110 in FIG. 36A during an image frame period and a blanking interval. In FIG. 36B, an example wherein the display panel 100 includes 312 row lines is suggested.

As described above, according to an embodiment of the disclosure, for one image frame, one data setting section and a plurality of light emitting sections may proceed for each row line. For this, referring to FIG. 36B, it can be seen that during an image frame period, scan signals (VST, Vini, SCCG, Vini2, Vcomp, SPWM) for a data setting operation are applied once for each row line, and an emission signal (Emi) for a light emitting operation is applied multiple times for each row line.

That is, a time period wherein VST, Vini, SCCG, Vini2, Vcomp, and SPWM signals having a low level are applied becomes the data setting section of the corresponding row line, and a time period wherein an Emi signal of a low level is applied becomes the light emitting section of the corresponding row line.

In embodiments, as described above, according to an embodiment of the disclosure, a data setting section and a light emitting section may proceed in the order of the row lines. For this, referring to FIG. 36B, it can be seen that each of the gate signals (VST, Vini, SCCG, Vini2, Vcomp, SPWM, Emi) is sequentially applied in the order of the row lines. That is, for example, a VST(n) signal having a low level and a VST(n+1) signal having a low level are applied with a difference as much as 1 H time (1.4 µs in the example of FIG. 12B) from each other. This is the same for the remaining gate signals (Vini signals (Vini(n) and Vini(n+1)), SCCG signals (SCCG(n) and SCCG(n+1)), Vini2 signals (Vini2(n) and Vini2(n+1)), Vcomp signals (Vcomp(n) and Vcomp(n+1)), SPWM signals (SPWM(n) and SPWM(n+1)), Emi signals (Emi(n) and Emi(n+1))).

In embodiments, referring to FIG. 36B, it can be seen that a Discharging signal having a low level is applied in a non-light emitting section in a blanking interval. As such, the potential difference between both ends of the inorganic light emitting element 120 is removed by a predetermined cycle, and accordingly, implementation of a correct black gray scale can be guaranteed, as described above.

In FIG. 36B, an example wherein an operation for removing a potential difference between both ends of the inorganic light emitting element is performed once for one image frame within a non-light emitting section that exists inside a blanking interval is suggested. However, embodiments are not limited thereto, and depending on products, the operation may be performed in various ways in various situations, as described above in FIGS. 7A to 7D.

In embodiments, as the detailed operations of the sub-pixel circuit 110 in a data setting section and a light emitting section can be understood through the circuit diagram shown in FIG. 36A and the driving timing diagram shown in FIG. 36B, more detailed explanation in that regard will be omitted below.

In this case, if a case wherein the capacitance value of C3 is sufficiently bigger than the capacitance value of C1 is assumed, C3/(C1+C3) may have a value close to 1, and C1/(C1+C3) may have a value close to 0. Here, if it is assumed that C3/(C1+C3) is 1, and C1/(C1+C3) is 0, it can be seen that the embodiments of FIGS. 36A and 36B operate in a similar manner to the embodiments of FIGS. 35A and 35B.

In the embodiments described through FIGS. 35A to 36B, the deviation in the threshold voltages of the second driving transistors was compensated as the threshold voltage of the second driving transistor was acquired while the second driving transistor operated as a source follower, and the acquired threshold voltage was applied to the gate terminal of the second driving transistor.

Figure 37A:
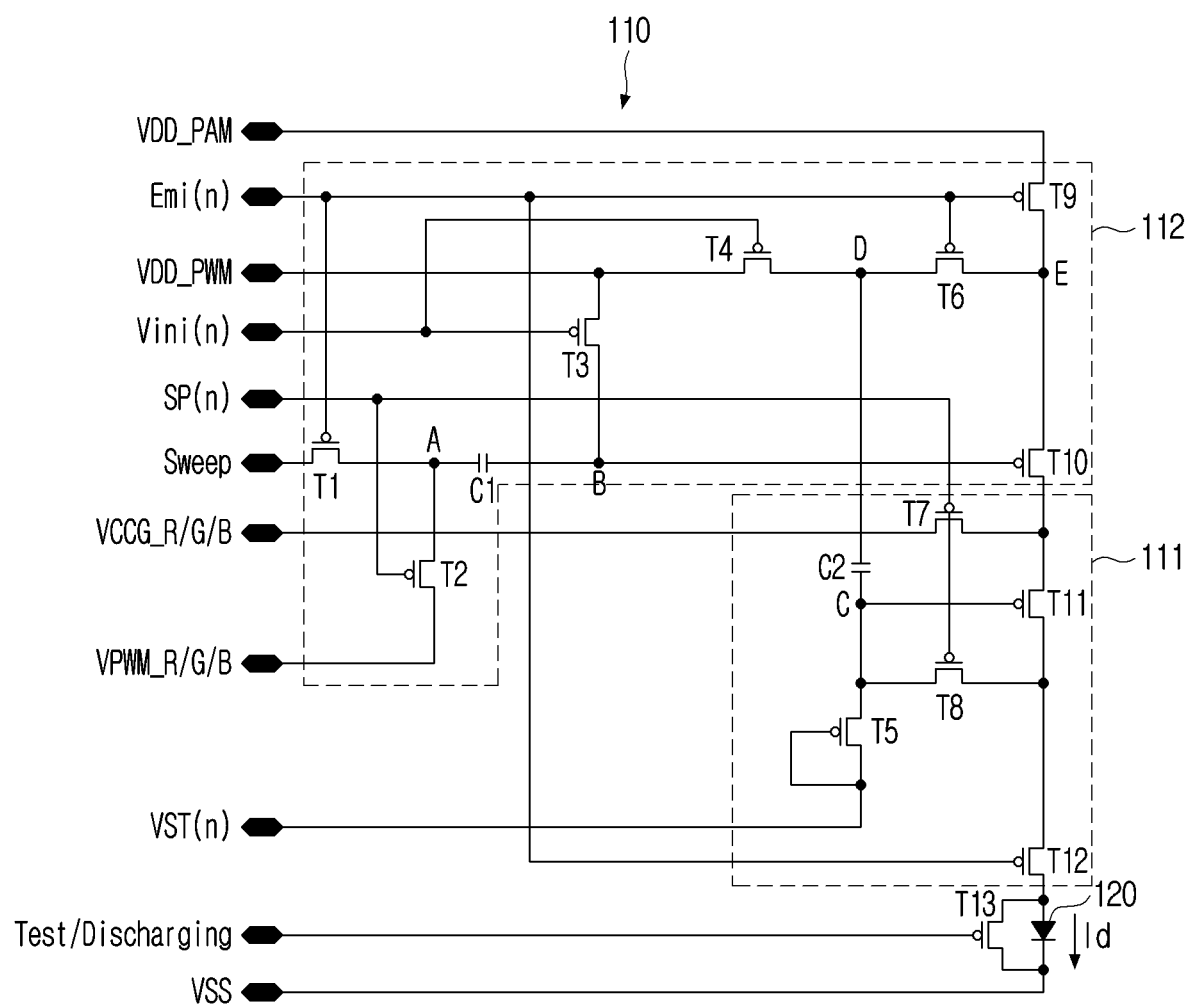
FIG. 37A is a detailed circuit diagram of a sub-pixel circuit according to still another embodiment.
Figure 37B:
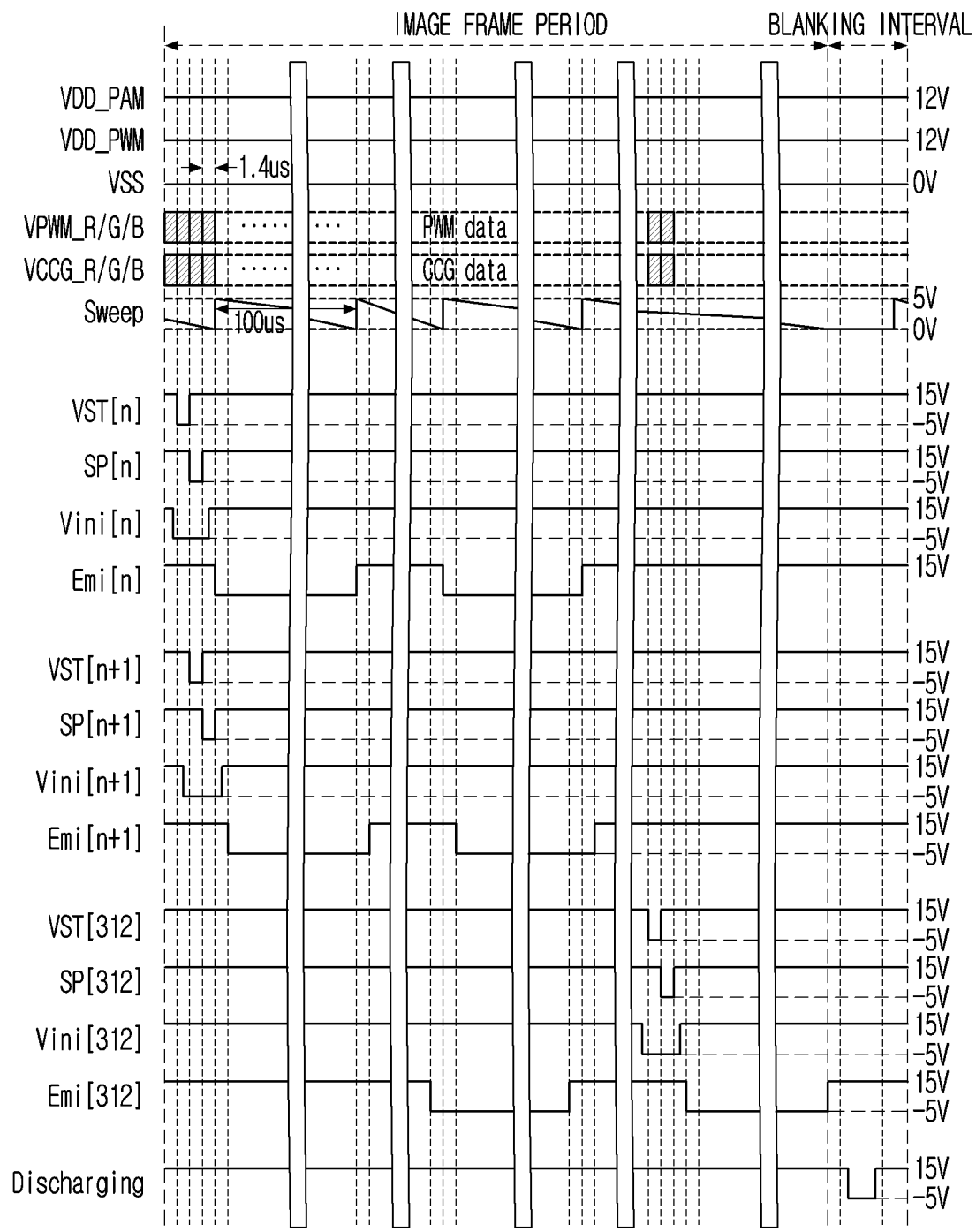
FIG. 37B is a timing diagram of various kinds of signals for driving a display panel including the sub-pixel circuit in FIG. 37A during an image frame period and a blanking interval, according to an embodiment.

However, a method of compensating the deviation in the threshold voltages of the second driving transistors is not limited thereto. In FIGS. 37A and 37B, embodiments wherein the deviation in the threshold voltages of the second driving transistors is compensated by correcting a PWM data voltage will be described.

In the case of the embodiments that will be described through FIGS. 37A and 37B, the number of the transistors included in the sub-pixel circuits decreases compared to the embodiments described above through FIGS. 35A to 36B, and accordingly, there is an advantage that embodiments can be applied to a display panel having a higher resolution.

In embodiments, in the embodiments of FIGS. 37A and 37B, the deviation in the threshold voltages of the first driving transistors can be compensated by the same method as that of the embodiments of FIGS. 35A to 36B.

FIG. 37A is a detailed circuit diagram of the sub-pixel circuit 110 according to still another embodiment of the disclosure which has the configuration as in FIG. 34. Referring to FIG. 37A, the sub-pixel circuit 110 includes a constant current generator circuit 111, a PWM circuit 112, and a transistor T13. In this case, the constant current generator circuit 111 includes a first driving transistor T11, and the PWM circuit 112 includes a second driving transistor T10, respectively.

The transistor T13 has the same connecting structure and function as those of the transistor T16 in FIG. 35A, and thus overlapping explanation will be omitted. This is also the same for the Test/Discharging signals.

The contents regarding VDD_PAM, VDD_PWM, and VSS are also the same as what is described above in FIG. 35A.

In embodiments, unlike the sub-pixel circuit 110 in FIG. 35A, the reference voltage (Vref) is not applied to the sub-pixel circuit 110 in FIG. 37A. This is because, in the embodiment of FIG. 37A, the threshold voltage of the second driving transistor does not need to be acquired while the sub-pixel circuit 110 operates.

Vini(n) refers to a scan signal applied to the sub-pixel circuit 110 in the data setting section, for applying the second driving voltage (VDD_PWM) to the B node and the D node. The second driving voltage (VDD_PWM) applied to the B node performs a role of making the second driving transistor T10 maintain the turned-off state during the data setting section, and the second driving voltage (VDD_PWM) applied to the D node becomes a reference potential when the constant current generator data voltage is set.

VST(n) refers to a scan signal applied to the sub-pixel circuit 110 in the data setting section in order to initialize the voltage of the C node. When the voltage of the C node is initialized according to a VST(n) signal, the first driving transistor T11 gets in a turned-on state.

SP(n) refers to a scan signal applied to the sub-pixel circuit 110 in the data setting section, for applying a constant current generator data voltage (VCCG_R/G/B) to the C node, and applying a PWM data voltage (VPWM_R/G/B) to the A node. In this case, the PWM data voltage (VPWM_R/G/B) may be a voltage to which a compensation value according to the deviation in the threshold voltages of the second driving transistors is reflected. The content regarding the compensation value will be described later in the explanation regarding a VPWM_R/G/B signal.

In embodiments, unlike the sub-pixel circuit 110 in FIG. 35A, a Vcomp(n) signal is not applied to the sub-pixel circuit 110 in FIG. 37A. This is because, in the embodiment of FIG. 37A, the threshold voltage of the second driving transistor does not need to be applied to the B node while the sub-pixel circuit 110 operates.

Emi(n) refers to an emission signal applied to the sub-pixel circuit 110 in the light emitting section, for applying the first driving voltage (VDD_PAM) to the E node and the D node, and applying the sweep voltage to the A node, and turning on the transistor T12.

In the above gate signals (scan signals and emission signals), n represents the $n^{th}$ row line. As described above, the driver 500 may drive the display panel 100 for each row line (or scan line or gate line), and thus each of the Vini(n), VST(n), SP(n), and Emi(n) may be applied identically to the sub-pixel circuits 110 included in the $n^{th}$ row line.

Sweep refers to a sweep signal. The content regarding a sweep signal is the same as what is described above in FIG. 35A, and thus overlapping explanation will be omitted.

VPWM_R/G/B refers to a PWM data voltage applied to the sub-pixel circuit 110. In the embodiments of FIGS. 35A and 36B, a PWM data voltage is just a voltage corresponding to a gray scale value of a sub-pixel, but in the embodiments of FIGS. 37A and 37B, a PWM data voltage may be a voltage corresponding to a value wherein a compensation value is reflected to a gray scale value of a sub-pixel.

In this case, the compensation value is a value for compensating the deviation in the brightness of the sub-pixels according to the deviation in the threshold voltages of the second driving transistors, and for example, it may be calculated for each sub-pixel in the manufacturing step of the display panel 100, and stored in the memory. Accordingly, the TCON may read the compensation value stored in the memory and reflect it to the image data, and transmit the image data to which the compensation value is reflected to the data driver, and accordingly, the PWM data voltage to which the compensation value is reflected may be applied to the sub-pixel circuit 110.

To be more specific, for example, in the manufacturing step, a test image (for example, an image wherein all pixels have the same gray scale value) may be displayed on the display panel 100, and the display panel 100 may be captured by an image capturing apparatus. When the test image is displayed, the compensation value has not yet been reflected, and thus a stain or brightness difference may be present for each pixel in the captured image due to the deviation in the threshold voltages of the second driving transistors. Accordingly, in an image captured afterwards, the compensation value for each sub-pixel may be calculated by calculating a value to be reflected to the gray scale value of each sub-pixel such that a stain or brightness deviation does not exist.

VCCG_R/G/B refers to a constant current generator data voltage applied to the sub-pixel circuit 110. As the content related to the constant current generator data voltage is the same as what is described above, overlapping explanation will be omitted. Also, as the contents regarding the problem due to an IR drop that occurs when a driving current flows in a light emitting section and a solution therefor are the same as what is described above, overlapping explanation will be omitted.

FIG. 37B is a timing diagram of various kinds of signals for driving the display panel 100 including the sub-pixel circuit 110 in FIG. 37A during an image frame period and a blanking interval. In FIG. 37B, an example wherein the display panel 100 includes 312 row lines is suggested.

Referring to FIG. 37B, it can be seen that during an image frame period, scan signals (VST, SP, Vini) for a data setting operation are applied once for each row line, and an emission signal (Emi) for a light emitting operation is applied multiple times for each row line. That is, a time period wherein VST, SP, and Vini signals having a low level are applied becomes the data setting section of the corresponding row line, and a time period wherein an Emi signal having a low level is applied becomes the light emitting section of the corresponding row line.

Also, referring to FIG. 37B, it can be seen that each of the gate signals (VST, SP, Vini, Emi) is sequentially applied in the order of the row lines. That is, for example, a VST(n) signal having a low level and a VST(n+1) signal having a low level are applied with a difference as much as 1 H time (1.4 µs in the example of FIG. 12B) from each other. This is the same for the remaining gate signals (SP signals (SP(n) and SP(n+1)), Vini signals (Vini(n) and Vini(n+1)), Emi signals (Emi(n) and Emi(n+1))).

In embodiments, referring to FIG. 37B, it can be seen that a Discharging signal having a low level is applied in a non-light emitting section in a blanking interval. The content in this regard is also the same as what is described above.

As the detailed operations of the sub-pixel circuit 110 in a data setting section and a light emitting section can be understood through the circuit diagram shown in FIG. 37A and the driving timing diagram shown in FIG. 37B, more detailed explanation in that regard will be omitted below.

Hereinafter, another embodiment of a display apparatus to which an external compensation method is applied will be described through FIGS. 38 to 39B.

Figure 38:
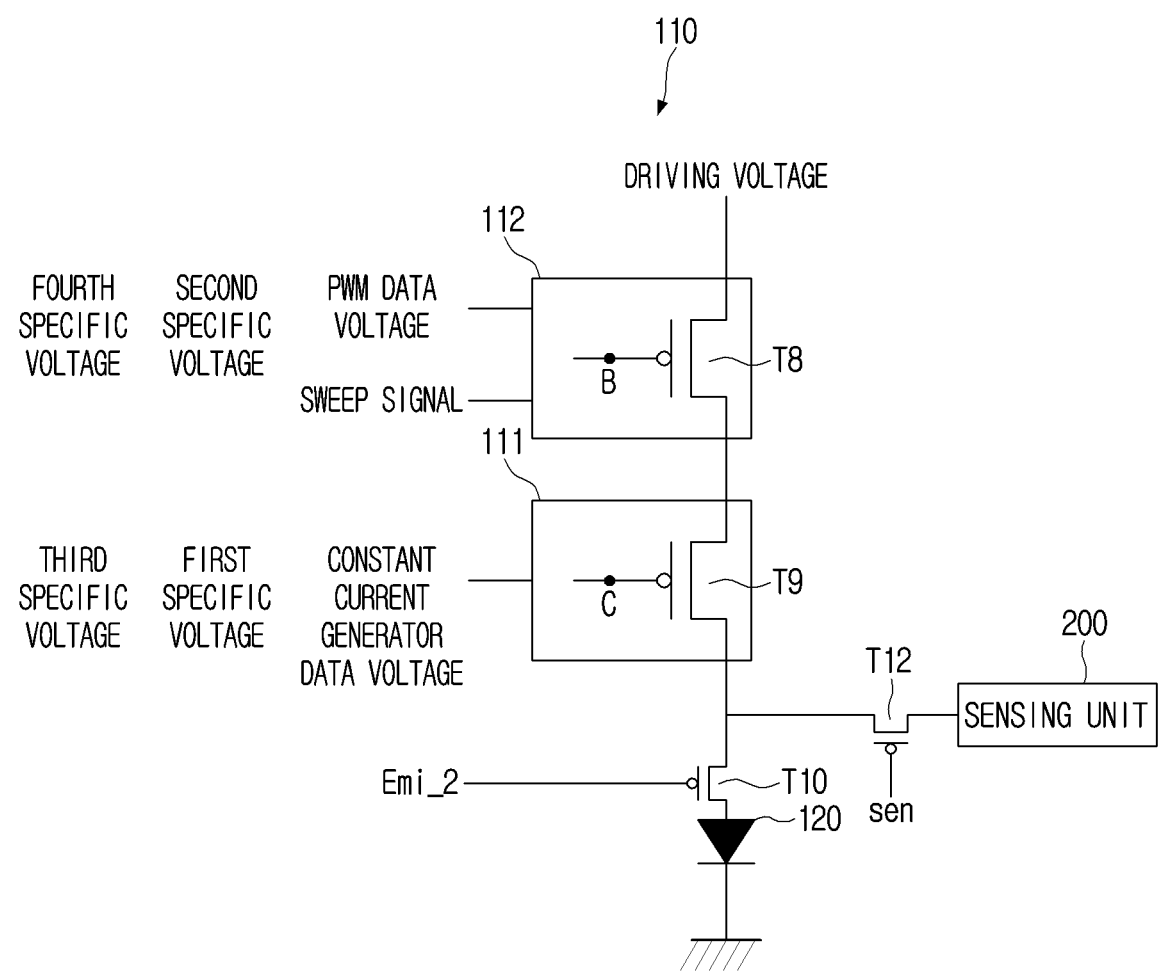
FIG. 38 is a schematic block diagram of a sub-pixel circuit according to an embodiment.

FIG. 38 is a schematic block diagram of the sub-pixel circuit 110 according to an embodiment of the disclosure. According to FIG. 38, the sub-pixel circuit 110 includes a constant current generator circuit 111, a PWM circuit 112, a transistor T10, and a transistor T12.

The constant current generator circuit 111 includes a first driving transistor T9, and it may provide a constant current to the inorganic light emitting element 120 based on a constant current generator data voltage applied during a display driving period.

Specifically, when a driving voltage is applied through the second driving transistor T8 of the PWM circuit 112 in a light emitting section, the constant current generator circuit 111 may apply the driving voltage to the inorganic light emitting element 120 through the first driving transistor T9. Accordingly, a constant current may flow in the inorganic light emitting element 120.

In this case, the magnitude of the constant current may vary depending on the magnitude of the constant current generator data voltage applied to the constant current generator circuit 111. That is, the constant current generator circuit 111 has capability of performing PAM driving of the inorganic light emitting element 120. Accordingly, in embodiments, the constant current generator data voltage may be referred to as a PAM data voltage, and the constant current generator circuit 111 may be referred to as a PAM circuit, respectively.

However, according to an embodiment of the disclosure, a same constant current generator data voltage may be applied to all of the constant current generator circuits 111 of the display panel 100, and in this example, the constant current generator circuits 111 may provide a constant current of a constant magnitude (or a same magnitude) to all of the inorganic light emitting elements 120 of the display panel 100.

The names of "constant current generator circuit" and "constant current generator data voltage" only emphasize that, when the same PAM data voltage is applied to the PAM circuits of the display panel 100 as described above, the PAM circuits operate as a constant current generator, for example constant current generator circuit 111, and the capability of the components is not limited by the names.

The PWM circuit 112 includes the second driving transistor, and it may control the time during which a constant current is provided to the inorganic light emitting element 120 based on a PWM data voltage and a sweep signal (specifically, a sweep voltage) applied to a display driving period.

Specifically, the PWM circuit 112 may control the time during which a constant current flows to the inorganic light emitting element 120 by applying a driving voltage to the constant current generator circuit 111 (specifically, a source terminal of the first driving transistor) only during the time period in which the second driving transistor is turned on in a light emitting section.

As described above, the constant current generator circuit 111 provides a constant current to the inorganic light emitting element 120 by applying the driving voltage applied through the second driving transistor of the PWM circuit 112 to the inorganic light emitting element 120.

In this case, the driving voltage is provided to the constant current generator circuit 111 from the PWM circuit 112 only while the second driving transistor is turned on in the light emitting section. Also, the time period in which the second driving transistor is turned on in the light emitting section is determined on the basis of the PWM data voltage and the sweep voltage as described below.

Accordingly, the PWM circuit 112 may control the time during which the constant current is provided to the inorganic light emitting element 120 based on the PWM data voltage and the sweep voltage.

Here, the sweep voltage is a voltage signal that sweeps between two different voltages once. In addition, the sweep voltage may be a part selected based on an emission signal Emi_1(n), which will be described later, among sweep signals in a form wherein a voltage linearly changing from the first voltage to the second voltage is continuously repeated. Also, the sweep signal is a global signal applied identically to all of the sub-pixel circuits 110 of the display panel 100, and the change rate of the sweep voltage according to time is constant.

In embodiments, in a light emitting section in a display driving period, the transistor T10 gets in a turned-on state by a control signal Emi_2. Accordingly, in the light emitting section, a driving voltage may be applied to the light emitting element 120, and a constant current may flow to the light emitting element 120. In contrast, during the display driving period, the transistor T12 maintains a turned-off state by a control signal Sen. Accordingly, during the display driving period, a constant current is not transmitted to the sensing unit 200.

In embodiments, in a sensing driving period, the transistor T10 gets in a turned-off state by the control signal Emi_2, and the transistor T12 gets in a turned-on state by the control signal Sen. Accordingly, a current flowing in the driving transistors T8, T9 may be transmitted to the sensing unit 200.

Specifically, in a constant current generator circuit sensing period in a sensing period, the first specific voltage may be applied to the constant current generator circuit 111 (specifically, the gate terminal of the first driving transistor T9), and the second specific voltage may be applied to the PWM circuit 112 (specifically, the gate terminal of the second driving transistor T8).

Accordingly, the first and second driving transistors T9, T8 are turned on, and the first current may flow in the second driving transistor T8 and the first driving transistor T9, and may be transmitted to the sensing unit 200 through the transistor T12 in a turned-on state.

In this case, the first current may be determined based on the first specific voltage applied to the gate terminal of the first driving transistor T9.

Specifically, a turn-on resistance of a transistor may be expressed as in Equation 1 below.

$$R_{on} = \frac{W}{L} \times \frac{C_i \times \mu_{eff}}{(V_{SG} - V_{TH})} \quad \text{(Equation 1)}$$

Here, $R_{on}$ is a turn-on resistance of a transistor, and it represents a resistance value that the transistor has in a turned-on state, W represents the width of a channel of the transistor, L represents the length of the channel of the transistor, $C_i$ represents the capacitance of an insulator layer that exists between a gate electrode layer and a channel layer of the transistor, $\mu_{eff}$ represents the effective mobility of the channel layer of the transistor, $V_{SG}$ represents a voltage between a source terminal and a gate terminal of the transistor, and $V_{TH}$ represents a threshold voltage of the transistor.

In the above Equation 1, W, L, $C_i$, $\mu_{eff}$, and $V_{TH}$ have fixed values, and the turn-on resistance of the transistor may be adjusted according to the voltage between the source terminal and the gate terminal.

In particular, driving voltages are applied to the source terminals of the first driving transistor T9 and the second driving transistor T8, and ultimately, the turn-on resistances of the first driving transistor T9 and the second driving transistor T8 may be determined based on the voltages applied to the gate terminals, i.e., the specific voltages.

In this case, according to an embodiment of the disclosure, the first and second specific voltages may have predetermined values so that the turn-on resistance value of the second driving transistor T8 has a smaller value than the turn-on resistance value of the first driving transistor T9.

For example, the first and second specific voltage values may be determined so that the turn-on resistance value of the second driving transistor T8 has a value smaller than 1 percent of the turn-on resistance value of the first driving transistor T9, but the disclosure is not limited thereto.

As described above, in case the turn-on resistance value of the second driving transistor T8 is smaller than the turn-on resistance value of the first driving transistor T9 to the extent that it can be ignored, it may be deemed that the first current value flowing in the first and second driving transistors T9, T8 in a constant current generator circuit sensing period is determined by the turn-on resistance value of the first driving transistor T9.

In embodiments, in a PWM circuit sensing period in a sensing period, the third specific voltage may be applied to the constant current generator circuit 111 (specifically, the gate terminal of the first driving transistor T9), and the fourth specific voltage may be applied to the PWM circuit 112 (specifically, the gate terminal of the second driving transistor T8).

Accordingly, the first and second driving transistors T9, T8 are turned on, and the second current may flow in the second driving transistor T8 and the first driving transistor T9, and may be transmitted to the sensing unit 200 through the transistor T12 in a turned-on state.

In this case, the second current may be determined based on the fourth specific voltage applied to the gate terminal of the second driving transistor T8.

That is, according to an embodiment of the disclosure, the third and fourth specific voltages may have predetermined values so that the turn-on resistance value of the first driving transistor T9 has a smaller value than the turn-on resistance value of the second driving transistor T8.

For example, the third and fourth specific voltage values may be determined so that the turn-on resistance value of the first driving transistor T9 has a value smaller than 1 percent of the turn-on resistance value of the second driving transistor T8, but the disclosure is not limited thereto.

As described above, in case the turn-on resistance value of the first driving transistor T9 is smaller than the turn-on resistance value of the second driving transistor T8 to the extent that it can be ignored, it may be deemed that the second current value flowing in the first and second driving transistors T9, T8 in a PWM circuit sensing period is determined by the turn-on resistance value of the second driving transistor T8.

In embodiments, when the first and second currents are transmitted, the sensing unit 200 may sense each of the first and second currents, and respectively output the first sensing data corresponding to the first current and the second sensing data corresponding to the second current to the correction unit 300.

Accordingly, the correction unit 300 may correct an image data voltage applied to the sub-pixel circuit 110 based on the sensing data.

Figure 39A:
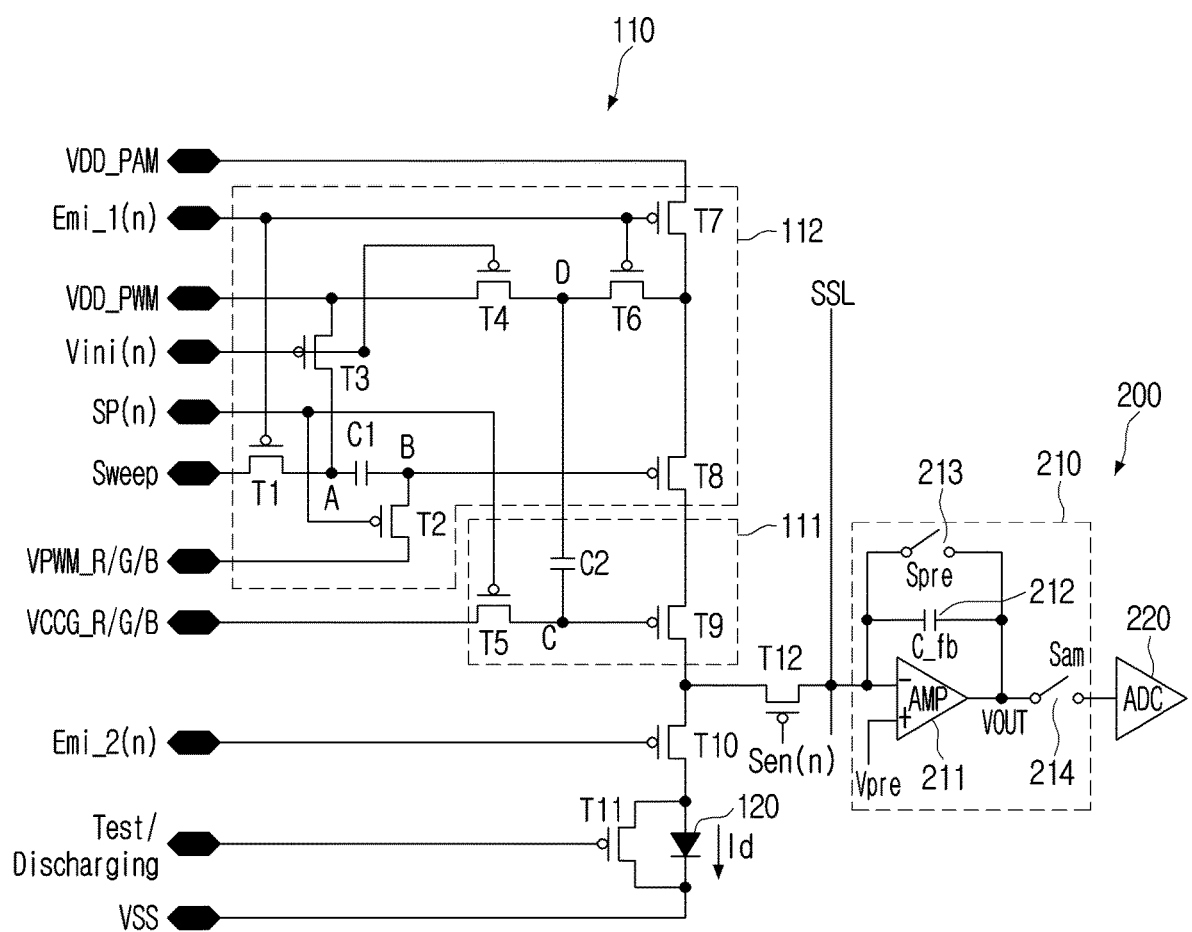
FIG. 39A is a detailed circuit diagram of a sub-pixel circuit and a sensing unit according to an embodiment.

FIG. 39A is a detailed circuit diagram of the sub-pixel circuit 110 and the sensing unit 200 according to an embodiment of the disclosure. FIG. 39A specifically illustrates a circuit related to one sub-pixel, i.e., one organic light emitting element 120, a sub-pixel circuit 110 for driving the inorganic light emitting element 120, and unit components of the sensing unit 200 for sensing a current flowing in the driving transistors T8, T9 included in the sub-pixel circuit 110.

According to FIG. 39A, the sub-pixel circuit 110 may include a constant current generator circuit 111, a PWM circuit 112, a transistor T10, a transistor T11, and a transistor T12.

The constant current generator circuit 111 includes a first driving transistor T9, a capacitor C2, and a transistor T5, as shown in FIG. 39A.

The transistor T5 is controlled to be turned on/turned off according to a control signal SP(n), and while the transistor T5 is turned on, it may apply a constant current generator data voltage or a specific voltage applied through a data signal line VCCG_R/G/B to the gate terminal (e.g., the C node) of the first driving transistor T9.

One end of the capacitor C2 is connected to the gate terminal (e.g., the C node) of the first driving transistor T9, and the other end is commonly connected to the drain terminal of the transistor T4 and the drain terminal of the transistor T6.

The first driving transistor T9 is serially connected with the second driving transistor T8. That is, the source terminal of the first driving transistor T9 is connected to the drain terminal of the second driving transistor T8.

Also, the drain terminal of the first driving transistor T9 is commonly connected to the source terminal of the transistor T10 and the source terminal of the transistor T12. In addition, the gate terminal of the first driving transistor T9 is commonly connected to one end of the capacitor C2 and the drain terminal of the transistor T5.

In embodiments, the PWM circuit 112 includes six transistors T1 to T4, T6, T7, a second driving transistor T8, and a capacitor C1, as shown in FIG. 39A.

The transistor T1 is controlled to be turned on/turned off according to a control signal Emi_1(n), and while the transistor T1 is turned on, it may apply a sweep signal (Sweep) to one end (e.g., the A node) of the capacitor C1.

The transistor T2 is controlled to be turned on/turned off according to a control signal SP(n), and while the transistor T2 is turned on, it may apply a PWM data voltage or a specific voltage applied through a data signal line VPWM_R/G/B to the gate terminal (e.g., the B node) of the second driving transistor T8.

The transistor T3 is controlled to be turned on/turned off according to a control signal Vini(n), and while the transistor T3 is turned on, it may apply a second driving voltage (VDD_PWM) to the A node.

The transistor T4 is controlled to be turned on/turned off according to a control signal Vini(n), and while the transistor T4 is turned on, it may apply the second driving voltage (VDD_PWM) to the other end (e.g., the D node) of the capacitor C2.

The transistor T7 is controlled to be turned on/turned off according to a control signal Emi_1(n), and while the transistor T7 is turned on, it may apply a first driving voltage (VDD_PAM) to the source terminal of the second driving transistor T8.

The transistor T6 is controlled to be turned on/turned off according to a control signal Emi_1(n), and while the transistor T6 is turned on, it may apply the first driving voltage (VDD_PAM) to the other end of the capacitor C2.

One end of the capacitor C1 is connected to the drain terminal (e.g., the A node) of the transistor T1, and the other end is connected to the gate terminal (e.g., the B node) of the second driving transistor T8.

The second driving transistor T8 is serially connected with the first driving transistor T9. That is, the drain terminal of the second driving transistor T8 is connected to the source terminal of the first driving transistor T9.

Also, the source terminal of the second driving transistor T8 is commonly connected to the source terminal of the transistor T6 and the drain terminal of the transistor T7. In addition, the gate terminal of the second driving transistor T8 is commonly connected to the other end of the capacitor C1 and the drain terminal of the transistor T2.

In embodiments, the source terminal of the transistor T10 is connected to the drain terminal of the first driving transistor T9, and its drain terminal is connected to the anode terminal of the inorganic light emitting element 120. The transistor T10 may be controlled to be turned on/turned off according to a control signal Emi_2(n), and electronically connect/separate the constant current generator circuit 111 and the inorganic light emitting element 120.

The transistor T11 is connected between the anode terminal and the cathode terminal of the inorganic light emitting element 120. The transistor T11 may be used for different uses respectively before and after the inorganic light emitting element 120 is mounted on the TFT layer and electronically connected with the sub-pixel circuit 110.

For example, before the inorganic light emitting element 120 and the sub-pixel circuit 110 are electronically connected with each other, the transistor T11 may be turned on according to a TEST signal to check whether the sub-pixel circuit 110 is abnormal.

Also, after the inorganic light emitting element 120 and the sub-pixel circuit 110 are connected with each other, the transistor T11 may perform a role of a discharging transistor. That is, the transistor T11 may be turned on according to a control signal (Discharging) for discharging a charge remaining in the inorganic light emitting element 120.

When the transistor T11 is turned on, the anode terminal and the cathode terminal of the inorganic light emitting element 120 are short-circuited, and thus the potential difference between both ends of the inorganic light emitting element 120 may be removed.

Here, the Discharging signal is a control signal provided from the TCON through the level shifter to control the turning-on/turning-off of the transistor T11, and is a global signal applied identically to all of the sub-pixel circuits 110 of the display panel 100.

The source terminal of the transistor T12 is connected to the drain terminal of the first driving transistor T9, and its drain terminal is connected to the sensing unit 200. The transistor T12 may be turned on according to a control signal Sen(n) while the sensing driving is performed, and transmit the aforementioned first and second currents to the sensing unit 200 through the sensing line (SSL).

In embodiments, the cathode terminal of the inorganic light emitting element 120 is connected to a ground voltage (VSS) terminal.

In embodiments, according to what is shown in FIG. 39A, the unit components of the sensing unit 200 includes a current integrator 210 and an analog to digital converter (ADC) 220. The current integrator 210 may include an amp 211, an integration capacitor 212, a first switch 213, and a second switch 214.

The amp 211 may include an inversion input terminal (−) that is connected to the sensing line (SSL) and receives input of the aforementioned first and second currents, a non-inversion input terminal (+) that receives input of a reference voltage (Vpre), and an output terminal (Vout).

The integration capacitor 212 may be connected between the inversion input terminal (−) and the output terminal (Vout) of the amp 211, and the first switch 213 may be connected to both ends of the integration capacitor 212. In embodiments, both ends of the second switch 214 may be respectively connected to the output terminal (Vout) of the amp 211 and the input end of the ADC 220, and the second switch 214 may be switched according to a control signal Sam.

In embodiments, the unit components of the sensing unit 200 shown in FIG. 39A may be provided for each sensing line (SSL). For example, in case a sensing line is provided for each column line of a pixel in the display panel 100 including 550 pixel column lines, the sensing unit 200 may include 550 of the unit components. As another example, in case a sensing line is provided for each column line of R, G, and B sub-pixels in the display panel 100 including 550 pixel column lines, the sensing unit 200 may include 1650 (=550*3) of the unit components.

Figure 39B:
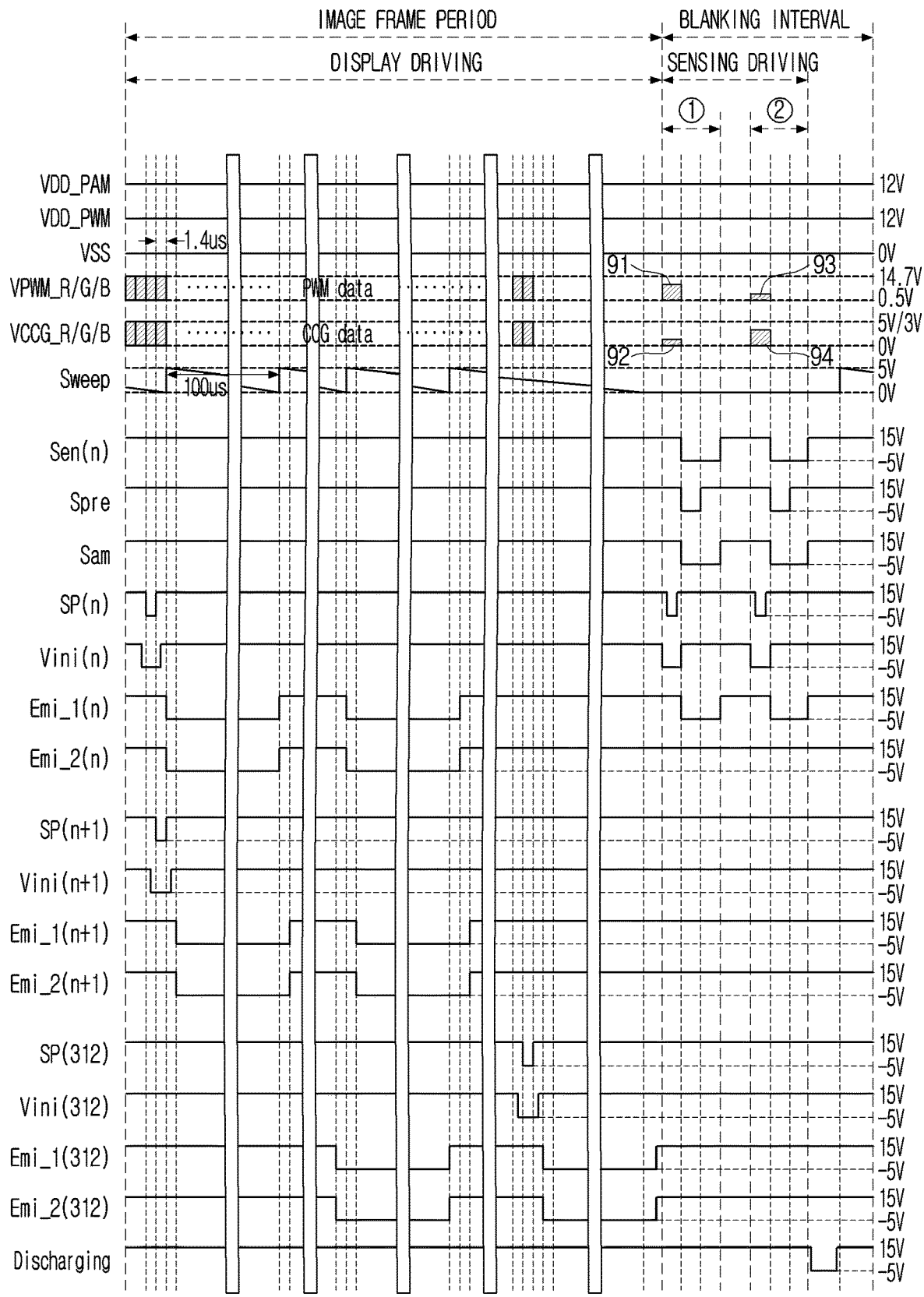
FIG. 39B is a timing diagram of various kinds of signals for driving a display panel including the sub-pixel circuit and the sensing unit in FIG. 39A during an image frame period and a blanking interval, according to an embodiment.

FIG. 39B is a driving timing diagram of the sub-pixel circuit 110 and the sensing unit 200 illustrated in FIG. 39A. Specifically, FIG. 39B illustrates various kinds of driving signals applied to the sub-pixel circuits 110 of the display panel 100 during one image frame period and a blanking interval. In FIG. 39B, an example wherein the display panel 100 includes 312 row lines is suggested.

Referring to FIG. 39B, VDD_PAM refers to a first driving voltage (e.g., +12[V]), VDD_PWM refers to a second driving voltage (e.g., +12[V]), and VSS refers to a ground voltage (e.g., 0[V]). The first driving voltage (VDD_PAM) and the second driving voltage (VDD_PWM) may be applied from the power IC to the sub-pixel circuits 110 through separate wirings. Accordingly, they do not influence each other. Also, the first driving voltage (VDD_PAM) and the second driving voltage (VDD_PWM) may be voltages of the same magnitude, but the disclosure is not limited thereto.

VPWM_R/G/B refers to a data signal line to which a PWM data voltage and a specific voltage are applied, or a signal applied through the line.

Specifically, in a display driving period, a PWM data voltage (PWM data) may be applied from the data driver to the PWM circuit 112 through VPWM_R/G/B.

In embodiments, in a sensing driving period, a specific voltage (specifically, the aforementioned fourth specific voltage 91, second specific voltage 93) may be applied from the data driver to the PWM circuit 112 through VPWM_R/G/B.

A voltage applied through a VPWM_R/G/B signal may have, for example, a value between +0.5[V] and +14.7[V] as shown in FIG. 39B, but the disclosure is not limited thereto.

In this case, PWM data voltages for each of R, G, and B sub-pixels may be time division multiplexed and applied from the data driver. As such, the time division multiplexed PWM data voltages may be respectively applied to a corresponding sub-pixel through a DeMux circuit.

VCCG_R/G/B refers to a data signal line to which a constant current generator data voltage and a specific voltage are applied, or a signal applied through the line.

Specifically, in a display driving period, a constant current generator data voltage (CCG data) may be applied from the data driver to the constant current generator circuit 111 through VCCG_R/G/B.

In embodiments, in a sensing driving period, a specific voltage (specifically, the aforementioned third specific voltage 92, first specific voltage 94) may be applied from the data driver to the constant current generator circuit 111 through VCCG_R/G/B.

A voltage applied through a VCCG_R/G/B signal may have, for example, a value between 0[V] and +5[V] as shown in FIG. 39B. In embodiments, the voltage may have a value between 0[V] and +3[V] as shown in FIG. 39B. However, the disclosure is not limited thereto.

In this case, according to an embodiment of the disclosure, a constant current generator data voltage of the same magnitude may be applied to the constant current generator circuits 111 of the display panel 100 for each type of the sub-pixels. In embodiments, depending on embodiments, the same constant current generator data voltage may be applied to all of the constant current generator circuits 111 regardless of the types of the sub-pixels. Accordingly, the magnitude of the driving current becomes identical for each type of the sub-pixels or all sub-pixels, and thus the problem of wavelength variation of the LED according to the change in the magnitude of the driving current may be solved.

In embodiments, the same constant current generator data voltage is applied to one display panel 100, but it is obvious that constant current generator data voltages of different magnitudes may be applied to different display panels. Accordingly, in case one large display apparatus includes a plurality of display panels which are connected, the deviation in the brightness or the deviation in the colors among the display panels may be compensated through adjustment of the constant current generator data voltages.

So far, it was described that the same constant current generator data voltage is applied to the constant current generator circuits 111 for the convenience of explanation, from the aspect of solving the problem of wavelength variation of the LED and expressing a gray scale of an image. However, as described above, there may be deviations in the threshold voltages and the mobility among the first driving transistors T9, and in the various embodiments of the disclosure, these deviations are compensated through the external compensation method, and accordingly, it is obvious that a constant current generator data voltage of which value was corrected through sensing driving is applied to the actual constant current generator circuits 111.

Vini(n) refers to a gate signal for applying the second driving voltage (VDD_PWM) to one end (e.g., the A node) of the capacitor C1 and the other end (e.g., the D node) of the capacitor C2. The second driving voltage (VDD_PWM) applied to the A node and the D node becomes a reference potential when an image data voltage or a specific voltage is set to the gate terminal (e.g., the B node) of the second driving transistor T8 and the gate terminal (e.g., the C node) of the first driving transistor T9.

SP(n) refers to a gate signal for applying an image data voltage and a specific voltage to the gate terminal (e.g., the B node) of the second driving transistor T8 and the gate terminal (e.g., the C node) of the first driving transistor T9.

Emi_1(n) refers to a gate signal for applying the first driving voltage (VDD_PAM) to the source terminal and the D node of the second driving transistor T8, and applying a sweep voltage to the A node.

Emi_2(n) refers to a gate signal for turning on the transistor T10 in a light emitting section.

Sen(n) refers to a gate signal for turning on the transistor T12 in a sensing period.

In the above control signals (e.g., gate signals), (n) refers to the $n^{th}$ row line. Accordingly, each of Vini(n), SP(n), Emi_1(n), Emi_2(n), and Sen(n) is applied identically to the sub-pixel circuits 110 included in the $n^{th}$ row line. Accordingly, the display panel 100 may be driven for each row line (or scan line or gate line).

Sweep refers to a sweep signal or a line to which a sweep signal is applied. A sweep signal may be generated in the TCON, and applied identically to all of the sub-pixel circuits 110 of the display panel 100 through the level shifter. That is, to all of the sub-pixel circuits 110 of the display panel 100, the same sweep signal may be applied. In this case, the sweep signal may be a global signal in a form wherein a voltage linearly changing from the first voltage (e.g., +5[V]) to the second voltage (e.g., 0[V]) is continuously repeated.

In embodiments, to the A node, a portion of a sweep signal is applied while the transistor T1 is turned on according to a control signal Emi_1(n). As such, a portion of a sweep signal selectively applied to the A node may be the aforementioned sweep voltage.

In this case, the transistors T1 of the display panel 100 are turned on in the order of the row lines according to Emi_1(n), and accordingly, apart from the fact that the sweep signal is a global signal applied identically to all of the row lines, the waveform of the sweep voltage applied to the A node of the sub-pixel circuits 110 may vary according to the row lines.

In embodiments, Spre and Sam are control signals related to sensing driving, and operations of the sensing unit 200 according to each control signal will be described later.

In embodiments, referring to FIG. 39B, it can be seen that in the display panel 100, display driving is performed within an image frame period, and sensing driving is performed within a blanking interval.

In a display driving period, the aforementioned data setting section and light emitting section proceed.

As described above, according to an embodiment of the disclosure, for one image frame, one data setting section and a plurality of light emitting sections may proceed for each row line. For this, referring to FIG. 39B, it can be seen that during a display driving period, scan signals (SP, Vini) for a data setting operation are applied once for each row line, and emission signals (Emi_1, Emi_2) for a light emitting operation are applied multiple times for each row line.

That is, a time section in which SP, Vini signals having a low level are applied becomes a data setting section of the corresponding row line, and a time section in which Emi signals having a low level are applied becomes a light emitting section of the corresponding row line.

In embodiments, as described above, according to an embodiment of the disclosure, a data setting section and a light emitting section may proceed in the order of the row lines. For this, referring to FIG. 39B, it can be seen that each of the gate signals (SP, Vini, Emi_1, Emi_2) is sequentially applied in the order of the row lines.

That is, for example, an SP(n) signal of having low level and an SP(n+1) signal having a low level are applied with a difference as much as 1 H time (1.4 µs in the example of FIG. 9B) from each other. This is the same for the remaining gate signals (e.g., Vini(n) and Vini(n+1), Emi_1(n) and Emi_1(n+1), Emi_2(n) and Emi_2(n+1)).

In embodiments, in a sensing driving period, sensing driving for the sub-pixel circuits 110 included in some row lines (the $n^{th}$ row line in the example of FIG. 39B) of the display panel is performed.

Referring to FIG. 39B, a sensing driving period (or a sensing period) may include a PWM circuit sensing period (0) and a constant current generator circuit sensing period (0).

During the PWM circuit sensing period (0), the second current flowing in the second driving transistor T8 and the first driving transistor T9 is transmitted to the sensing unit 200 based on the fourth specific voltage 91 and the third specific voltage 92.

During the constant current generator circuit sensing period (0), the first current flowing in the second driving transistor T8 and the first driving transistor T9 is transmitted to the sensing unit 200 based on the second specific voltage 93 and the first specific voltage 94.

Accordingly, the sensing unit 200 may respectively output the second sensing data and the first sensing data based on the second and first currents.

In this case, according to an embodiment of the disclosure, the sensing driving may be performed within a blanking interval as shown in FIG. 39B.

However, embodiments are not limited thereto. For example, the sensing driving may be performed during a booting period, a power-off period, or a screen-off period, etc. of the display apparatus 1000. Here, the booting period may mean a period after the system power was applied until the screen is turned on, the power-off period may mean a period after the screen was turned off until the system power is released, and the screen-off period may mean a period wherein the system power is being applied, but the screen is turned off.

In embodiments, as described above, a problem may occur due to a leakage current when implementing a black gray scale. Thus, according to an embodiment of the disclosure, a Discharging signal having a low level (e.g., −5[V]) may be applied to the sub-pixel circuits 110 (specifically, the gate terminal of the transistor T11) within a blanking interval after the display driving and the sensing driving are completed, as shown in FIG. 39B. Accordingly, when the transistor T11 is turned on, a potential difference between both ends of the inorganic light emitting element 120 may be removed, and through this, more correct implementation of a black gray scale can be guaranteed.

In FIG. 39B, an example wherein an operation for removing a potential difference between both ends of the inorganic light emitting element 120 is performed once for one image frame within a non-light emitting section that exists inside a blanking interval is suggested. However, embodiments are not limited thereto, and depending on products, the operation may be performed in various ways in various situations, as described above in FIGS. 7A to 7D.

In embodiments, as the detailed operations of the sub-pixel circuit 110 in a display driving section and a sensing driving section can be understood through the circuit diagram shown in FIG. 39A and the driving timing diagram shown in FIG. 39B, more detailed explanation in that regard will be omitted below.

In embodiments, according to the various embodiments of the disclosure as described above, a phenomenon in which a wavelength of light emitted from an inorganic light emitting element changes according to a gray scale can be prevented. Also, a stain of an image that might appear on a screen due to a difference in the threshold voltage between driving transistors can be easily compensated. Further, correction of colors is facilitated. In addition, power consumption consumed in driving a display panel can be reduced. Further, an effect of a drop of a driving voltage in a process of setting a data voltage can be compensated. Also, problems of disuniformity of brightness and horizontal crosstalk by a sweep load can be improved. In addition, a dynamic range can be sufficiently secured.

The descriptions above are merely illustrative of the technical idea of the disclosure, and a person skilled in the art to which the disclosure belongs will be able to perform various modifications and variations without departing from the essential characteristics of the disclosure. For example, a case in which a sub-pixel circuit is implemented with a PMOS TFT was described above, but a person skilled in the art will be able to perform a modification of implementing a sub-pixel circuit with an NMOS TFT or a CMOS TFT.

In addition, embodiments according to the disclosure are not for limiting the technical idea of the disclosure but for explaining the technical idea, and the scope of the technical idea of the disclosure is not limited by the embodiments. Accordingly, the scope of the disclosure should be construed by the appended claims, and all technical ideas in an equivalent range to the scope of the disclosure should be construed as being included within the scope of the disclosure.

What is claimed is:

1. A display apparatus comprising:
   a display panel comprising a pixel array including a plurality of pixels arranged in a plurality of row lines, and a plurality of sub-pixel circuits, wherein each pixel of the plurality of pixels includes a plurality of inorganic light emitting elements, and wherein each sub-pixel circuit of the plurality of sub-pixel circuits corresponds to an inorganic light emitting element of the plurality of light emitting elements; and
   a driver configured to drive the plurality of sub-pixel circuits so that the plurality of inorganic light emitting elements emit light a plurality of times in an order of the plurality of row lines based on an image data voltage corresponding to one image frame,
   wherein the each sub-pixel circuit includes a discharge transistor configured to remove a potential difference between both ends of a corresponding inorganic light emitting element based on a predetermined cycle,
   wherein the driver is further configured to:
      during a data setting section that proceeds in the order of the plurality of row lines, set the image data voltage for the plurality of sub-pixel circuits in the order of the plurality of row lines, and
      in each light emitting section of a plurality of light emitting sections that proceed in the order of the plurality of row lines, drive the plurality of sub-pixel circuits so that the plurality of inorganic light emitting elements emit the light in the order of the plurality of row lines based on the set image data voltage.

2. The display apparatus of claim 1, wherein a first light emitting section from among the plurality of light emitting sections is temporally consecutive with the data setting section, and
   wherein the plurality of light emitting sections have a predetermined time interval with respect to each other.

3. The display apparatus of claim 1, wherein the discharge transistor is further configured to be turned on based on the predetermined cycle, and to short-circuit the both ends of the inorganic light emitting element while the discharge transistor is turned on.

4. The display apparatus of claim 3, wherein the discharge transistor is further configured to be turned on at least once per image frame.

5. The display apparatus of claim 3, wherein the discharge transistor is further configured to be turned on once per a plurality of image frames.

6. The display apparatus of claim 1, wherein discharge transistors included in the display panel are turned on at once after the data setting section proceeds for all of the plurality of row lines of the display panel.

7. The display apparatus of claim 1,
   wherein the image data voltage comprises a constant current generator data voltage and a pulse width modulation (PWM) data voltage, and
   wherein the each sub-pixel circuit comprises:
      a constant current generator circuit comprising a first driving transistor, and configured to provide a constant current to the corresponding inorganic light emitting element based on the constant current generator data voltage; and
      a PWM circuit comprising a second driving transistor, and configured to control a time during which the constant current is provided to the corresponding inorganic light emitting element based on a sweep voltage which sweeps between two different voltages and the PWM data voltage.

8. The display apparatus of claim 7, wherein the constant current generator circuit is further configured to set, in the data setting section, the constant current generator data voltage and a first voltage based on a threshold voltage of the first driving transistor to a gate terminal of the first driving transistor, and
   wherein the PWM circuit is further configured to set, in the data setting section, the PWM data voltage and a second voltage based on a threshold voltage of the second driving transistor to a gate terminal of the second driving transistor.

9. The display apparatus of claim 8, wherein the constant current generator circuit is further configured to provide, in the each light emitting section, a driving current having a magnitude based on the first voltage to the inorganic light emitting element, and
   wherein the PWM circuit is further configured to control, in the each light emitting section, the time during which the constant current is provided to the corresponding inorganic light emitting element based on a voltage of the gate terminal of the second driving transistor changing from the second voltage according to the sweep voltage.

10. The display apparatus of claim 7, further comprising:
a sensing unit configured to sense currents flowing in the first driving transistor and the second driving transistor based on a specific voltage, and to output sensing data corresponding to the sensed currents; and
a correction unit configured to correct the constant current generator data voltage and the PWM data voltage applied to the plurality of sub-pixel circuits based on the sensing data.

11. The display apparatus of claim 1, wherein the plurality of sub-pixel circuits are configured to be driven by a first driving voltage in the each light emitting section, and are further configured to be driven by a second driving voltage separate from the first driving voltage in the data setting section.

12. A display apparatus comprising:
a display panel comprising a pixel array including a plurality of pixels arranged in a plurality of row lines, and a plurality of sub-pixel circuits, wherein each pixel of the plurality of pixels includes a plurality of inorganic light emitting elements, and wherein each sub-pixel circuit of the plurality of sub-pixel circuits corresponds to an inorganic light emitting element of the plurality of light emitting elements; and
a driver configured to drive the plurality of sub-pixel circuits so that the plurality of inorganic light emitting elements emit light a plurality of times in an order of the plurality of row lines based on an image data voltage corresponding to one image frame,
wherein the each sub-pixel circuit includes a discharge transistor configured to remove a potential difference between both ends of a corresponding inorganic light emitting element based on a predetermined cycle, and
wherein the potential difference is generated, based on the image data voltage being a value corresponding to a black gray scale, by a leakage current flowing in the inorganic light emitting element, and a junction capacitance of the inorganic light emitting element.

* * * * *